United States Patent
Kim et al.

(10) Patent No.: US 12,426,500 B2
(45) Date of Patent: Sep. 23, 2025

(54) LIGHT EMITTING ELEMENT AND AMINE COMPOUND FOR THE SAME

(71) Applicant: Samsung Display Co., Ltd., Yongin-si (KR)

(72) Inventors: Dongjun Kim, Suwon-si (KR); Hankyu Pak, Suwon-si (KR); Eunjae Jeong, Hwaseong-si (KR); Sanghyun Han, Hwaseong-si (KR); Minji Kim, Hwaseong-si (KR); Sohee Jo, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 880 days.

(21) Appl. No.: 17/362,764

(22) Filed: Jun. 29, 2021

(65) Prior Publication Data

US 2022/0115597 A1 Apr. 14, 2022

(30) Foreign Application Priority Data

Oct. 13, 2020 (KR) .................. 10-2020-0132176

(51) Int. Cl.
*H10K 85/60* (2023.01)
*H10K 50/15* (2023.01)

(52) U.S. Cl.
CPC ......... *H10K 85/636* (2023.02); *H10K 85/624* (2023.02); *H10K 85/626* (2023.02);
(Continued)

(58) Field of Classification Search
CPC .. H10K 85/636; H10K 85/624; H10K 85/633; H10K 85/6574; H10K 85/6576;
(Continued)

(56) References Cited

U.S. PATENT DOCUMENTS

| | | |
|---|---|---|
| 4,720,432 A | 1/1988 | VanSlyke et al. |
| 5,061,569 A | 10/1991 | VanSlyke et al. |

(Continued)

FOREIGN PATENT DOCUMENTS

| | | |
|---|---|---|
| CN | 106612616 A | 5/2017 |
| CN | 112552190 A | 3/2021 |

(Continued)

OTHER PUBLICATIONS

WO-2016182270-A1 English Translation (Year: 2016).*
Office action dated Apr. 24, 2025, of Corresponding Chinese Patent Application 202111185621.8, 7 pages.

*Primary Examiner* — Anita Nassiri-Motlagh
(74) *Attorney, Agent, or Firm* — Womble Bond Dickinson (US) LLP

(57) ABSTRACT

Provided is a light emitting element including a first electrode, a second electrode, and at least one functional layer between the first electrode and the second electrode, and the at least one functional layer may include an amine compound represented by Formula 1 below, thereby exhibiting high luminous efficiency and improved service life characteristics.

(Continued)

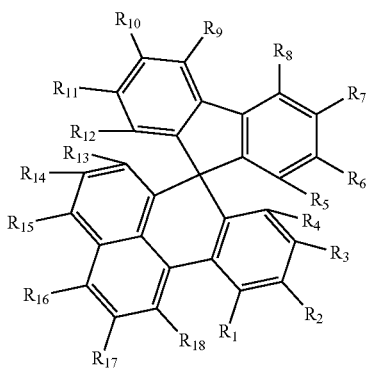

[Formula 1]

(52) U.S. Cl.
CPC ....... *H10K 85/633* (2023.02); *H10K 85/6572* (2023.02); *H10K 85/6574* (2023.02); *H10K 85/6576* (2023.02); *H10K 50/15* (2023.02)

(58) Field of Classification Search
CPC ... H10K 85/626; H10K 85/6572; H10K 50/15
USPC .................................................... 252/301.16
See application file for complete search history.

(56) References Cited

U.S. PATENT DOCUMENTS

| | | | |
|---|---|---|---|
| 6,242,115 | B1 | 6/2001 | Thomson et al. |
| 8,021,764 | B2 | 9/2011 | Hwang et al. |
| 9,419,237 | B2 | 8/2016 | Shitagaki et al. |
| 2019/0378980 | A1 | 12/2019 | Kim et al. |
| 2020/0161558 | A1* | 5/2020 | Takaya ................. H10K 85/623 |

FOREIGN PATENT DOCUMENTS

| | | |
|---|---|---|
| JP | H 11-144873 A | 5/1999 |
| JP | 2000-302756 A | 10/2000 |
| JP | 2003-133075 A | 5/2003 |
| JP | 2004-079265 A | 3/2004 |
| JP | 2006-151979 A | 6/2006 |
| KR | 10-2014-0018132 A | 2/2014 |
| KR | 10-1397286 B1 | 5/2014 |
| KR | 10-2015-0051830 A | 5/2015 |
| KR | 10-2016-0131887 A | 11/2016 |
| KR | 10-1695270 B1 | 1/2017 |
| KR | 10-2019-0140549 A | 12/2019 |
| WO | WO-2016182270 A1 * | 11/2016 ............. C07C 13/72 |

* cited by examiner

18 Claims, 6 Drawing Sheets

LIGHT EMITTING ELEMENT AND AMINE COMPOUND FOR THE SAME

CROSS-REFERENCE TO RELATED APPLICATION

This application claims priority to and the benefit of Korean Patent Application No. 10-2020-0132176, filed on Oct. 13, 2020, the entire contents of which are hereby incorporated by reference.

BACKGROUND

1. Field

Embodiments of the present disclosure herein relate to a light emitting element and an amine compound used therein, and, for example, to an amine compound used in a hole transport region and a light emitting element including the same.

2. Description of the Related Art

Recently, the development of an organic electroluminescence display as an image display device is being actively conducted. The organic electroluminescence display includes so-called a self-luminescent light emitting element in which holes and electrons injected from a first electrode and a second electrode recombine in an emission layer, and thus, a luminescent material of the emission layer emits light to implement display.

In the application of a light emitting element to a display device, there is a demand for a light emitting element having low driving voltage, high luminous efficiency, and a long service life, and development on materials for a light emitting element capable of stably attaining such characteristics is being continuously conducted.

In addition, development on materials of a hole transport region for suppressing or reducing the diffusion of exciton energy of the emission layer is being carried out in order to implement a highly efficient light emitting element.

SUMMARY

Embodiments the present disclosure provide a light emitting element exhibiting excellent luminous efficiency and long service life characteristics.

Embodiments of the present disclosure also provide an amine compound which is a material for a light emitting element having high efficiency and long service life characteristics.

An embodiment of the present disclosure provides an amine compound represented by Formula 1 below:

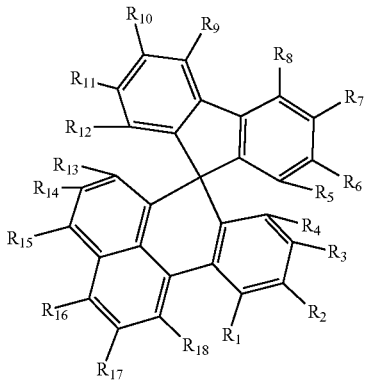

[Formula 1]

In Formula 1 above, at least one selected from among $R_1$ to $R_{18}$ is a deuterium atom, and the rest are each independently a hydrogen atom, a halogen atom, a substituted or unsubstituted silyl group, or a substituted or unsubstituted alkyl group having 1 to 20 carbon atoms, and any one selected from $R_3$, $R_6$, $R_8$, and $R_{15}$ is represented by Formula 2 below:

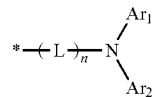

[Formula 2]

In Formula 2 above, n is an integer of 0 to 3, and L is a substituted or unsubstituted arylene group having 6 to 30 ring-forming carbon atoms, or a substituted or unsubstituted heteroarylene group having 2 to 30 ring-forming carbon atoms, and $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms.

In an embodiment, Formula 1 above may be represented by any one selected from among Formula 1-1 to Formula 1-3 below:

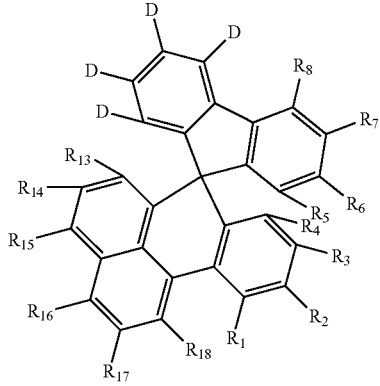

[Formula 1-1]

[Formula 1-2]

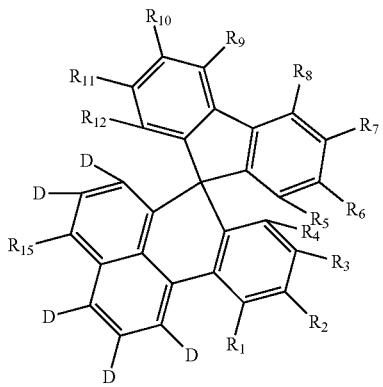

[Formula 1-3]

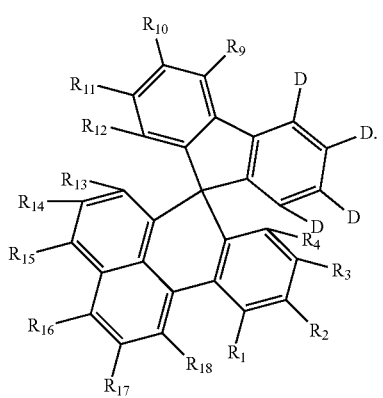

In Formula 1-1 above, $R_1$ to $R_8$ and $R_{13}$ to $R_{18}$ are each independently a hydrogen atom, a halogen atom, a substituted or unsubstituted silyl group, or a substituted or unsubstituted alkyl group having 1 to 20 carbon atoms, and any one selected from $R_3$, $R_6$, $R_8$, and $R_{15}$ is represented by Formula 2 above. In Formula 1-2 above, $R_1$ to $R_{12}$ are each independently a hydrogen atom, a halogen atom, a substituted or unsubstituted silyl group, or a substituted or unsubstituted alkyl group having 1 to 20 carbon atoms, and any one selected from $R_3$, $R_6$, and $R_8$ is represented by Formula 2 above. In Formula 1-3 above, $R_1$ to $R_4$ and $R_9$ to $R_{18}$ are each independently a hydrogen atom, a halogen atom, a substituted or unsubstituted silyl group, or a substituted or unsubstituted alkyl group having 1 to 20 carbon atoms, and $R_3$ or $R_{15}$ is represented by Formula 2 above.

Formula 1 above may be represented by any one selected from among Formula 1A to Formula 1 D below:

[Formula 1A]

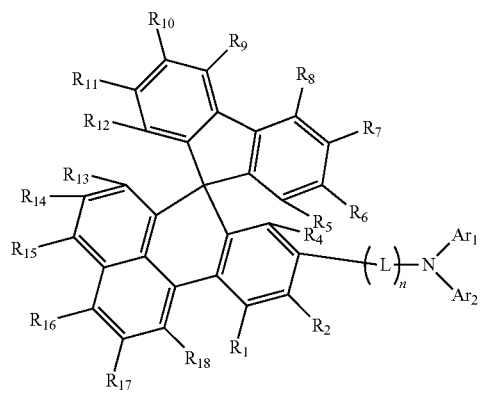

[Formula 1B]

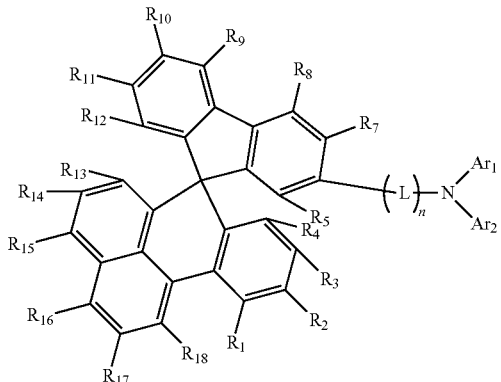

[Formula 1C]

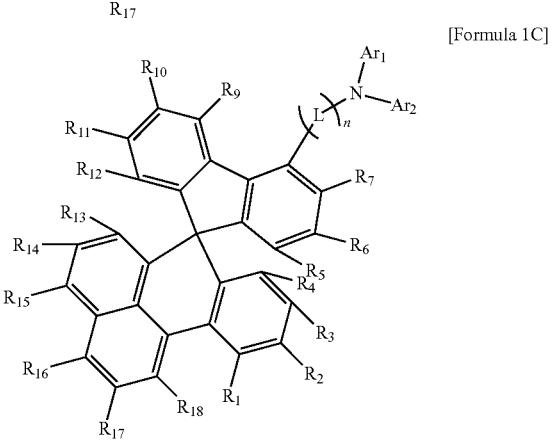

[Formula 1D]

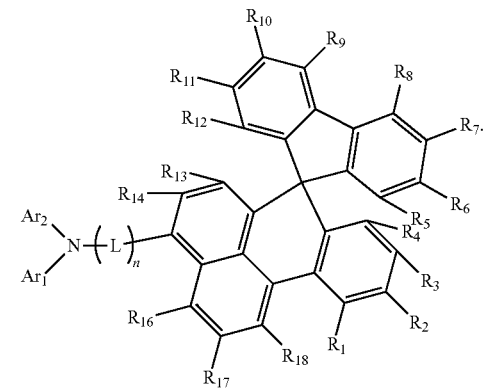

In Formula 1A above, at least one selected from among $R_5$ to $R_{18}$ is a deuterium atom, and the rest are hydrogen atoms, in Formula 1B and Formula 1C above, at least one selected from among $R_1$ to $R_4$ and $R_9$ to $R_{18}$ is a deuterium atom, and the rest are hydrogen atoms, and in Formula 1 D above, at least one selected from among $R_1$ to $R_{14}$ and $R_{16}$ to $R_{18}$ is a deuterium atom, and the rest are hydrogen atoms. In Formula 1A to Formula 1 D above, L, n, $Ar_1$, and $Ar_2$ are the same as in Formula 2 above.

In an embodiment, $Ar_1$ and $Ar_2$ may be each independently a substituted or unsubstituted phenyl group, a substituted or unsubstituted naphthyl group, a substituted or unsubstituted fluorenyl group, a substituted or unsubstituted biphenyl group, a substituted or unsubstituted phenanthrenyl group, a substituted or unsubstituted carbazole group, a substituted or unsubstituted indolyl group, a substituted or unsubstituted pyridyl group, a substituted or unsubstituted dibenzofuranyl group, or a substituted or unsubstituted dibenzothiophenyl group.

In an embodiment, any one selected from $Ar_1$ and $Ar_2$ may be a substituted or unsubstituted carbazole group.

In an embodiment, $Ar_1$ and $Ar_2$ may be different from each other.

In an embodiment, Formula 2 above may be represented by Formula 2-1 below:

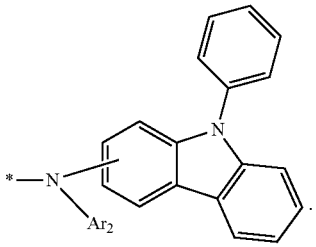

[Formula 2-1]

In Formula 2-1 above, $Ar_2$ is the same as defined with respect to Formula 2 above.

In Formula 2 above, when n is an integer of 1 or greater, L are each independently a substituted or unsubstituted divalent phenyl group, a substituted or unsubstituted divalent biphenyl group, a substituted or unsubstituted divalent naphthyl group, a substituted or unsubstituted divalent fluorene group, a substituted or unsubstituted divalent phenanthrene group, a substituted or unsubstituted divalent carbazole group, a substituted or unsubstituted divalent indole group, or a substituted or unsubstituted divalent pyridine group.

In an embodiment of the present disclosure, a light emitting element includes: a first electrode; a second electrode on the first electrode; and at least one functional layer between the first electrode and the second electrode, and including the above-described amine compound of an embodiment.

In an embodiment, the at least one functional layer may include an emission layer, a hole transport region between the first electrode and the emission layer, and an electron transport region between the emission layer and the second electrode, and the hole transport region may include the above-described amine compound of an embodiment.

In an embodiment, the hole transport region may include a hole injection layer on the first electrode, and a hole transport layer on the hole injection layer, and the hole transport layer may include the above-described amine compound of an embodiment.

BRIEF DESCRIPTION OF THE DRAWINGS

The accompanying drawings are included to provide a further understanding of the subject matter of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
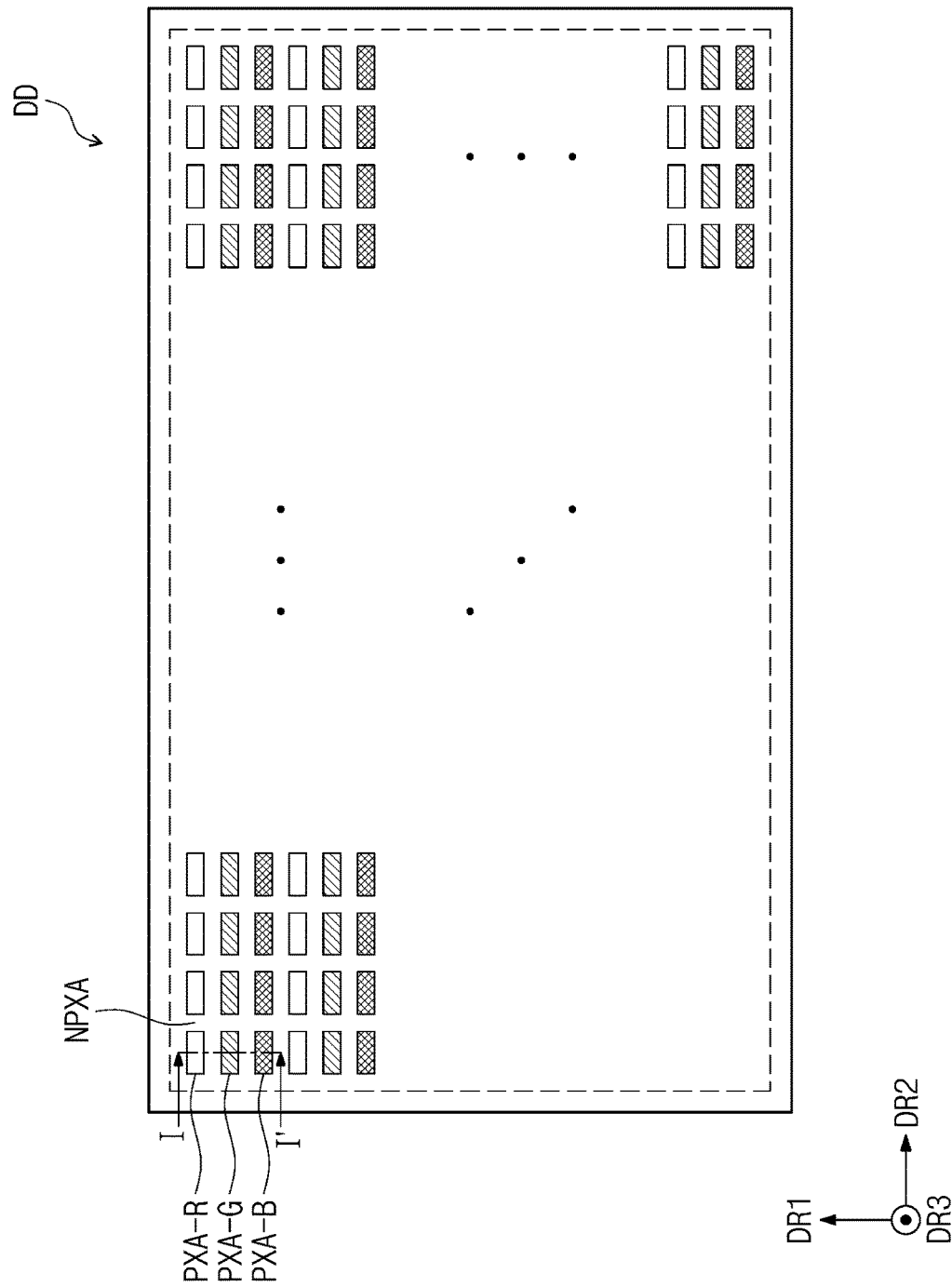
FIG. 1 is a plan view illustrating a display device according to an embodiment of the present disclosure.

The subject matter of the present disclosure may be modified in many alternate forms, and thus, example embodiments will be illustrated in the drawings and described in more detail. It should be understood, however, that it is not intended to limit the scope of the present disclosure to the particular forms disclosed, but rather, is intended to cover all modifications, equivalents, and alternatives falling within the spirit and scope of the present disclosure.

When explaining each of the drawings, like reference numbers are used for referring to like elements. In the accompanying drawings, the dimensions of each structure may be exaggeratingly illustrated for clarity of the present disclosure. It will be understood that, although the terms "first," "second," etc. may be used herein to describe various elements, these elements should not be limited by these terms. These terms are only used to distinguish one element from another. For example, a first element may be referred to as a second element, and, similarly, the second element may be referred to as the first element, without departing from the spirit and scope of the present disclosure. The terms of a singular form may include plural forms unless the context clearly indicates otherwise.

In the present application, it will be understood that the another of "comprise" or "have" specifies the presence of a feature, a fixed number, a step, a process, an element, a component, or a combination thereof disclosed in the present specification, but does not exclude the possibility of presence or addition of one or more other features, fixed numbers, steps, processes, elements, components, or combination thereof.

In the present application, when a layer, a film, a region, or a plate is referred to as being "above" or "in an upper portion" another layer, film, region, or plate, it can be not only directly on the layer, film, region, or plate, but intervening layers, films, regions, or plates may also be present. Similarly, when a layer, a film, a region, or a plate is referred to as being "below," "in a lower portion of" another layer, film, region, or plate, it can be not only directly under the layer, film, region, or plate, but intervening layers, films, regions, or plates may also be present. In addition, it will be understood that when a layer, a film, a region, or a plate is referred to as being "on" another layer, film, region, or plate, it can be not only on the layer, film, region, or plate, but also under the layer, film, region, or plate.

In the present description, the term "substituted or unsubstituted" may mean unsubstituted or substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents described above may be substituted or unsubstituted. For example, a biphenyl group may be interpreted as an aryl group or a phenyl group substituted with a phenyl group.

In the present description, the phrase "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the rings formed by being bonded to each other may be connected to another ring to form a spiro structure.

In the present specification, the term "an adjacent group" may mean a substituent substituted at an atom which is directly connected to an atom substituted with a corresponding substituent, another substituent substituted at an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethyl-cyclopentane may be interpreted as "adjacent groups" to each other. In addition, two methyl groups in 4,5-dimethylphenanthrene may be interpreted as "adjacent groups" to each other.

In the present description, examples of a halogen atom may include a fluorine atom, a chlorine atom, a bromine atom, or an iodine atom.

In the present specification, an alkyl group may be a linear, branched or cyclic type (e.g., alkyl group may be a linear alkyl group, a branched alkyl group, or a cyclic alkyl group). The number of carbon atoms in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-heneicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but the embodiment of the present disclosure is not limited thereto.

The term "hydrocarbon ring group," as used herein, means any suitable functional group or substituent derived from an aliphatic hydrocarbon ring. The hydrocarbon ring group may be a saturated hydrocarbon ring group having 5 to 20 ring-forming carbon atoms.

The term "aryl group," as used herein, means any suitable functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but the embodiment of the present disclosure is not limited thereto.

In the present description, a fluorenyl group may be substituted, and two substituents may be combined with each other to form a spiro structure. Examples of cases where the fluorenyl group is substituted are as follows. However, the embodiment of the present disclosure is not limited thereto.

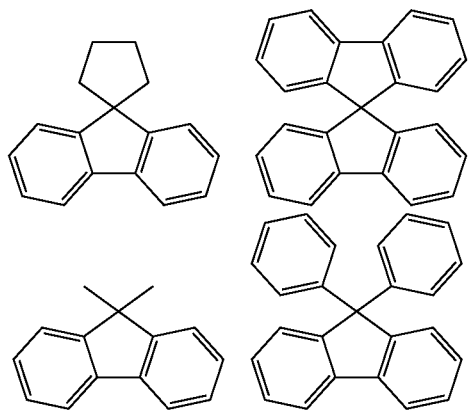

The term "heterocyclic group," as used herein, means any suitable functional group or substituent derived from a ring including at least one of B, O, N, P, Si, or Se as a heteroatom. The heterocyclic group includes an aliphatic heterocyclic group and an aromatic heterocyclic group. The aromatic heterocyclic group may be a heteroaryl group. The aliphatic heterocycle and the aromatic heterocycle may be monocyclic or polycyclic.

In the present description, the heterocyclic group may include at least one of B, O, N, P, Si or S as a heteroatom. If the heterocyclic group includes two or more heteroatoms, the two or more heteroatoms may be the same or different. The heterocyclic group may be a monocyclic heterocyclic group or a polycyclic heterocyclic group and has the concept including a heteroaryl group. The ring-forming carbon number of the heterocyclic group may be 2 to 30, 2 to 20, or 2 to 10.

In the present description, the aliphatic heterocyclic group may include one or more selected from among B, O, N, P, Si, and S as a heteroatom. The number of ring-forming carbon atoms of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but the embodiment of the present disclosure is not limited thereto.

The term "heteroaryl group," as used herein, may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but the embodiment of the present disclosure is not limited thereto.

In the present description, the above description with respect to the aryl group may be applied to an arylene group except that the arylene group is a divalent group. The explanation on the aforementioned heteroaryl group may be applied to the heteroarylene group except that the heteroarylene group is a divalent group.

In the present description, a silyl group includes an alkylsilyl group and/or an arylsilyl group. Examples of the silyl group may include trimethylsilyl, triethylsilyl, t-butyldimethylsilyl, propyldimethylsilyl, triphenylsilyl, diphenylsilyl, phenylsilyl, etc.

However, an embodiment of the present disclosure is not limited thereto.

In the present description, the number of carbon atoms in an amino group is not specifically limited, but may be 1 to 30. The amino group may include an alkyl amino group, an aryl amino group, and/or a heteroaryl amino group. Examples of the amino group include a methylamino group, a dimethylamino group, a phenylamino group, a diphenylamino group, a naphthylamino group, a 9-methyl-anthracenylamino group, etc., but are not limited thereto.

In the present description, the number of ring-forming carbon atoms in a carbonyl group may be 0, 1 to 40, 1 to 30, or 1 to 20. For example, the carbonyl group may have the following structures, but the embodiment of the present disclosure is not limited thereto.

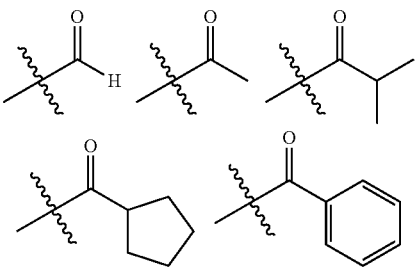

In the present description, the number of carbon atoms in a sulfinyl group and a sulfonyl group is not particularly limited, but may be 1 to 30. The sulfinyl group may include an alkyl sulfinyl group and an aryl sulfinyl group. The sulfonyl group may include an alkyl sulfonyl group and an aryl sulfonyl group.

In the present description, a thiol group may include an alkylthio group and/or an arylthio group. The term "thiol group," as used herein, may mean that a sulfur atom is bonded to the alkyl group or the aryl group as defined above. Examples of the thiol group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but the embodiment of the present disclosure is not limited thereto.

The term "oxy group," as used herein, may mean that an oxygen atom is bonded to the alkyl group or the aryl group as defined above. The oxy group may include an alkoxy group and/or an aryl oxy group. The alkoxy group may be a linear chain alkoxy group, a branched chain alkoxy group, or a ring alkoxy group. The number of carbon atoms in the alkoxy group is not specifically limited, but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., without limitation.

The term "boron group," as used herein, may mean that a boron atom is bonded to the alkyl group or the aryl group as defined above. The boron group includes an alkyl boron group and/or an aryl boron group. Examples of the boron group may include a trimethylboron group, a triethylboron group, a t-butyldimethylboron group, a triphenylboron group, a diphenylboron group, a phenylboron group, etc., but the embodiment of the present disclosure is not limited thereto.

In the present description, an alkenyl group may be a linear alkenyl group or a branched alkenyl group. The number of carbon atoms in the alkenyl group is not specifically limited, but is 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but the embodiment of the present disclosure is not limited thereto.

In the present description, the number of carbon atoms in an amine group is not specifically limited, but may be 1 to 30. The amine group may include an alkyl amine group and/or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but the embodiment of the present disclosure is not limited thereto.

In the present description, the alkyl group among an alkylthio group, an alkylsulfoxy group, an alkylaryl group, an alkylamino group, an alkyl boron group, an alkyl silyl group, and an alkyl amine group is the same as the examples of the alkyl group described above.

In the present description, the aryl group among an aryloxy group, an arylthio group, an arylsulfoxy group, an arylamino group, an arylboron group, an arylsilyl group, an arylamine group is the same as the examples of the aryl group described above.

A direct linkage herein may mean a single bond (e.g., a single covalent bond).

In the present specification,

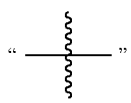

and " ——— ∗ " mean a position to be connected.

Hereinafter, embodiments of the present disclosure will be described with reference to the accompanying drawings.

FIG. 1 is a plan view illustrating an embodiment of a display device DD.

Figure 2:
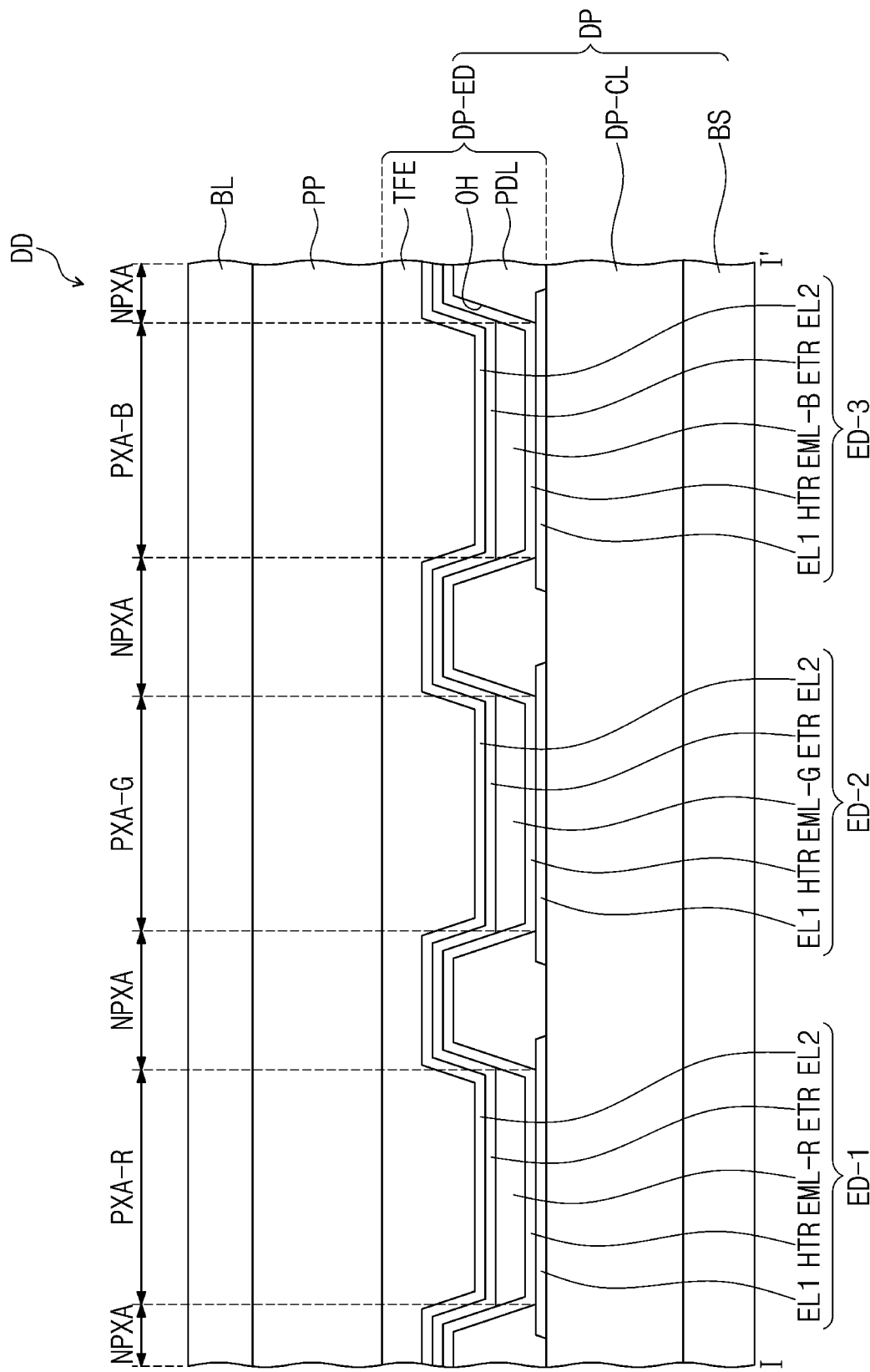
FIG. 2 is a cross-sectional view of a display device according to an embodiment of the present disclosure.

FIG. 2 is a cross-sectional view of the display device DD of the embodiment. FIG. 2 is a cross-sectional view illustrating a part taken along line I-I' of FIG. 1.

The display device DD may include a display panel DP and an optical layer PP on the display panel DP. The display panel DP includes light emitting elements ED-1, ED-2, and ED-3. The display device DD may include a plurality of light emitting elements ED-1, ED-2, and ED-3. The optical layer PP may be on the display panel DP and control reflected light in the display panel DP due to external light. The optical layer PP may include, for example, a polarization layer and/or a color filter layer. In one or more embodiments, the optical layer PP may be omitted from the display device DD of an embodiment.

A base substrate BL may be on the optical layer PP. The base substrate BL may be a member which provides a base surface on which the optical layer PP is located. The base substrate BL may be a glass substrate, a metal substrate, a plastic substrate, etc. However, the embodiment of the present disclosure is not limited thereto, and the base substrate BL may be an inorganic layer, an organic layer, or a composite material layer including an inorganic material and an organic material. In one or more embodiments, the base substrate BL may be omitted.

The display device DD according to an embodiment may further include a filling layer. The filling layer may be between a display element layer DP-ED and the base substrate BL. The filling layer may be an organic material layer. The filling layer may include at least one selected from an acrylic-based resin, a silicone-based resin, and an epoxy-based resin.

The display panel DP may include a base layer BS, a circuit layer DP-CL provided on the base layer BS, and a display element layer DP-ED. The display element layer DP-ED may include a pixel defining film PDL, the light emitting elements ED-1, ED-2, and ED-3 between portions of the pixel defining film PDL, and an encapsulation layer TFE on the light emitting elements ED-1, ED-2, and ED-3.

The base layer BS may be a member which provides a base surface on which the display element layer DP-ED is located. The base layer BS may be a glass substrate, a metal substrate, a plastic substrate, etc. However, the embodiment of the present disclosure is not limited thereto, and the base layer BS may be an inorganic layer, an organic layer, or a composite material layer including an inorganic material and an organic material.

In an embodiment, the circuit layer DP-CL is on the base layer BS, and the circuit layer DP-CL may include a plurality of transistors. Each of the transistors may include a control electrode, an input electrode, and an output electrode. For example, the circuit layer DP-CL may include a switching transistor and a driving transistor in order to drive the light emitting elements ED-1, ED-2, and ED-3 of the display element layer DP-ED.

Each of the light emitting elements ED-1, ED-2, and ED-3 may have a structure of a light emitting element ED of an embodiment according to FIGS. 3 to 6, which will be described later. Each of the light emitting elements ED-1, ED-2 and ED-3 may include a first electrode EL1, a hole transport region HTR, emission layers EML-R, EML-G and EML-B, an electron transport region ETR, and a second electrode EL2.

FIG. 2 illustrates an embodiment in which the emission layers EML-R, EML-G, and EML-B of the light emitting elements ED-1, ED-2, and ED-3 in the openings OH defined in the pixel defining film PDL, and the hole transport region HTR, the electron transport region ETR, and the second electrode EL2 are provided as a common layer in the entire light emitting elements ED-1, ED-2, and ED-3. However, the embodiment of the present disclosure is not limited thereto, and in one or more embodiments, the hole transport region HTR and the electron transport region ETR in an embodiment may be provided by being patterned inside the opening hole OH defined in the pixel defining film PDL. For example, the hole transport region HTR, the emission layers EML-R, EML-G, and EML-B, and the electron transport region ETR in an embodiment may be provided by being patterned in an inkjet printing method.

The encapsulation layer TFE may cover the light emitting elements ED-1, ED-2 and ED-3. The encapsulation layer TFE may seal the display element layer DP-ED. The encapsulation layer TFE may be a thin film encapsulation layer. The encapsulation layer TFE may be formed by laminating one layer or a plurality of layers. The encapsulation layer TFE includes at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film protects the display element layer DP-ED from moisture/oxygen, and the encapsulation-organic film protects the display element layer DP-ED from foreign substances such as dust particles. The encapsulation-inorganic film may include silicon nitride, silicon oxynitride, silicon oxide, titanium oxide, aluminum oxide, and/or the like, but the embodiment of the present disclosure is not particularly limited thereto. The encapsulation-organic film may include an acrylic-based compound, an epoxy-based compound, and/or the like. The encapsulation-organic film may include a photopolymerizable organic material, but the embodiment of the present disclosure is not particularly limited thereto.

The encapsulation layer TFE may be on the second electrode EL2 and may fill the opening hole OH.

Referring to FIGS. 1 and 2, the display device DD may include a non-light emitting region NPXA and light emitting regions PXA-R, PXA-G and PXA-B. The light emitting regions PXA-R, PXA-G and PXA-B each may be a region which emits light generated from the light emitting elements ED-1, ED-2 and ED-3, respectively. The light emitting regions PXA-R, PXA-G, and PXA-B may be spaced apart from each other in a plane.

Each of the light emitting regions PXA-R, PXA-G, and PXA-B may be a region divided by pixel defining film PDL. The non-light emitting regions NPXA may be regions between the adjacent light emitting regions PXA-R, PXA-G, and PXA-B, which correspond to portions of the pixel defining film PDL. In the present description, each of the light emitting regions PXA-R, PXA-G, and PXA-B may correspond to a pixel. The pixel defining film PDL may separate the light emitting elements ED-1, ED-2, and ED-3. The emission layers EML-R, EML-G and EML-B of the light emitting elements ED-1, ED-2 and ED-3 may be in openings OH defined by the pixel defining film PDL and separated from each other.

The light emitting regions PXA-R, PXA-G and PXA-B may be divided into a plurality of groups according to the color of light generated from the plurality of light emitting elements ED-1, ED-2 and ED-3. In the display device DD of an embodiment shown in FIGS. 1 and 2, three light emitting regions PXA-R, PXA-G, and PXA-B which emit red light, green light, and blue light, respectively are illustrated as examples. For example, the display device DD of an embodiment may include the red light emitting region PXA-R, the green light emitting region PXA-G, and the blue light emitting region PXA-B which are different.

In the display device DD according to an embodiment, the plurality of light emitting elements ED-1, ED-2 and ED-3 may emit light in different wavelength regions. For example, in an embodiment, the display device DD may include the first light emitting element ED-1 that emits red light, the second light emitting element ED-2 that emits green light, and the third light emitting element ED-3 that emits blue light. In one or more embodiments, the red light emitting region PXA-R, the green light emitting region PXA-G, and the blue light emitting region PXA-B of the display device DD may correspond to the first light emitting element ED-1, the second light emitting element ED-2, and the third light emitting element ED-3, respectively.

However, the embodiment of the present disclosure is not limited thereto, and the first to the third light emitting elements ED-1, ED-2, and ED-3 may emit light in the same wavelength range or at least one light emitting element may emit light in a wavelength range different from the others. For example, the first to third light emitting elements ED-1, ED-2, and ED-3 may all emit blue light.

The light emitting regions PXA-R, PXA-G, and PXA-B in the display device DD according to an embodiment may be arranged in a stripe form. Referring to FIG. 1, the plurality of red light emitting regions PXA-R, the plurality of green light emitting regions PXA-G, and the plurality of blue light emitting regions PXA-B each may be arranged along a second directional axis DR2. In addition, the red light emitting region PXA-R, the green light emitting region PXA-G, and the blue light emitting region PXA-B may be alternately arranged in this order along a first directional axis DR1.

FIGS. 1 and 2 illustrate that all the light emitting regions PXA-R, PXA-G, and PXA-B have similar area, but the embodiment of the present disclosure is not limited thereto, and the light emitting regions PXA-R, PXA-G, and PXA-B may have different areas from each other according to a wavelength range of the emitted light. In this case, the areas of the light emitting regions PXA-R, PXA-G, and PXA-B may mean areas when viewed in a plane defined by the first directional axis DR1 and the second directional axis DR2.

In one or more embodiments, the arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously combined and provided according to characteristics of a display quality required in the display device DD. For example, the arrangement form of the light emitting regions PXA-R, PXA-G, and PXA-B may be a PENTILE® arrangement structure (e.g., an RGBG matrix, RGBG structure, or RGBG matrix structure) or a diamond arrangement form. PENTILE® is a duly registered trademark of Samsung Display Co., Ltd.

In addition, the areas of the light emitting regions PXA-R, PXA-G, and PXA-B may be different from each other. For example, in an embodiment, the area of the green light emitting region PXA-G may be smaller than that of the blue light emitting region PXA-B, but the embodiment of the present disclosure is not limited thereto.

Hereinafter, FIGS. 3 to 6 are cross-sectional views schematically illustrating light emitting elements according to an embodiment. The light emitting elements ED according to embodiments each may include a first electrode EL1, a second electrode EL2 facing the first electrode EL1, and at least one functional layer between the first electrode EL1 and the second electrode EL2. The at least one functional layer may include a hole transport region HTR, an emission layer EML, and an electron transport region ETR that are sequentially stacked. For example, each of the light emitting elements ED of embodiments may include the first electrode EL1, the hole transport region HTR, the emission layer EML, the electron transport region ETR, and the second electrode EL2 that are sequentially stacked.

Figure 3:
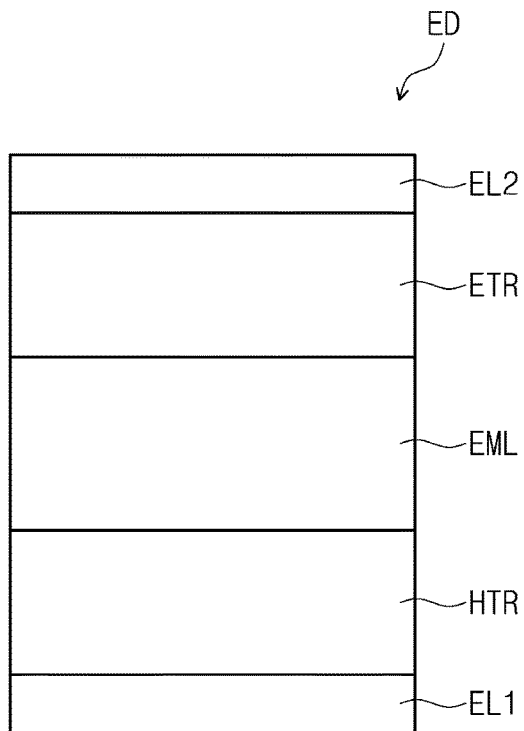
FIG. 3 is a cross-sectional view schematically illustrating a light emitting element according to an embodiment of the present disclosure.
Figure 4:
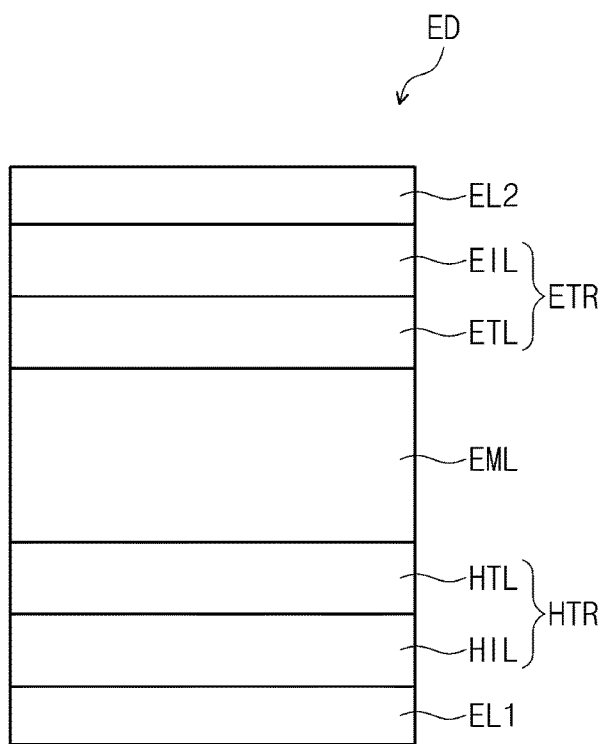
FIG. 4 is a cross-sectional view schematically illustrating a light emitting element according to an embodiment of the present disclosure.
Figure 5:
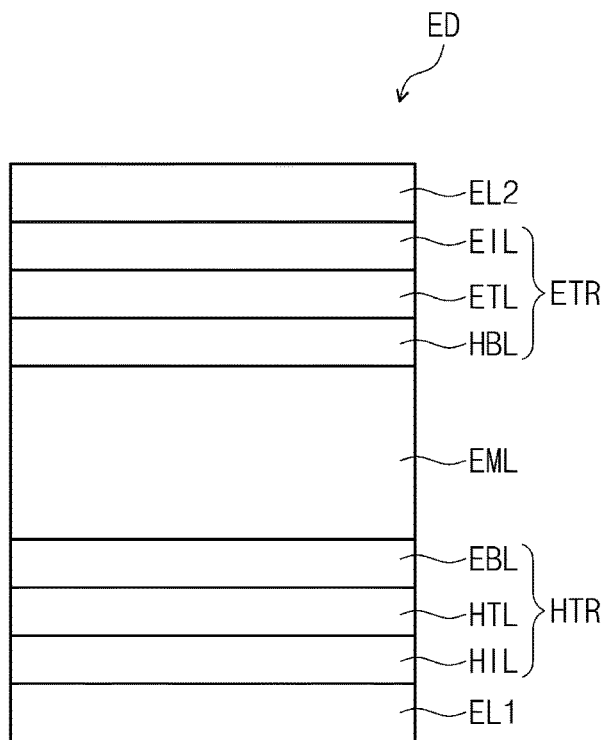
FIG. 5 is a cross-sectional view schematically illustrating a light emitting element according to an embodiment of the present disclosure.
Figure 6:
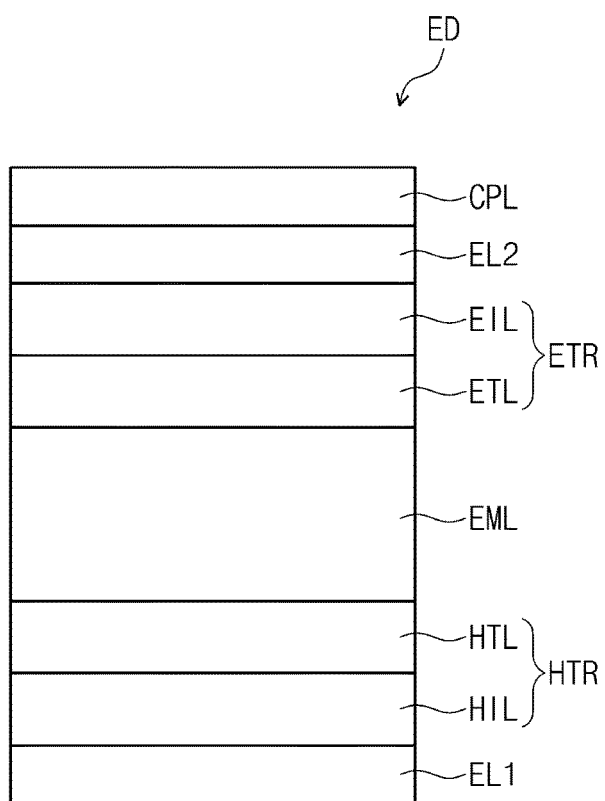
FIG. 6 is a cross-sectional view schematically illustrating a light emitting element according to an embodiment of the present disclosure.

Compared to FIG. 3, FIG. 4 illustrates a cross-sectional view of a light emitting element ED of an embodiment, in which a hole transport region HTR includes a hole injection layer HIL and a hole transport layer HTL, and an electron transport region ETR includes an electron injection layer EIL and an electron transport layer ETL. In addition, compared to FIG. 3, FIG. 5 illustrates a cross-sectional view of a light emitting element ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 4, FIG. 6 illustrates a cross-sectional view of a light emitting element ED of an embodiment including a capping layer CPL on a second electrode EL2.

The light emitting element ED of an embodiment may include the amine compound of an embodiment, which will be described further below, in at least one functional layer of the hole transport region HTR, the emission layer EML, the electron transport region ETR, and/or the like.

In the light emitting element ED according to an embodiment, the first electrode EL1 has conductivity (e.g., electrical conductivity). The first electrode EL1 may be formed of a metal material, a metal alloy, or a conductive compound (e.g., an electrically conductive compound). The first electrode EL1 may be an anode or a cathode. However, the embodiment of the present disclosure is not limited thereto. In addition, the first electrode EL1 may be a pixel electrode. The first electrode EL1 may be a transmissive electrode, a transflective electrode, or a reflective electrode. If the first electrode EL1 is a transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In one or more embodiments, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but the embodiment of the present disclosure is not limited thereto. In addition, the embodiment of the present disclosure is not limited thereto, and the first electrode EL1 may include the above-described metal materials, combinations of at least two metal materials of the above-described metal materials, oxides of the above-described metal materials, and/or the like. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one selected from of a hole injection layer HIL, a hole transport layer HTL, a buffer layer or an emission-auxiliary layer, and an electron blocking layer EBL. The thickness of the hole transport region HTR may be, for example, from about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, and may have a single layer structure formed of a hole injection material and a hole transport material. In addition, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1, but the embodiment of the present disclosure is not limited thereto.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR in the light emitting element ED of an embodiment may include an amine compound represented by Formula 1 below. In addition, the hole transport layer HTL in the light emitting element ED of an embodiment may include an amine compound represented by Formula 1 below:

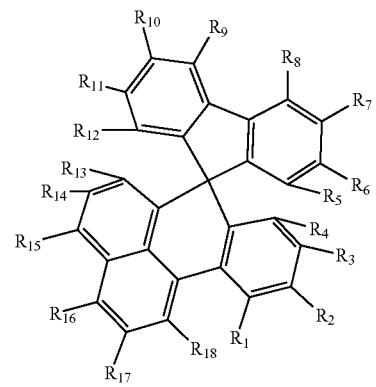

[Formula 1]

In Formula 1, any one selected from $R_3$, $R_6$, $R_8$, and $R_{15}$ is represented by Formula 2 below:

[Formula 2]

In one or more embodiments, the amine compound of an embodiment may have a form in which one amine derivative represented by Formula 2 is bonded in a condensed cycle having a spiro structure represented by Formula 1. For example, the amine compound of an embodiment may be a monoamine compound including one amine derivative.

In Formula 1, at least one selected from among $R_1$ to $R_{18}$ may be a deuterium atom, and the rest may be each independently a hydrogen atom, a halogen atom, a substituted or unsubstituted silyl group, or a substituted or unsubstituted alkyl group having 1 to 20 carbon atoms.

In one or more embodiments, the rest substituents except for at least one substituent selected from among $R_3$, $R_6$, $R_8$, and $R_{15}$ of Formula 1 to which the amine derivative represented by Formula 2 is bonded may be each independently a deuterium atom, a hydrogen atom, a halogen atom, a substituted or unsubstituted silyl group, or a substituted or unsubstituted alkyl group having 1 to 20 carbon atoms.

In one or more embodiments, the amine compound of an embodiment has a structure in which the condensed cycle having a spiro structure and the amine derivative are bonded, and may be substituted with at least one deuterium atom.

In one or more embodiments, in Formula 2 above, n may be an integer of 0 to 3, and L may be a substituted or unsubstituted arylene group having 6 to 30 ring-forming carbon atoms, or a substituted or unsubstituted heteroarylene group having 2 to 30 ring-forming carbon atoms.

In addition, in Formula 2, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms.

In the amine compound of an embodiment, n may be 0. When n is 0, a nitrogen atom (N) of the amine derivative represented by Formula 2 may be directly linked to the condensed cycle of Formula 1. In one or more embodiments, the N of the amine derivative may be linked via a single bond to a carbon atom of the condensed cycle.

In Formula 2, when n is an integer of 1 or greater, L are each independently a substituted or unsubstituted divalent phenyl group, a substituted or unsubstituted divalent biphenyl group, a substituted or unsubstituted divalent naphthyl group, a substituted or unsubstituted divalent fluorene group, a substituted or unsubstituted divalent phenanthrene group, a substituted or unsubstituted divalent carbazole group, a substituted or unsubstituted divalent indole group, or a substituted or unsubstituted divalent pyridine group. However, the embodiment of the present disclosure is not limited thereto.

In Formula 2, when n is an integer of 2 or greater, a plurality of L's may all be the same or at least one may be different from the rest.

In addition, in Formula 2, $Ar_1$ and $Ar_2$ may be each independently a substituted or unsubstituted phenyl group, a substituted or unsubstituted naphthyl group, a substituted or unsubstituted fluorenyl group, a substituted or unsubstituted biphenyl group, a substituted or unsubstituted phenanthrenyl group, a substituted or unsubstituted carbazole group, a substituted or unsubstituted indolyl group, a substituted or unsubstituted pyridyl group, a substituted or unsubstituted dibenzofuranyl group, or a substituted or unsubstituted dibenzothiophenyl group. However, the embodiments are not limited thereto.

In an embodiment, $Ar_1$ and $Ar_2$ may be different from each other. Any one selected from $Ar_1$ and $Ar_2$ may be a heteroaryl group including N as a ring-forming atom, and the rest may be a substituted or unsubstituted aryl group having 6 to 30 ring-forming carbon atoms, or a substituted or unsubstituted heteroaryl group having 2 to 30 ring-forming carbon atoms and excluding N as a ring-forming atom. However, the embodiment of the present disclosure is not limited thereto.

In an embodiment, any one selected from $Ar_1$ and $Ar_2$ may be a substituted or unsubstituted carbazole group. For example, any one selected from $Ar_1$ and $Ar_2$ may be each independently a substituted or unsubstituted phenyl group, a substituted or unsubstituted naphthyl group, a substituted or unsubstituted fluorenyl group, a substituted or unsubstituted biphenyl group, a substituted or unsubstituted phenanthrenyl group, a substituted or unsubstituted indolyl group, a substituted or unsubstituted pyridyl group, a substituted or unsubstituted dibenzofuranyl group, or a substituted or unsubstituted dibenzothiophenyl group.

In an embodiment, Formula 2 may be represented by Formula 2-1 below:

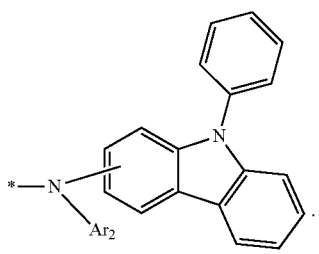

[Formula 2-1]

In Formula 2-1, $Ar_2$ may be a substituted or unsubstituted aryl group having 6 to 30 ring-forming carbon atoms, or a substituted or unsubstituted heteroaryl group having 2 to 30 ring-forming carbon atoms. For example, in Formula 2-1, the case where $Ar_2$ is a carbazole group is excluded. In one or more embodiments, in Formula 2-1, $Ar_2$ may be a substituted or unsubstituted phenyl group, a substituted or unsubstituted naphthyl group, a substituted or unsubstituted fluorenyl group, a substituted or unsubstituted biphenyl group, a substituted or unsubstituted phenanthrenyl group, a substituted or unsubstituted indolyl group, a substituted or unsubstituted pyridyl group, a substituted or unsubstituted dibenzofuranyl group, or a substituted or unsubstituted dibenzothiophenyl group, but the embodiment of the present disclosure is not limited thereto.

In embodiment, the amine compound represented by Formula 1 may be represented by any one selected from among Formula 1-1 to Formula 1-3 below:

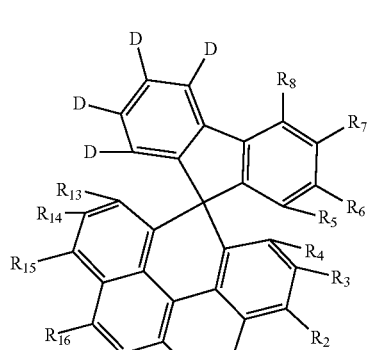

[Formula 1-1]

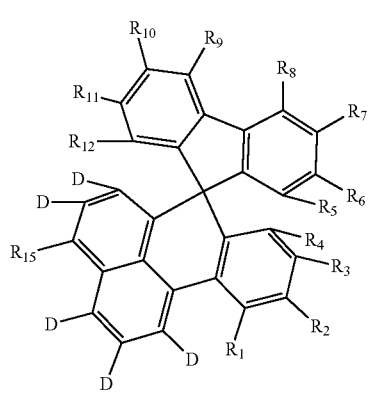

[Formula 1-2]

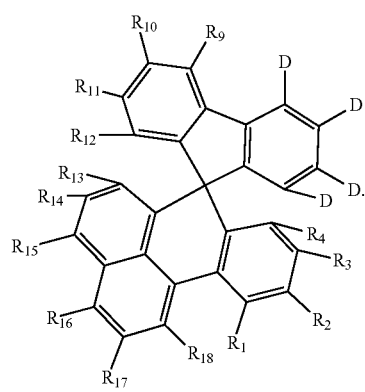

[Formula 1-3]

In Formula 1-1, $R_1$ to $R_8$ and $R_{13}$ to $R_{18}$ may be each independently a hydrogen atom, a halogen atom, a substituted or unsubstituted silyl group, or a substituted or unsubstituted alkyl group having 1 to 20 carbon atoms, and any one selected from $R_3$, $R_6$, $R_8$, and $R_{15}$ may be represented by Formula 2 as described above. For example, in Formula 1-1, any one selected from $R_3$, $R_6$, $R_8$, and $R_{15}$ may be substituted with the amine derivative represented by Formula 2 as described above, and the rest, which are not substituted with the amine derivative, of $R_3$, $R_6$, $R_8$, and $R_{15}$ may be hydrogen atoms. In addition, in an embodiment represented by Formula 1-1, all of $R_1$ to $R_8$ and $R_{13}$ to $R_{18}$ except for those, which are substituted with the amine derivative, of $R_3$, $R_6$, $R_8$, and $R_{15}$ may be hydrogen atoms.

In Formula 1-2, $R_1$ to $R_{12}$ may be each independently a hydrogen atom, a halogen atom, a substituted or unsubstituted silyl group, or a substituted or unsubstituted alkyl group having 1 to 20 carbon atoms. In addition, $R_{15}$ may be a deuterium atom, or may be represented by Formula 2 above, and when $R_{15}$ is a deuterium atom, any one selected from $R_3$, $R_6$, and $R_8$ may be represented by Formula 2 as described above. For example, in the amine compound represented by Formula 1-2 of an embodiment, any one selected from $R_3$, $R_6$, and $R_8$ may be substituted with the amine derivative of Formula 2 as described above, and the rest, which are not substituted with the amine derivative of Formula 2, of $R_3$, $R_6$, and $R_8$ may be hydrogen atoms. Also, when any one selected from $R_3$, $R_6$, and $R_8$ is substituted with the amine derivative of Formula 2, $R_{15}$ may be a deuterium atom. In addition, all of $R_1$ to $R_{12}$ except for those, which are substituted with the amine derivative of Formula 2, of $R_3$, $R_6$, and $R_8$ may be hydrogen atoms.

In one or more embodiments, in an embodiment represented by Formula 1-2, $R_{15}$ may be substituted with the amine derivative represented by Formula 2. In this case, all of $R_1$ to $R_{12}$ may be hydrogen atoms. However, the embodiment of the present disclosure is not limited thereto.

In Formula 1-3, $R_1$ to $R_4$ and $R_9$ to $R_{18}$ may be each independently a hydrogen atom, a halogen atom, a substituted or unsubstituted silyl group, or a substituted or unsubstituted alkyl group having 1 to 20 carbon atoms, and $R_3$ or $R_{15}$ may be represented by Formula 2 as described above. In an embodiment represented by Formula 1-3, when $R_3$ is represented by Formula 2, $R_{15}$ may be a hydrogen atom, and when $R_{15}$ is represented by Formula 2, $R_3$ may be a hydrogen atom. For example, when $R_3$ is represented by Formula 2, all of $R_1$, $R_2$, $R_4$, and $R_9$ to $R_{18}$ may be hydrogen atoms. In addition, when $R_{15}$ is represented by Formula 2, all of $R_1$ to $R_4$, $R_9$ to $R_{14}$, and $R_{16}$ to $R_{18}$ may be hydrogen atoms. However, the embodiment of the present disclosure is not limited thereto.

The amine compound represented by Formula 1 of an embodiment may be represented by any one selected from among Formula 1A to Formula 1 D below. Hereinafter, in the amine compound represented by Formula 1A to Formula 1 D of an embodiment, the same as described in Formula 2 as described above may be applied with respect to L, n, $Ar_1$, and $Ar_2$.

[Formula 1A]

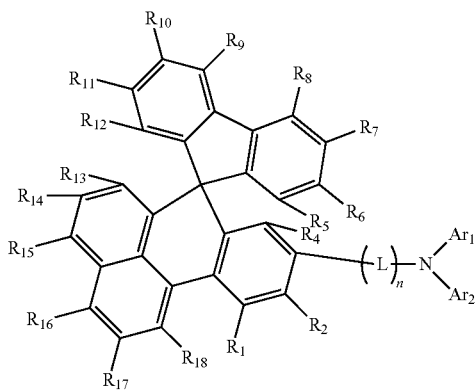

[Formula 1B]

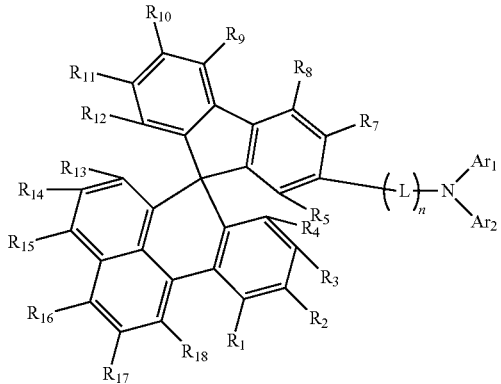

[Formula 1C]

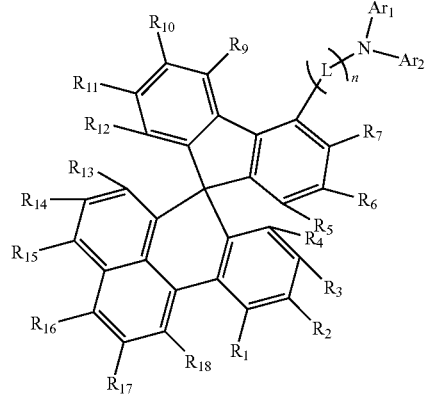

[Formula 1D]

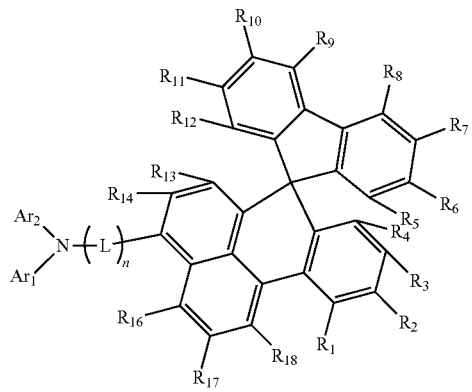

In an embodiment represented by Formula 1A, at least one selected from among $R_5$ to $R_{18}$ may be a deuterium atom, and the rest may be hydrogen atoms. For example, $R_9$ to $R_{12}$ of $R_5$ to $R_{18}$ may be deuterium atoms, and the rest may be hydrogen atoms. In addition, $R_{13}$ to $R_{18}$ of $R_5$ to $R_{18}$ may be deuterium atoms, and the rest may be hydrogen atoms. In one or more embodiments, in an embodiment represented by Formula 1A, $R_1$, $R_2$, and $R_4$ may be hydrogen atoms. However, the embodiment of the present disclosure is not limited thereto.

In an embodiment represented by Formula 1B or Formula 1C above, at least one selected from among $R_1$ to $R_4$ and $R_9$ to $R_{18}$ may be a deuterium atom, and the rest may be hydrogen atoms. For example, $R_9$ to $R_{12}$ may be deuterium atoms, and $R_1$ to $R_4$ and $R_{13}$ to $R_{18}$ may be hydrogen atoms. In addition, in an embodiment, $R_{13}$ to $R_{18}$ may be deuterium atoms, and $R_1$ to $R_4$ and $R_9$ to $R_{12}$ may be hydrogen atoms. In one or more embodiments, in an embodiment represented by Formula 1B, $R_5$, $R_7$, and $R_8$ may be hydrogen atoms, and in an embodiment represented by Formula 1C, $R_5$, $R_6$, and $R_7$ may be hydrogen atoms. However, the embodiment of the present disclosure is not limited thereto.

In an embodiment represented by Formula 1D, at least one selected from among $R_1$ to $R_{14}$ and $R_{16}$ to $R_{18}$ may be a deuterium atom, and the rest may be hydrogen atoms. For example, $R_1$ to $R_4$ may be deuterium atoms and the rest may be hydrogen atoms. Also, in an embodiment, $R_{13}$, $R_{14}$, and $R_{16}$ to $R_{18}$ may be deuterium atoms, and the rest may be hydrogen atoms. However, the embodiment of the present disclosure is not limited thereto.

The amine compound represented by Formula 1 of an embodiment may be represented by one selected from among the compounds of Compound Group 1 below. The hole transport region HTR of the light emitting element ED of an embodiment may include at least one selected from among the amine compounds disclosed in Compound Group 1 below:

1

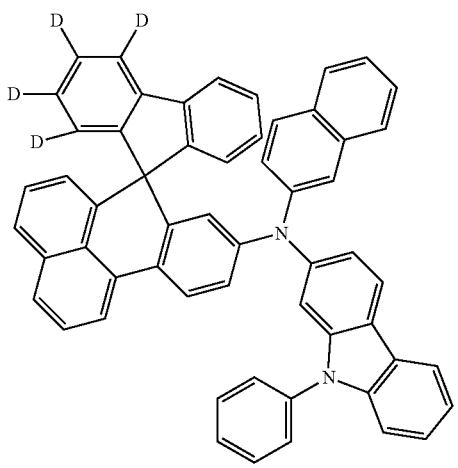

3

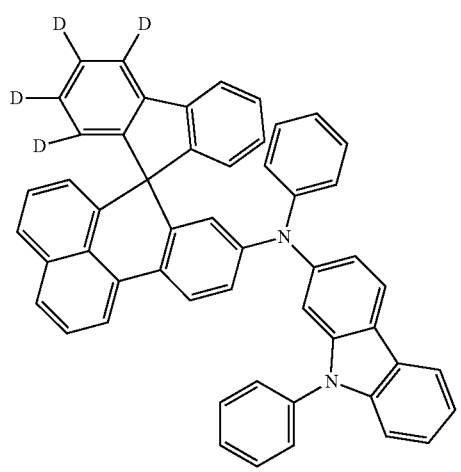

2

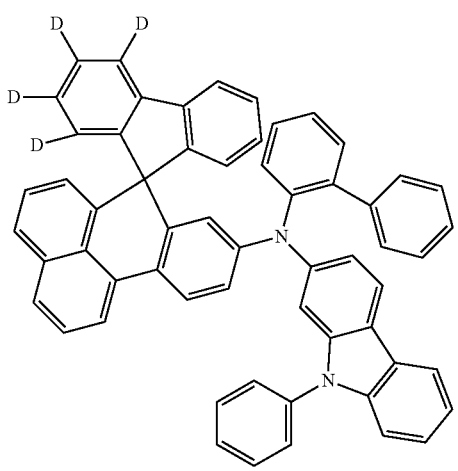

4

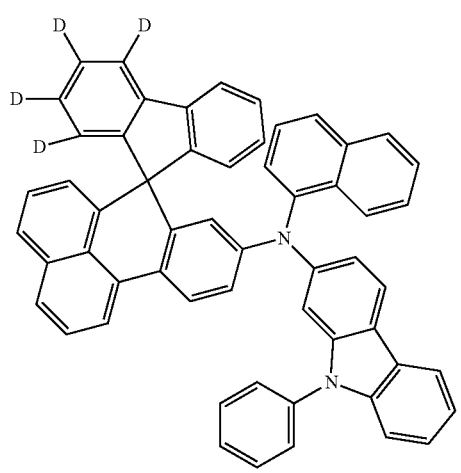

5

6
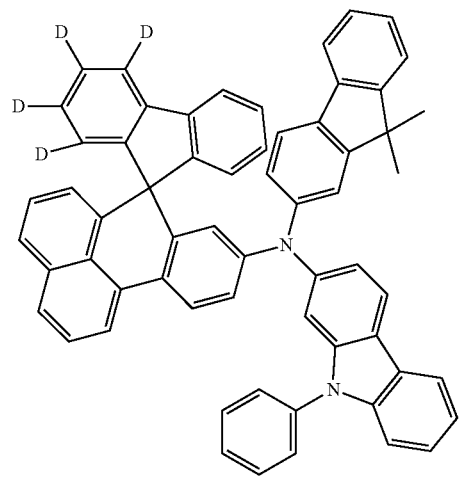
7
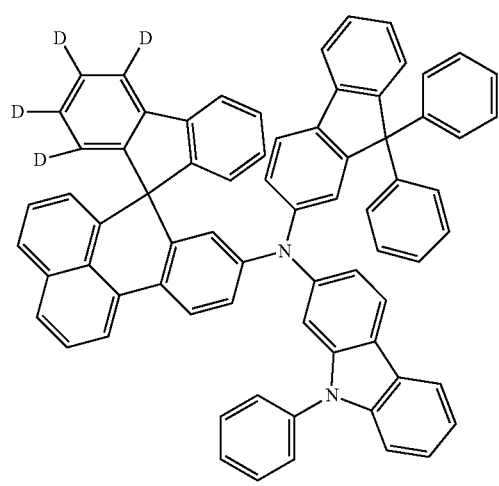
8
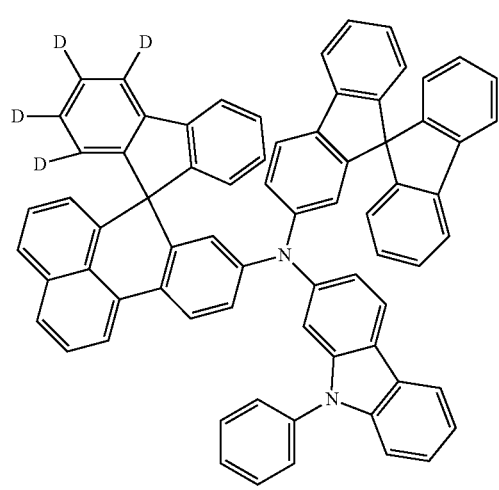
9
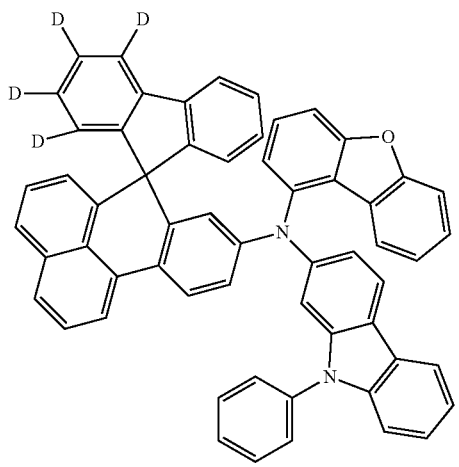
10
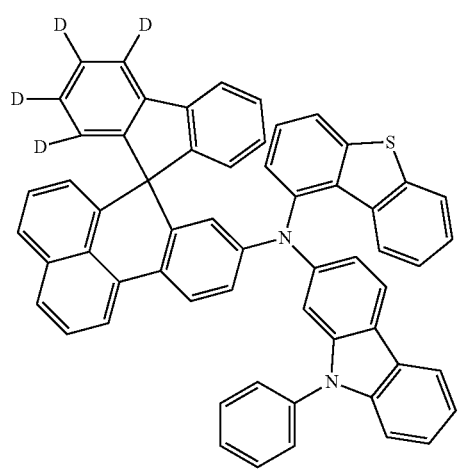
11

12
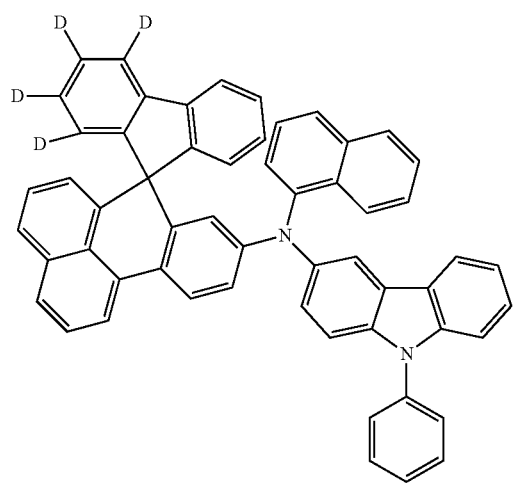
13
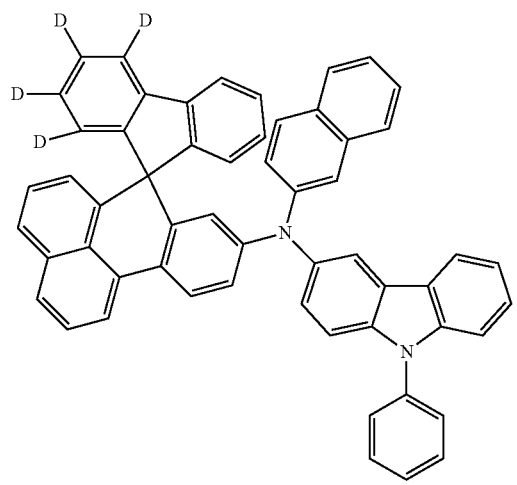
14
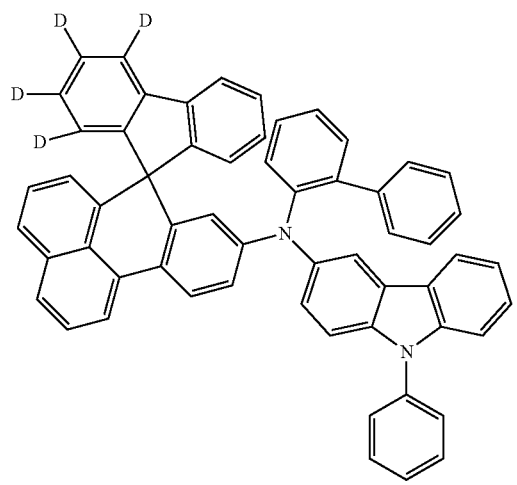
15
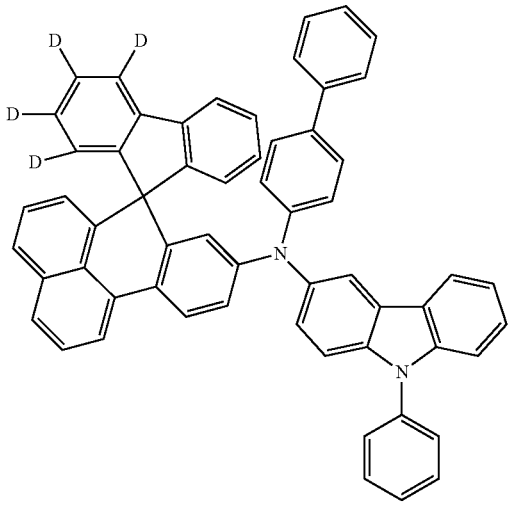
16
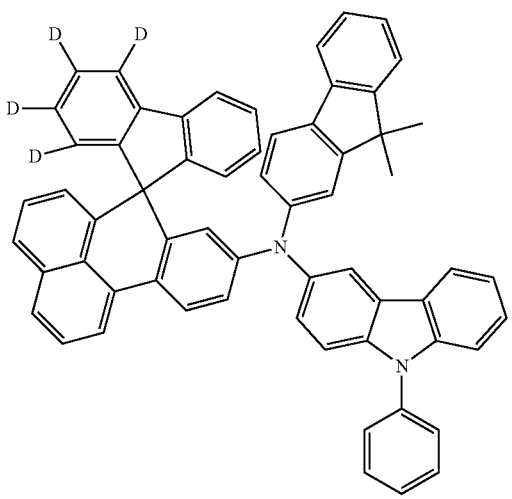
17
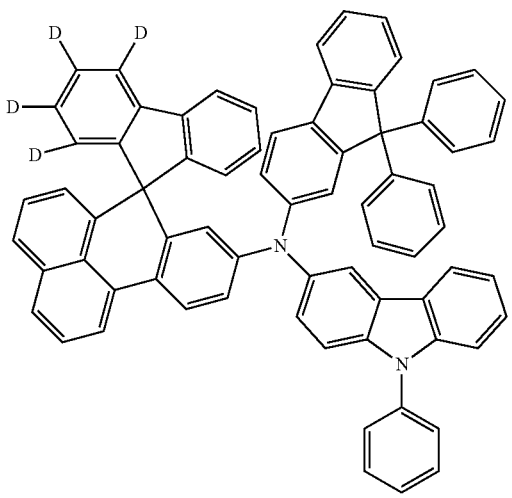

18
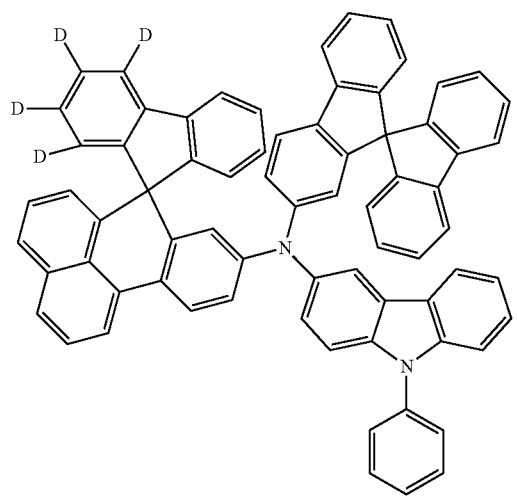
19
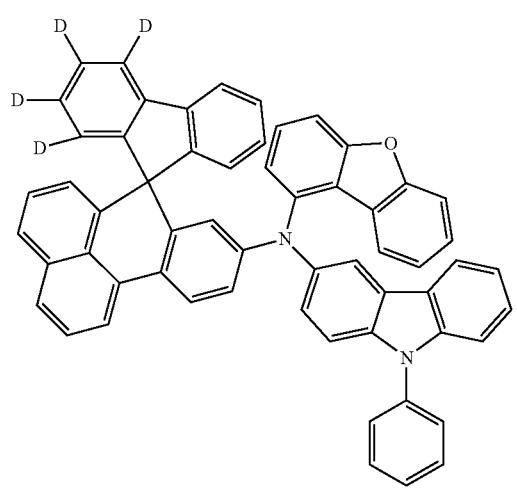
20
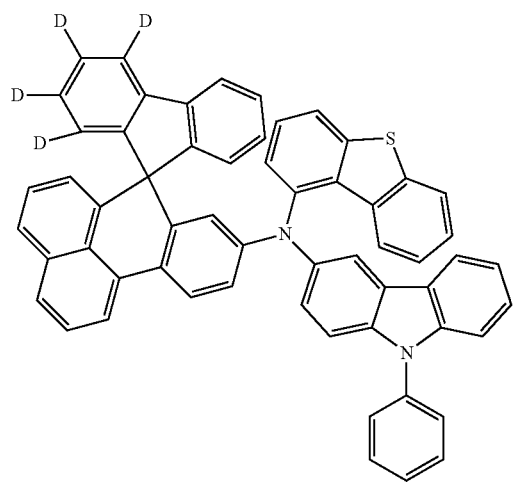
21
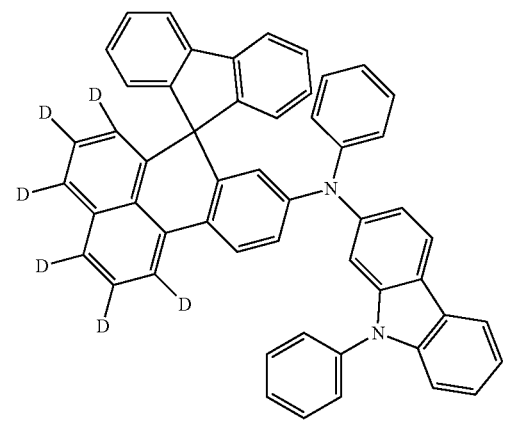
22
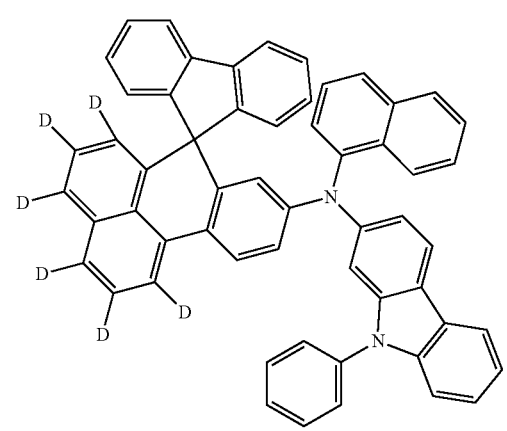
23
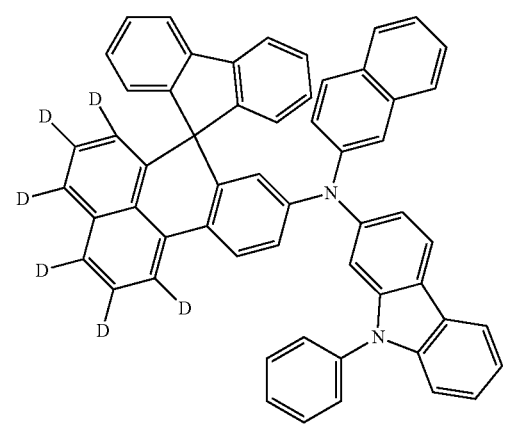

24
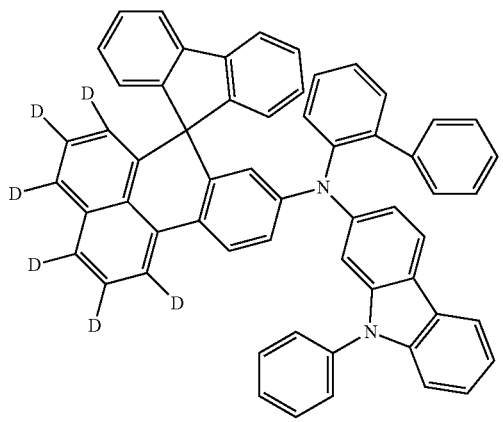
25
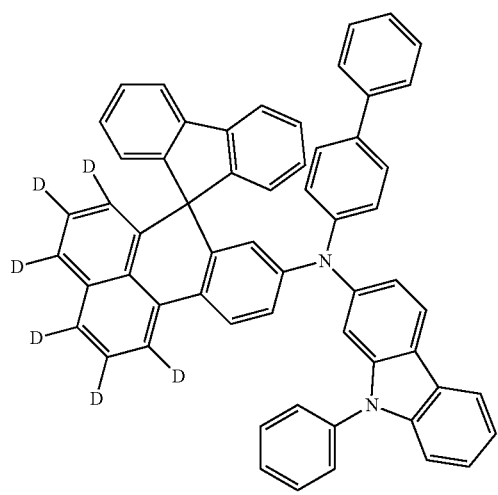
26
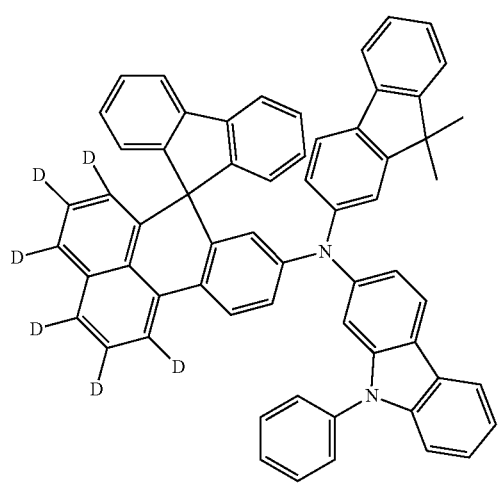
27
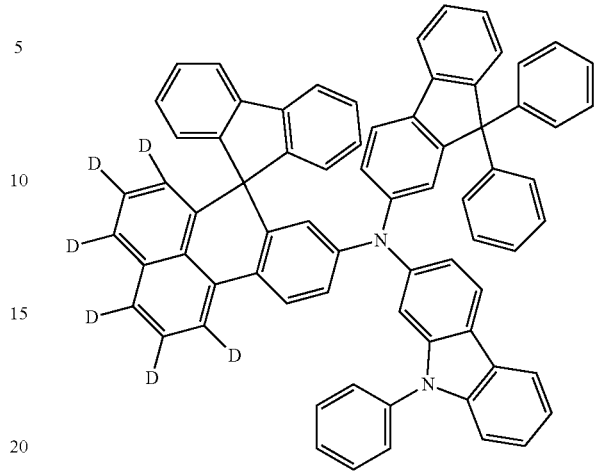
28
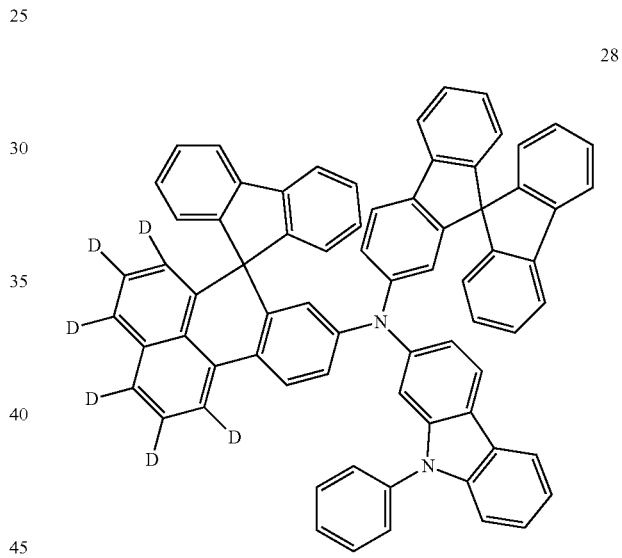
29
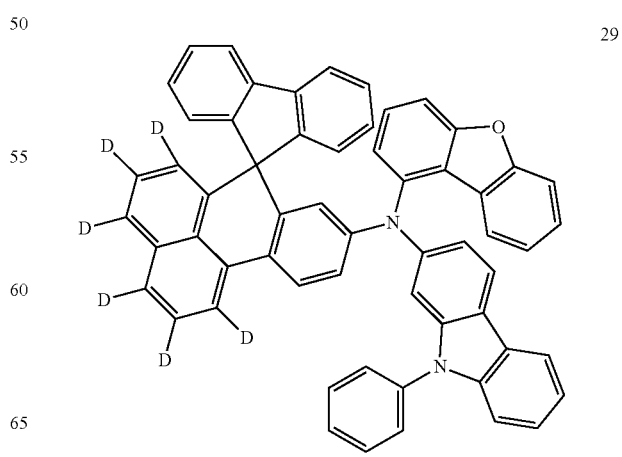

30
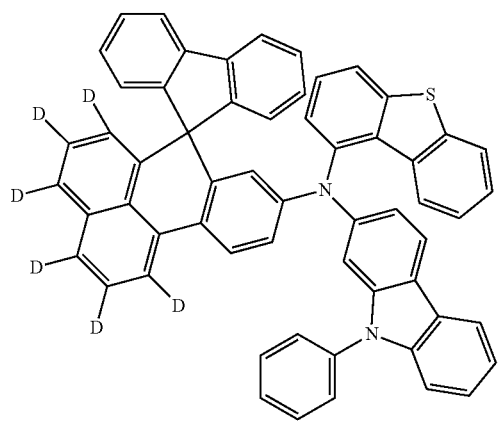
31
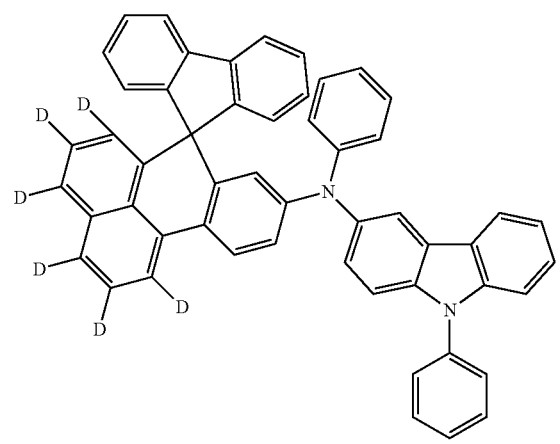
32
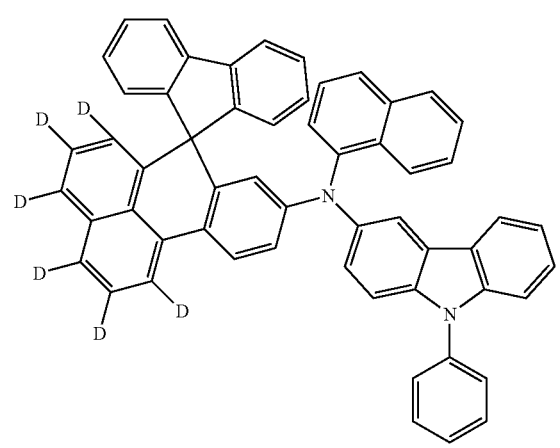
33
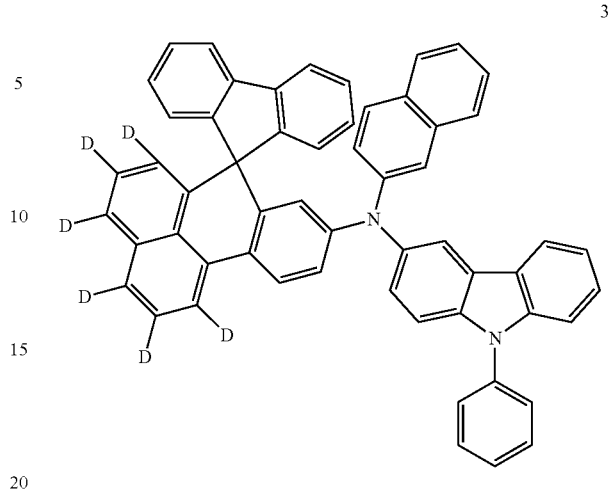
34
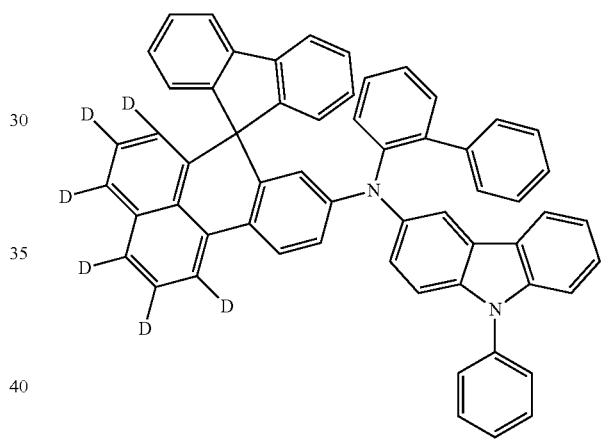
35
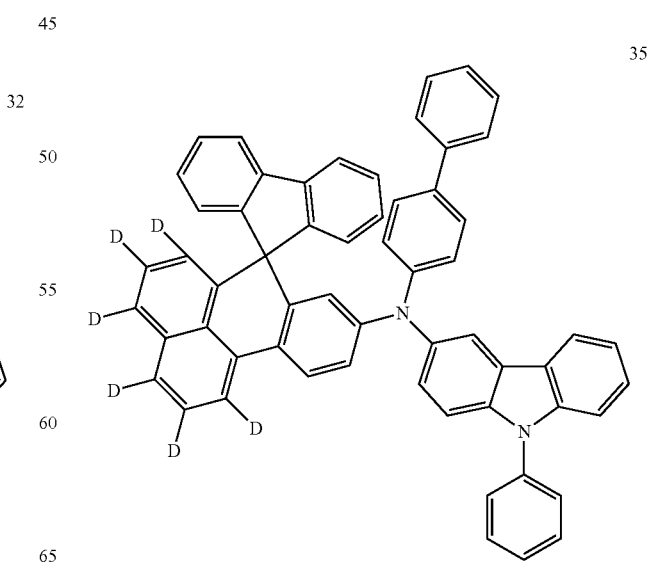

36
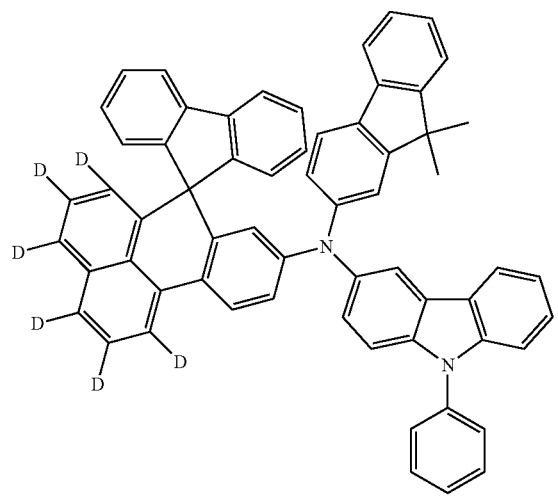
37
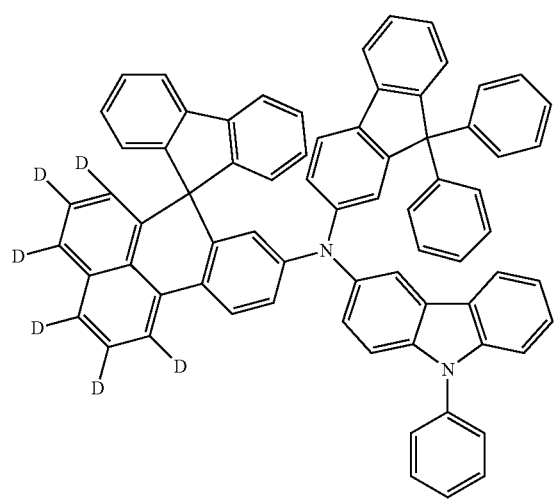
38
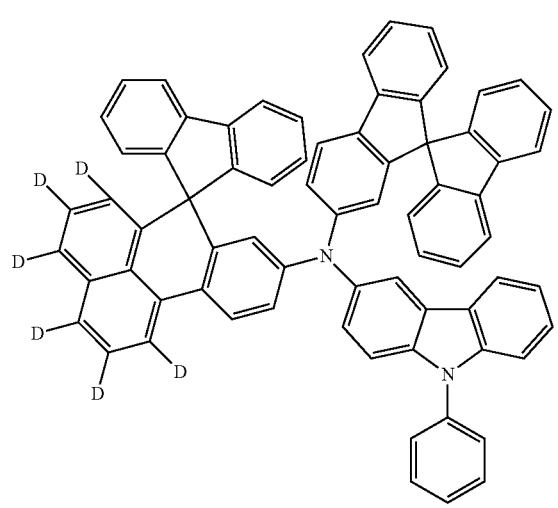
39
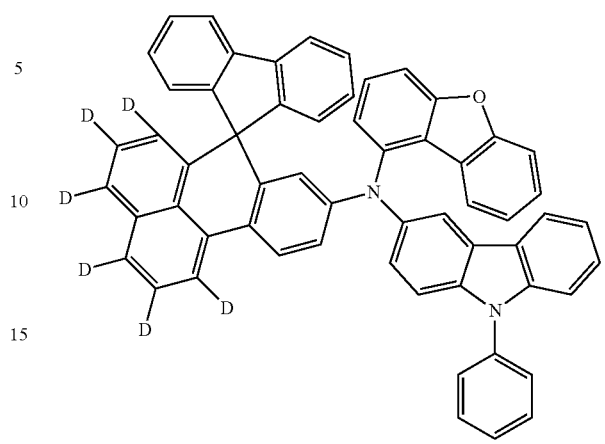
40
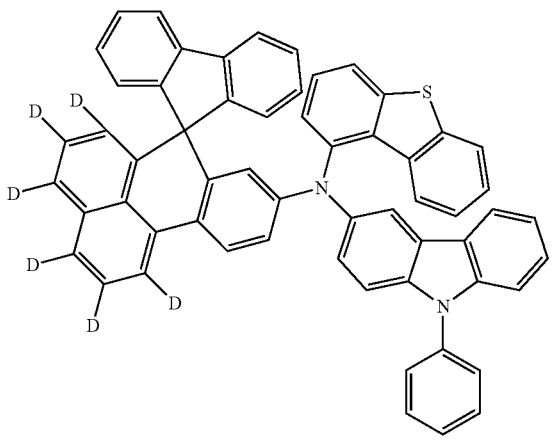
41
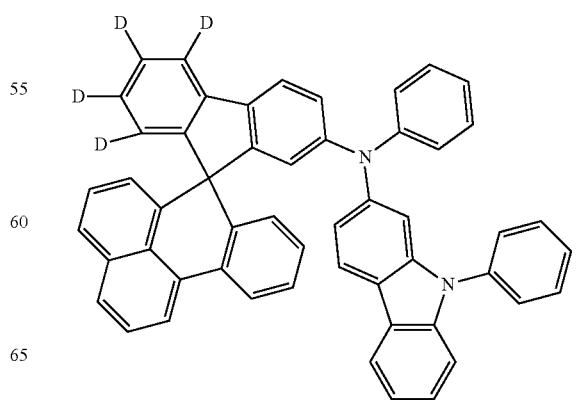

42
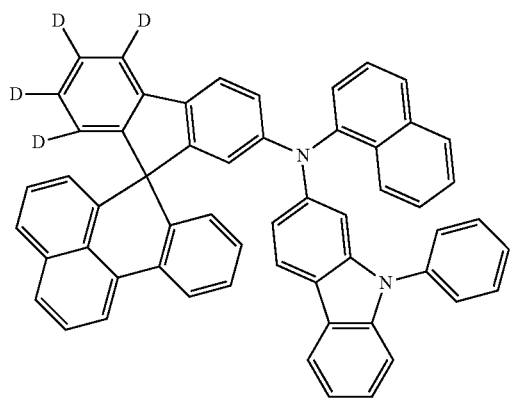
43
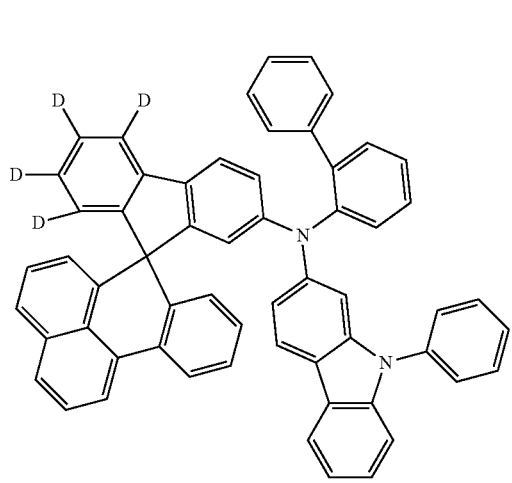
44
45
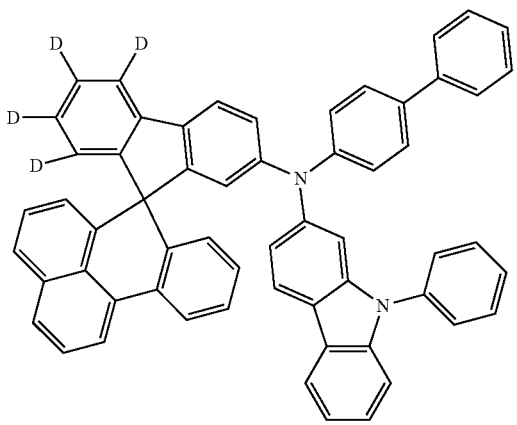
46
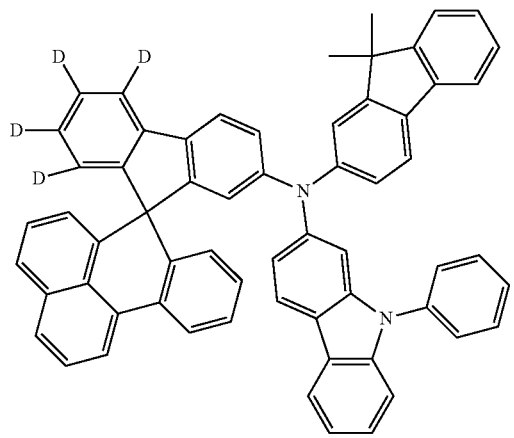
47
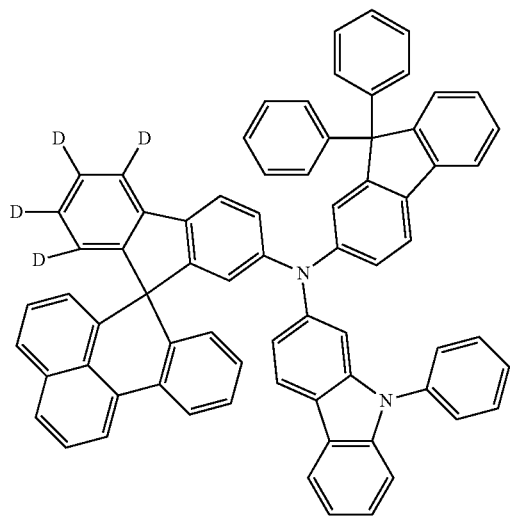

48
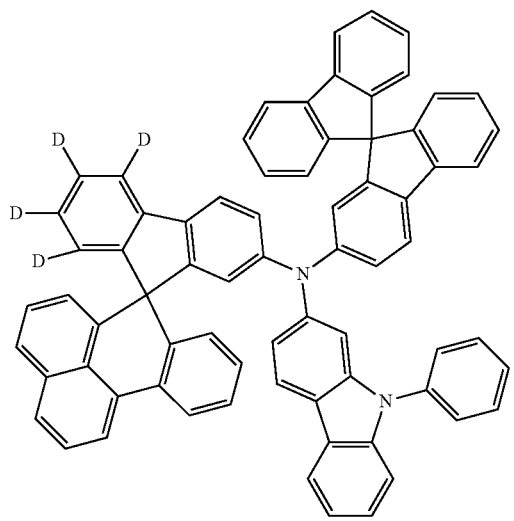
49
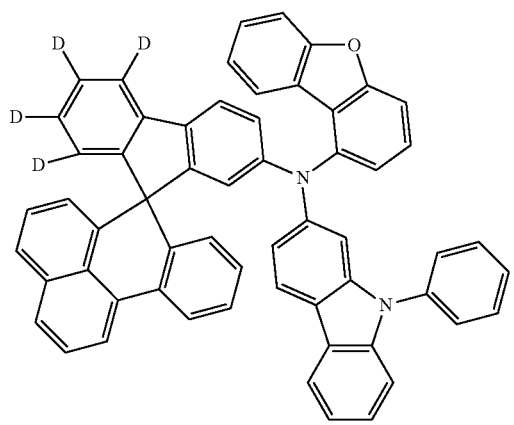
50
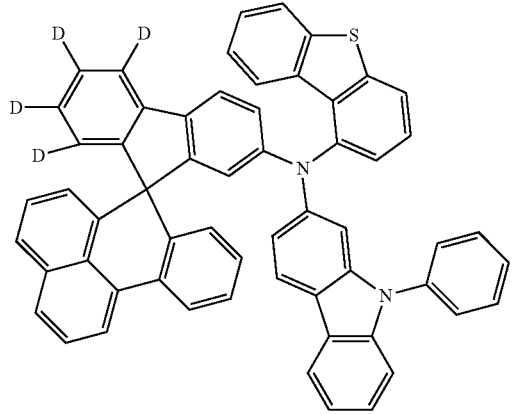
51
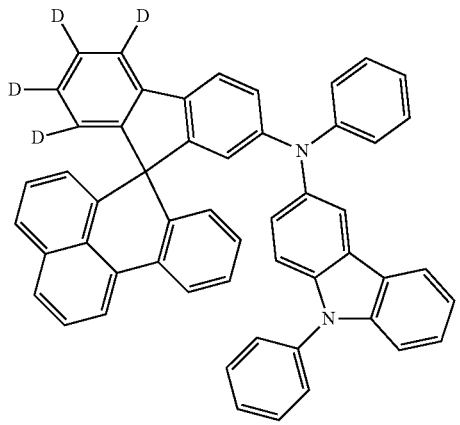
52
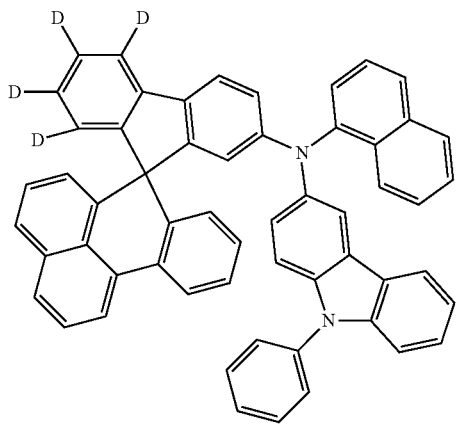
53
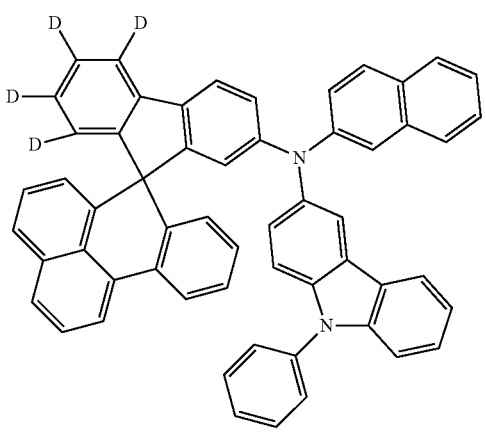

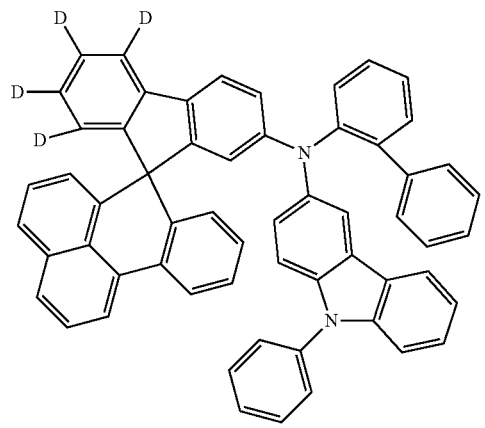
54
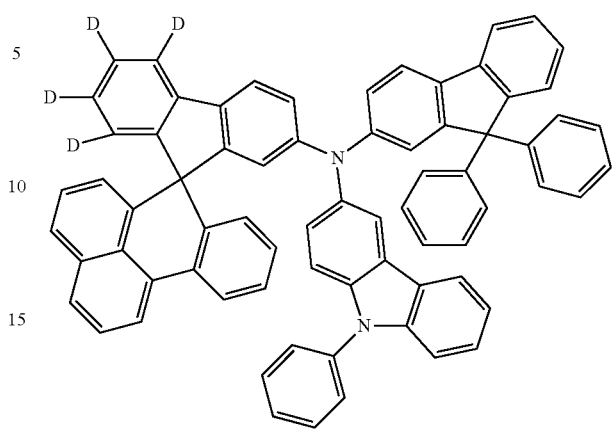
57
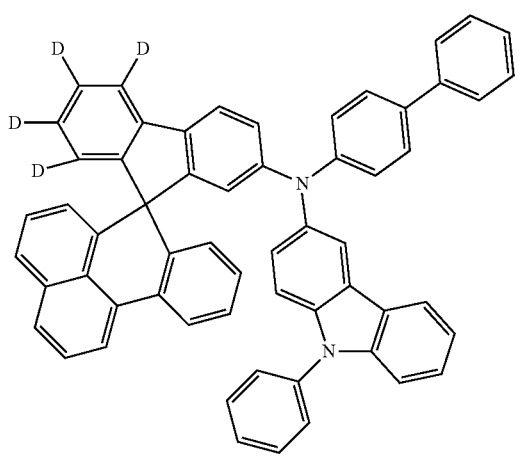
55
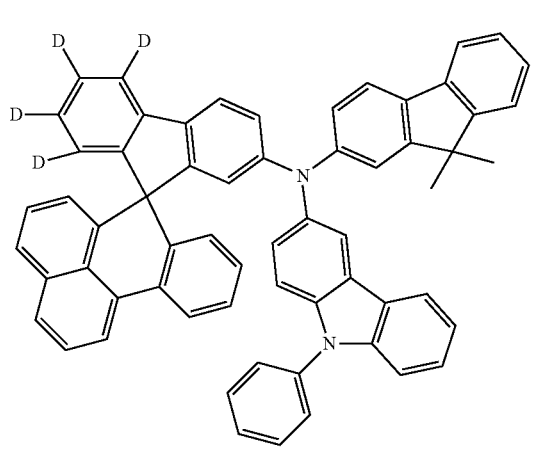
56
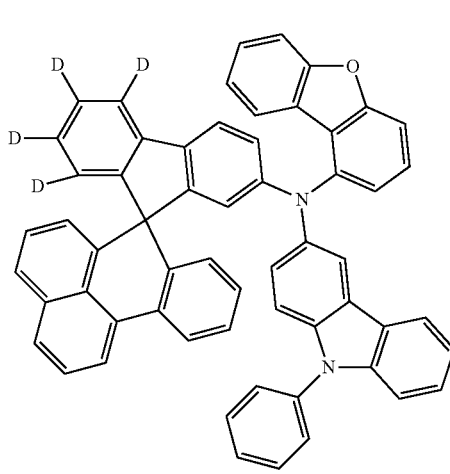
58
59

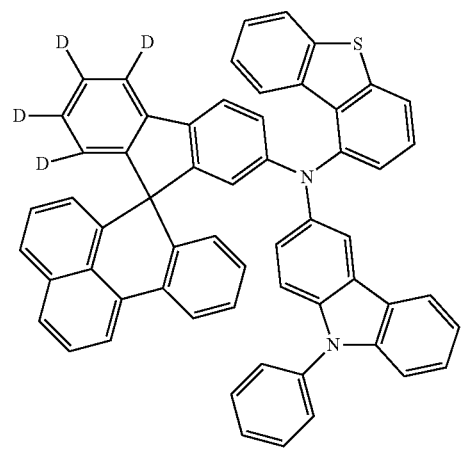
60
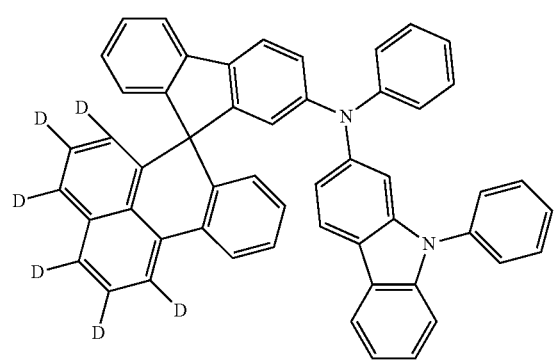
61
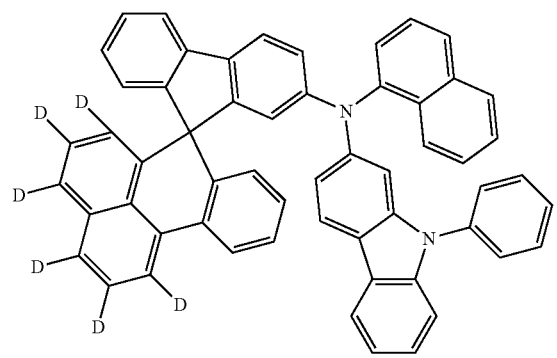
62
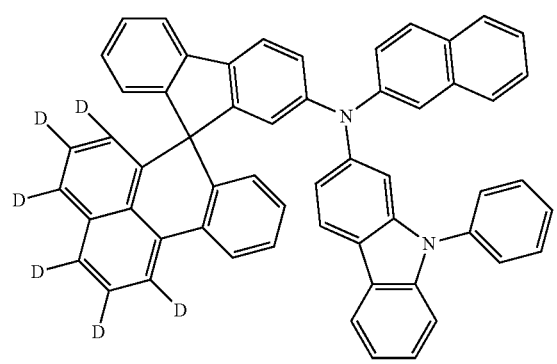
63
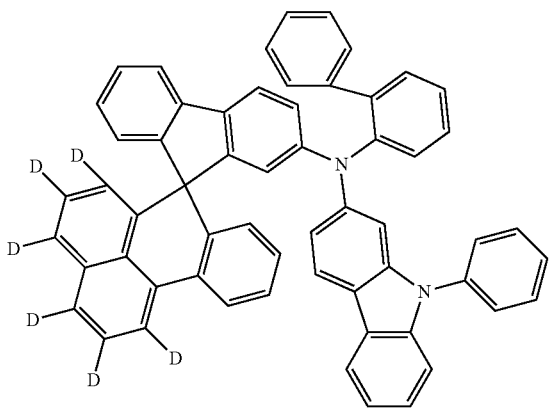
64
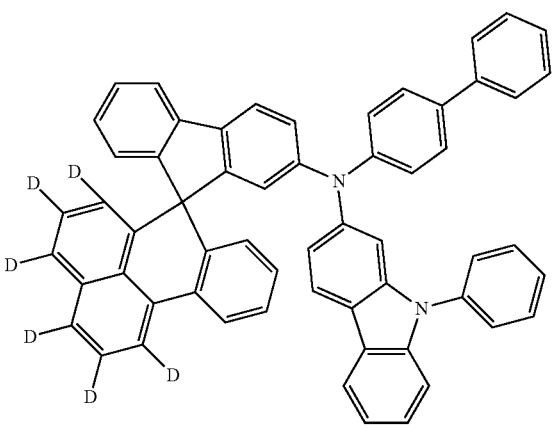
65
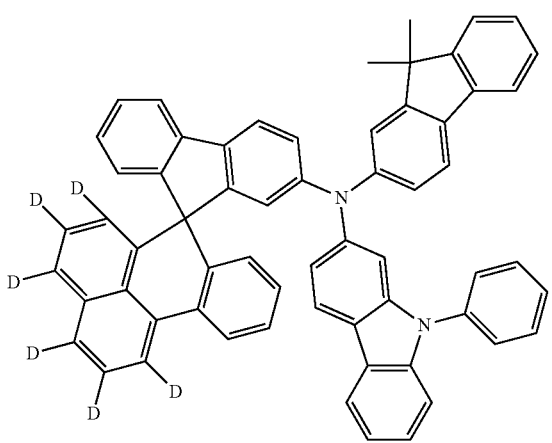
66

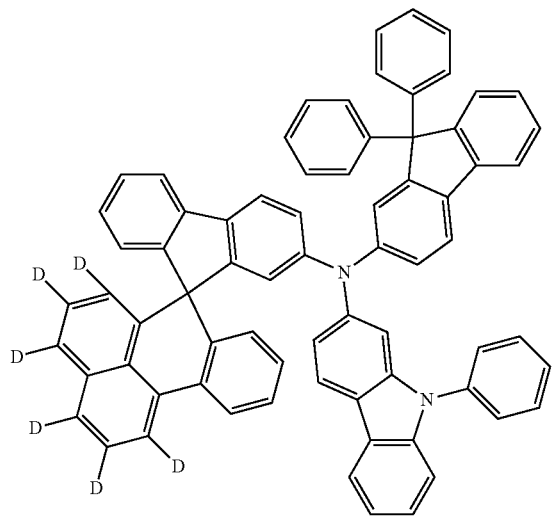
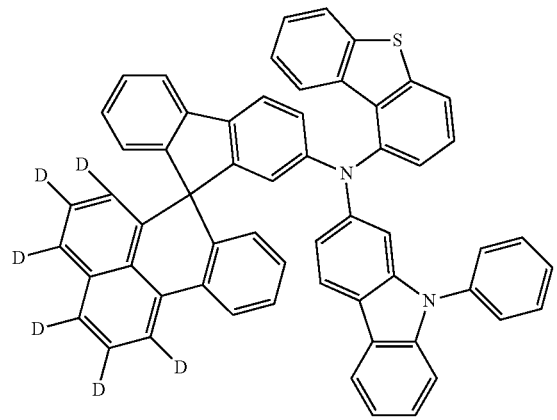
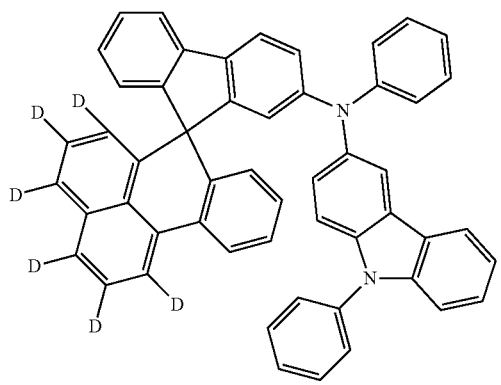
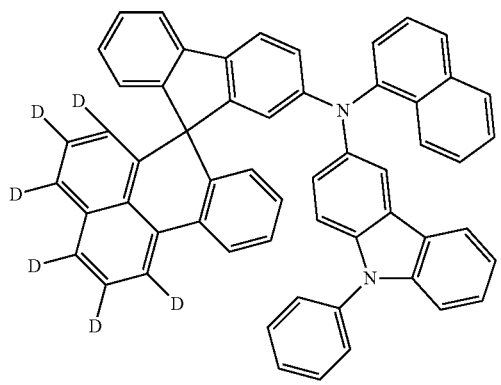
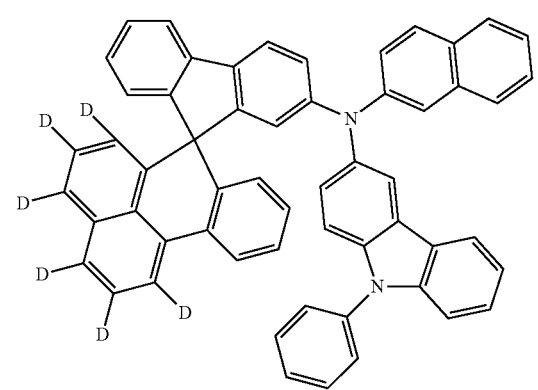

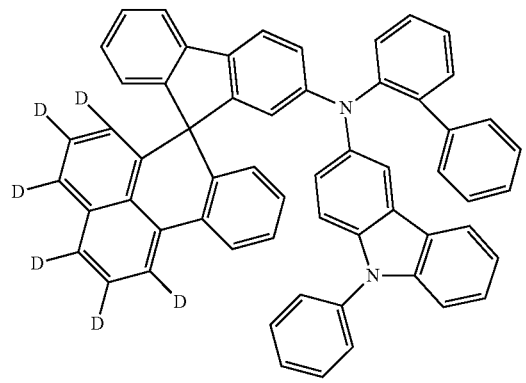
74
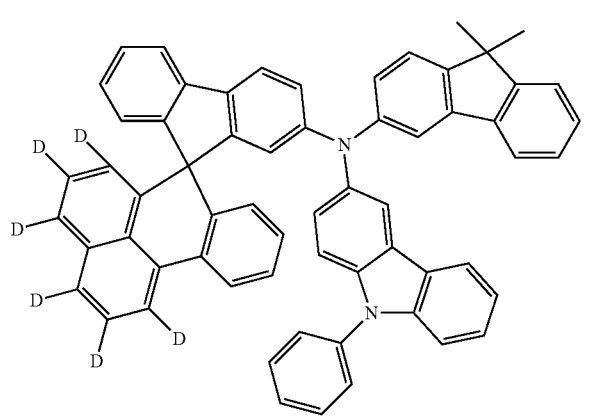
75
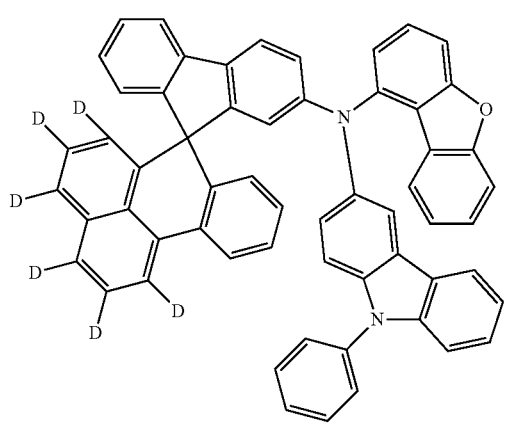
76
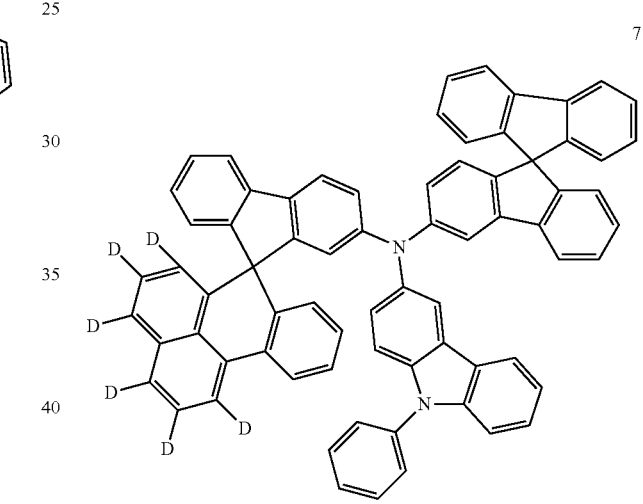
77
78
79

80
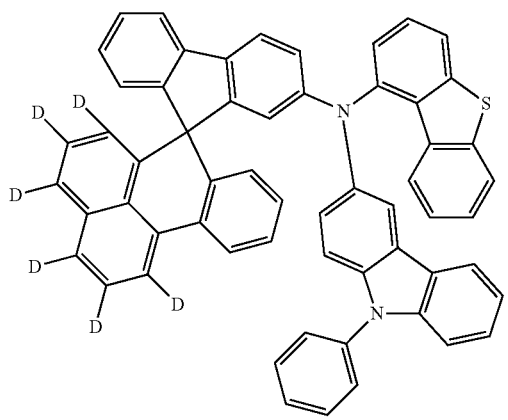
81
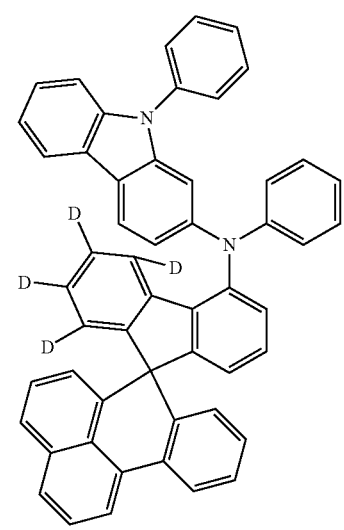
82
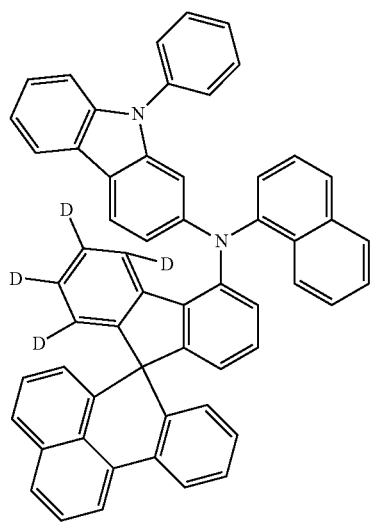
83
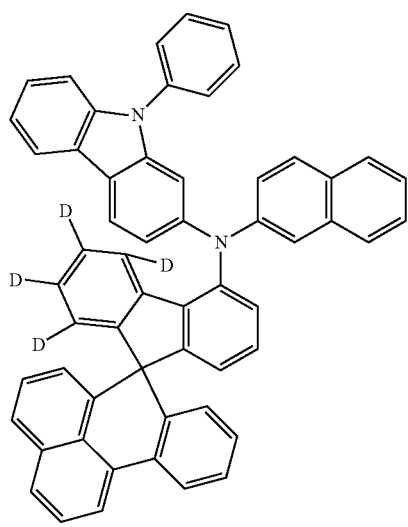
84
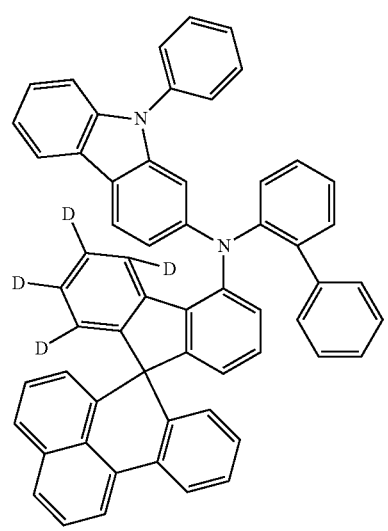
85
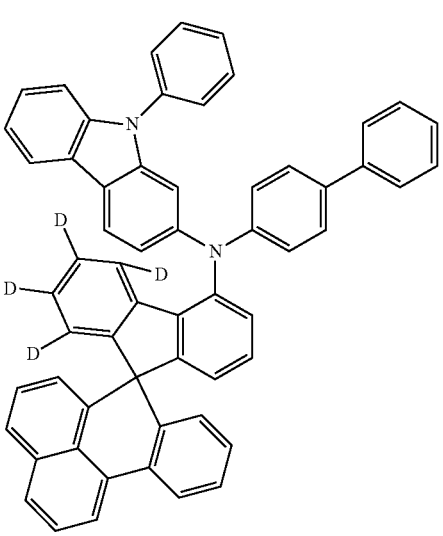

86
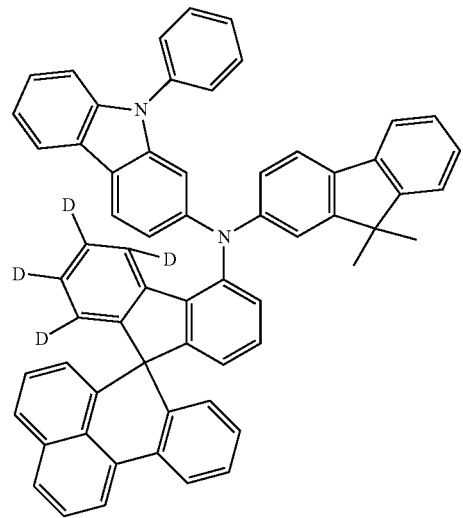
87
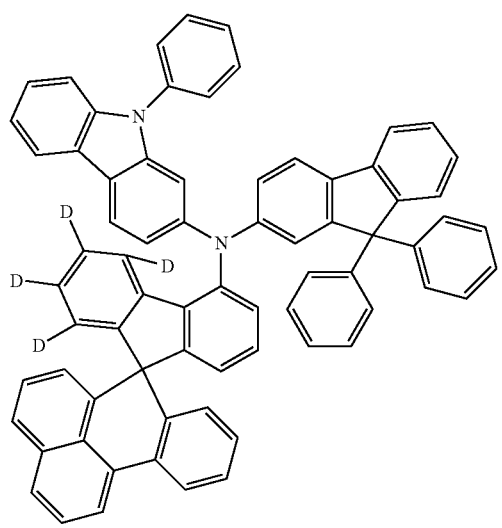
88
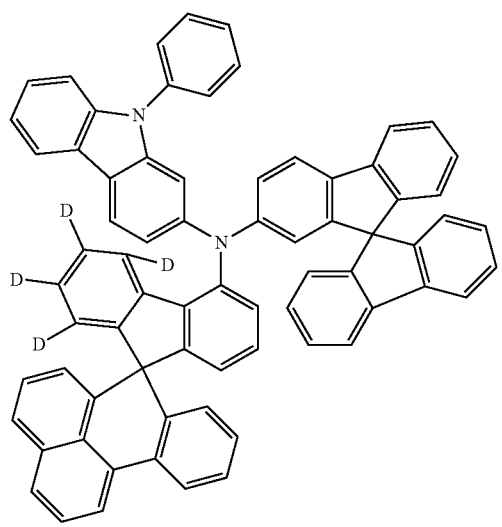
89
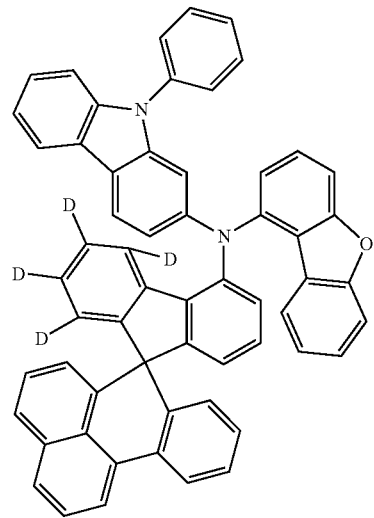
90
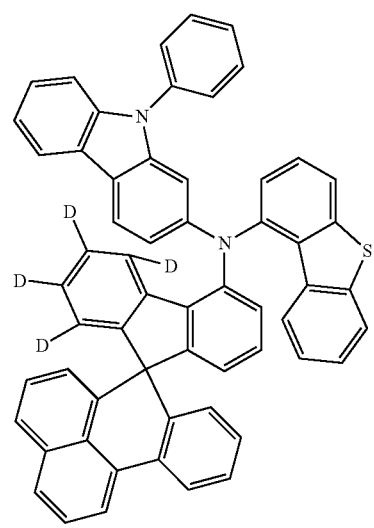
91
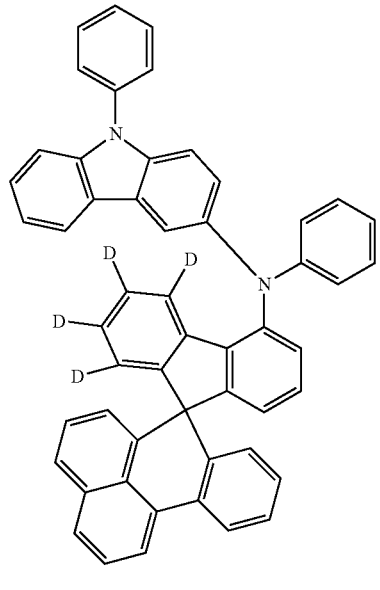

92
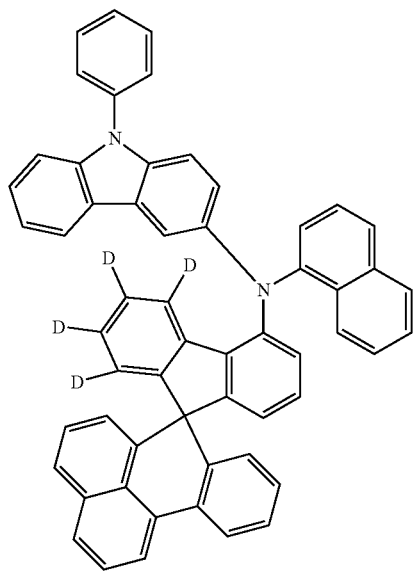
93
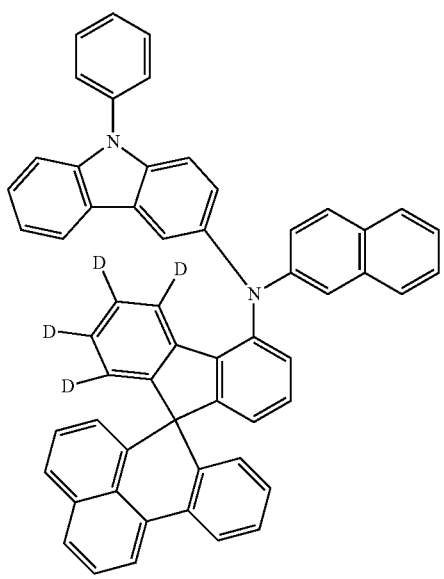
94
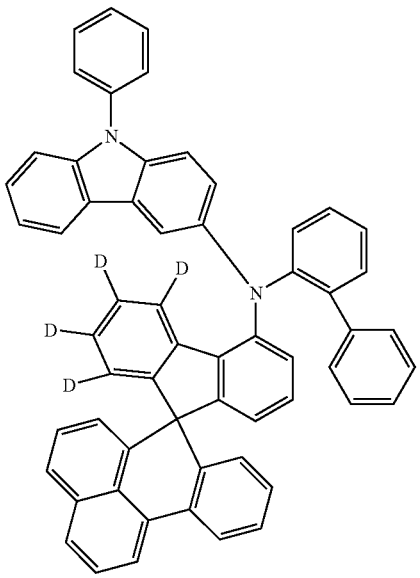
95
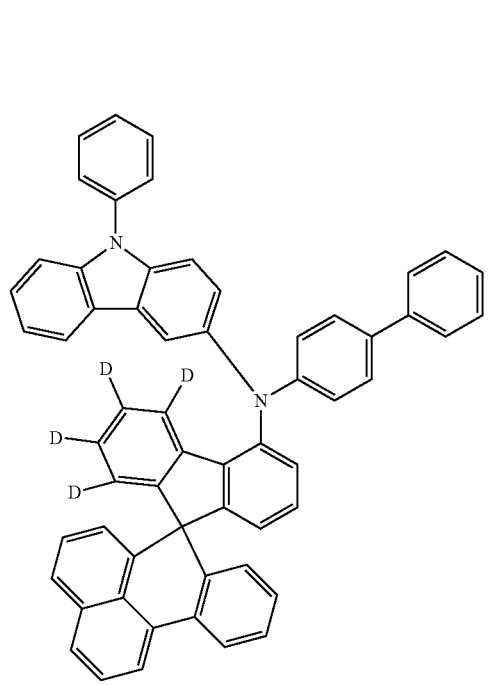

96
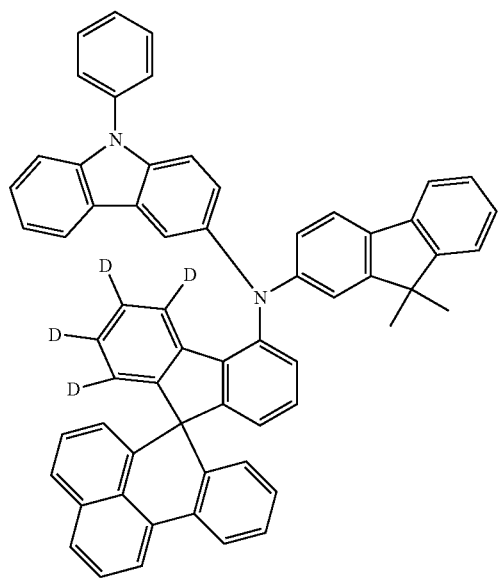
97
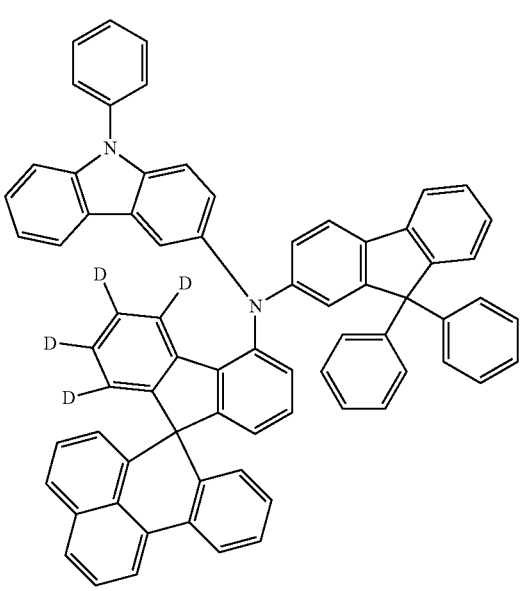
98
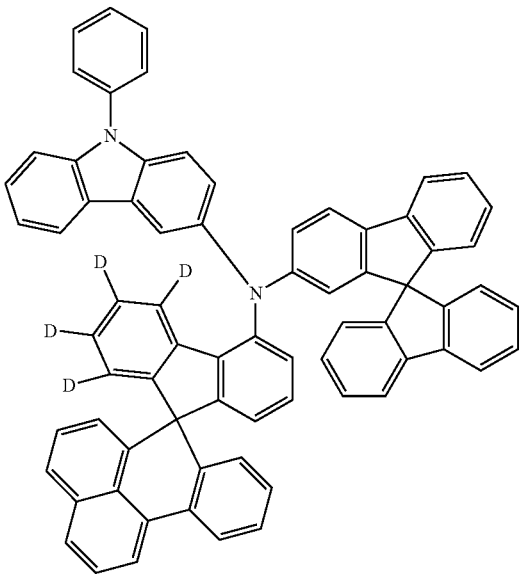
99
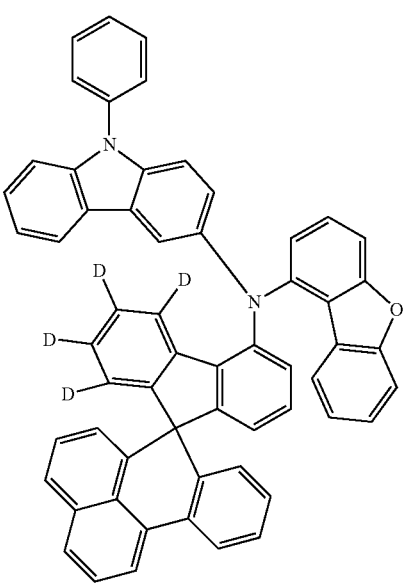

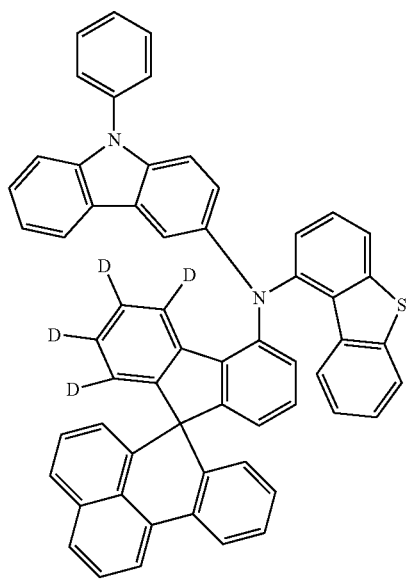
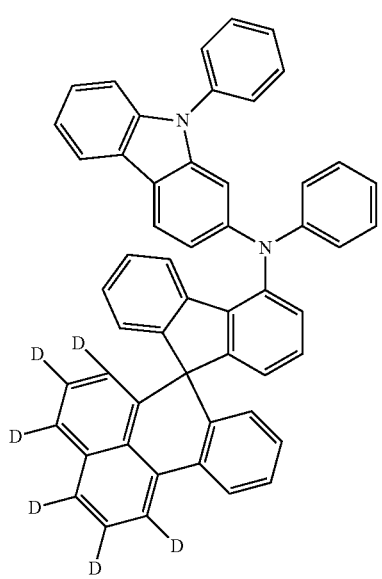
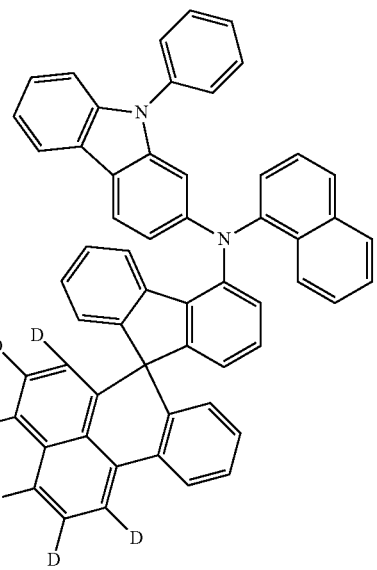
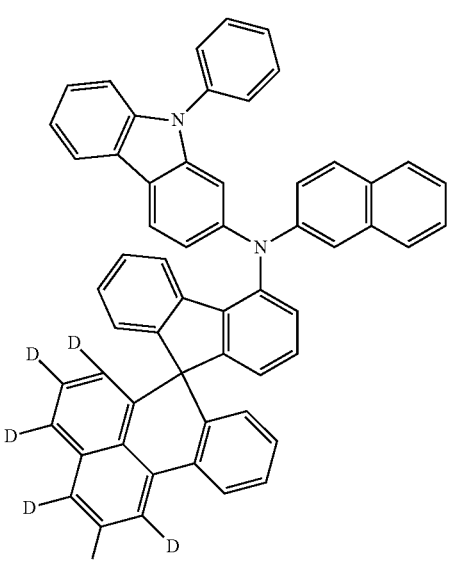

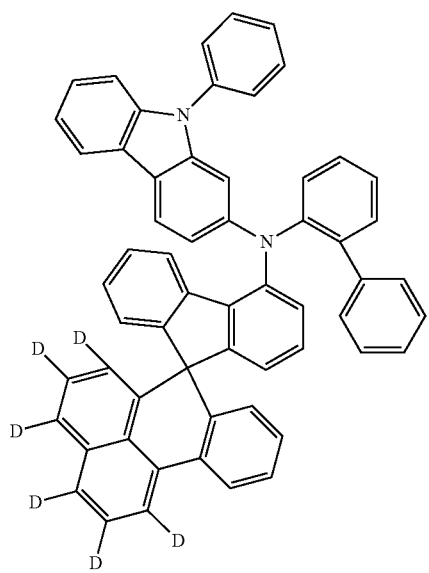
104
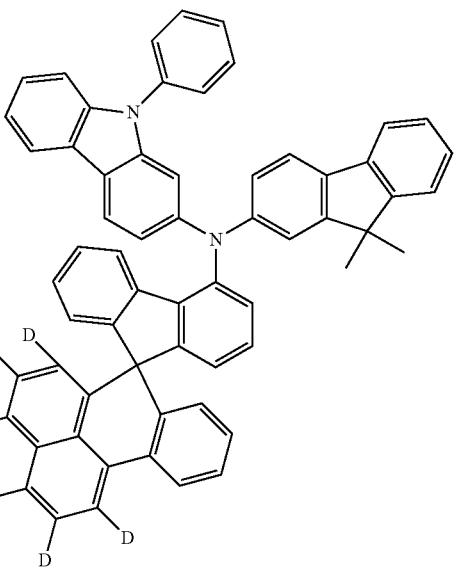
106
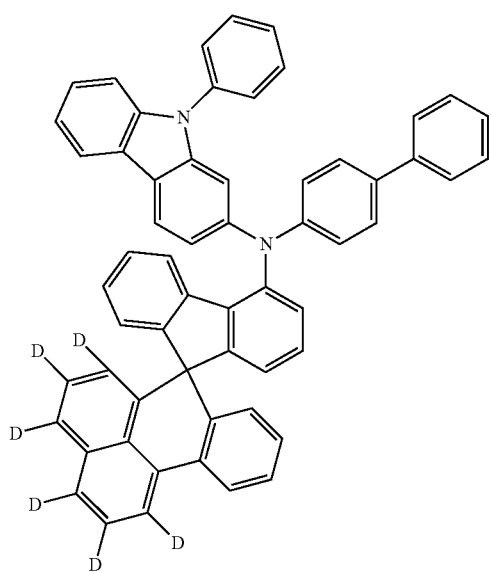
105
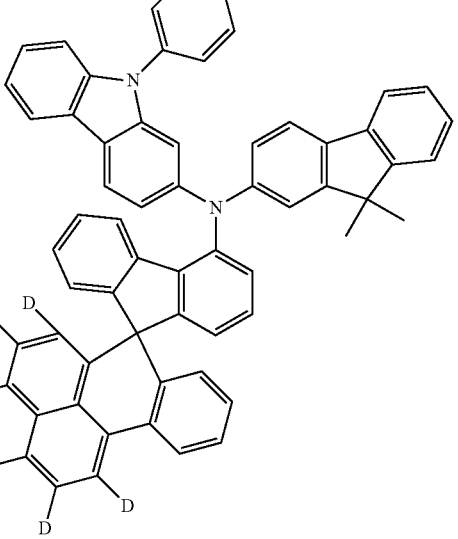
107

108
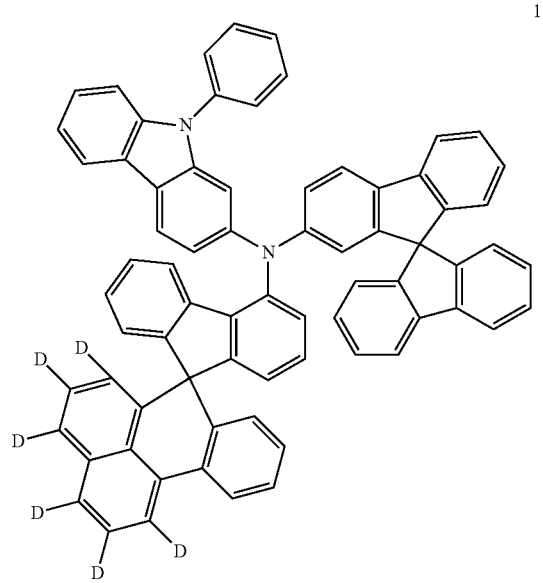
109
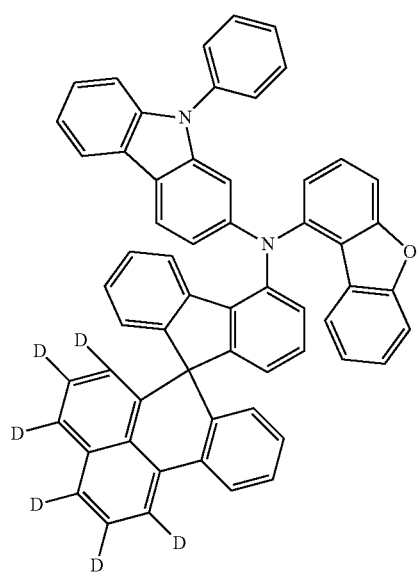
110
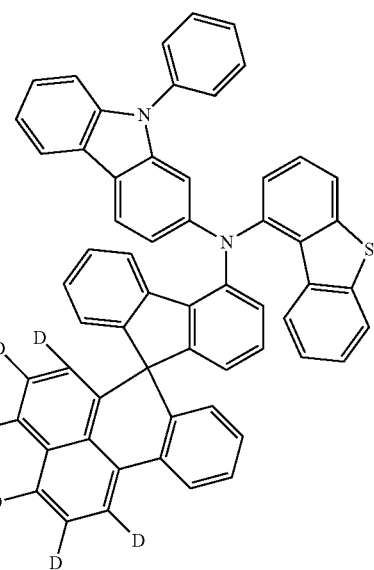
111
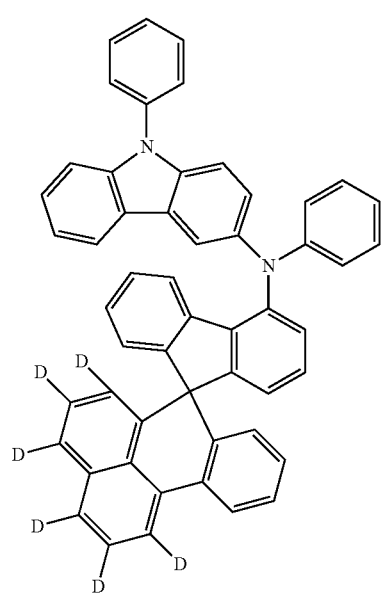

112
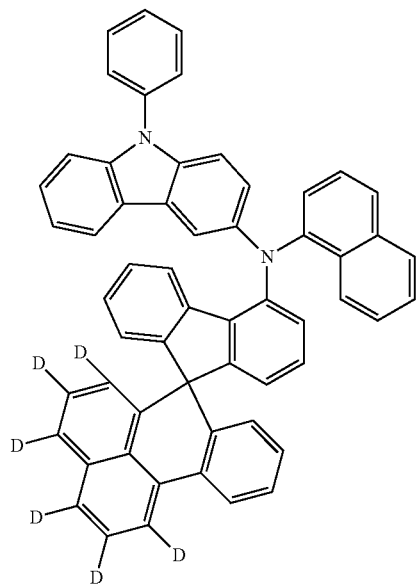
114
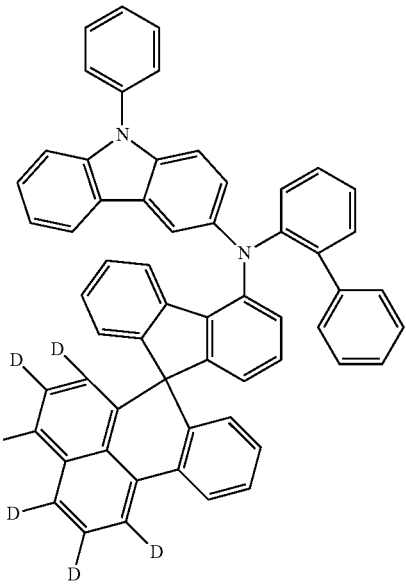
113
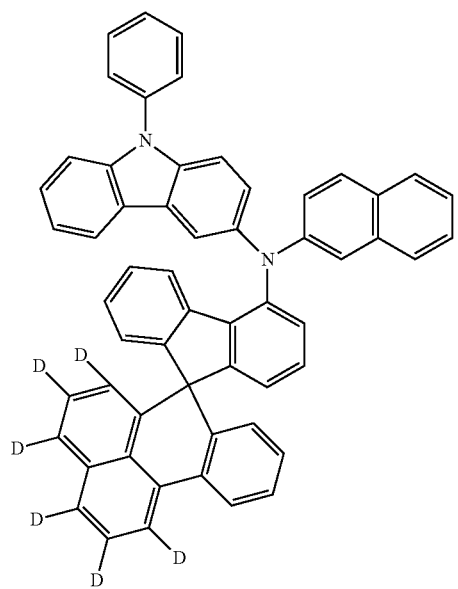
115
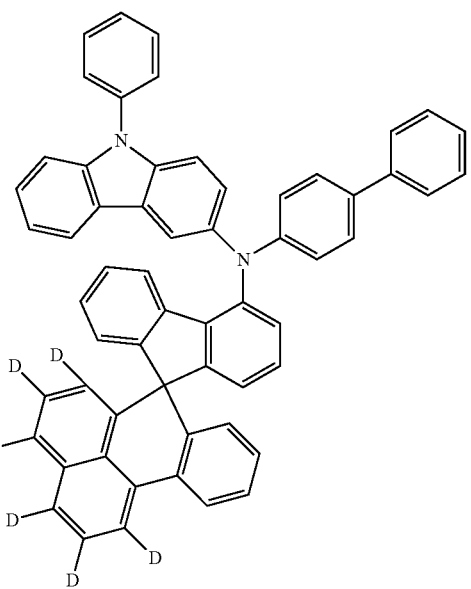

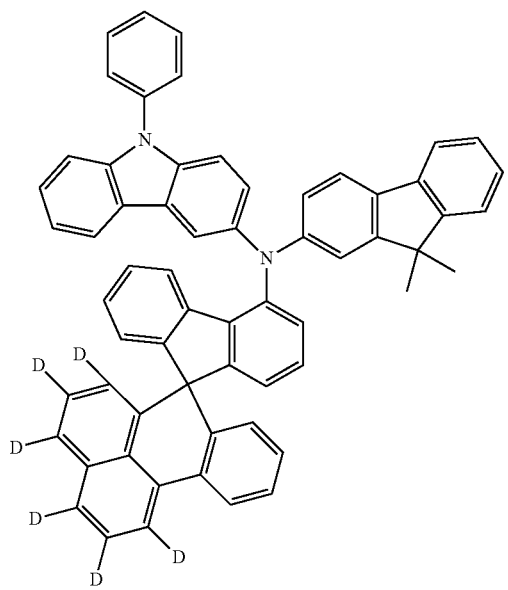
116
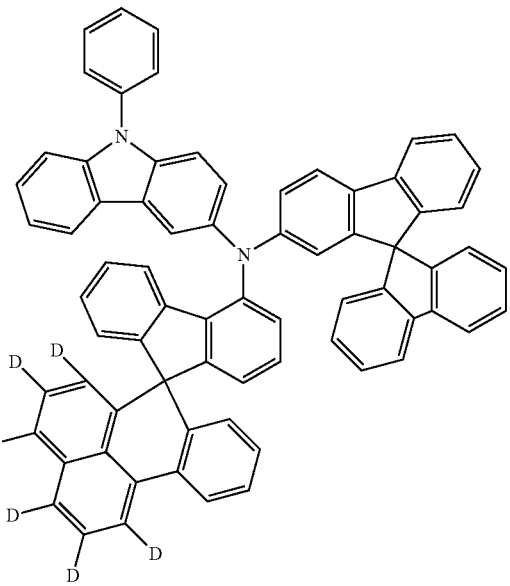
118
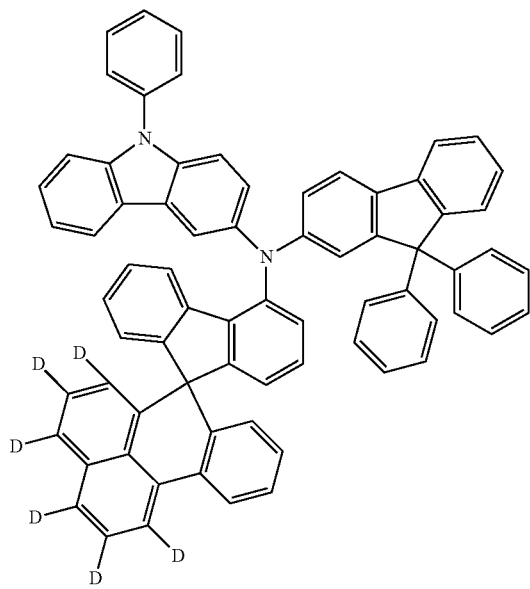
117
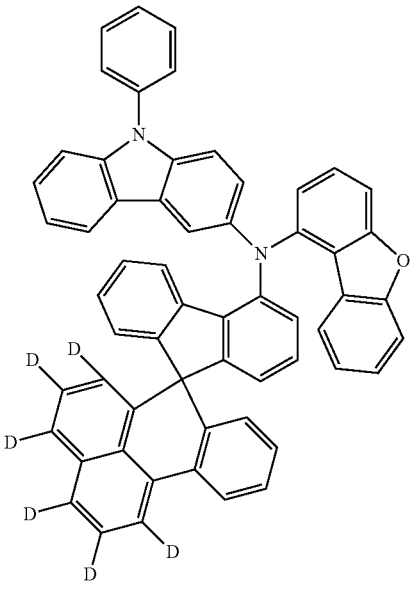
119

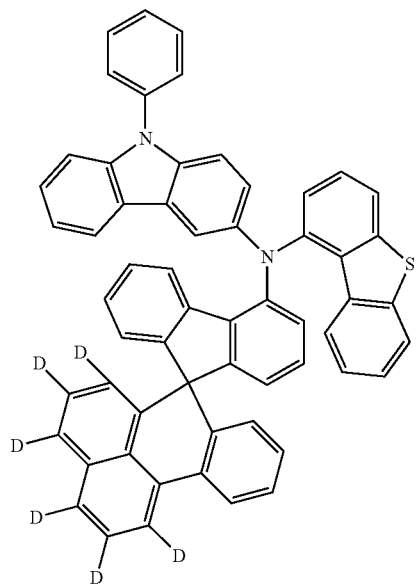
120
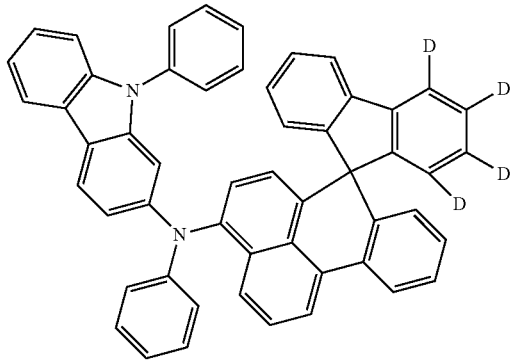
121
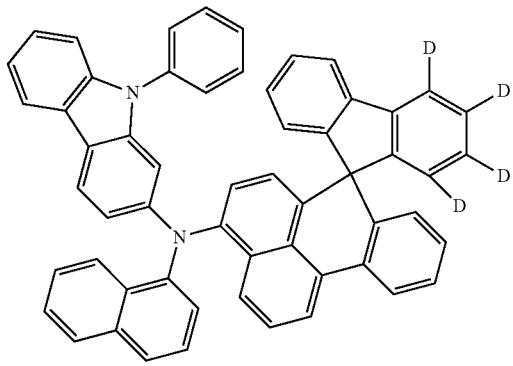
122
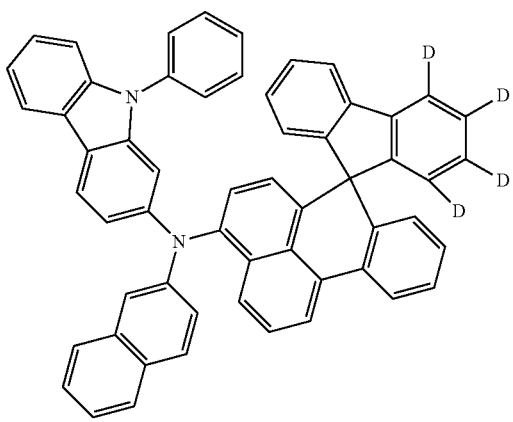
123
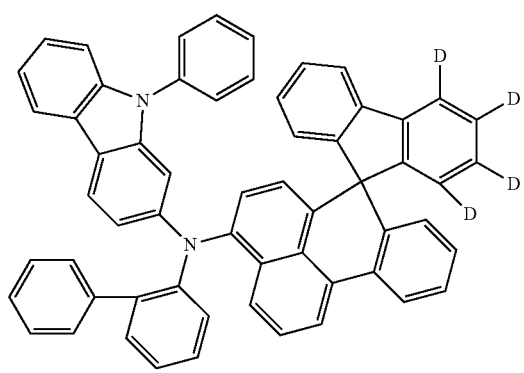
124
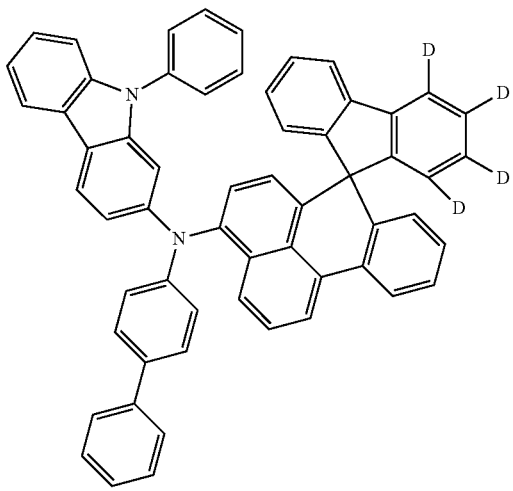
125

126
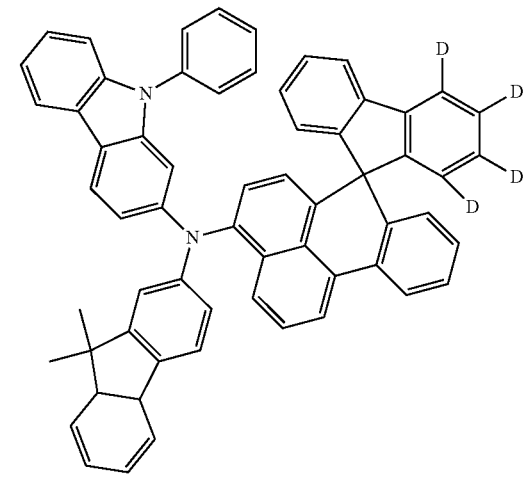
127
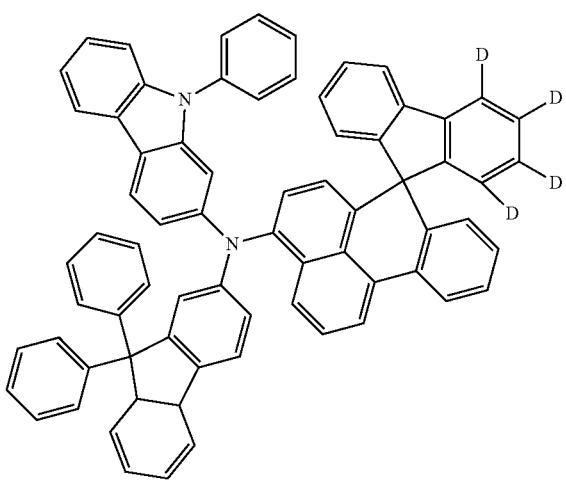
128
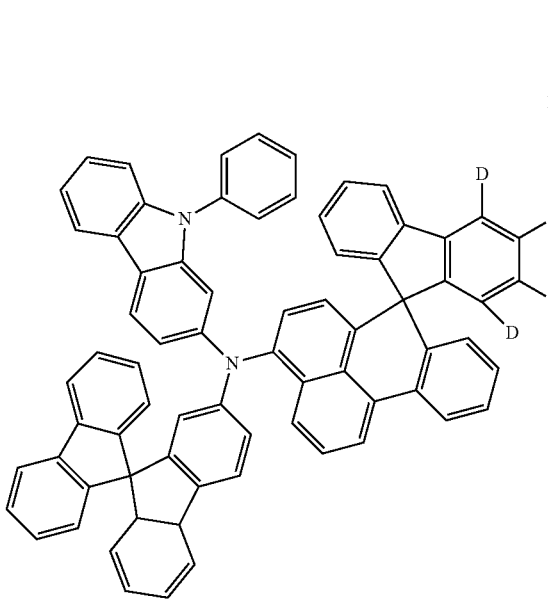
129
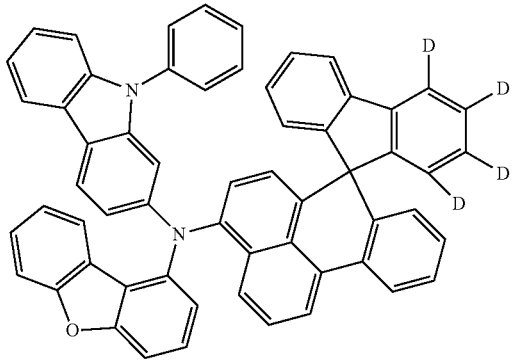
130
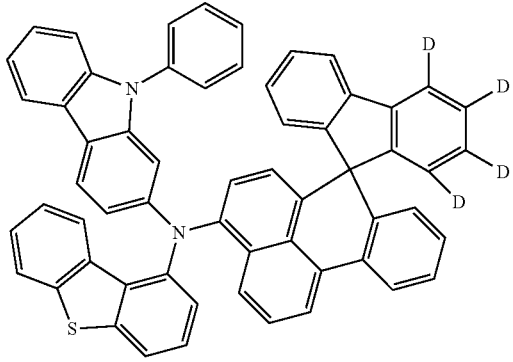
131
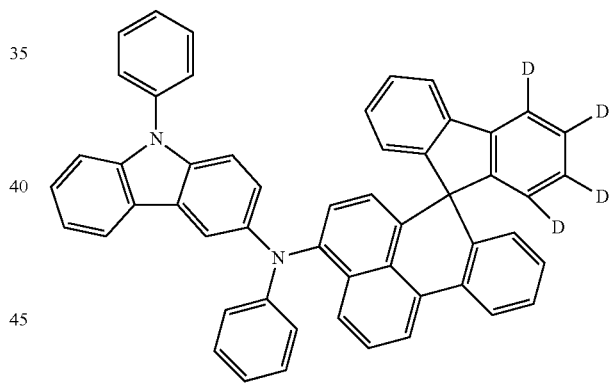
132
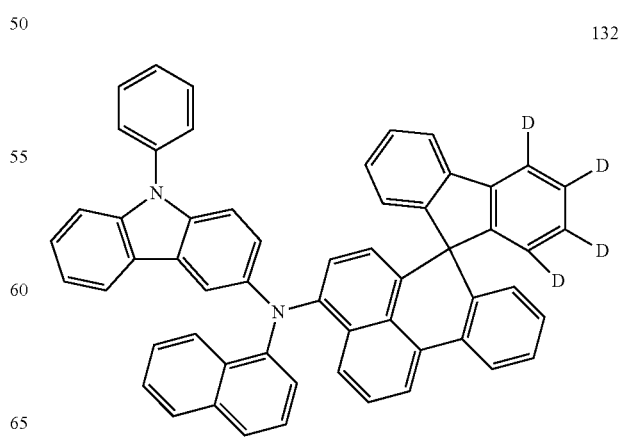

133
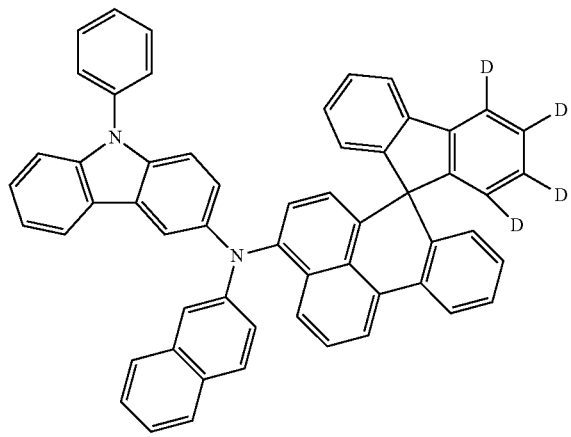
134
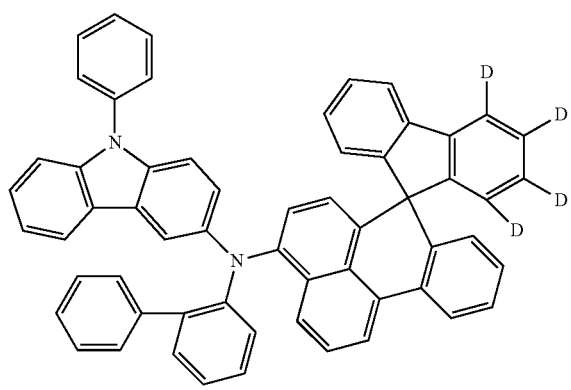
135
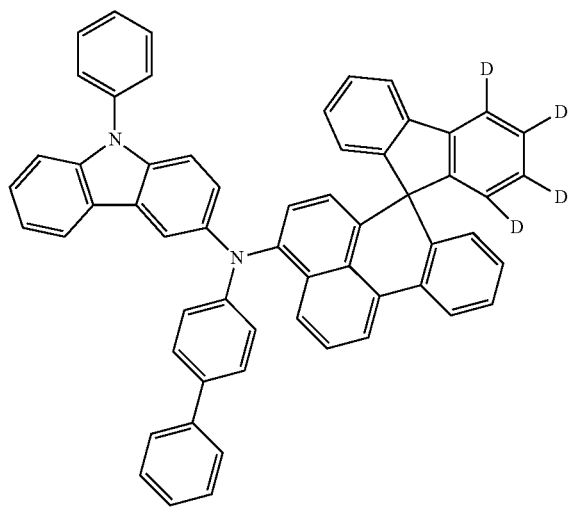
136
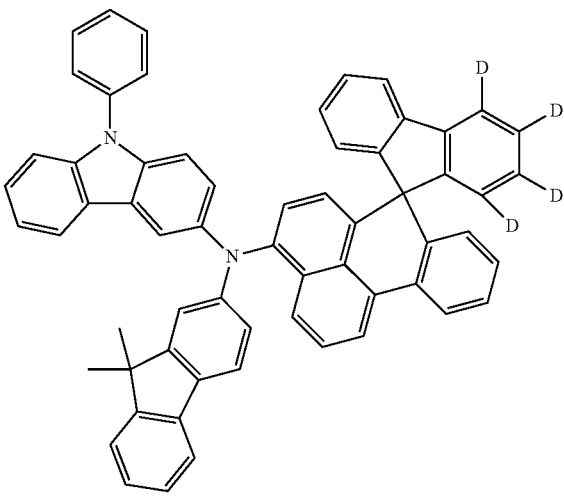
137
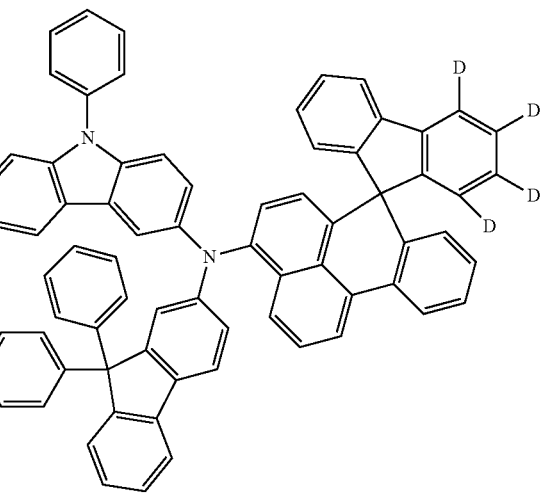
138
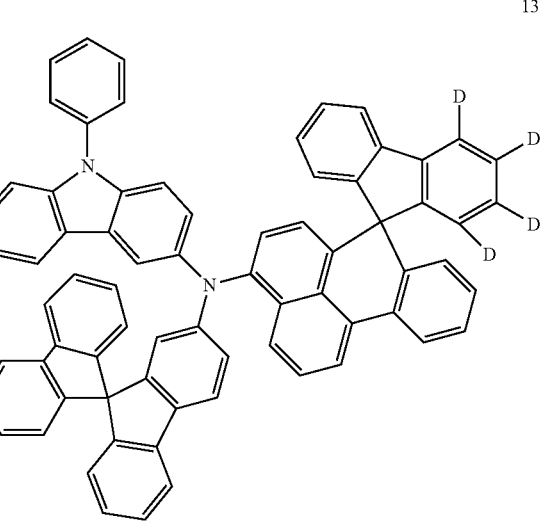

139
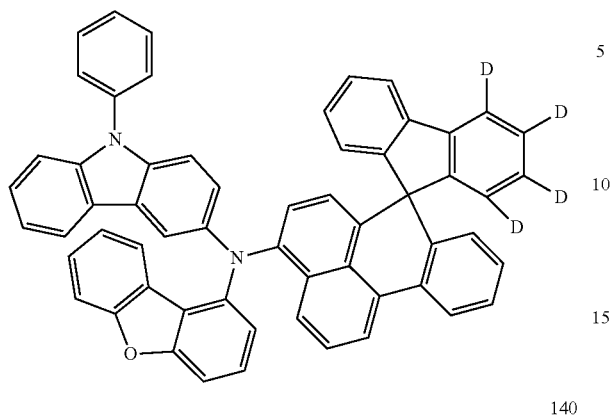
140
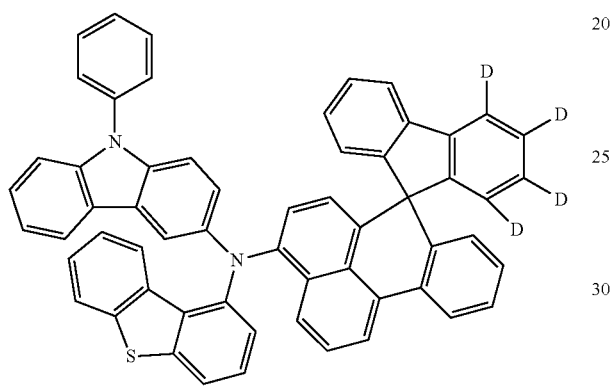
141
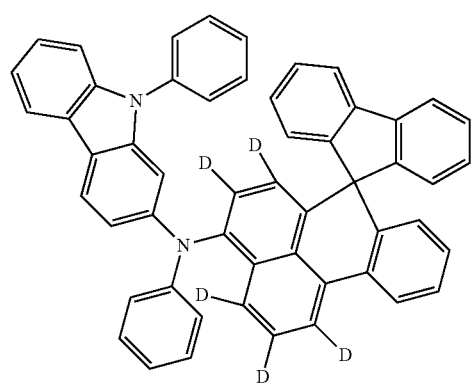
142
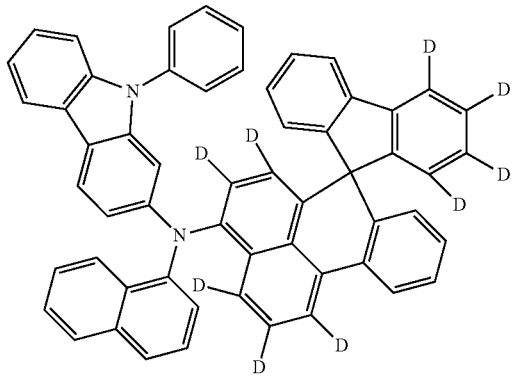
143
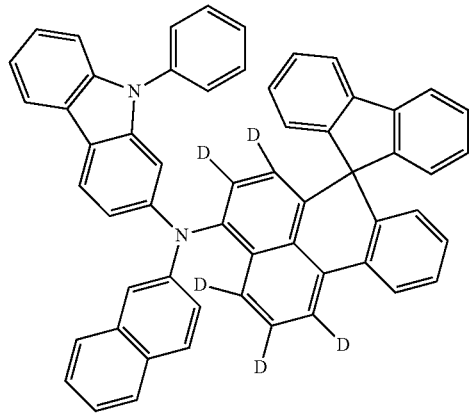
144
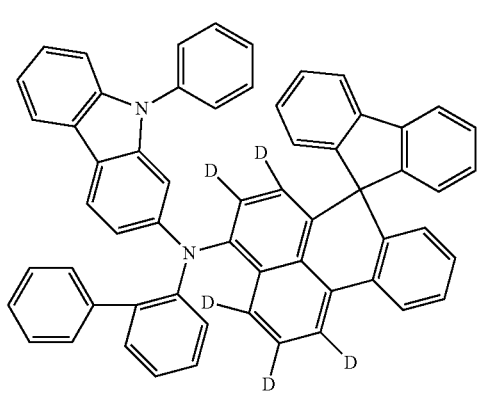
145
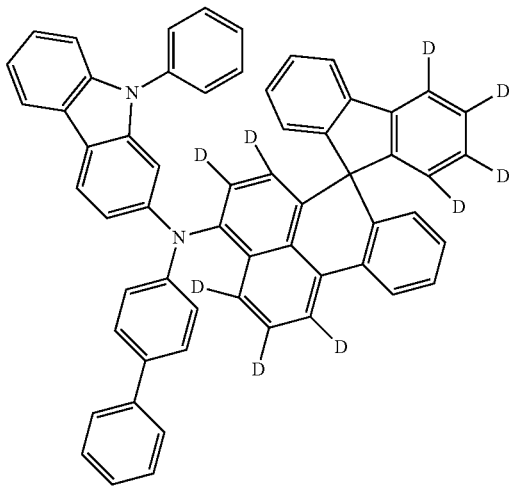

146
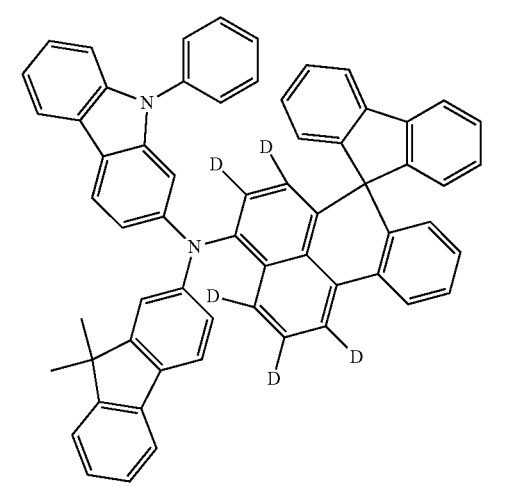
147
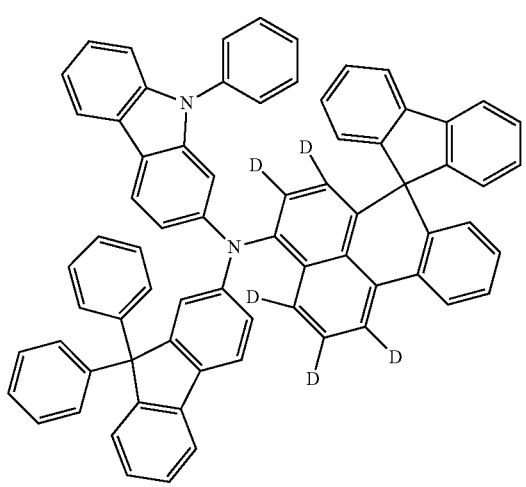
148
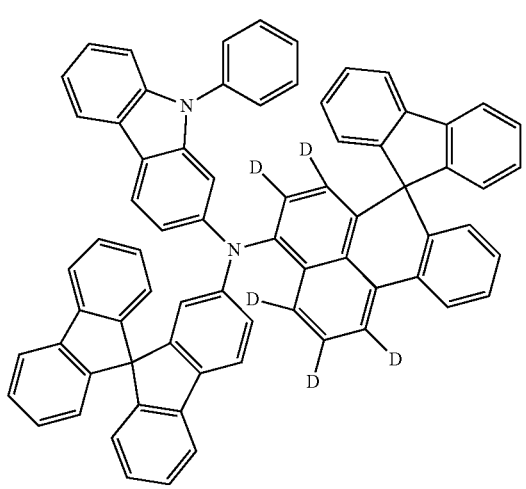
149
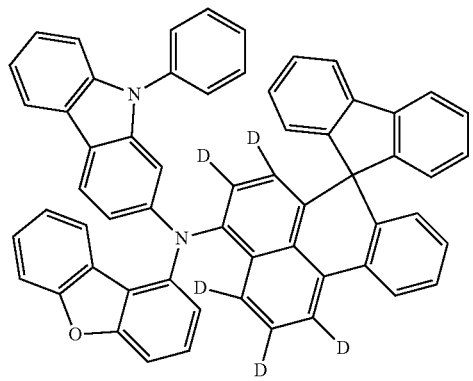
150
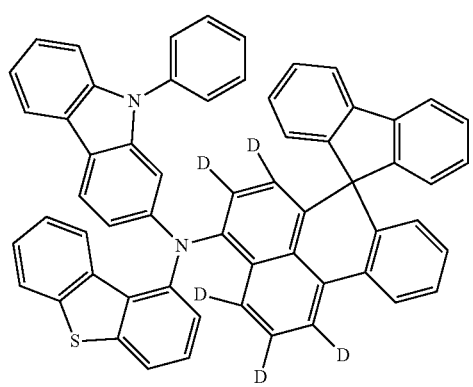
151
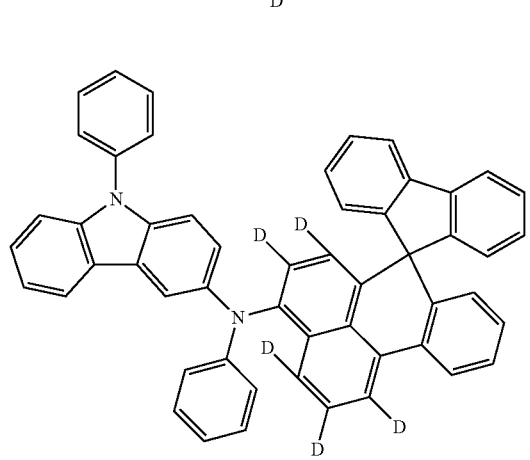
152
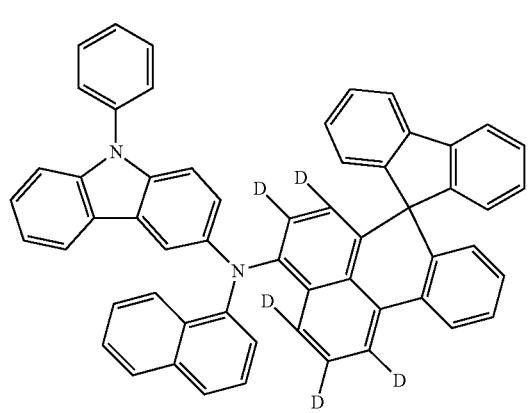

153
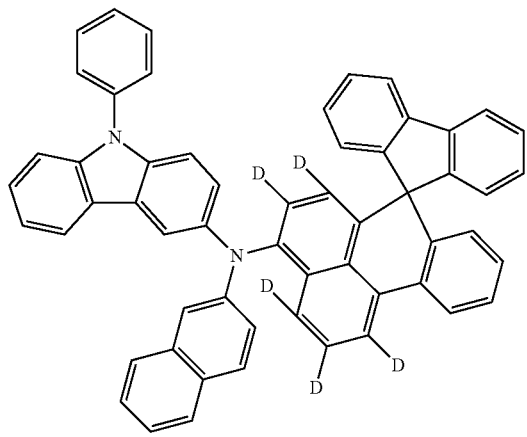
154
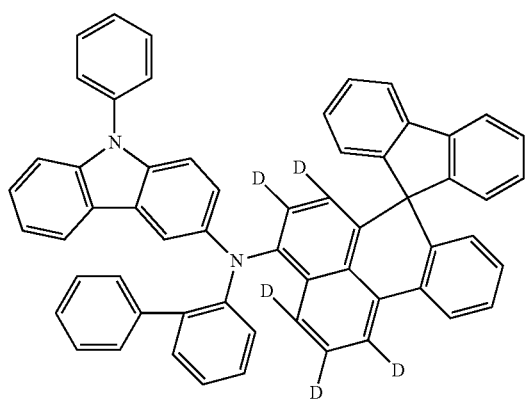
155
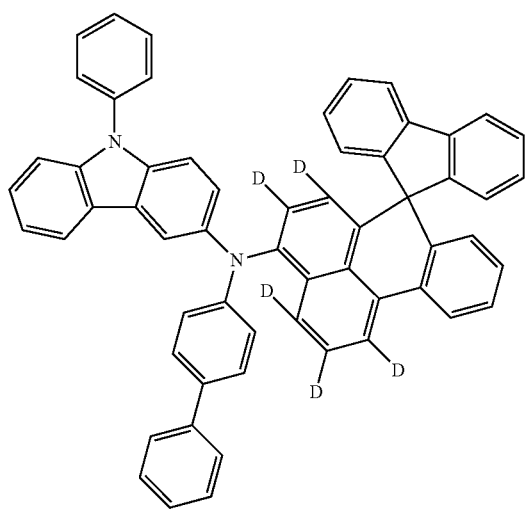
156
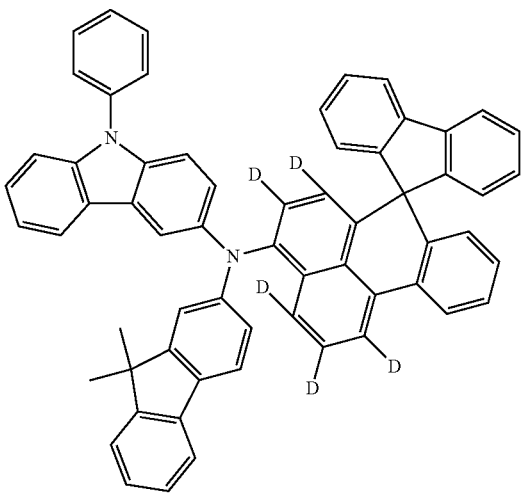
157
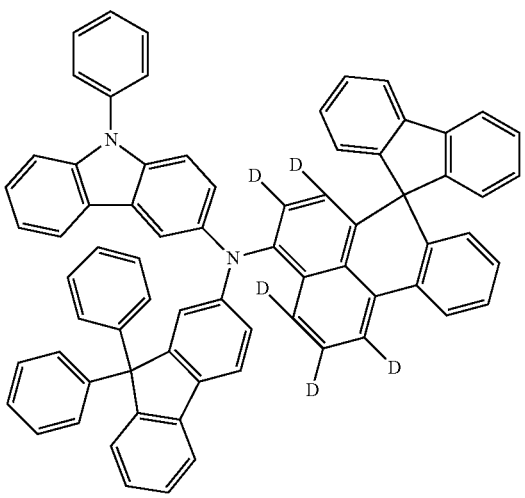
158
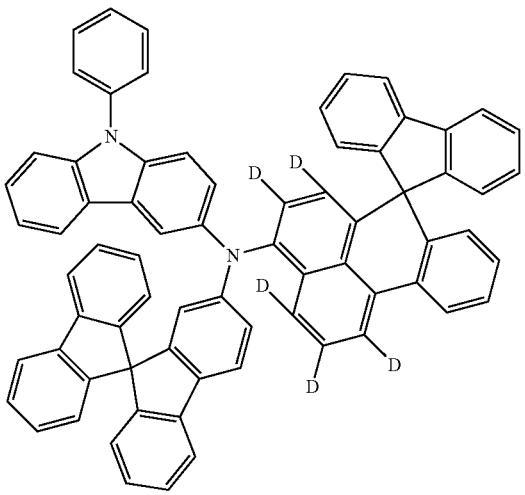

159

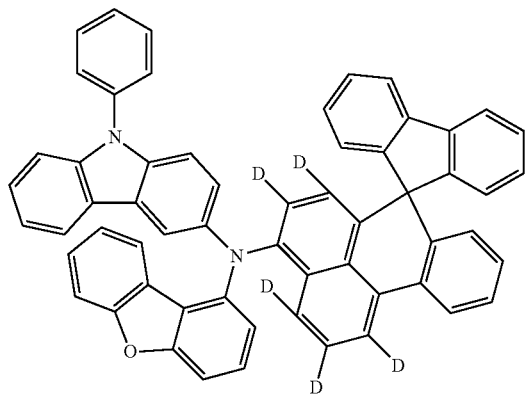

160

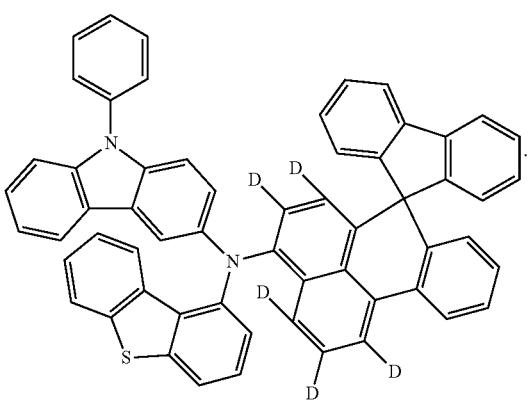

The amine compound represented by Formula 1 according to an embodiment has a molecular structure in which the condensed cycle having a spiro structure and the amine derivative are bonded, may have a high glass transition temperature and high melting point properties due to the introduction of the condensed cycle (e.g., a condensed cyclic group having a spiro structure), thereby exhibiting excellent heat resistance and durability characteristics. In addition, the amine compound has a structure in which at least one deuterium atom is substituted at the condensed cycle, and thus the service life characteristic may be further improved. When the amine compound of an embodiment is used in the hole transport region, the hole transport characteristic may be increased to improve recombination probability of holes and electrons in the emission layer, thereby improving luminous efficiency. In addition, the amine compound of an embodiment, which has excellent stability and in which at least one deuterium atom is substituted at the condensed cycle as described above, is included as a material for the light emitting element, and thereby a service life of the light emitting element of an embodiment may also be improved.

In one or more embodiments, the light emitting element ED of an embodiment may further include materials for the hole transport region, which will be described further below, in addition to the above-described amine compound of an embodiment.

The hole transport region HTR may include a compound represented by Formula H-1 below:

[Formula H-1]

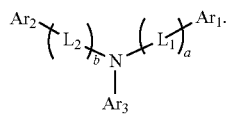

In Formula H-1 above, $L_1$ and $L_2$ may be each independently a direct linkage (e.g., a single covalent bond), a substituted or unsubstituted arylene group having 6 to 30 ring-forming carbon atoms, or a substituted or unsubstituted heteroarylene group having 2 to 30 ring-forming carbon atoms. a and b may be each independently an integer of 0 to 10. In one or more embodiments, when a or b is an integer of 2 or greater, a plurality of $L_1$'s and $L_2$'s may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms.

The compound represented by Formula H-1 above may be a monoamine compound. In one or more embodiments, the compound represented by Formula H-1 above may be a diamine compound in which at least one selected from among $Ar_1$ to $Ar_3$ includes the amine group as a substituent. In addition, the compound represented by Formula H-1 above may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one selected from among the compounds of Compound Group H below. However, the compounds listed in Compound Group H below are examples, and the compounds represented by Formula H-1 are not limited to those represented by Compound Group H below:

H1

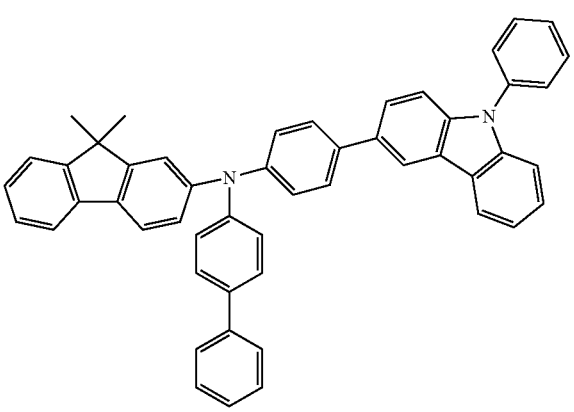

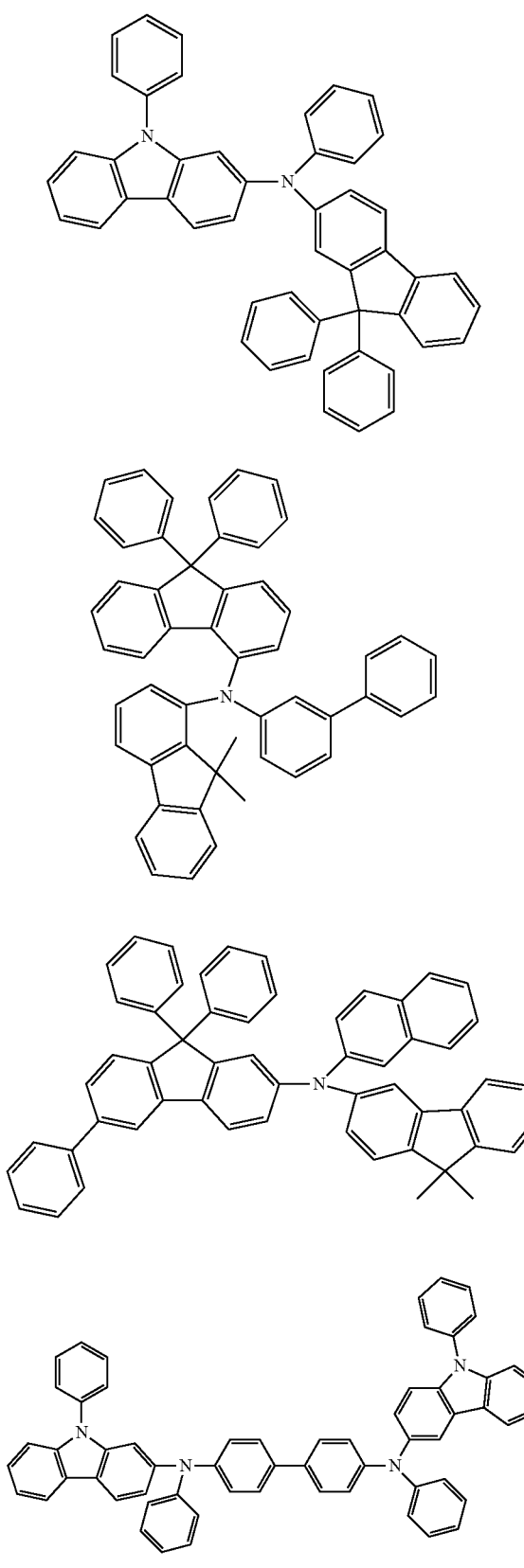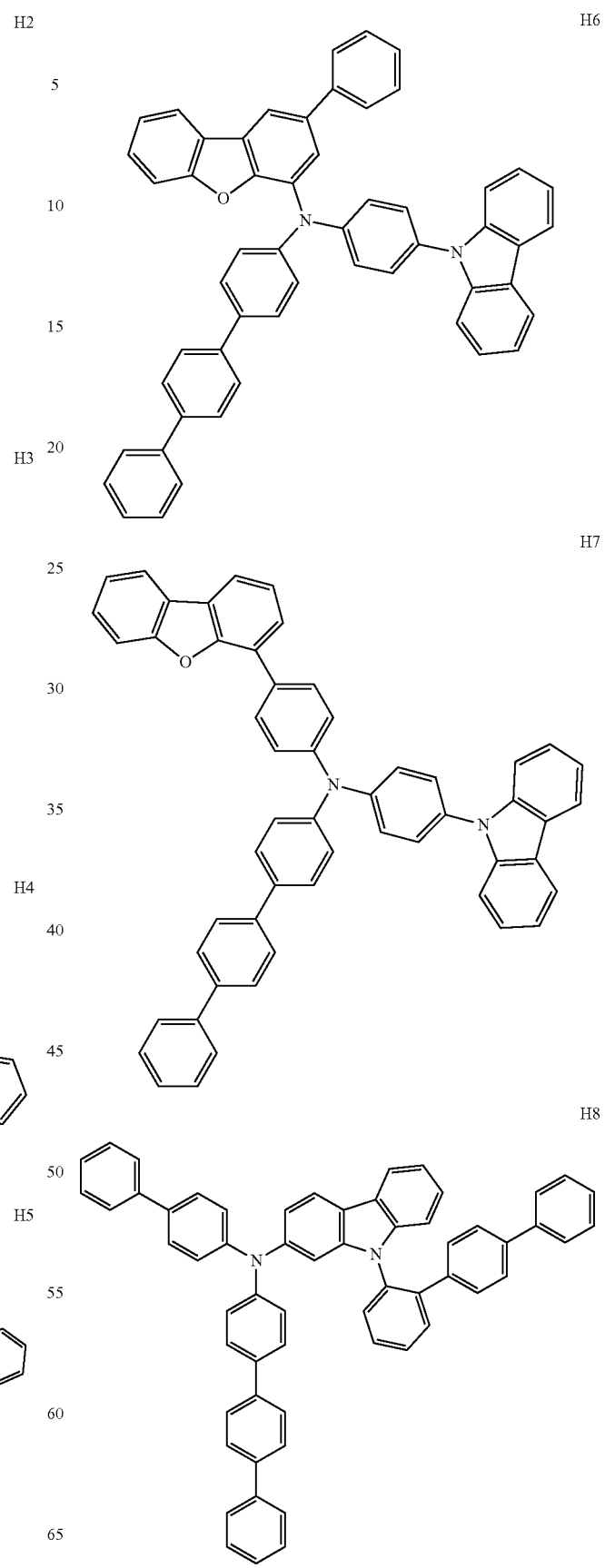

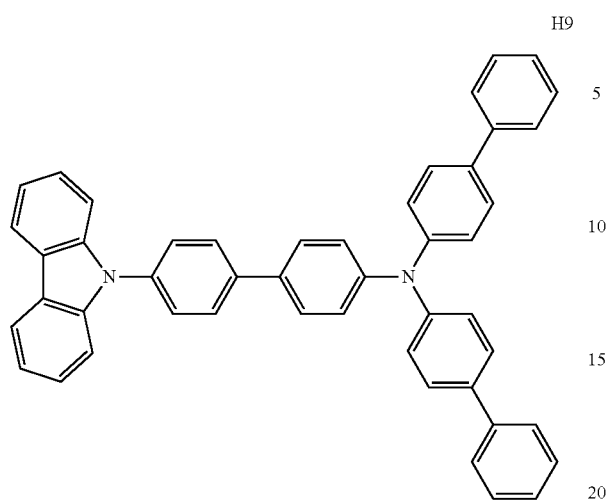
H9
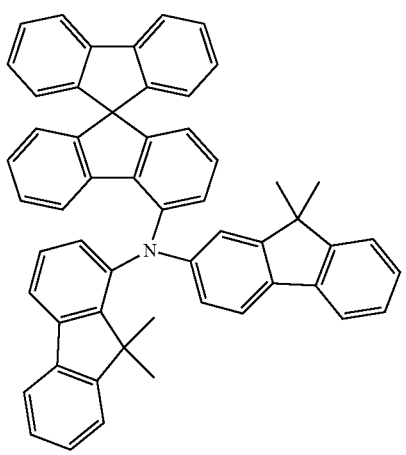
H12
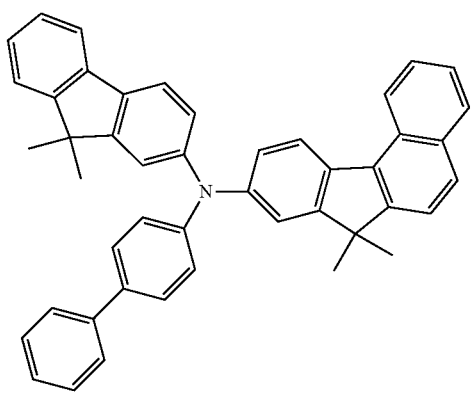
H10
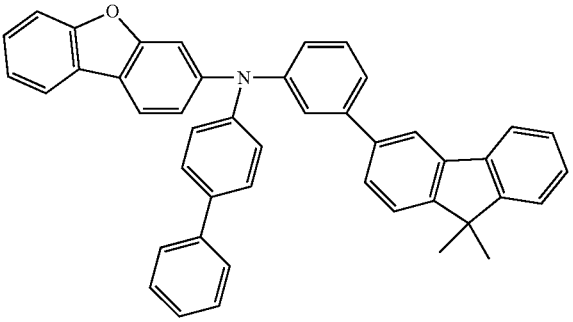
H13
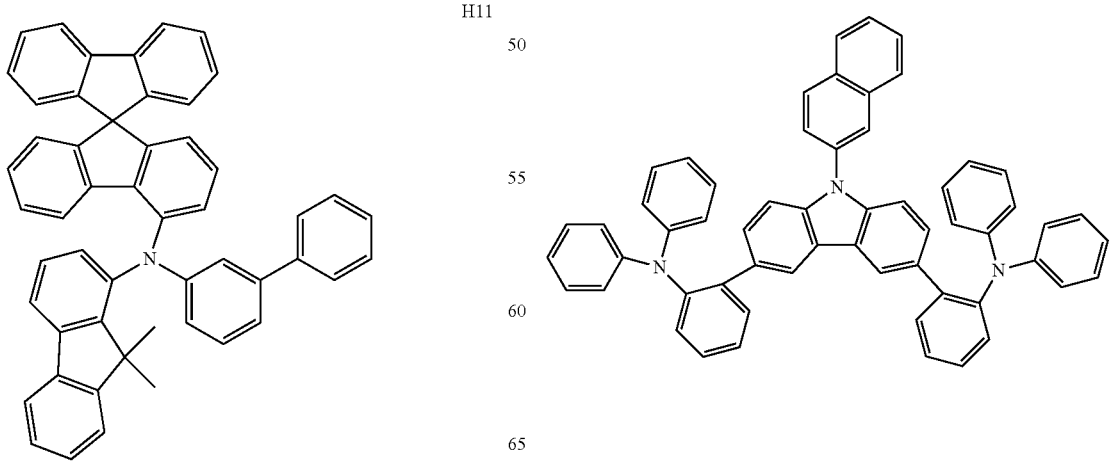
H11
H14

H15 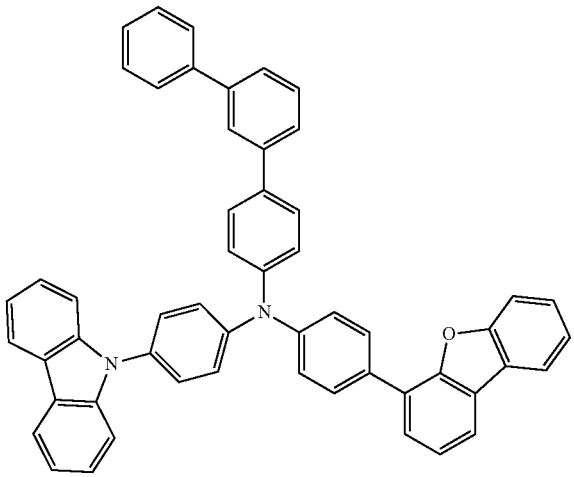

H16 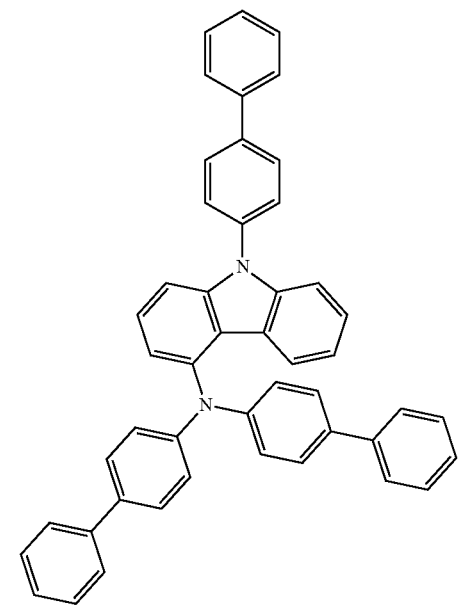

H17 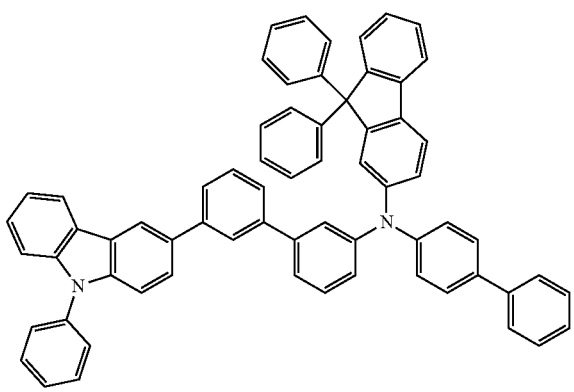

H18 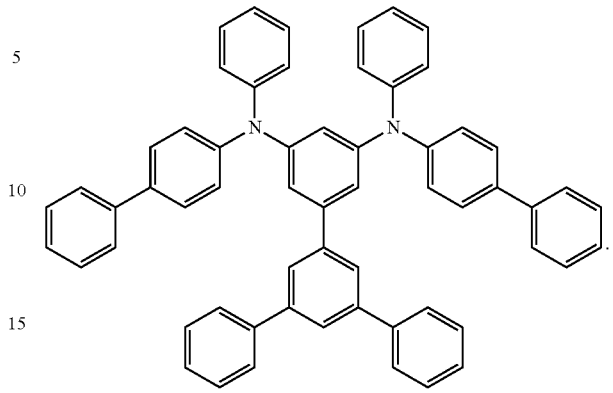

The hole transport region HTR may include a phthalocyanine compound such as copper phthalocyanine; $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4"-[tris(3-methylphenyl)phenylamino]triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc., but the embodiment of the present disclosure is not limited thereto.

The hole transport region HTR may include carbazole derivatives such as N-phenyl carbazole and polyvinyl carbazole, fluorene derivatives, N,N'-bis(3-methylphenyl)-N,N'-diphenyl-[1,1-biphenyl]-4,4'-diamine (TPD), triphenylamine derivatives such as 4,4',4"-tris(N-carbazolyl)triphenylamine (TCTA), N,N'-di(naphthalene-I-yl)-N,N'-diphenyl-benzidine (NPB), 4,4'-cyclohexylidene bis[N,N-bis(4-methylphenyl]benzenamine](TAPC), 4,4'-bis[N,N'-(3-tolyl)amino]-3,3'-dimethylbiphenyl (HMTPD), 1,3-bis(N-carbazolyl)benzene (mCP), etc.

In addition, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compound of the hole transport region in at least one selected from a hole injection layer HIL, a hole transport layer HTL, and an electron blocking layer EBL.

The thickness of the hole transport region HTR may be from about 100 Å to about 10,000 Å, for example, from about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 30 Å to about 1,000 Å. For example, when the hole transport region HTR includes the electron blocking layer EBL, the electron blocking layer EBL may have a thickness of about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport characteristics may be achieved without a substantial increase in a driving voltage.

The hole transport region HTR may further include a charge generating material in addition to the above-described materials to increase conductivity (e.g., electrical conductivity). The charge generating material may be dispersed uniformly or non-uniformly in the hole transport region HTR. The charge generating material may be, for example, a p-dopant. The p-dopant may include at least one selected from a halogenated metal compound, a quinone derivative, a metal oxide, and a cyano group-containing compound, but the embodiment of the present disclosure is not limited thereto. For example, the p-dopant may include metal halides such as CuI and/or RbI, quinone derivatives such as tetracyanoquinodimethane (TCNQ) and/or 2,3,5,6-tetrafluoro-7,7,8,8-tetracyanoquinodimethane (F4-TCNQ), metal oxides such as tungsten oxide and/or molybdenum oxide, dipyrazino[2,3-f: 2',3'-h]quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile, etc., but the embodiment of the present disclosure is not limited thereto.

As described above, the hole transport region HTR may further include at least one selected from the buffer layer and the electron blocking layer EBL in addition to the hole injection layer HIL and the hole transport layer HTL. The buffer layer may compensate for a resonance distance according to the wavelength of light emitted from the emission layer EML and may thus increase light emission efficiency. Materials which may be included in the hole transport region HTR may be used as materials to be included in the buffer layer. The electron blocking layer EBL is a layer that serves to prevent or reduce injection of electrons from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

In the light emitting element ED of an embodiment, the emission layer EML may include anthracene derivatives, pyrene derivatives, fluoranthene derivatives, chrysene derivatives, dehydrobenzanthracene derivatives, and/or triphenylene derivatives. For example, the emission layer EML may include anthracene derivatives and/or pyrene derivatives.

In each light emitting element ED of embodiments illustrated in FIGS. 3 to 6, the emission layer EML may include a host and a dopant, and the emission layer EML may include a compound represented by Formula E-1 below. The compound represented by Formula E-1 below may be used as a fluorescence host material.

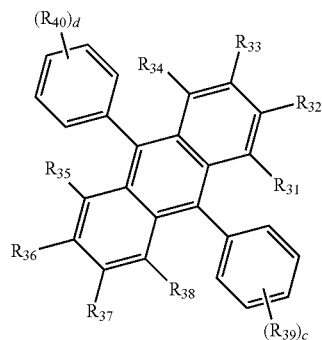

[Formula E-1]

In Formula E-1, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and, optionally, may be bonded to an adjacent group to form a ring. In one or more embodiments, $R_{31}$ to $R_{40}$ may be bonded to an adjacent group to form a saturated hydrocarbon ring or an unsaturated hydrocarbon ring.

In Formula E-1, c and d may be each independently an integer of 0 to 5.

Formula E-1 may be represented by any one selected from among Compound E1 to Compound E19 below:

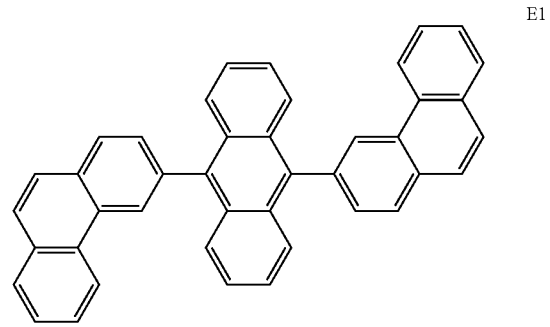

E1

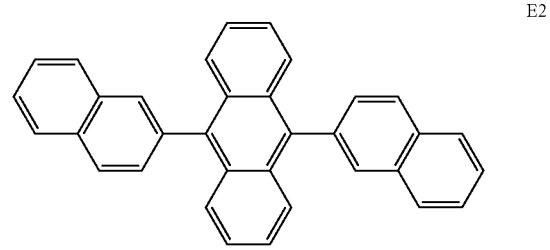

E2

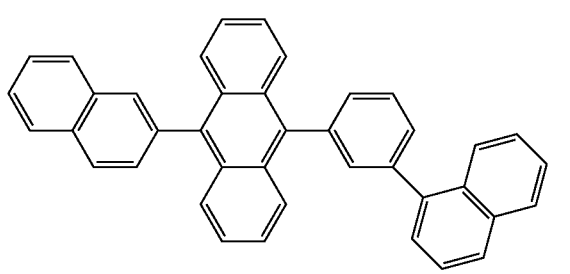

E3

-continued
E4
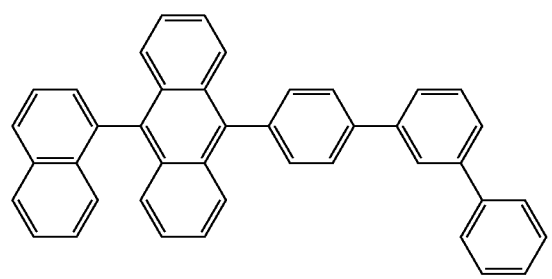
E5
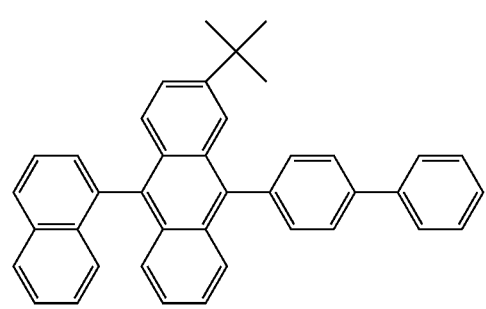
E6
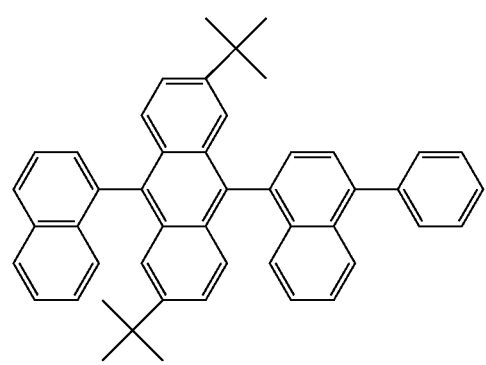
E7
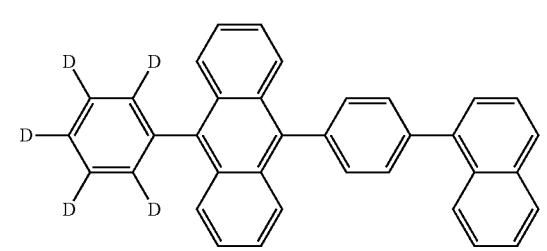
E8
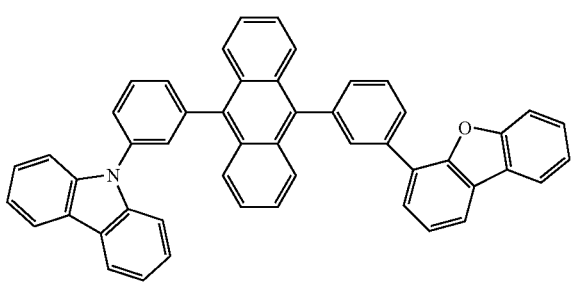
-continued
E9
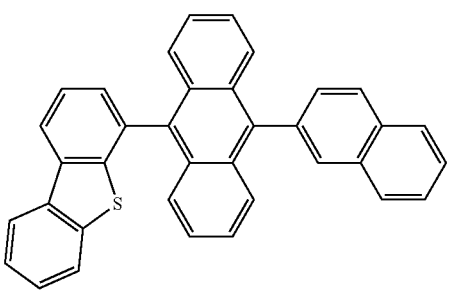
E10
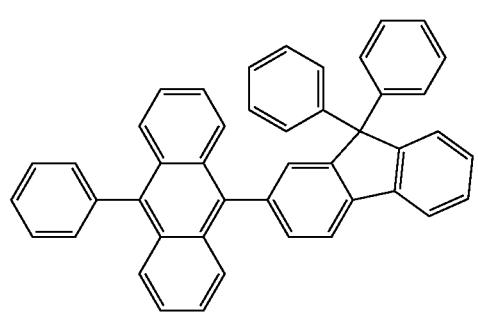
E11
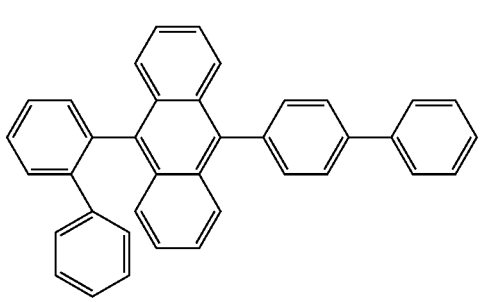
E12
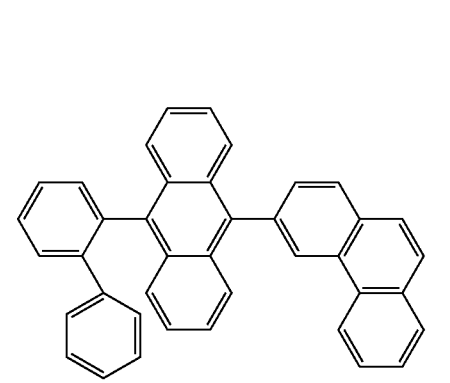
E13
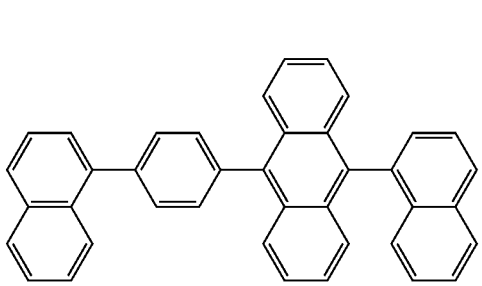

E14
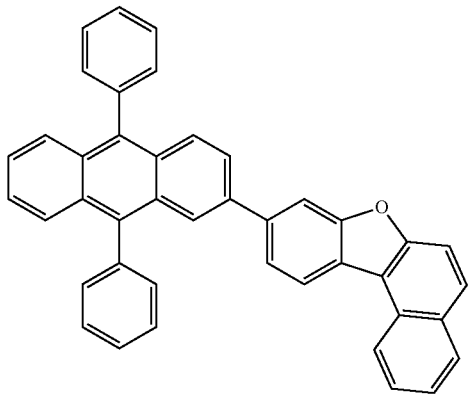

E15
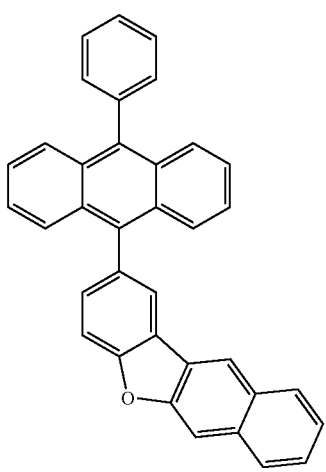

E16
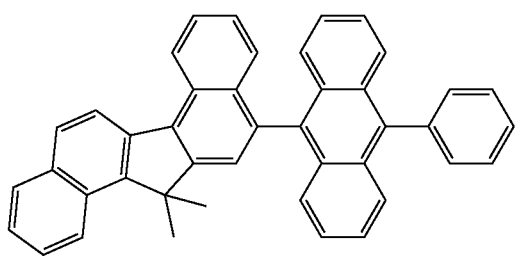

E17
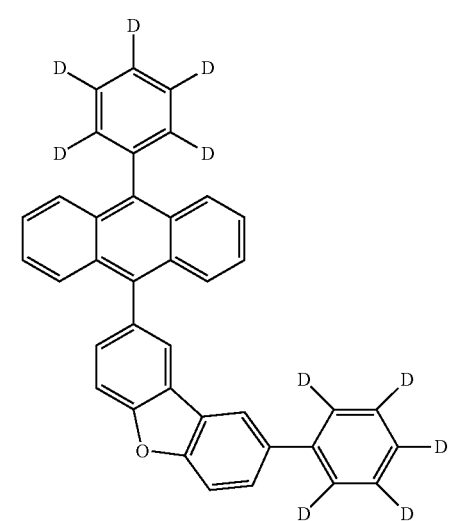

E18
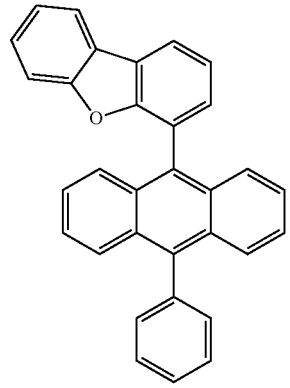

E19
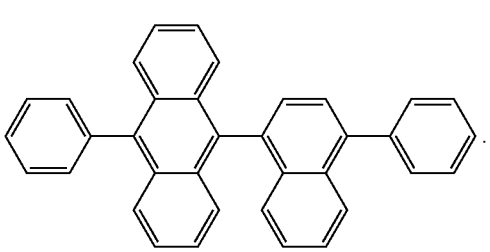

In an embodiment, the emission layer EML may include a compound represented by Formula E-2a and/or a compound represented by Formula E-2b below. The compound represented by Formula E-2a and/or the compound represented by Formula E-2b below may be used as a phosphorescence host material.

[Formula E-2a]

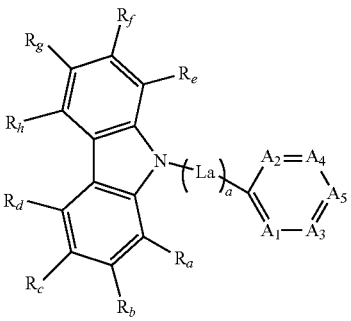

In Formula E-2a, and a may be an integer of 0 to 10, La may be a direct linkage (e.g., a single covalent bond), a substituted or unsubstituted arylene group having 6 to 30 ring-forming carbon atoms, or a substituted or unsubstituted heteroarylene group having 2 to 30 ring-forming carbon atoms. In one or more embodiments, when a is an integer of 2 or greater, a plurality of La'S may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or $CR_i$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In one or more embodiments, in Formula E-2a, two or three selected from among $A_1$ to $A_5$ may be N, and the others may be $CR_i$.

[Formula E-2b]

$$(Cbz1)\text{---}(L_b)_b\text{---}(Cbz2)$$

In Formula E-2b, Cbz1 and Cbz2 may be each independently an unsubstituted carbazole group, or a carbazole group substituted with an aryl group having 6 to 30 ring-forming carbon atoms. $L_b$ is a direct linkage (e.g., a single covalent bond), a substituted or unsubstituted arylene group having 6 to 30 ring-forming carbon atoms, or a substituted or unsubstituted heteroarylene group having 2 to 30 ring-forming carbon atoms. In one or more embodiments, b is an integer of 0 to 10, and when b is an integer of 2 or more, a plurality of $L_b$'s may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a and/or the compound represented by Formula E-2b may be represented by any one selected from among the compounds of Compound Group E-2 below. However, the compounds listed in Compound Group E-2 below are examples, the compound represented by Formula E-2a and/or the compound represented by Formula E-2b are not limited to those represented by Compound Group E-2 below.

[Compound Group E-2]

E-2-1

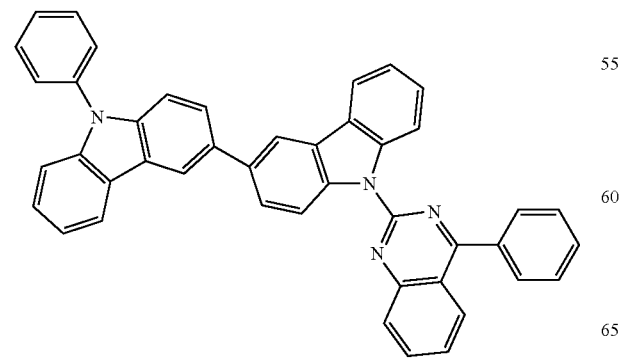

E-2-2

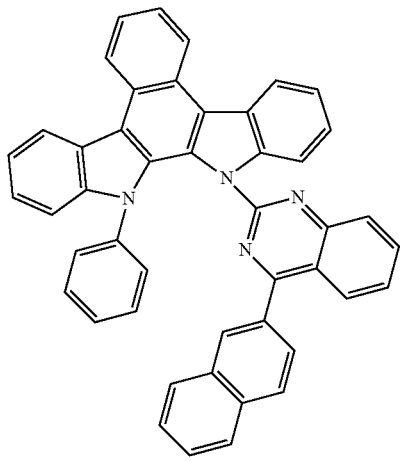

E-2-3

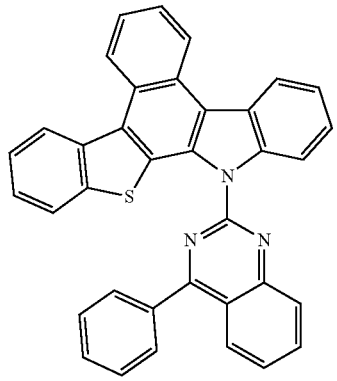

E-2-4

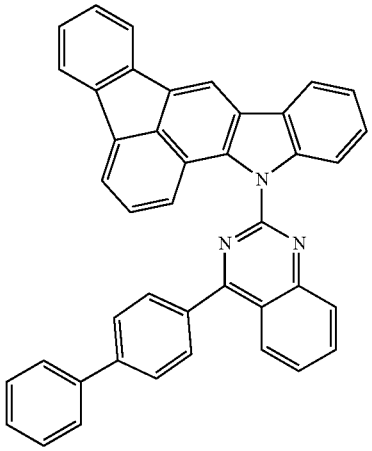

-continued
E-2-5
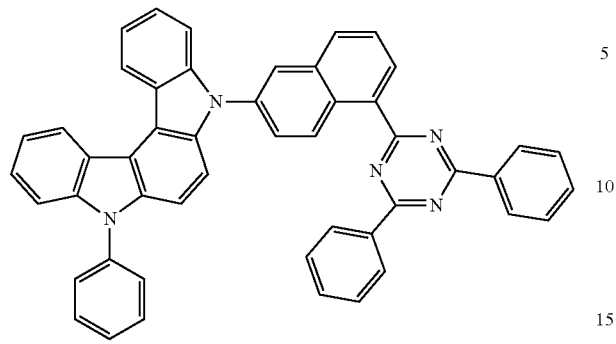
E-2-6
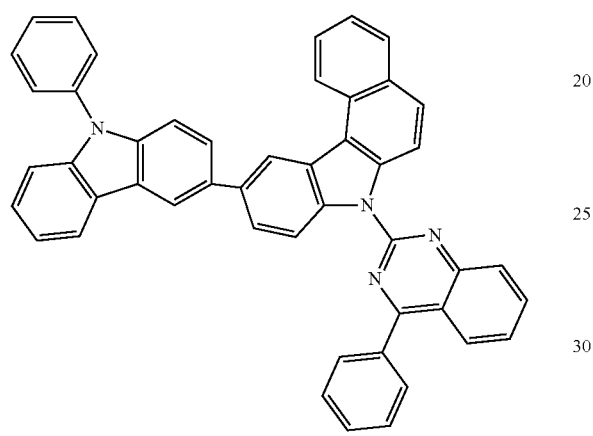
E-2-7
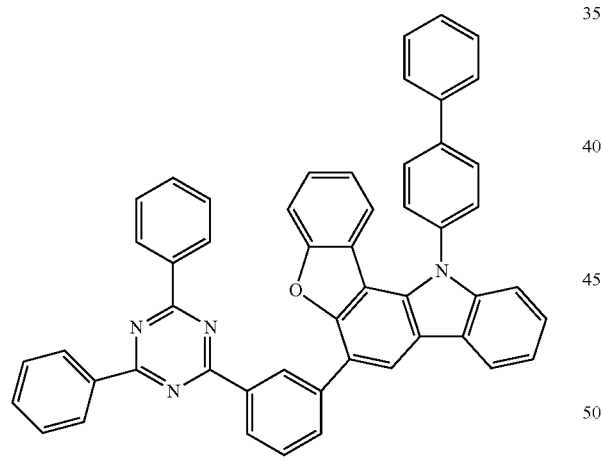
E-2-8
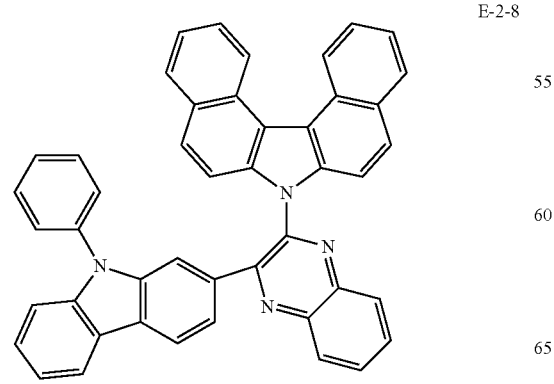
-continued
E-2-9
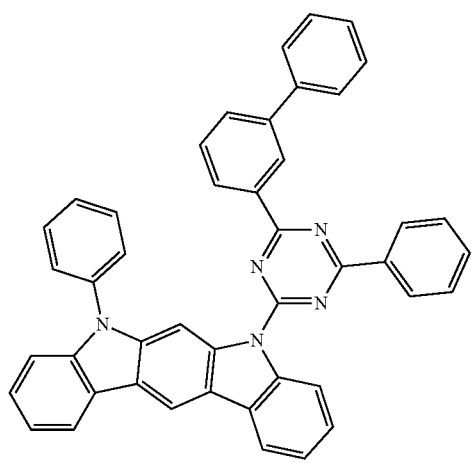
E-2-10
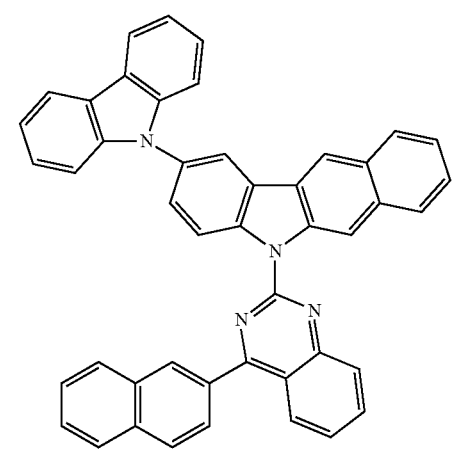
E-2-11
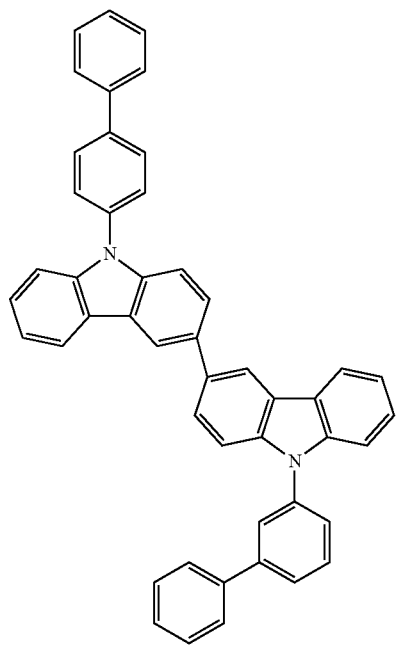

E-2-12
E-2-13
E-2-14
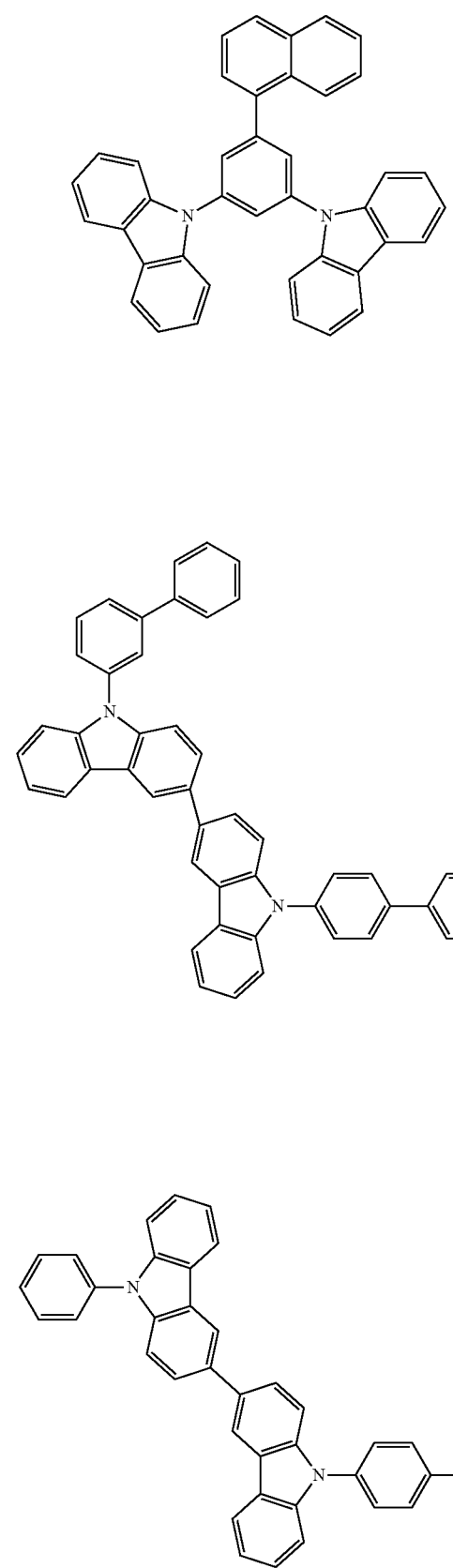
E-2-15
E-2-16
E-2-17
E-2-18
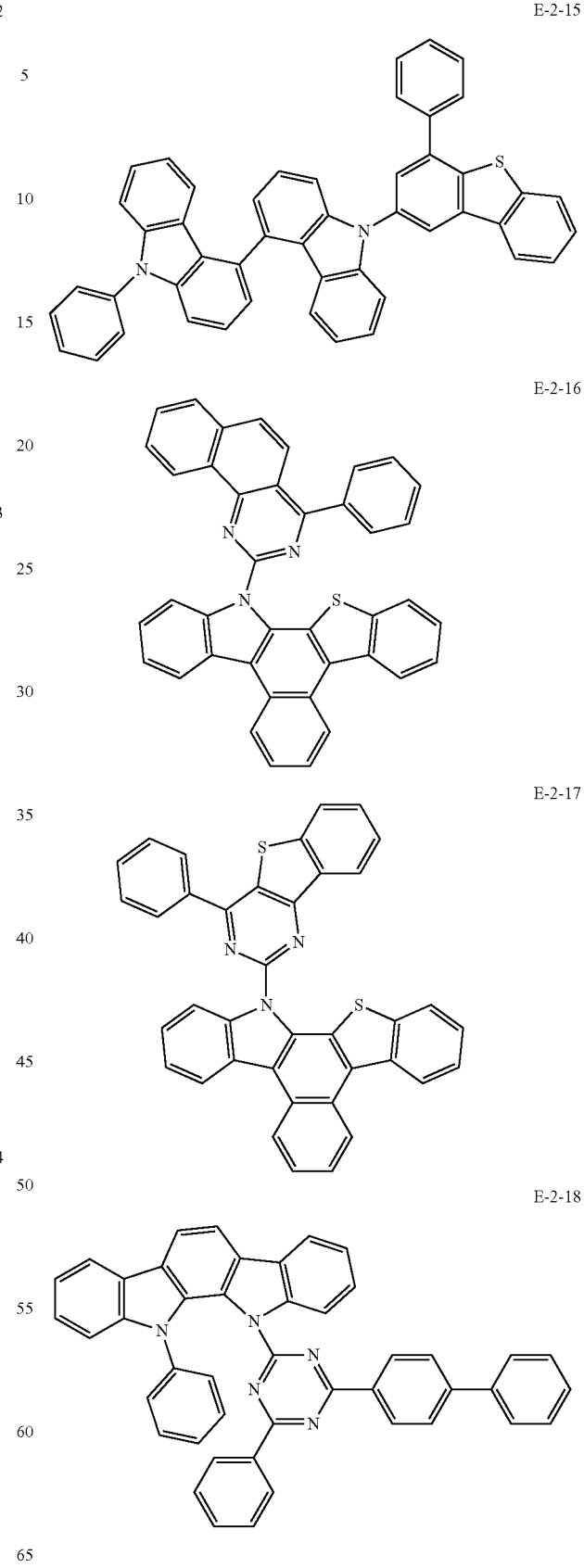

E-2-19
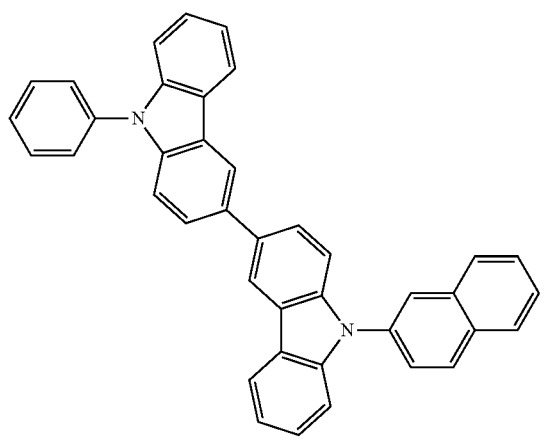

E-2-20
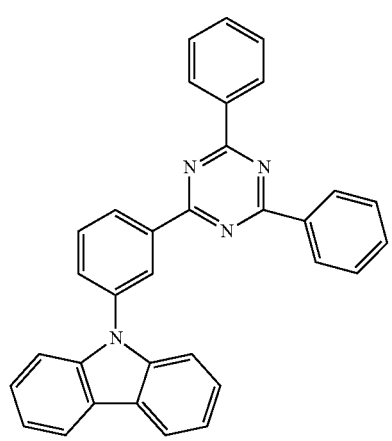

E-2-21
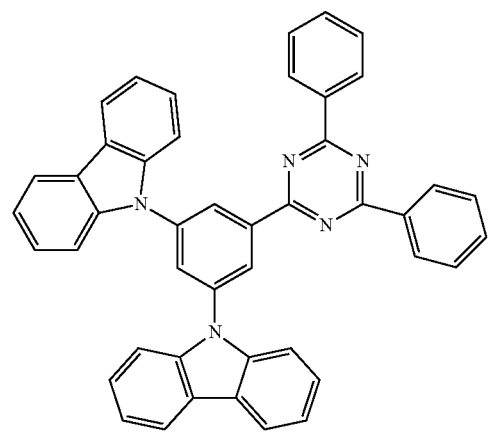

E-2-22
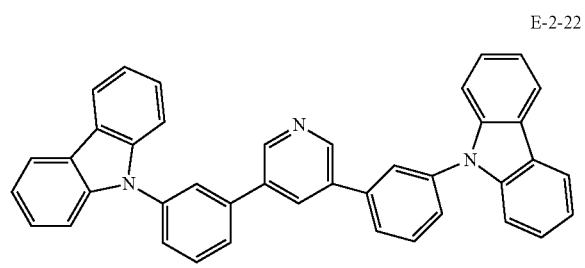

E-2-23
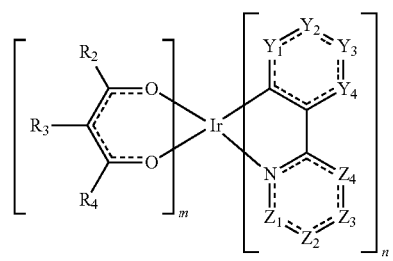

The emission layer EML may further include any suitable material generally used in the art as a host material. For example, the emission layer EML may include, as a host material, at least one selected from bis[2-(diphenylphosphino)phenyl]ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)-triphenylamine (TCTA), and 1,3,5-tris (1-phenyl-1H-benzo[d]imidazole-2-yl)benzene (TPBi). However, the embodiment of the present disclosure is not limited thereto, and for example, tris(8-hydroxyquinolino) aluminum ($Alq_3$), 4poly(n-vinylcabazole) (PVK), 9,10-di (naphthalen-2-yl)anthracene (ADN), 2-tert-butyl-9,10-di (naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenylcyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as a host material.

The emission layer EML may include a compound represented by Formula M-a and/or a compound represented by Formula M-b below. The compound represented by Formula M-a and/or the compound represented by Formula M-b below may be used as a phosphorescence dopant material.

[Formula M-a]

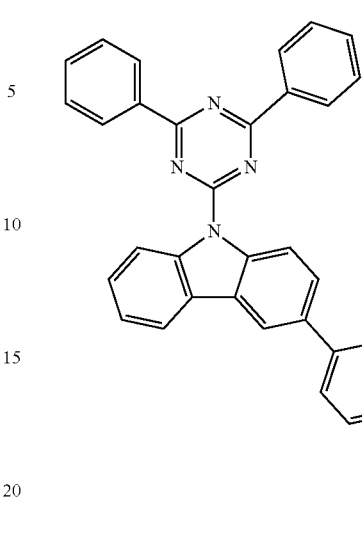

In Formula M-a above, $Y_1$ to $Y_4$ and $Z_1$ to $Z_4$ may be each independently $CR_1$ or N, $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and, optionally, may be bonded to an adjacent group to form a ring. In Formula M-a, m is 0 or 1, and n is 2 or 3. In Formula M-a, when m is 0, n is 3, and when m is 1, n is 2.

The compound represented by Formula M-a may be used as a red phosphorescence dopant or a green phosphorescence dopant.

The compound represented by Formula M-a may be represented by any one selected from among Compound M-a1 to Compound M-a19 below. However, Compounds M-a1 to M-a19 below are examples, and the compound represented by Formula M-a is not limited to those represented by Compounds M-a1 to M-a19 below.

M-a1
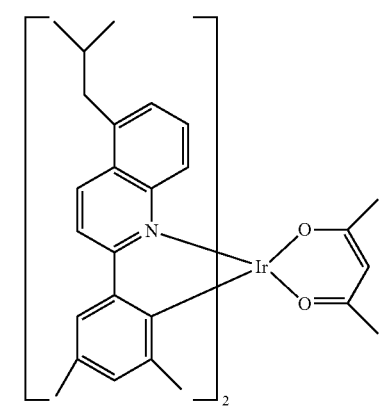

M-a2
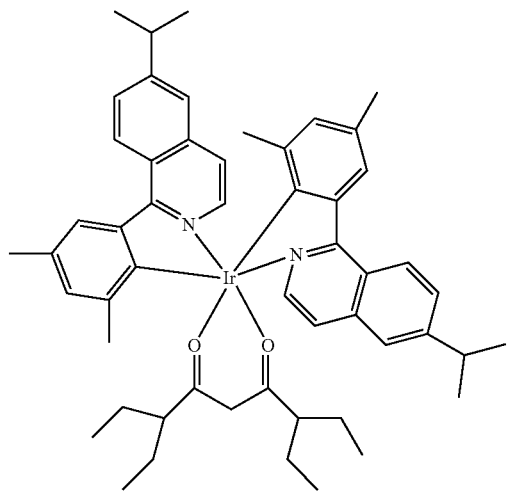

M-a3
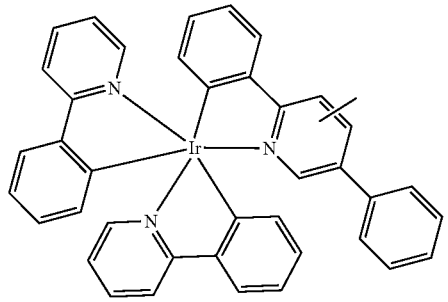

M-a4
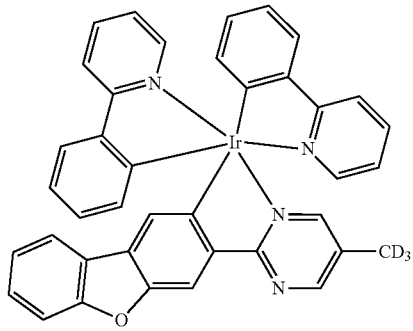

M-a5
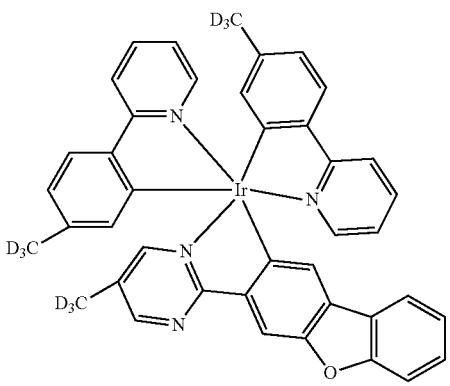

M-a6
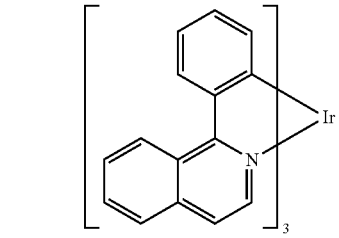

M-a7
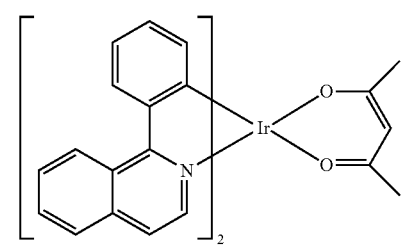

M-a8
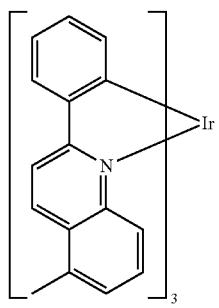
M-a9
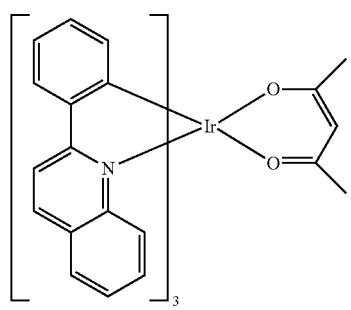
M-a10
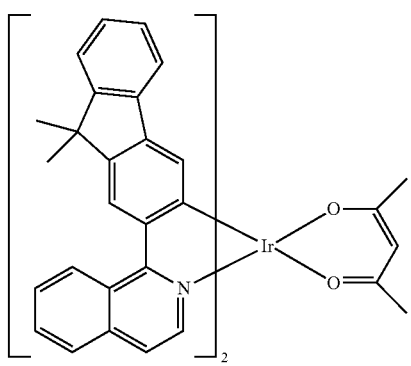
M-a11
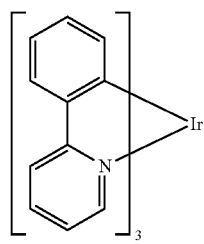
M-a12
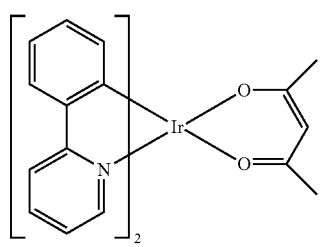
M-a13
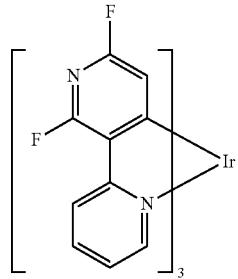
M-a14
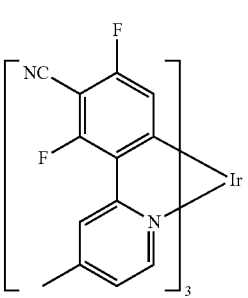
M-a15
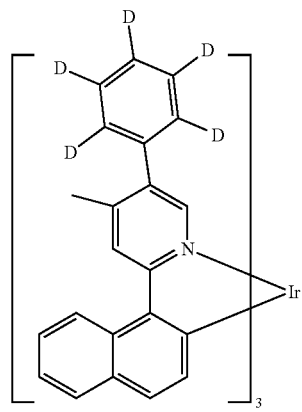
M-a16

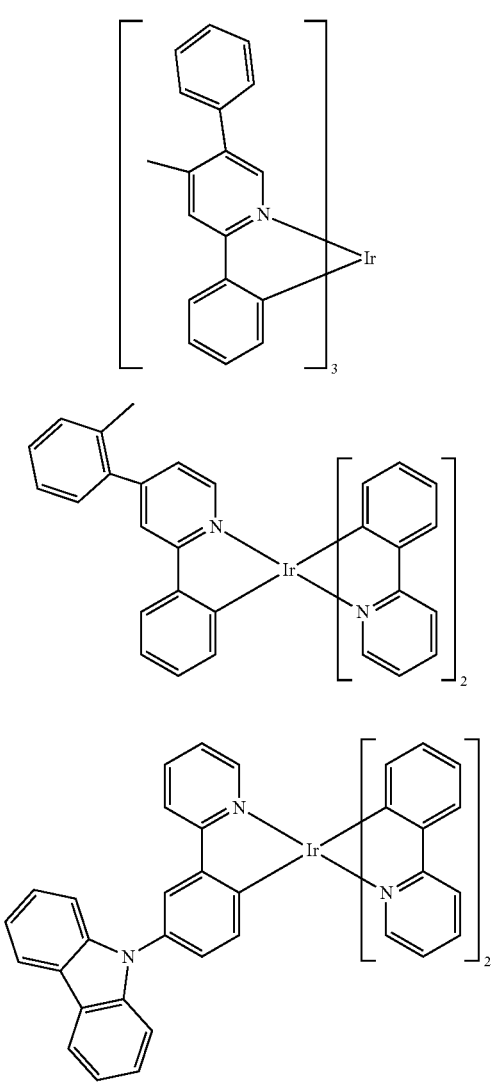

M-a17

M-a18

M-a19

Compound M-a1 and Compound M-a2 may be used as a red dopant material, and Compound M-a3 to Compound M-a5 may be used as a green dopant material.

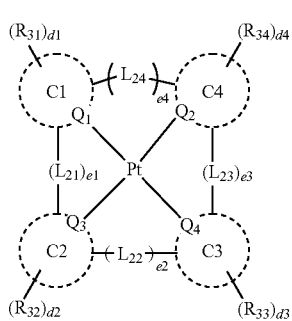

[Formula M-b]

In Formula M-b, $Q_1$ to $Q_4$ are each independently C or N, and $C_1$ to $C_4$ are each independently a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ are each independently a direct linkage (e.g., a single covalent bond), *—O—*, *—S—*,

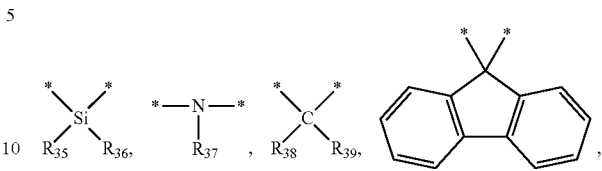

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and, optionally, are bonded to an adjacent group to form a ring, and d1 to d4 are each independently an integer of 0 to 4.

The compound represented by Formula M-b may be used as a blue phosphorescence dopant or a green phosphorescence dopant.

The compound represented by Formula M-b may be represented by any one selected from among the compounds below. However, the compounds below are examples, and the compound represented by Formula M-b is not limited to those represented by the compounds below.

M-b-1

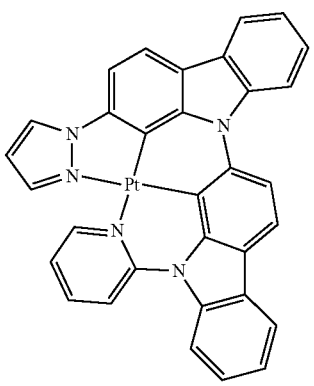

M-b-2

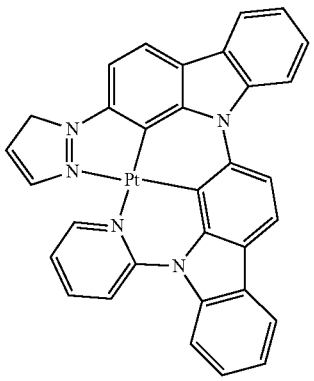

M-b-3
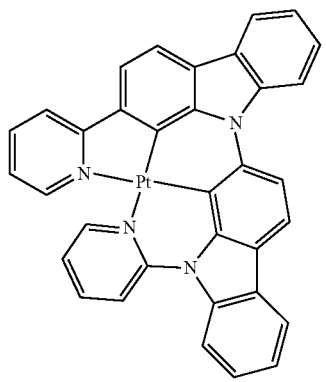
M-b-4
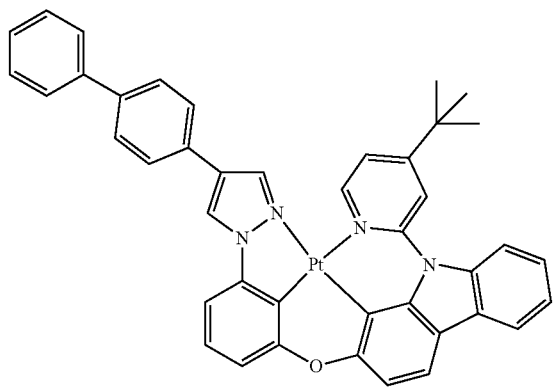
M-b-5
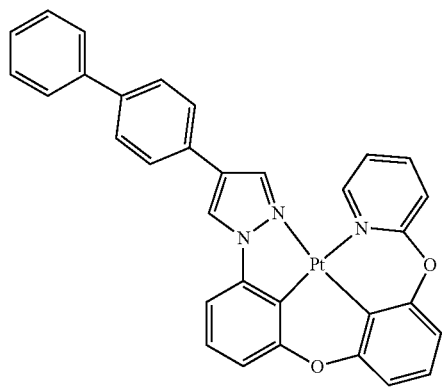
M-b-6
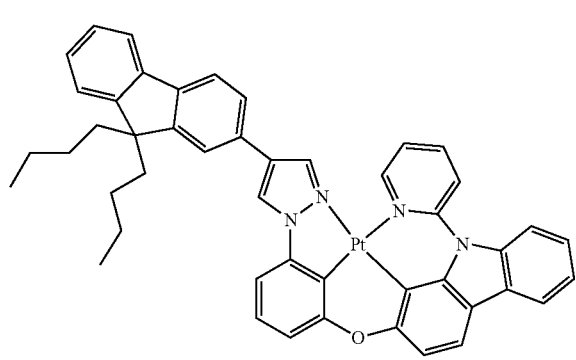
M-b-7
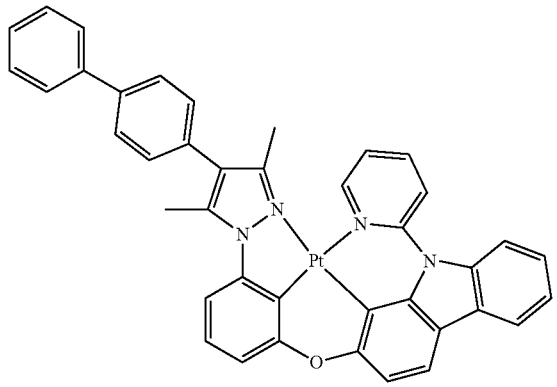
M-b-8
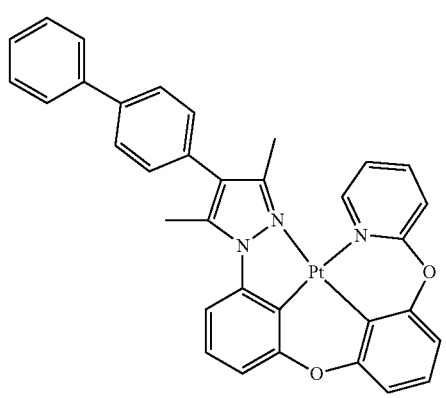
M-b-9
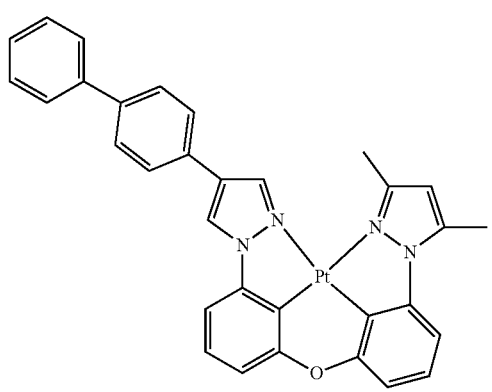
M-b-10
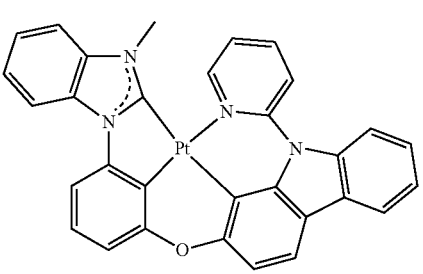

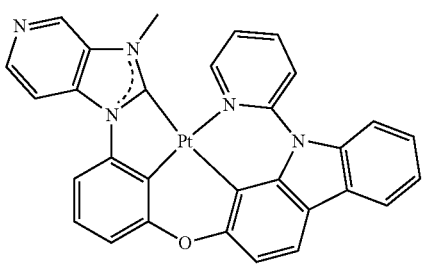

M-b-12

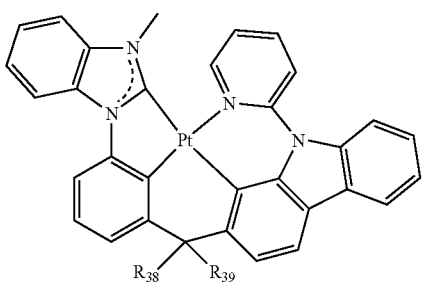

M-b-13

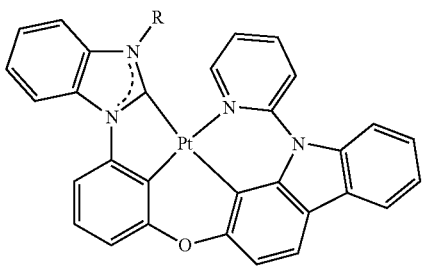

M-b-14

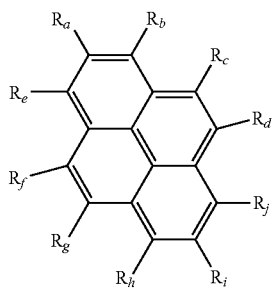

In the compounds, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one selected from among Formula F-a to Formula F-c below. The compound represented by Formula F-a or Formula F-c below may be used as a fluorescence dopant material.

[Formula F-a]

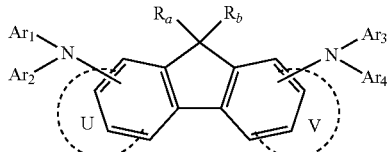

In Formula F-a, two selected from among $R_a$ to $R_j$ may be each independently substituted with *—$NAr_1Ar_2$. The rest, which are not substituted with *—$NAr_1Ar_2$, among $R_a$ to $R_j$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, at least one selected from $Ar_1$ and $Ar_2$ may be a heteroaryl group containing O or S as a ring-forming atom.

[Formula F-b]

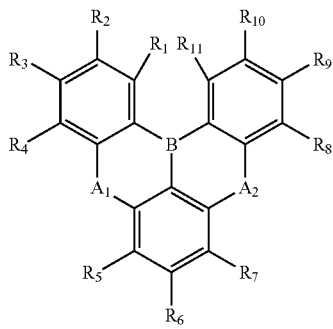

In Formula F-b, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and, optionally, may be bonded to an adjacent group to form a ring.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, in Formula F-b, it means that when the number of U or V is 1, one ring forms a condensed ring at a part described as U or V, and when the number of U or V is 0, a ring described as U or V is not present. In one or more embodiments, when the number of U is 0 and the number of V is 1, or when the number of U is 1 and the number of V is 0, the condensed ring having a fluorene core of Formula F-b may be a four-ring cyclic compound. In addition, when each number of U and V is 0, the condensed ring of Formula F-b may be a three-ring cyclic compound. In addition, when each number of U and V is 1, the condensed ring having a fluorene core of Formula F-b may be a five-ring cyclic compound.

[Formula F-c]

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and, optionally, are bonded to an adjacent group to form a ring.

In Formula F-c, $A_1$ and $A_2$ may be each independently bonded to substituents of an adjacent ring to form a condensed ring. For example, when $A_1$ and $A_2$ are each independently $NR_m$, $A_1$ may be bonded to $R_4$ or $R_5$ to form a ring. In addition, $A_2$ may be bonded to $R_7$ or $R_8$ to form a ring.

In an embodiment, the emission layer EML may include, as a dopant material, styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), 4,4'-bis[2-(4-(N,N-diphenylamino)phenyl)vinyl]biphenyl (DPAVBi), perylene and/or derivatives thereof (e.g., 2,5,8,11-tetra-t-butylperylene (TBP)), pyrene and/or derivatives thereof (e.g., 1,1-dipyrene, 1,4-dipyrenylbenzene, and/or 1,4-bis(N,N-diphenylamino)pyrene), etc.

The emission layer EML may include any suitable phosphorescence dopant material generally used in the art. For example, a metal complex including iridium (Ir), platinum (Pt), osmium (Os), aurum (Au), titanium (Ti), zirconium (Zr), hafnium (Hf), europium (Eu), terbium (Tb), and/or thulium (Tm) may be used as a phosphorescence dopant. In one or more embodiments, iridium(III) bis(4,6-difluorophenylpyridinato-N,C2') (Flrpic), bis(2,4-difluorophenylpyridinato)-tetrakis(1-pyrazolyl)borate iridium(III) (Fir6), and/or platinum octaethyl porphyrin (PtOEP) may be used as a phosphorescence dopant. However, the embodiment of the present disclosure is not limited thereto.

The emission layer EML may include a quantum dot material. The core of the quantum dot may be selected from among a Group II-VI compound, a Group III-VI compound, a Group I-III-VI compound, a Group III-V compound, a Group III-II-V compound, a Group IV-VI compound, a Group IV element, a Group IV compound, and a combination thereof.

A Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

A Group I-III-VI compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and a mixture thereof, and/or a quaternary compound such as $AgInGaS_2$ and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In one or more embodiments, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, and/or a quaternary compound may be present in particles in a uniform (e.g., substantially uniform) concentration distribution, or may be present in the same particle in a partially different concentration distribution. In addition, the quantum dot may have a core/shell structure in which one quantum dot surrounds another quantum dot. An interface between the core and the shell may have a concentration gradient in which the concentration of an element present in the shell becomes lower along a direction toward the center of the core.

In some embodiments, a quantum dot may have the above-described core-shell structure including a core having nanocrystals and a shell surrounding the core. The shell of the quantum dot may serve as a protection layer to prevent or reduce chemical deformation of the core so as to maintain semiconductor properties, and/or a charging layer to impart electrophoresis properties to the quantum dot. The shell may be a single layer or a multilayer. An interface between the core and the shell may have a concentration gradient in which the concentration of an element present in the shell becomes lower along a direction towards the center of the core.

An example of the shell of the quantum dot may include a metal and/or non-metal oxide, a semiconductor compound, or a combination thereof.

For example, the metal and/or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound such as $MgAl_2O_4$, $CoFe_2O_4$, $NiFe_2O_4$, and/or $CoMn_2O_4$, but the present disclosure is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the present disclosure is not limited thereto.

The quantum dot may have a full width of half maximum (FWHM) of a light emission wavelength spectrum of about 45 nm or less, about 40 nm or less, or, for example, about 30 nm or less, and color purity and/or color reproducibility may be improved in the above range. In addition, light emitted through such a quantum dot is emitted in all directions, and thus a wide viewing angle may be improved.

In addition, although the form of a quantum dot is not particularly limited as long as it is a form generally used in the art. For example, a quantum dot in the form of spherical, pyramidal, multi-arm, and/or cubic nanoparticles, nanotubes, nanowires, nanofibers, nanoparticles, etc. may be used.

A quantum dot may control the color of emitted light according to the particle size thereof and thus the quantum dot may have various suitable light emission colors such as green, red, etc.

In each light emitting element ED of embodiments illustrated in FIGS. 1 to 4, the electron transport region ETR is provided on the emission layer EML. The electron transport region ETR may include at least one selected from the hole blocking layer HBL, the electron transport layer ETL, and the electron injection layer EIL, but the embodiment of the present disclosure is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but the embodiment of the present disclosure is not limited thereto. The thickness of the electron transport region ETR may be, for example, from about 1,000 Å to about 1,500 Å.

The electron transport region ETR may be formed by using various suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

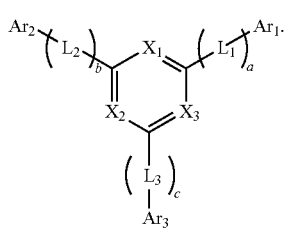

[Formula ET-1]

In Formula ET-1, at least one selected from among $X_1$ to $X_3$ is N, and the others are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage (e.g., a single covalent bond), a substituted or unsubstituted arylene group having 6 to 30 ring-forming carbon atoms, or a substituted or unsubstituted heteroarylene group having 2 to 30 ring-forming carbon atoms. In one or more embodiments, when a to c are an integer of 2 or greater, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl) phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq$_2$), 9,10-di(naphthalene-2-yl)anthracene (ADN), 1,3-Bis[3,5-di(pyridin-3-yl)phenyl]benzene (BmPyPhB), or a mixture thereof.

In addition, the electron transport regions ETR may include a metal halide such as LiF, NaCl, CsF, RbCl, RbI, CuI, and/or KI, a lanthanide metal such as Yb, and/or a co-deposited material of the metal halide and the lanthanide metal. For example, the electron transport region ETR may include KI:Yb, RbI:Yb, etc. as a co-deposited material. In one or more embodiments, the electron transport region ETR may be formed using a metal oxide such as $Li_2O$ and/or BaO, and/or 8-hydroxyl-lithium quinolate (Liq), etc., but the embodiment of the present disclosure is not limited thereto.

The electron transport region ETR may also be formed of a mixture material of an electron transport material and an insulating organometallic salt. The organometallic salt may be a material having an energy band gap of about 4 eV or more. For example, the organometallic salt may include, for example, metal acetates, metal benzoates, metal acetoacetates, metal acetylacetonates, and/or metal stearates.

The electron transport region ETR may further include at least one selected from 2,9-dimethyl-4,7-diphenyl-1,10-phenanthroline (BCP), and 4,7-diphenyl-1,10-phenanthroline (Bphen) in addition to the above-described materials, but the embodiment of the present disclosure is not limited thereto.

The electron transport region ETR may include the above-described compounds of the hole transport region in at least one selected from the electron injection layer EIL, the electron transport layer ETL, and the hole blocking layer HBL.

When the electron transport region ETR includes the electron transport layer ETL, the electron transport layer ETL may have a thickness of about 100 Å to about 1,000 Å, for example, about 150 Å to about 500 Å. If the thickness of the electron transport layer ETL satisfies the above-described range, suitable or satisfactory electron transport characteristics may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. If the thickness of the electron injection layer EIL satisfies the above-described range, suitable or satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but the embodiment of the present disclosure is not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, and/or mixture thereof (e.g., AgMg, AgYb, and/or MgYb). In one or more embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

In one or more embodiments, the second electrode EL2 may be coupled with an auxiliary electrode. If the second electrode EL2 is coupled with the auxiliary electrode, the resistance of the second electrode EL2 may decrease.

In one or more embodiments, the capping layer CPL may further be on the second electrode EL2 of the light emitting element ED of an embodiment. The capping layer CPL may include a multilayer or a single layer. In an embodiment, the capping layer CPL may include the above-described amine compound of an embodiment.

In an embodiment, the capping layer CPL may be an organic layer and/or an inorganic layer. For example, when the capping layer CPL includes an inorganic material, the inorganic material may include an alkaline metal compound such as LiF, an alkaline earth metal compound such as $MgF_2$, SiON, SiNx, SiOy, etc.

For example, when the capping layer CPL includes an organic material, the organic material may include α-NPD, NPB, TPD, m-MTDATA, $Alq_3$, CuPc, N4,N4,N4',N4'-tetra(biphenyl-4-yl)biphenyl-4,4'-diamine (TPD15), 4,4',4"-tris(carbazol sol-9-yl)triphenylamine (TCTA), etc., an epoxy resin, and/or acrylate such as methacrylate. However, the embodiment of the present disclosure is not limited thereto, and the capping layer CPL may include at least one selected from among Compounds P1 to P5 below:

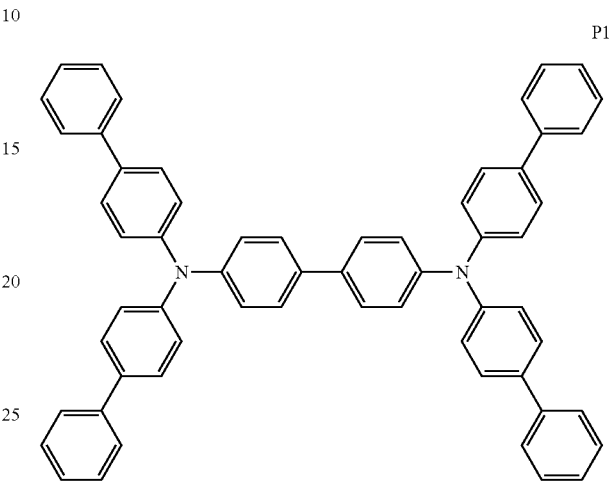

P1

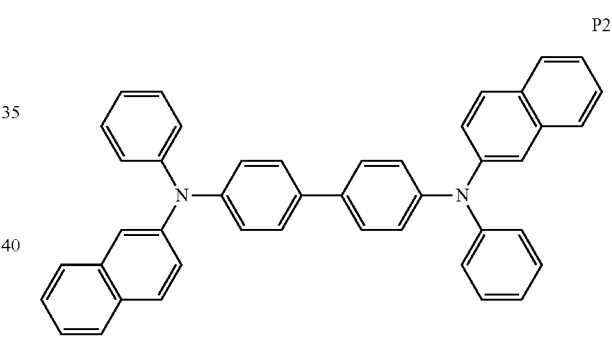

P2

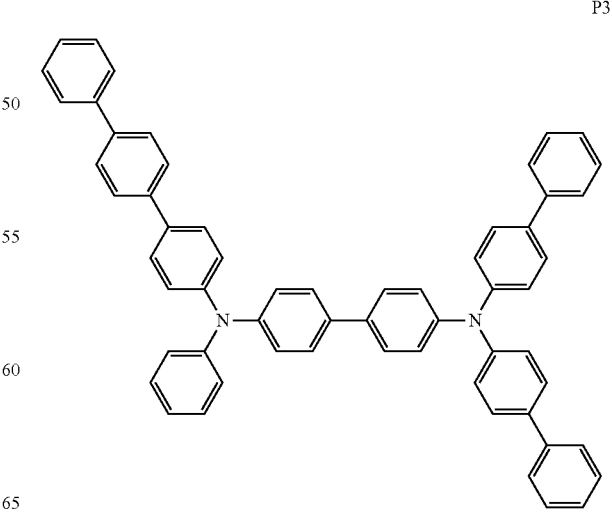

P3

-continued

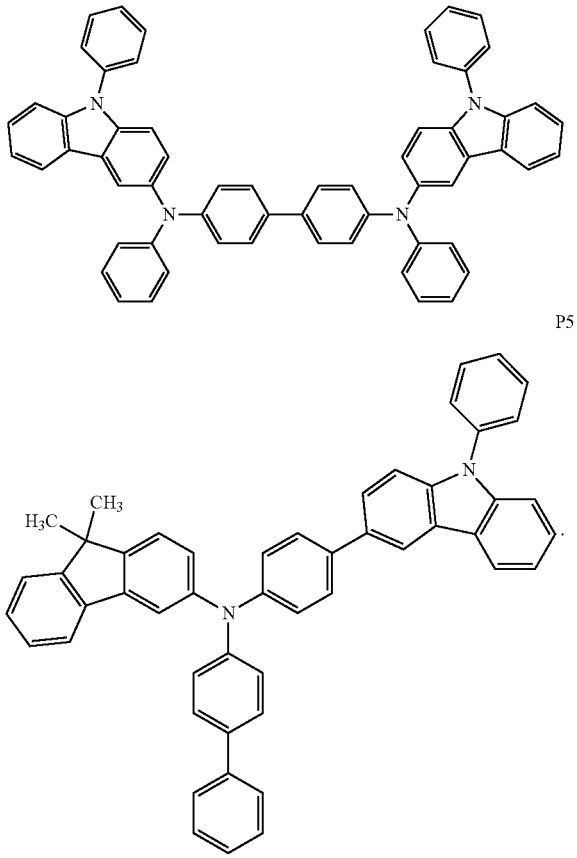

In one or more embodiments, the refractive index of the capping layer CPL may be about 1.6 or more. For example, the refractive index of the capping layer CPL may be about 1.6 or more with respect to light in a wavelength range of about 550 nm to about 660 nm.

Figure 7:
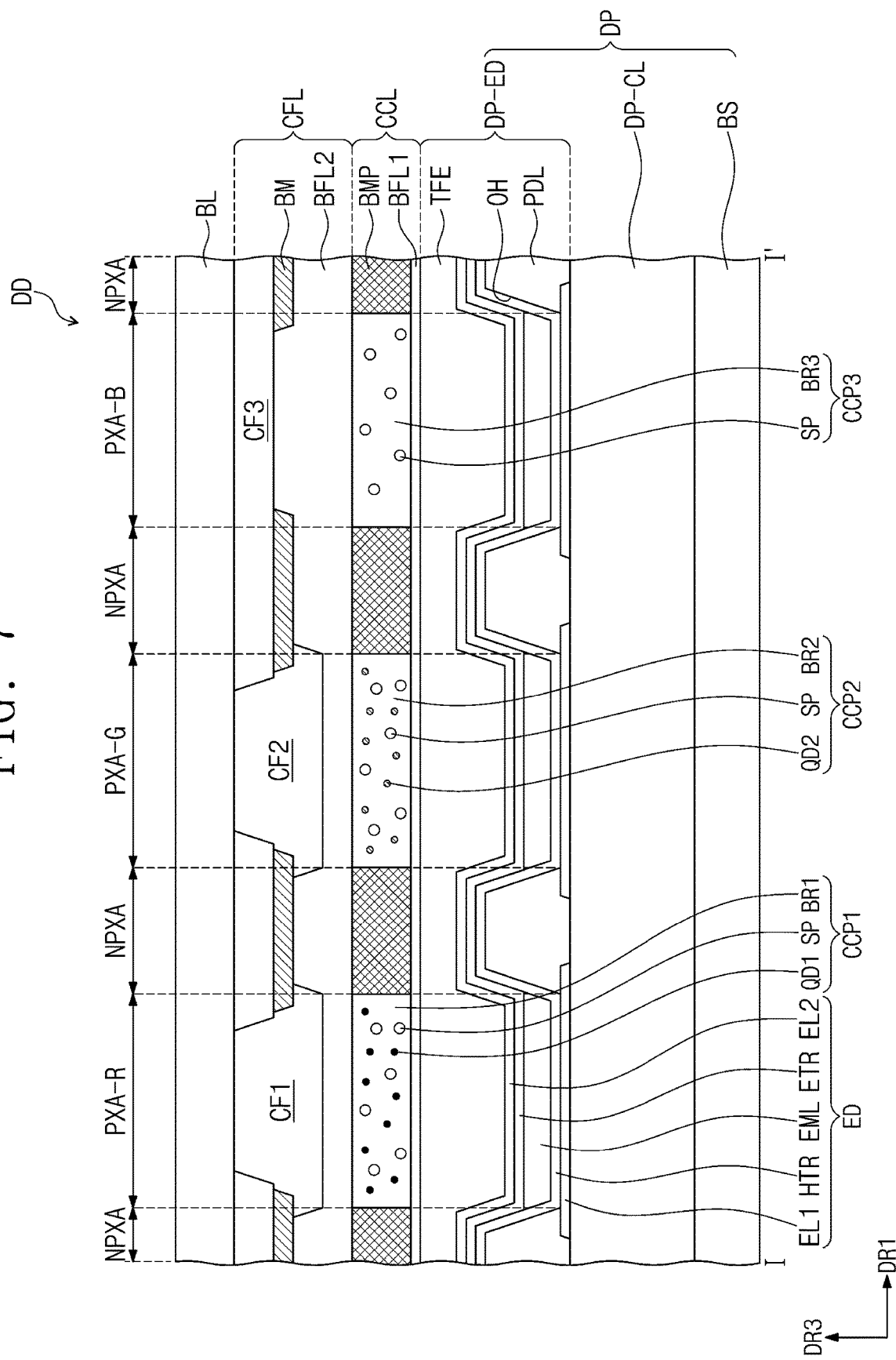
FIG. 7 is a cross-sectional view of a display device according to an embodiment of the present disclosure.
Figure 8:
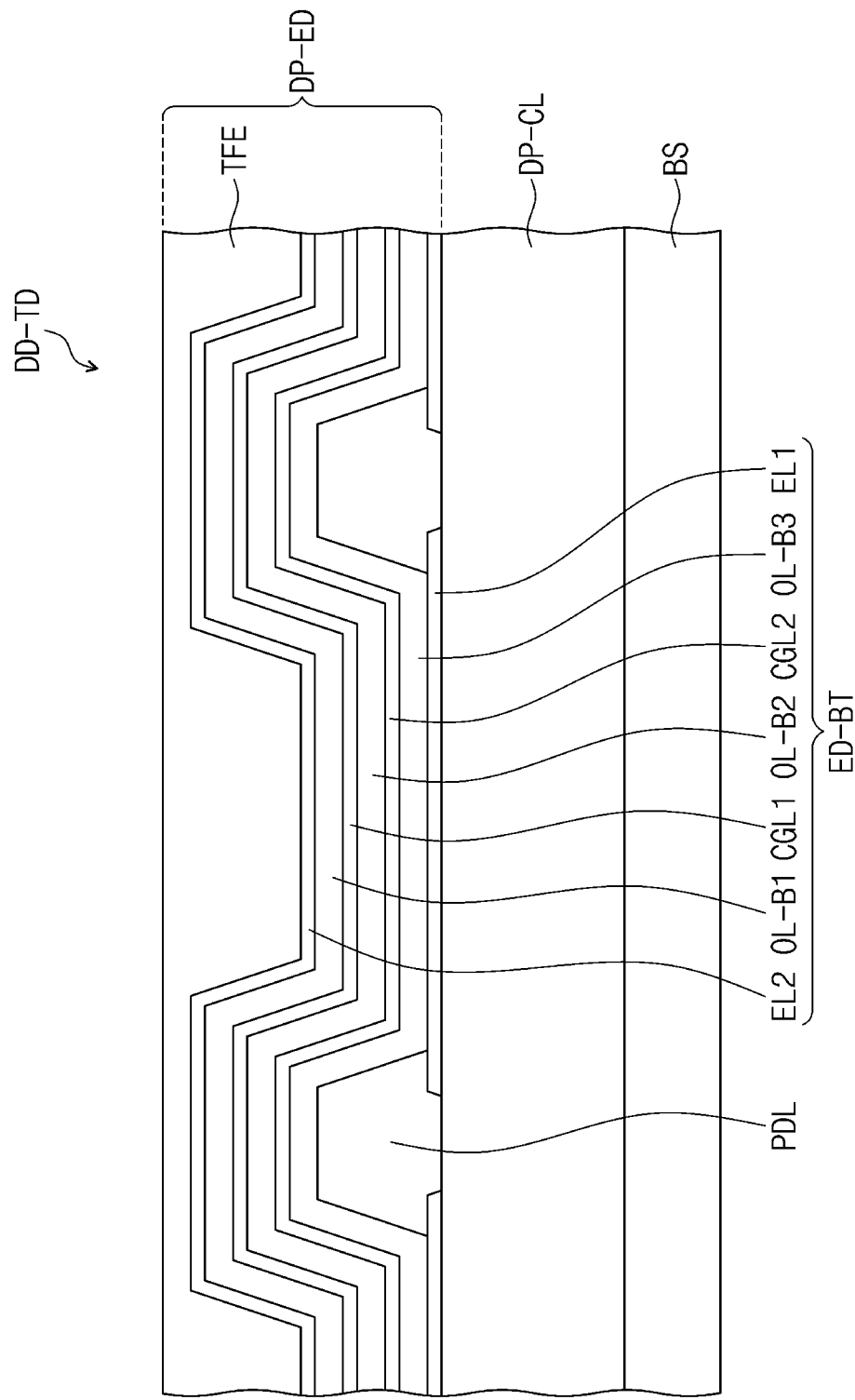
FIG. 8 is a cross-sectional view of a display device according to an embodiment of the present disclosure.

FIGS. 7 and 8 each are a cross-sectional view of a display device according to an embodiment. Hereinafter, in describing the display device of an embodiment with reference to FIGS. 7 and 8, the duplicated features which have been described in FIGS. 1 to 6 are not described again, but their differences will be mainly described.

Referring to FIG. 7, the display device DD according to an embodiment may include a display panel DP including a display element layer DP-ED, a light control layer CCL on the display panel DP, and a color filter layer CFL.

In an embodiment illustrated in FIG. 7, the display panel DP may include a base layer BS, a circuit layer DP-CL provided on the base layer BS, and the display element layer DP-ED, and the display element layer DP-ED may include a light emitting element ED.

The light emitting element ED may include a first electrode EL1, a hole transport region HTR on the first electrode EL1, an emission layer EML on the hole transport region HTR, an electron transport region ETR on the emission layer EML, and a second electrode EL2 on the electron transport region ETR. For example, the structures of the light emitting elements of FIGS. 3 to 6 as described above may be equally applied to the structure of the light emitting element ED shown in FIG. 7.

Referring to FIG. 7, the emission layer EML may be in an opening OH defined in a pixel defining film PDL. For example, the emission layer EML which is divided by the pixel defining film PDL and provided corresponding to each light emitting regions PXA-R, PXA-G, and PXA-B may emit light in the same wavelength range. In the display device DD of an embodiment, the emission layer EML may emit blue light. In one or more embodiments, the emission layer EML may be provided as a common layer in the entire light emitting regions PXA-R, PXA-G, and PXA-B.

The light control layer CCL may be on the display panel DP. The light control layer CCL may include a light conversion body. The light conversion body may be a quantum dot, a phosphor, and/or the like. The light conversion body may emit provided light by converting the wavelength thereof. In one or more embodiments, the light control layer CCL may include a layer containing the quantum dot and/or a layer containing the phosphor.

The light control layer CCL may include a plurality of light control units CCP1, CCP2 and CCP3. The light control units CCP1, CCP2, and CCP3 may be spaced apart from one another.

Referring to FIG. 7, divided patterns BMP may be between the light control units CCP1, CCP2 and CCP3 which are spaced apart from each other, but the embodiment of the present disclosure is not limited thereto. FIG. 7 illustrates that the divided patterns BMP do not overlap the light control units CCP1, CCP2 and CCP3, but at least a portion of the edges of the light control units CCP1, CCP2 and CCP3 may overlap the divided patterns BMP.

The light control layer CCL may include a first light control unit CCP1 containing a first quantum dot QD1 which converts a first color light provided from the light emitting element ED into a second color light, a second light control unit CCP2 containing a second quantum dot QD2 which converts the first color light into a third color light, and a third light control unit CCP3 which transmits the first color light.

In an embodiment, the first light control unit CCP1 may provide red light that is the second color light, and the second light control unit CCP2 may provide green light that is the third color light. The third light control unit CCP3 may transmit blue light that is the first color light provided by the light-emitting element ED. For example, the first quantum dot QD1 may be a red quantum dot, and the second quantum dot QD2 may be a green quantum dot. The same as described above may be applied with respect to the quantum dots QD1 and QD2.

In addition, the light control layer CCL may further include a scatterer SP (e.g., a light scatterer SP). The first light control unit CCP1 may include the first quantum dot QD1 and the scatterer SP, the second light control unit CCP2 may include the second quantum dot QD2 and the scatterer SP, and the third light control unit CCP3 may not include any quantum dot but may instead include the scatterer SP.

The scatterer SP may be inorganic particles. For example, the scatterer SP may include at least one selected from $TiO_2$, ZnO, $Al_2O_3$, $SiO_2$, and hollow silica. The scatterer SP may include any one selected from $TiO_2$, ZnO, $Al_2O_3$, $SiO_2$, and hollow silica, or may be a mixture of at least two materials selected from among $TiO_2$, ZnO, $Al_2O_3$, $SiO_2$, and hollow silica.

The first light control unit CCP1, the second light control unit CCP2, and the third light control unit CCP3 each may include base resins BR1, BR2, and BR3 in which the quantum dots QD1 and QD2 and the scatterer SP are dispersed. In an embodiment, the first light control unit CCP1 may include the first quantum dot QD1 and the scatterer SP dispersed in a first base resin BR1, the second light control unit CCP2 may include the second quantum dot QD2 and the scatterer SP dispersed in a second base resin BR2, and the third light control unit CCP3 may include the scatterer SP dispersed in a third base resin BR3. The base resins BR1, BR2, and BR3 are media in which the quantum dots QD1 and QD2 and the scatterer SP are dispersed, and may be formed of various suitable resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may serve to prevent or reduce penetration of moisture and/or oxygen (which may, hereinafter, be referred to as 'moisture/oxygen'). The barrier layer BFL1 may be on the light control units CCP1, CCP2, and CCP3 to block or reduce the exposure of the light control units CCP1, CCP2 and CCP3 to moisture/oxygen. In one or more embodiments, the barrier layer BFL1 may cover the light control units CCP1, CCP2, and CCP3. In addition, the barrier layer BFL1 may be provided between the light control units CCP1, CCP2, and CCP3 and the color filter layer CFL.

The barrier layers BFL1 and BFL2 may include at least one inorganic layer. In one or more embodiments, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. In one or more embodiments, the barrier layers BFL1 and BFL2 may further include an organic film. The barrier layers BFL1 and BFL2 may be formed of a single layer or a plurality of layers.

In the display device DD of an embodiment, the color filter layer CFL may be on the light control layer CCL. For example, the color filter layer CFL may be directly on the light control layer CCL. In this case, the barrier layer BFL2 may be omitted.

The color filter layer CFL may include a light shielding unit BM and filters CF-B, CF-G, and CF-R. The color filter layer CFL may include a first filter CF1 that transmits the second color light, a second filter CF2 that transmits the third color light, and a third filter CF3 that transmits the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment and/or dye. The first filter CF1 may include a red pigment and/or dye, the second filter CF2 may include a green pigment and/or dye, and the third filter CF3 may include a blue pigment and/or dye. In one or more embodiments, the embodiment of the present disclosure is not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

Furthermore, in an embodiment, the first filter CF1 and the second filter CF2 may be a yellow filter. The first filter CF1 and the second filter CF2 may not be separated but be provided as one filter.

The light shielding unit BM may be a black matrix. The light shielding unit BM may include an organic light shielding material and/or an inorganic light shielding material containing a black pigment and/or dye. The light shielding unit BM may prevent or reduce light leakage, and may separate boundaries between the adjacent filters CF1, CF2, and CF3. In addition, in an embodiment, the light shielding unit BM may be formed of a blue filter.

The first to third filters CF1, CF2, and CF3 may correspond to the red light emitting region PXA-R, the green light emitting region PXA-G, and the blue light emitting region PXA-B, respectively.

A base substrate BL may be on the color filter layer CFL. The base substrate BL may be a member which provides a base surface in which the color filter layer CFL, the light control layer CCL, and the like are located. The base substrate BL may be a glass substrate, a metal substrate, a plastic substrate, etc. However, the embodiment of the present disclosure is not limited thereto, and the base substrate BL may be an inorganic layer, an organic layer, or a composite material layer including an inorganic material and an organic material. In one or more embodiments, the base substrate BL may be omitted.

FIG. 8 is a cross-sectional view illustrating a part of a display device according to an embodiment. FIG. 8 illustrates a cross-sectional view of a part corresponding to the display panel DP of FIG. 7. In the display device DD-TD of an embodiment, the light emitting element ED-BT may include a plurality of light emitting structures OL-B1, OL-B2, and OL-B3. The light emitting element ED-BT may include a first electrode EL1 and a second electrode EL2 which face each other, and the plurality of light emitting structures OL-B1, OL-B2, and OL-B3 sequentially stacked in the thickness direction between the first electrode EL1 and the second electrode EL2. The light emitting structures OL-B1, OL-B2, and OL-B3 each may include an emission layer EML (FIG. 7) and a hole transport region HTR and an electron transport region ETR together with the emission layer EML (FIG. 7) therebetween.

In one or more embodiments, the light emitting element ED-BT included in the display device DD-TD of an embodiment may be a light emitting element having a tandem structure and including a plurality of emission layers.

In an embodiment illustrated in FIG. 8, each light emitted from each of the light emitting structures OL-B1, OL-B2, and OL-B3 may be blue light. However, the embodiment of the present disclosure is not limited thereto, and the light emitted from each of the light emitting structures OL-B1, OL-B2, and OL-B3 may be in a wavelength range different from each other. For example, the light emitting element ED-BT including the plurality of light emitting structures OL-B1, OL-B2, and OL-B3 which emit light in a wavelength range different from each other may emit white light.

A charge generation layer CGL may be between the neighboring light emitting structures OL-B1, OL-B2, and OL-B3. The charge generation layer CGL may include a p-type charge generation layer and/or an n-type charge generation layer.

At least one selected from the light emitting structures OL-B1, OL-B2, and OL-B3 included in the display device DD-TD of an embodiment may contain the above-described amine compound of an embodiment.

The light emitting element ED according to an embodiment of the present disclosure may include the above-described amine compound of an embodiment in at least one functional layer between the first electrode EL1 and the second electrode EL2, thereby exhibiting improved luminous efficiency and service life characteristics. The light emitting element ED according to an embodiment may include the above-described amine compound of an embodiment in at least one selected from the hole transport region HTR between the first electrode EL1 and the second electrode EL2, the emission layer EML, and the electron transport region ETR, and/or may be included in a capping layer CPL.

For example, the amine compound according to an embodiment may be included in the hole transport region HTR of the light emitting element ED of an embodiment, and the light emitting element of an embodiment may exhibit excellent luminous efficiency and long service life characteristics.

The above-described amine compound of an embodiment has a structure in which the condensed cycle substituted with at least one deuterium atom and the amine derivative are bonded, and thus, may have excellent durability and heat resistance, thereby exhibiting improved service life characteristic. Also, the amine compound of an embodiment may have improved stability and hole transport ability of the material, thereby long service life and high efficiency characteristics of the light emitting element.

Hereinafter, with reference to Examples and Comparative Examples, an amine compound according to an embodiment of the present disclosure and a light emitting element of an embodiment of the present disclosure will be described in more detail. In addition, Examples shown below are illustrated only for the understanding of the present disclosure, and the scope of the present disclosure is not limited thereto.

EXAMPLES

1. Synthesis of Amine Compound

First, a synthetic method of an amine compound according to the present embodiment will be described in more detail by illustrating the synthetic method of Compounds 1, 6, 17, 37, 44, 50, 62, 84, 95, 115, 119, 150, and 160 of Compound Group 1. Also, in the following descriptions, the synthetic method of the amine compound is provided as an example, but the synthetic method according to an embodiment of the present disclosure is not limited to the Examples below.

Synthesis of Compound 1

Amine Compound 1 according to an example may be synthesized by, for example, the steps shown in Reaction Scheme 1 below:

Reaction Scheme 1

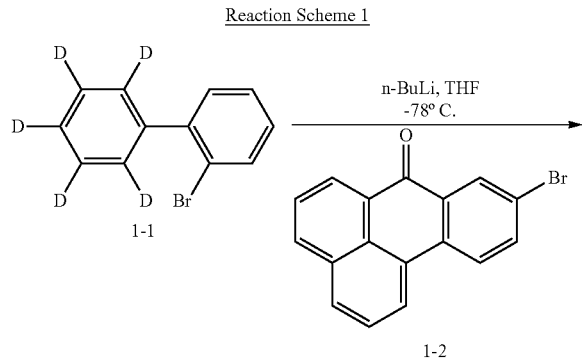

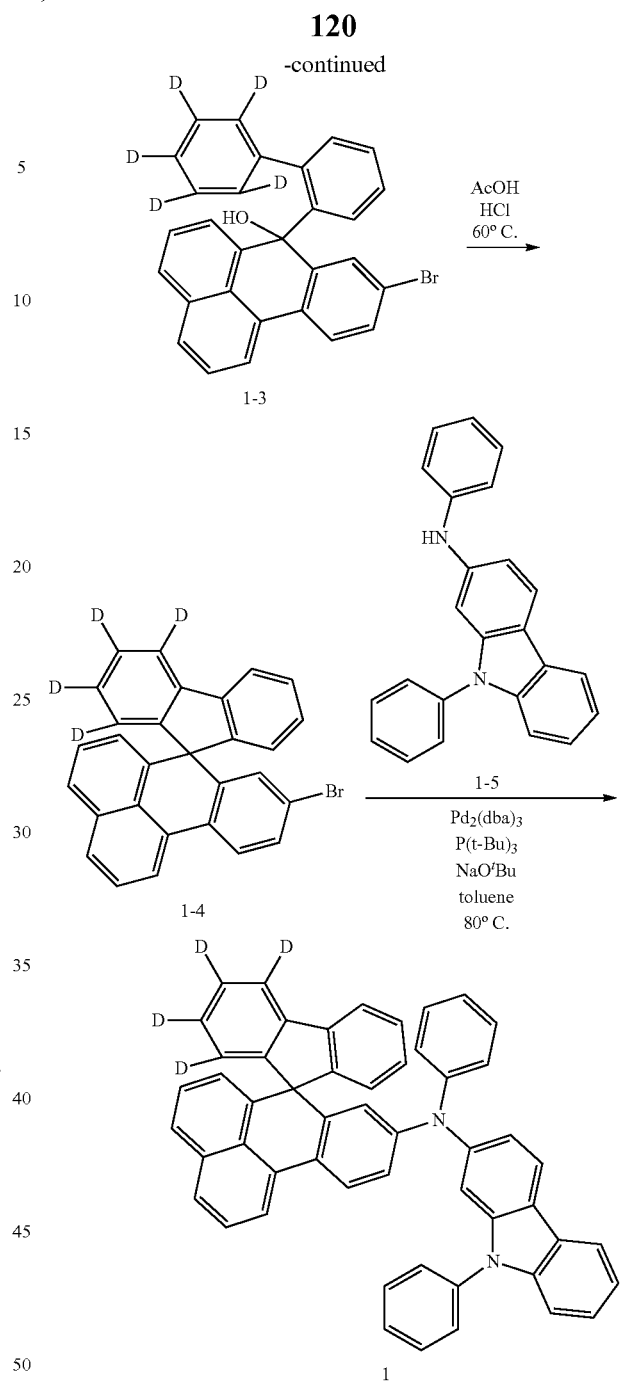

Synthesis of Compound 1-3

In an argon atmosphere, in a 250 mL two-neck flask, Compound 1-1 (2.38 g) was dissolved in THF (50 mL), and then 2.5 M n-BuLi (4.8 mL) was added dropwise thereto at about −78° C. After this reaction solution was stirred at about −78° C. for about 1 hour, Compound 1-2 (3.09 g) was added thereto, and then stirred for about 12 hours. Thereafter, the reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 1-3 (3.32 g, yield: 71%).

By measuring utilizing fast atom bombardment-mass spectrometry (FAB-MS), a mass number of m/z=466.09 was observed by molecular ion peak, thereby identifying Compound 1-3.

Synthesis of Compound 1-4

In an argon atmosphere, in a 250 mL two-neck flask, Compound 1-3 (4.67 g), acetic acid (30 mL), and HCl (6 mL) were added and stirred at about 60° C. for about 4 hours. The reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 1-4 (3.58 g, yield: 80%).

By measuring utilizing FAB-MS, a mass number of m/z=447.08 was observed by molecular ion peak, thereby identifying Compound 1-4.

Synthesis of Compound 1

In an argon atmosphere, in a 250 mL two-neck flask, Compound 1-4 (4.48 g), Compound 1-5 (3.34 g), Pd$_2$(dba)$_3$ (0.46 g), P(t-Bu)$_3$ (0.21 g), and NaOtBu (2.44 g) were dissolved in toluene (50 mL) and then stirred at about 80° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 1 (4.70 g, yield: 67%).

By measuring utilizing FAB-MS, a mass number of m/z=701.30 was observed by molecular ion peak, thereby identifying Compound 1.

Synthesis of Compound 6

Amine Compound 6 according to an example may be synthesized by, for example, the steps shown in Reaction Scheme 2 below:

Reaction Scheme 2

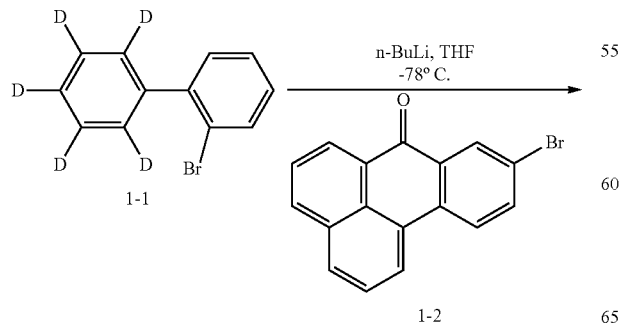

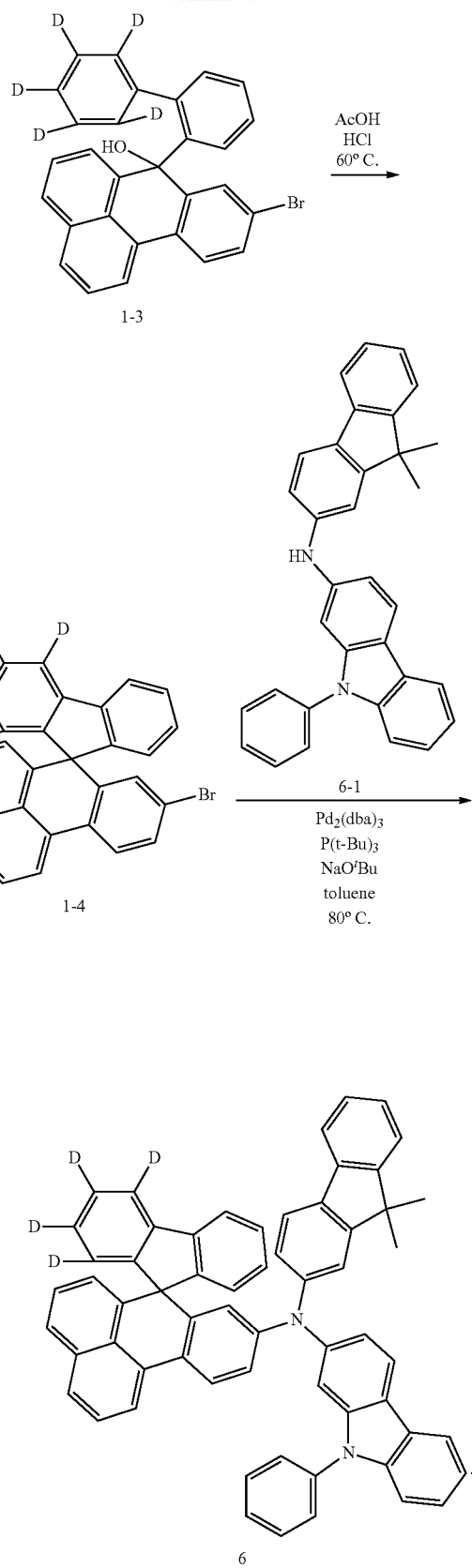

Synthesis of Compound 6

In an argon atmosphere, in a 250 mL two-neck flask, Compound 1-4 (4.48 g), Compound 6-1 (3.34 g), Pd$_2$(dba)$_3$ (0.46 g), P(t-Bu)$_3$ (0.21 g), and NaOtBu (2.44 g) were dissolved in toluene (50 mL) and then stirred at about 80° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 6 (4.90 g, yield: 60%).

By measuring utilizing FAB-MS, a mass number of m/z=817.36 was observed by molecular ion peak, thereby identifying Compound 6.

Synthesis of Compound 17

Amine Compound 17 according to an example may be synthesized by, for example, the steps shown in Reaction Scheme 3 below:

Reaction Scheme 3

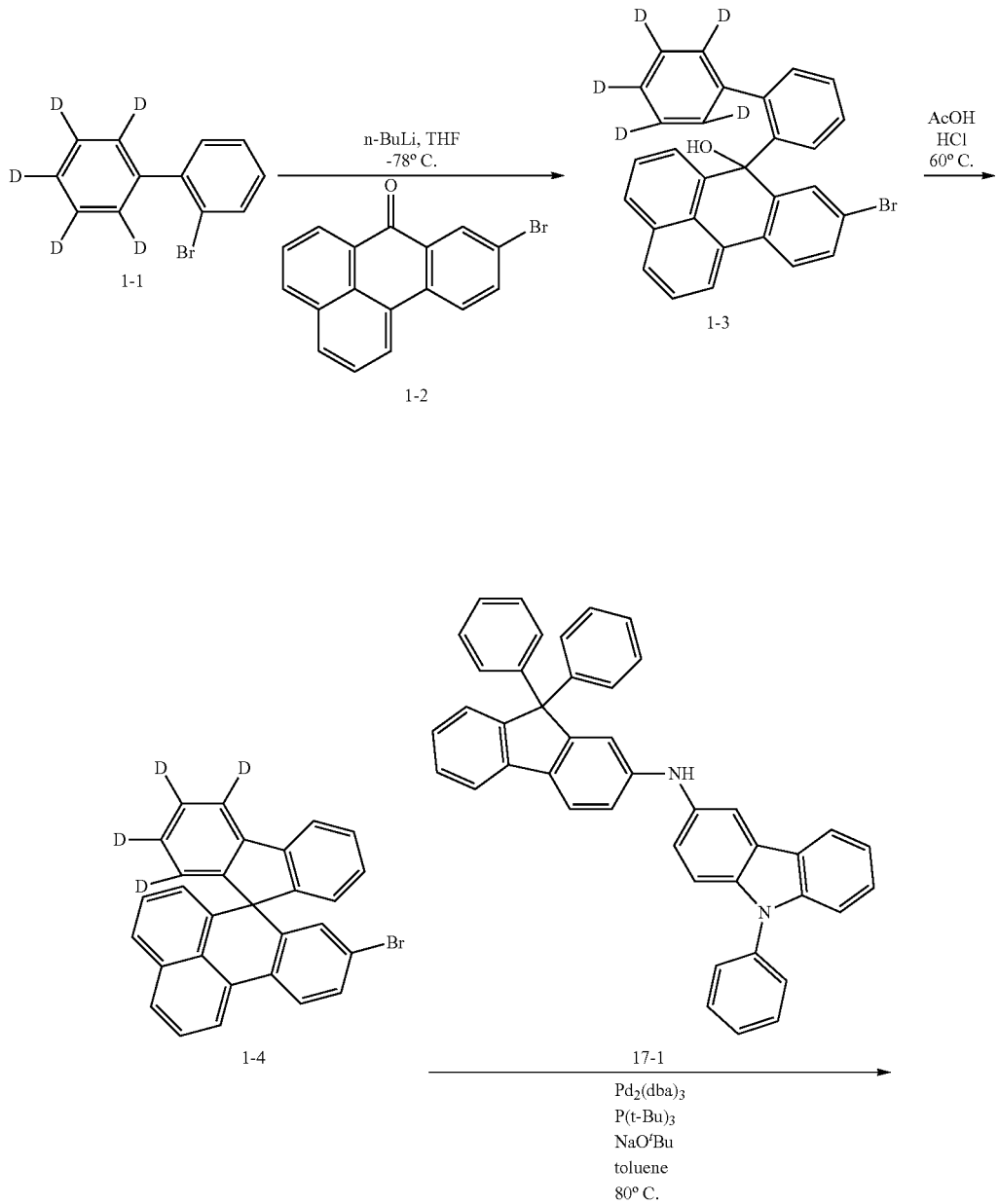

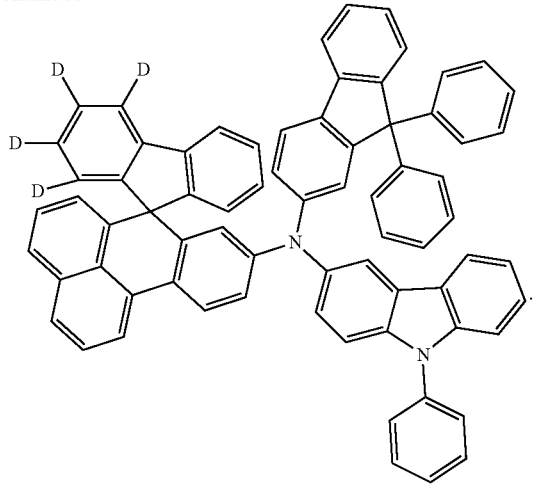

17

Synthesis of Compound 17

In an argon atmosphere, in a 250 mL two-neck flask, Compound 1-4 (4.48 g), Compound 17-1 (5.74 g), $Pd_2(dba)_3$ (0.46 g), $P(t-Bu)_3$ (0.21 g), and NaOtBu (2.44 g) were dissolved in toluene (50 mL) and then stirred at about 80° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 17 (4.90 g, yield: 60%).

By measuring utilizing FAB-MS, a mass number of m/z=817.36 was observed by molecular ion peak, thereby identifying Compound 17.

Synthesis of Compound 37

Amine Compound 37 according to an example may be synthesized by, for example, the steps shown in Reaction Scheme 4 below:

Reaction Scheme 4

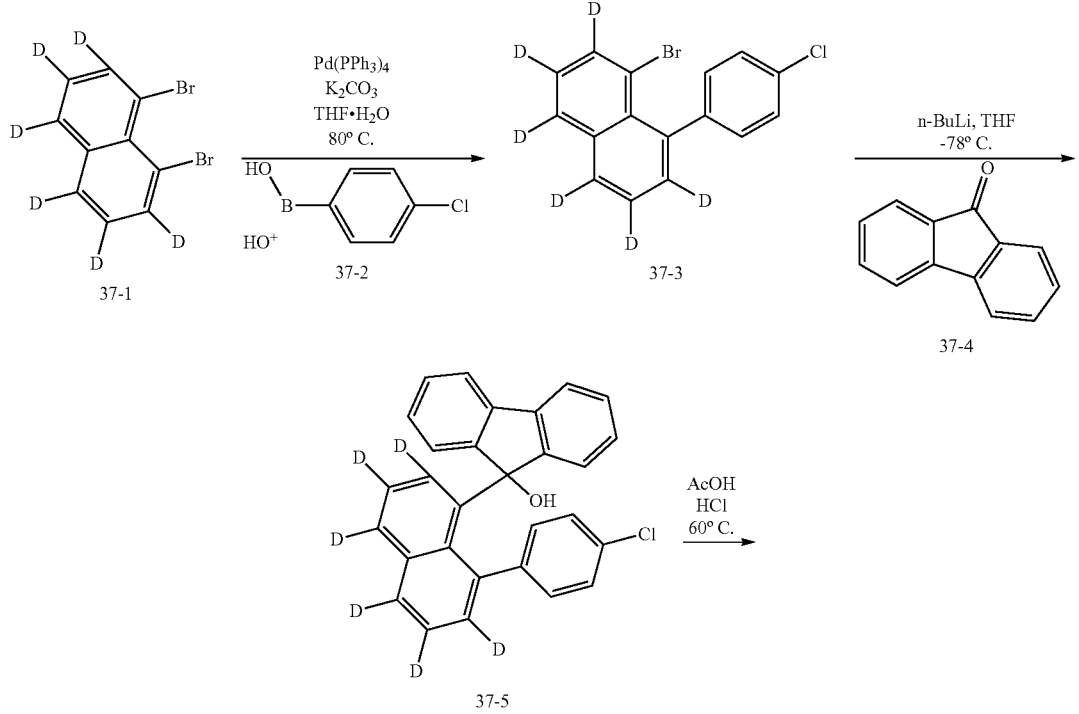

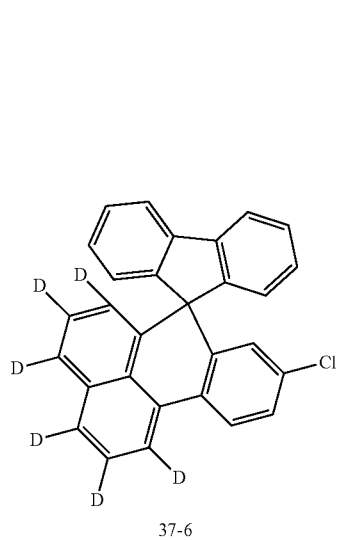

37-6

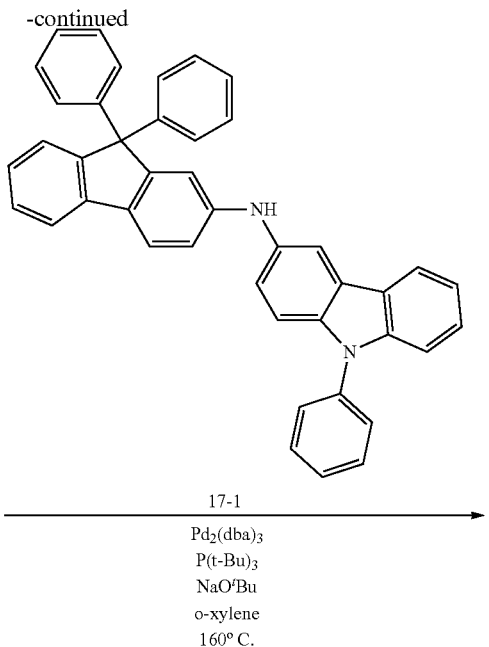

17-1
Pd₂(dba)₃
P(t-Bu)₃
NaOtBu
o-xylene
160° C.

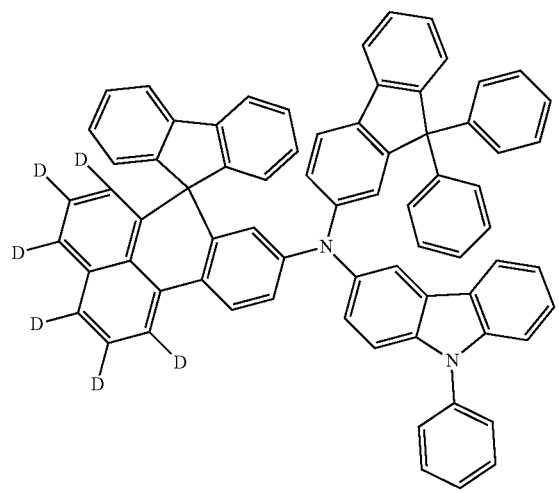

37

Synthesis of Compound 37-3

Compound 37-1 (2.90 g), $Pd_2(dba)_3$ (0.56 g), $K_2CO_3$ (3.45 g), and Compound 37-2 (1.56 g) were dissolved in THF/$H_2O$ (100 mL/50 mL) and then stirred at about 80° C. for about 12 hours. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 37-3 (1.80 g, yield: 56%).

By measuring utilizing FAB-MS, a mass number of m/z=321.00 was observed by molecular ion peak, thereby identifying Compound 37-3.

Synthesis of Compound 37-5

In an argon atmosphere, in a 250 mL two-neck flask, Compound 37-3 (3.22 g) is dissolved in THF (50 mL), and then 2.5 M n-BuLi (4.8 mL) was added dropwise thereto at about −78° C. After the resultant reaction solution was stirred at about −78° C. for about 1 hour, Compound 37-4 (1.80 g) was added thereto, and then stirred for about 12 hours. Thereafter, the reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 37-5 (2.58 g, yield: 61%).

By measuring utilizing FAB-MS, a mass number of m/z=523.15 was observed by molecular ion peak, thereby identifying Compound 37-5.

Synthesis of Compound 37-6

In an argon atmosphere, in a 250 mL two-neck flask, Compound 37-5 (4.24 g), acetic acid (30 mL), and HCl (6 mL) were added and stirred at about 60° C. for about 4 hours. The reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 37-6 (3.20 g, yield: 79%).

By measuring utilizing FAB-MS, a mass number of m/z=405.14 was observed by molecular ion peak, thereby identifying Compound 37-6.

Synthesis of Compound 37

In an argon atmosphere, in a 250 mL two-neck flask, Compound 37-6 (4.06 g), Compound 17-1 (5.74 g), $Pd_2(dba)_3$ (0.46 g), $P(t-Bu)_3$ (0.21 g), and NaOtBu (2.44 g) were dissolved in o-xylene (50 mL) and then stirred at about 160° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 37 (6.79 g, yield: 72%).

By measuring utilizing FAB-MS, a mass number of m/z=944.40 was observed by molecular ion peak, thereby identifying Compound 37.

Synthesis of Compound 44

Amine Compound 5 according to an example may be synthesized by, for example, the steps shown in Reaction Scheme 5 below:

Reaction Scheme 5

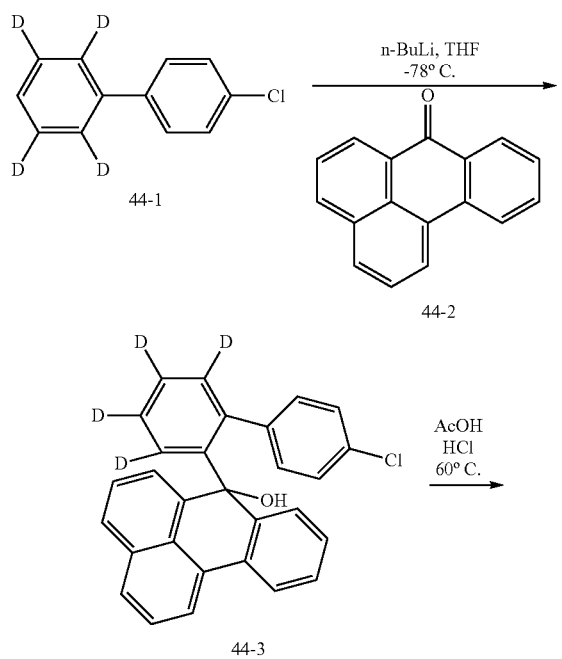

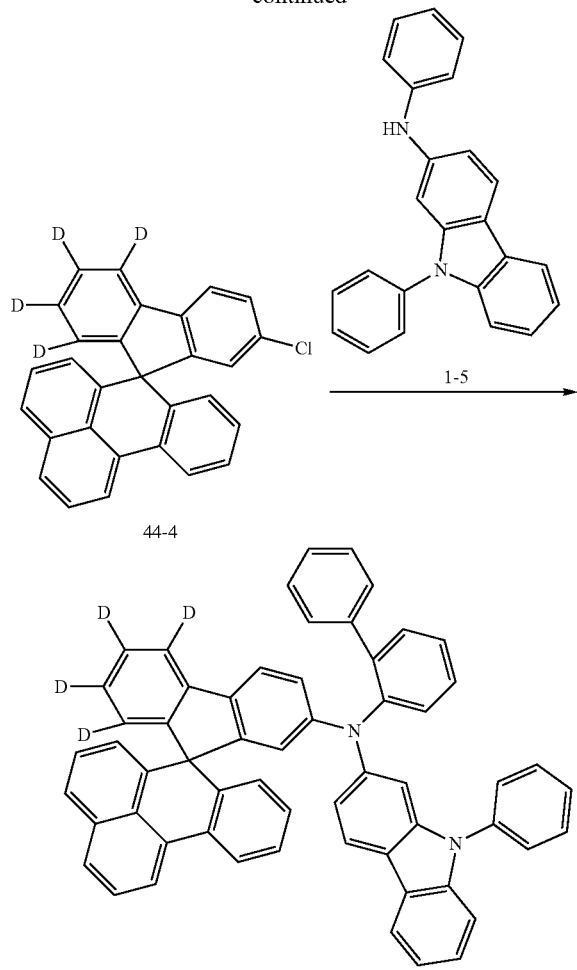

Synthesis of Compound 44-3

In an argon atmosphere, in a 250 mL two-neck flask, Compound 44-1 (2.67 g) is dissolved in THF (50 mL), and then 2.5 M n-BuLi (4.8 mL) was added dropwise thereto at about −78° C. After the resultant reaction solution was stirred at about −78° C. for about 1 hour, Compound 44-2 (2.30 g) was added thereto, and then stirred for about 12 hours. Thereafter, the reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 44-3 (2.70 g, yield: 64%).

By measuring utilizing FAB-MS, a mass number of m/z=421.14 was observed by molecular ion peak, thereby identifying Compound 44-3.

Synthesis of Compound 44-4

In an argon atmosphere, in a 250 mL two-neck flask, Compound 44-3 (4.22 g), acetic acid (30 mL), and HCl (6 mL) were added and stirred at about 60° C. for about 4 hours. Thereafter, the reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 44-4 (3.39 g, yield: 84%).

By measuring utilizing FAB-MS, a mass number of m/z=403.13 was observed by molecular ion peak, thereby identifying Compound 44-4.

Synthesis of Compound 44

In an argon atmosphere, in a 250 mL two-neck flask, Compound 44-4 (4.04 g), Compound 1-5 (3.34 g), $Pd_2(dba)_3$ (0.46 g), $P(t-Bu)_3$ (0.21 g), and NaOtBu (2.44 g) were dissolved in o-xylene (50 mL) and then stirred at about 160° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 44 (5.99 g, yield: 77%).

By measuring utilizing FAB-MS, a mass number of m/z=777.33 was observed by molecular ion peak, thereby identifying Compound 44.

Synthesis of Compound 50

Amine Compound 50 according to an example may be synthesized by, for example, the steps shown in Reaction Scheme 6 below:

Reaction Scheme 6

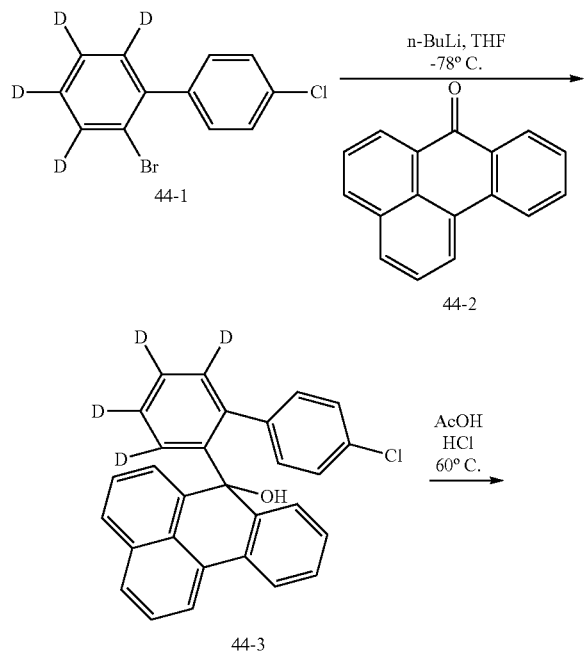

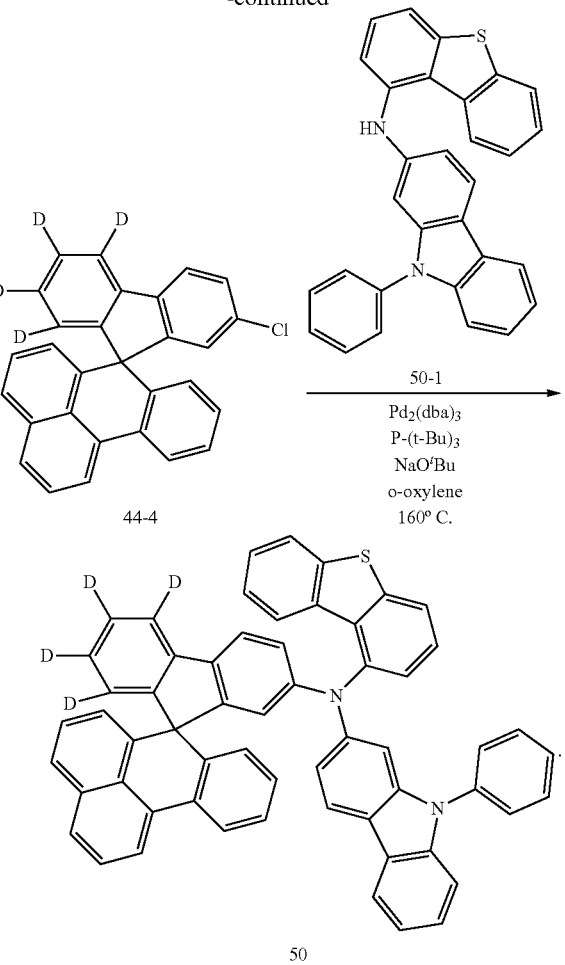

Synthesis of Compound 50

In an argon atmosphere, in a 250 mL two-neck flask, Compound 44-4 (4.04 g), Compound 50-1 (4.40 g), $Pd_2(dba)_3$ (0.46 g), $P(t-Bu)_3$ (0.21 g), and NaOtBu (2.44 g) were dissolved in o-xylene (50 mL) and then stirred at about 160° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 50 (5.97 g, yield: 74%).

By measuring utilizing FAB-MS, a mass number of m/z=807.29 was observed by molecular ion peak, thereby identifying Compound 50.

Synthesis of Compound 62

Amine Compound 62 according to an example may be synthesized by, for example, the steps shown in Reaction Scheme 7 below:

Reaction Scheme 7

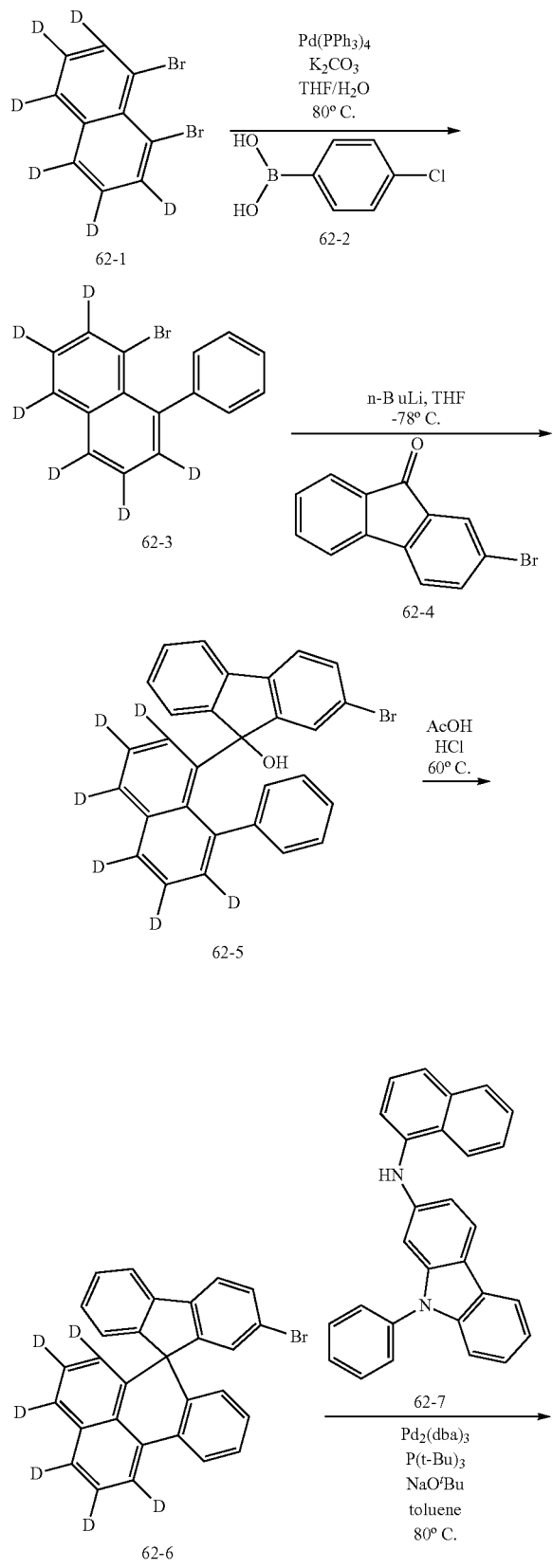

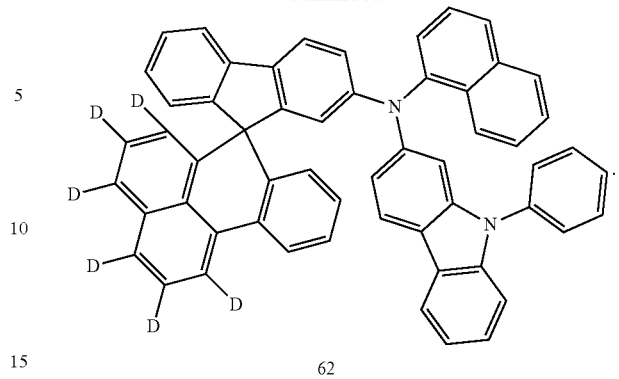

Synthesis of Compound 62-3

Compound 62-1 (2.90 g), Pd(PPh$_3$)$_4$ (0.56 g), K$_2$CO$_3$ (3.45 g), and Compound 62-2 (1.22 g) were dissolved in THF/H$_2$O (100 mL/25 mL) and then stirred at about 80° C. for about 12 hours. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 62-3 (1.84 g, yield: 64%).

By measuring utilizing FAB-MS, a mass number of m/z=287.04 was observed by molecular ion peak, thereby identifying Compound 62-3.

Synthesis of Compound 62-5

In an argon atmosphere, in a 250 mL two-neck flask, Compound 62-3 (2.88 g) is dissolved in THF (50 mL), and then 2.5 M n-BuLi (4.8 mL) was added dropwise thereto at about −78° C. After the resultant reaction solution was stirred at about −78° C. for about 1 hour, Compound 62-4 (2.57 g) was added thereto, and then stirred for about 12 hours. Thereafter, the reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 62-5 (2.62 g, yield: 56%).

By measuring utilizing FAB-MS, a mass number of m/z=467.10 was observed by molecular ion peak, thereby identifying Compound 62-5.

Synthesis of Compound 62-6

In an argon atmosphere, in a 250 mL two-neck flask, Compound 62-5 (4.24 g), acetic acid (30 mL), and HCl (6 mL) were added and stirred at about 60° C. for about 4 hours. Thereafter, the reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 62-6 (3.96 g, yield: 88%).

By measuring utilizing FAB-MS, a mass number of m/z=449.09 was observed by molecular ion peak, thereby identifying Compound 62-6.

Synthesis of Compound 62

In an argon atmosphere, in a 250 mL two-neck flask, Compound 62-6 (4.50 g), Compound 62-7 (3.84 g), Pd$_2$(dba)$_3$ (0.46 g), P(t-Bu)$_3$ (0.21 g), and NaOtBu (2.44 g) were dissolved in toluene (50 mL) and then stirred at about 80° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 62 (6.03 g, yield: 80%).

By measuring utilizing FAB-MS, a mass number of m/z=753.33 was observed by molecular ion peak, thereby identifying Compound 62.

Synthesis of Compound 84

Amine Compound 84 according to an example may be synthesized by, for example, the steps shown in Reaction Scheme 8 below:

Reaction Scheme 8

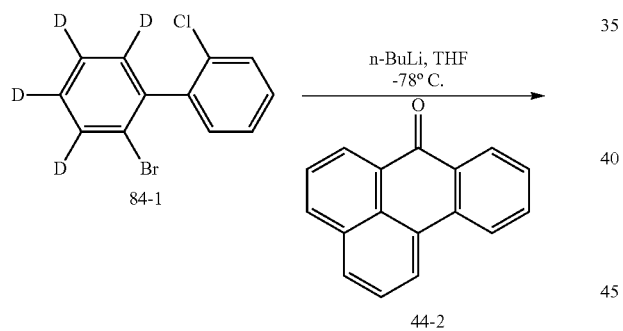

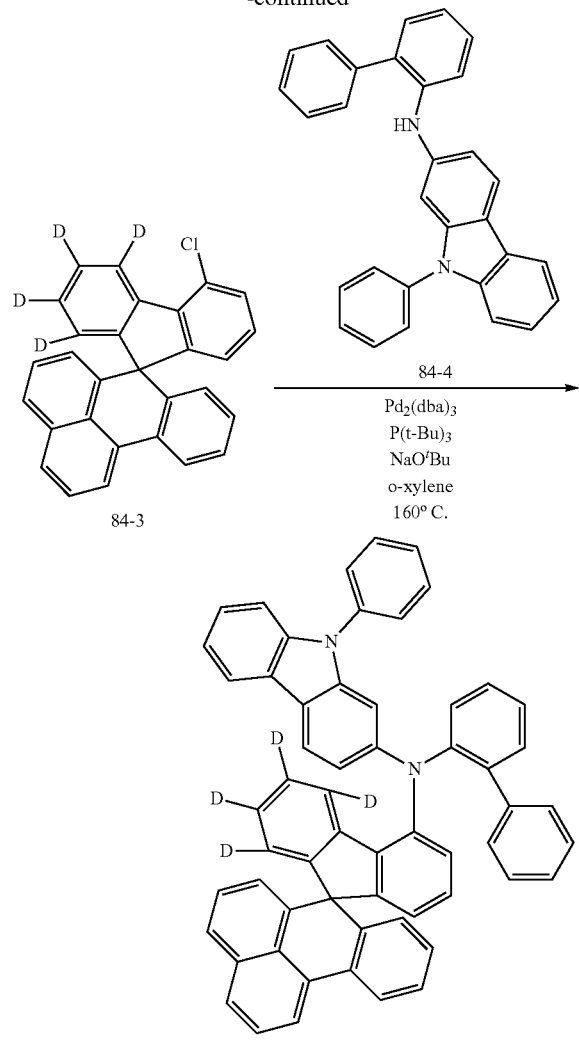

Synthesis of Compound 84-2

In an argon atmosphere, in a 250 mL two-neck flask, Compound 84-1 (2.69 g) is dissolved in THF (50 mL), and then 2.5 M n-BuLi (4.8 mL) was added dropwise thereto at about −78° C. After the resultant reaction solution was stirred at about −78° C. for 1 hour, Compound 44-2 (2.30 g) was added thereto, and then stirred for about 12 hours. The reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 84-2 (2.57 g, yield: 61%).

By measuring utilizing FAB-MS, a mass number of m/z=421.14 was observed by molecular ion peak, thereby identifying Compound 84-2.

Synthesis of Compound 84-3

In an argon atmosphere, in a 250 mL two-neck flask, Compound 84-2 (4.22 g), acetic acid (30 mL), and HCl (6 mL) were added and stirred at about 60° C. for about 4 hours. Thereafter, the reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 84-3 (3.43 g, yield: 85%).

By measuring utilizing FAB-MS, a mass number of m/z=403.13 was observed by molecular ion peak, thereby identifying Compound 84-3.

Synthesis of Compound 84

In an argon atmosphere, in a 250 mL two-neck flask, Compound 84-3 (4.04 g), Compound 84-4 (4.10 g), $Pd_2(dba)_3$ (0.46 g), $P(t\text{-}Bu)_3$ (0.21 g), and NaOtBu (2.44 g) were dissolved in o-xylene (50 mL) and then stirred at 160° C. for 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 84 (5.50 g, yield: 71%).

By measuring utilizing FAB-MS, a mass number of m/z=777.33 was observed by molecular ion peak, thereby identifying Compound 84.

Synthesis of Compound 95

Amine Compound 95 according to an example may be synthesized by, for example, the steps shown in Reaction Scheme 9 below:

Reaction Scheme 9

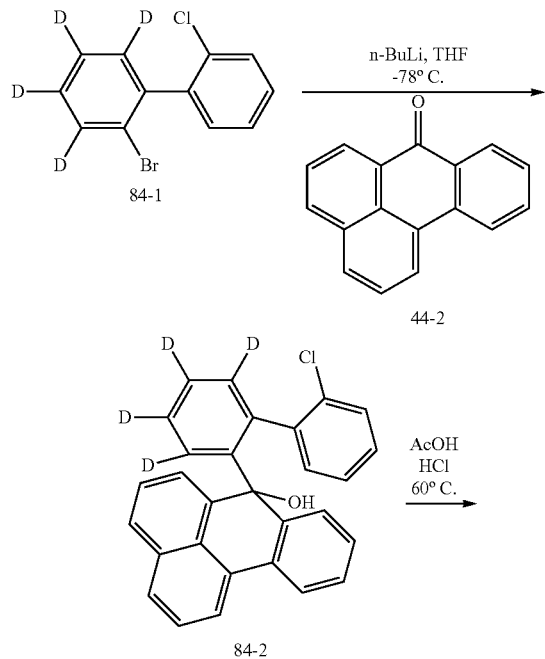

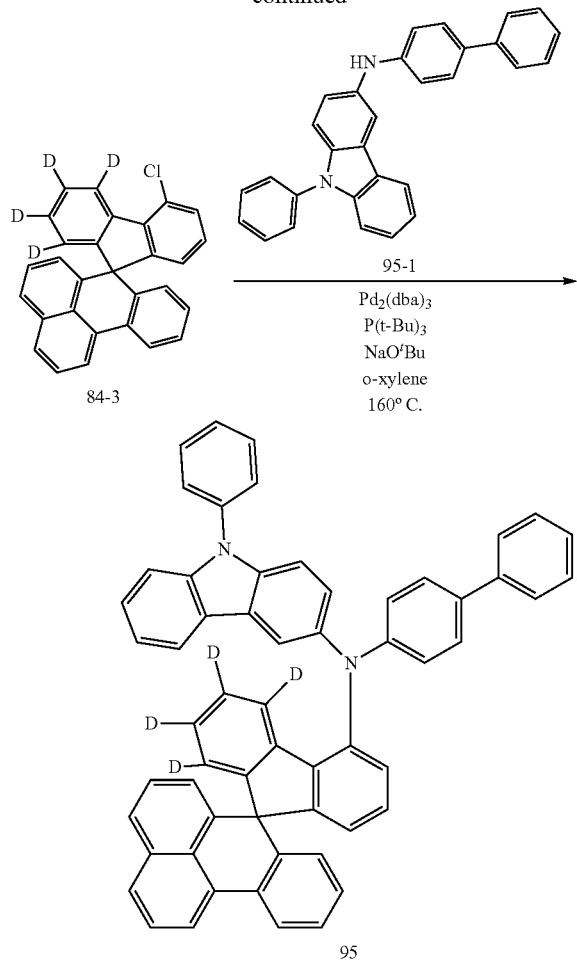

Synthesis of Compound 95

In an argon atmosphere, in a 250 mL two-neck flask, Compound 84-3 (4.04 g), Compound 95-1 (4.10 g), $Pd_2(dba)_3$ (0.46 g), $P(t\text{-}Bu)_3$ (0.21 g), and NaOtBu (2.44 g) were dissolved in o-xylene (50 mL) and then stirred at about 160° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 95 (5.60 g, yield: 72%).

By measuring utilizing FAB-MS, a mass number of m/z=777.33 was observed by molecular ion peak, thereby identifying Compound 94.

Synthesis of Compound 115

Amine Compound 115 according to an example may be synthesized by, for example, the steps shown in Reaction Scheme 10 below:

Reaction Scheme 10
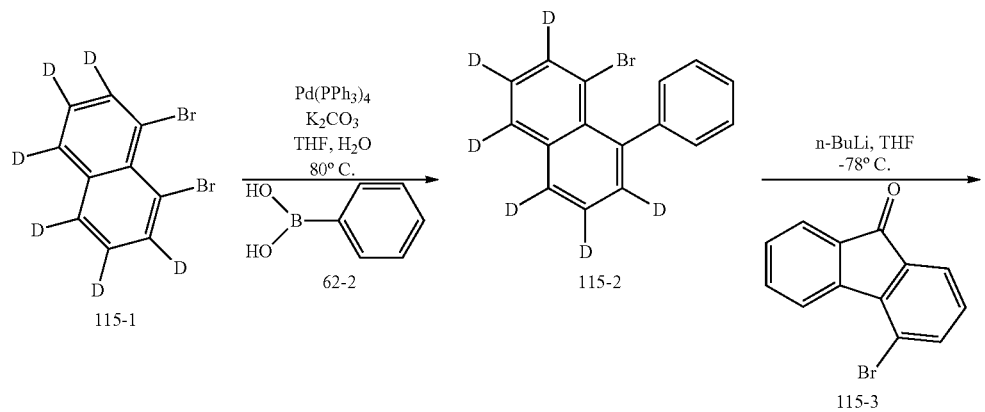
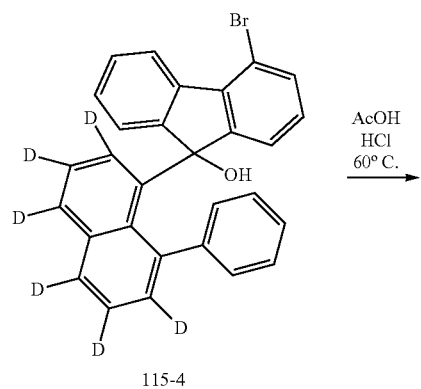
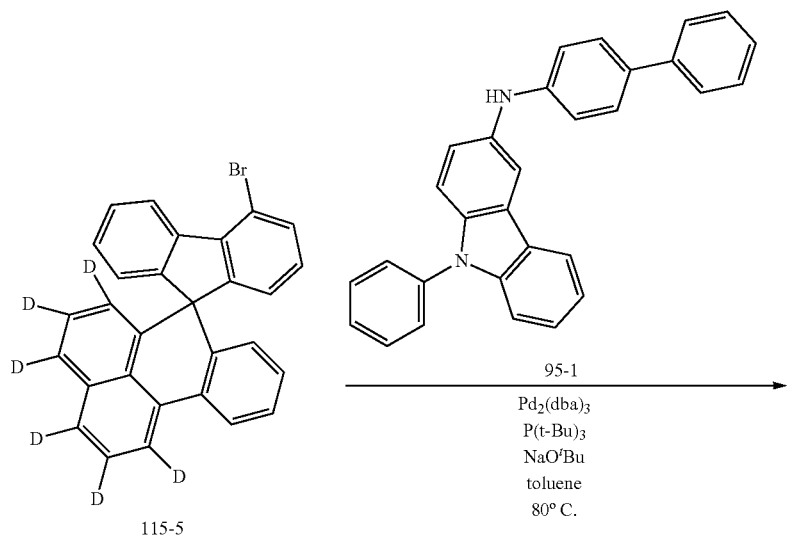

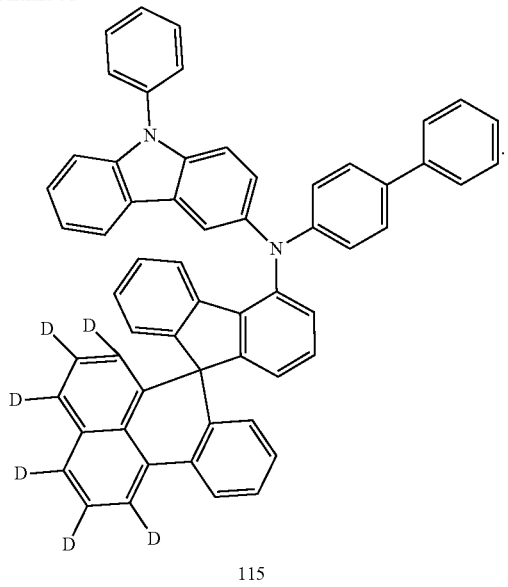 [SMILES: [2H]c1c([2H])c2c3c(c([2H])c([2H])c([2H])c3c1[2H])C1(c3ccccc3-c3c(N(c4ccc(-c5ccccc5)cc4)c4ccc5c(c4)c4ccccc4n5-c4ccccc4)cccc31)c1ccccc1-2]

115

Synthesis of Compound 115-2

Compound 115-1 (2.90 g), Pd(PPh$_3$)$_4$ (0.56 g), K$_2$CO$_3$ (3.45 g), and Compound 62-2 (1.22 g) were dissolved in THF/H$_2$O (100 mL/25 mL) and then stirred at about 80° C. for about 12 hours. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 115-2 (1.81 g, yield: 63%).

By measuring utilizing FAB-MS, a mass number of m/z=287.04 was observed by molecular ion peak, thereby identifying Compound 115-2.

Synthesis of Compound 115-4

In an argon atmosphere, in a 250 mL two-neck flask, Compound 115-2 (2.88 g) was dissolved in THF (50 mL), and then 2.5 M n-BuLi (4.8 mL) was added dropwise thereto at about −78° C. After the resultant reaction solution was stirred at about −78° C. for about 1 hour, Compound 115-3 (2.57 g) was added thereto, and then stirred for about 12 hours. Thereafter, the reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 115-4 (2.62 g, yield: 56%).

By measuring utilizing FAB-MS, a mass number of m/z=467.10 was observed by molecular ion peak, thereby identifying Compound 115-4.

Synthesis of Compound 115-5

In an argon atmosphere, in a 250 mL two-neck flask, Compound 115-4 (4.68 g), acetic acid (30 mL), and HCl (6 mL) were added and stirred at about 60° C. for about 4 hours. Thereafter, the reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 115-5 (4.05 g, yield: 90%).

By measuring utilizing FAB-MS, a mass number of m/z=449.09 was observed by molecular ion peak, thereby identifying Compound 115-5.

Synthesis of Compound 115

In an argon atmosphere, in a 250 mL two-neck flask, Compound 115-5 (4.50 g), Compound 95-1 (4.10 g), Pd$_2$(dba)$_3$ (0.46 g), P(t-Bu)$_3$ (0.21 g), and NaOtBu (2.44 g) were dissolved in toluene (50 mL) and then stirred at about 80° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 115-5 (5.14 g, yield: 66%).

By measuring utilizing FAB-MS, a mass number of m/z=779.34 was observed by molecular ion peak, thereby identifying Compound 115.

Synthesis of Compound 119

Amine Compound 119 according to an example may be synthesized by, for example, the steps shown in Reaction Scheme 11 below:

Reaction Scheme 11

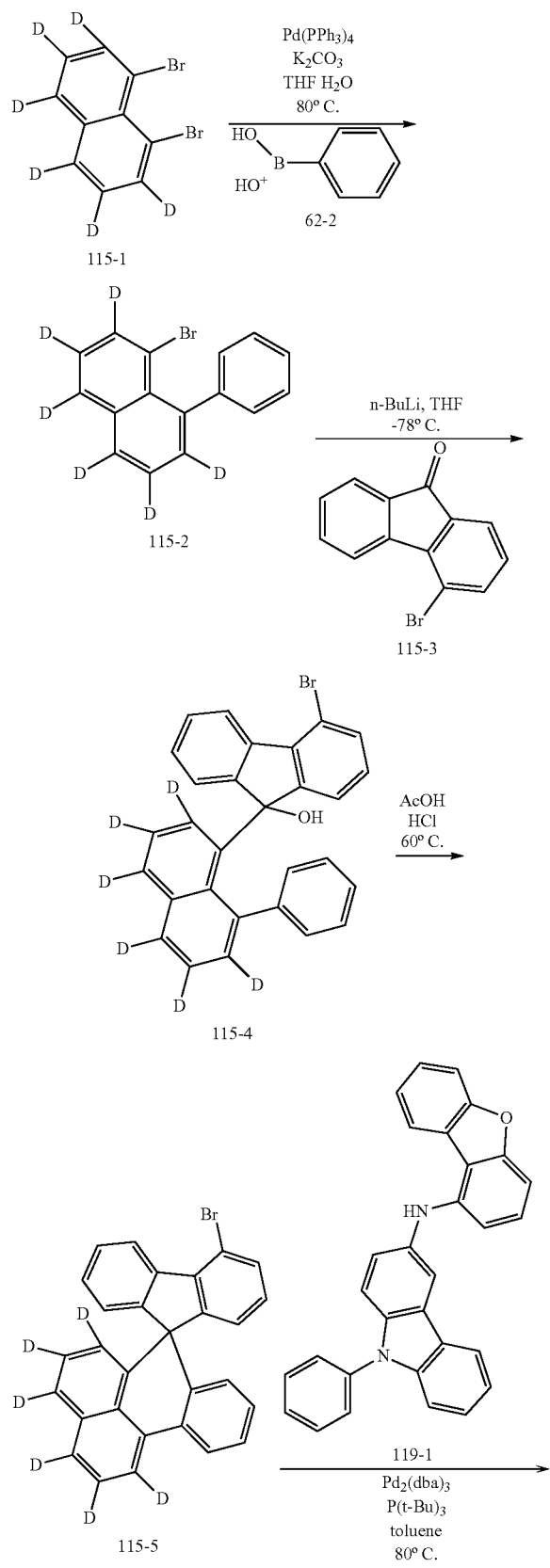

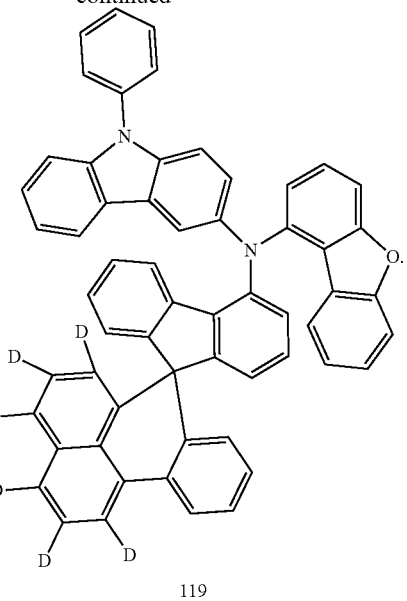

119

Synthesis of Compound 119

In an argon atmosphere, in a 250 mL two-neck flask, Compound 115-5 (4.50 g), Compound 119-1 (4.24 g), Pd$_2$(dba)$_3$ (0.46 g), P(t-Bu)$_3$ (0.21 g), and NaOtBu (2.44 g) were dissolved in toluene (50 mL) and then stirred at about 80° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 119 (6.11 g, yield: 77%).

By measuring utilizing FAB-MS, a mass number of m/z=793.32 was observed by molecular ion peak, thereby identifying Compound 119.

Synthesis of Compound 150

Amine Compound 150 according to an example may be synthesized by, for example, the steps shown in Reaction Scheme 12 below:

Reaction Scheme 12

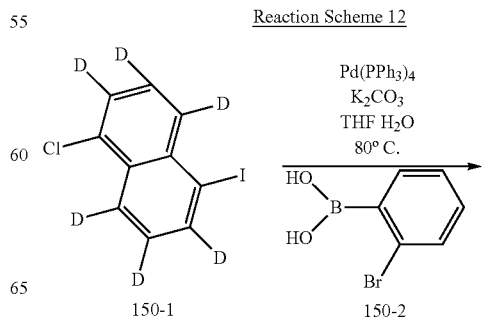

-continued

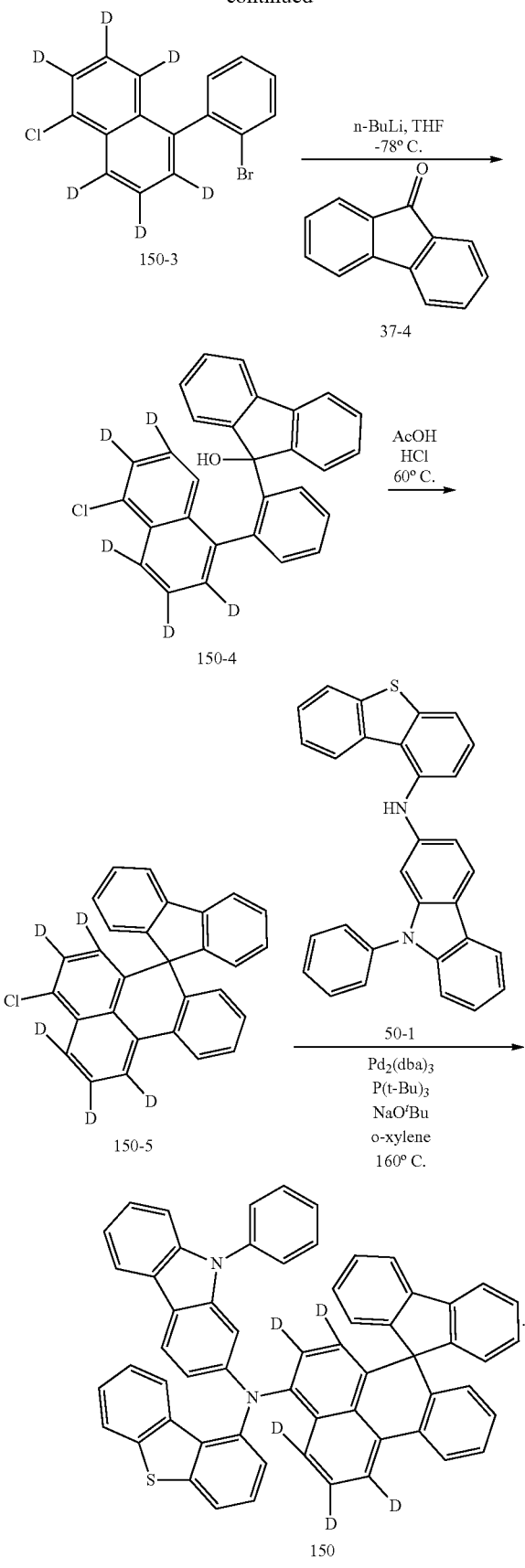

Synthesis of Compound 150-3

Compound 150-1 (2.93 g), Pd(PPh$_3$)$_4$ (0.56 g), K$_2$CO$_3$ (3.45 g), and Compound 150-2 (1.99 g) were dissolved in THF/H$_2$O (100 mL/25 mL) and then stirred at about 80° C. for about 12 hours. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 150-3 (1.96 g, yield: 61%).

By measuring utilizing FAB-MS, a mass number of m/z=321.00 was observed by molecular ion peak, thereby identifying Compound 150-3.

Synthesis of Compound 150-4

In an argon atmosphere, in a 250 mL two-neck flask, Compound 150-3 (3.22 g) is dissolved in THF (50 mL), and then 2.5 M n-BuLi (4.8 mL) was added dropwise thereto at about −78° C. After the resultant reaction solution was stirred at about −78° C. for about 1 hour, Compound 37-4 (1.80 g) was added thereto, and then stirred for about 12 hours. Thereafter, the reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 150-4 (2.53 g, yield: 60%).

By measuring utilizing FAB-MS, a mass number of m/z=422.14 was observed by molecular ion peak, thereby identifying Compound 150-4.

Synthesis of Compound 150-5

In an argon atmosphere, in a 250 mL two-neck flask, Compound 150-4 (4.23 g), acetic acid (30 mL), and HCl (6 mL) were added and stirred at about 60° C. for about 4 hours. The reaction was quenched with water followed by extracting an organic layer three times with ethyl ether. The separated organic layer was dried over anhydrous magnesium sulfate and distilled at reduced pressure to obtain residues. The obtained residues were separated and purified by column chromatography to obtain Compound 150-5 (3.40 g, yield: 84%).

By measuring utilizing FAB-MS, a mass number of m/z=404.13 was observed by molecular ion peak, thereby identifying Compound 150-5.

Synthesis of Compound 150

In an argon atmosphere, in a 250 mL two-neck flask, Compound 150-5 (4.05 g), Compound 50-1 (4.40 g), Pd$_2$(dba)$_3$ (0.46 g), P(t-Bu)$_3$ (0.21 g), and NaOtBu (2.44 g) were dissolved in o-xylene (50 mL) and then stirred at about 160° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 150 (5.50 g, yield: 68%).

147

By measuring utilizing FAB-MS, a mass number of m/z=808.29 was observed by molecular ion peak, thereby identifying Compound 150.

Synthesis of Compound 160

Amine Compound 160 according to an example may be synthesized by, for example, the steps shown in Reaction Scheme 13 below:

Reaction Scheme 13

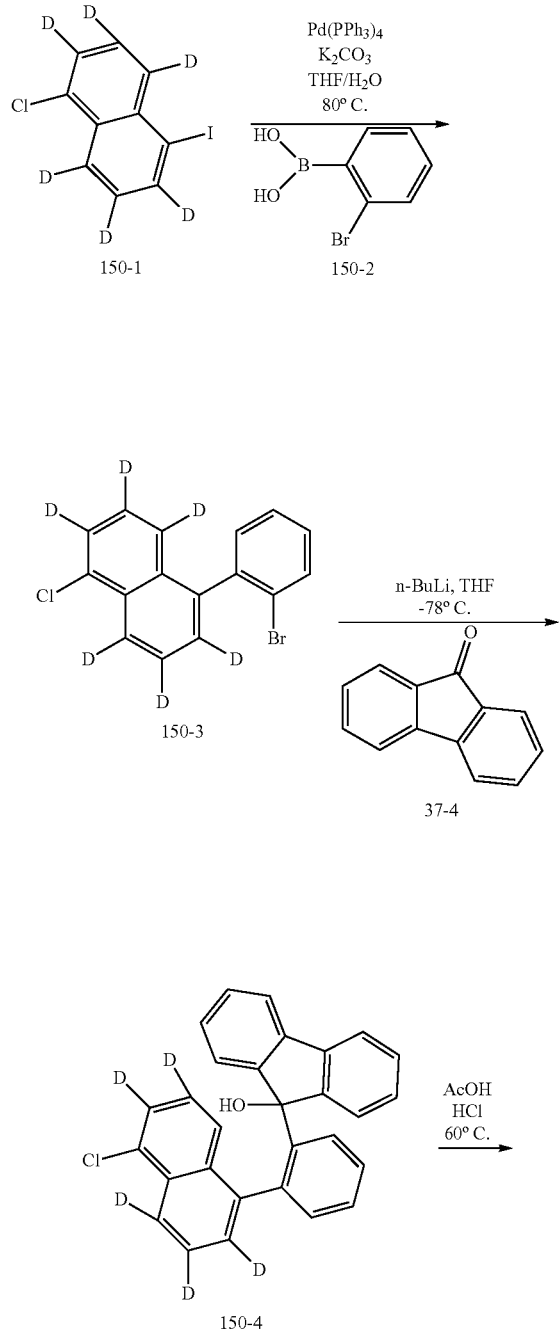

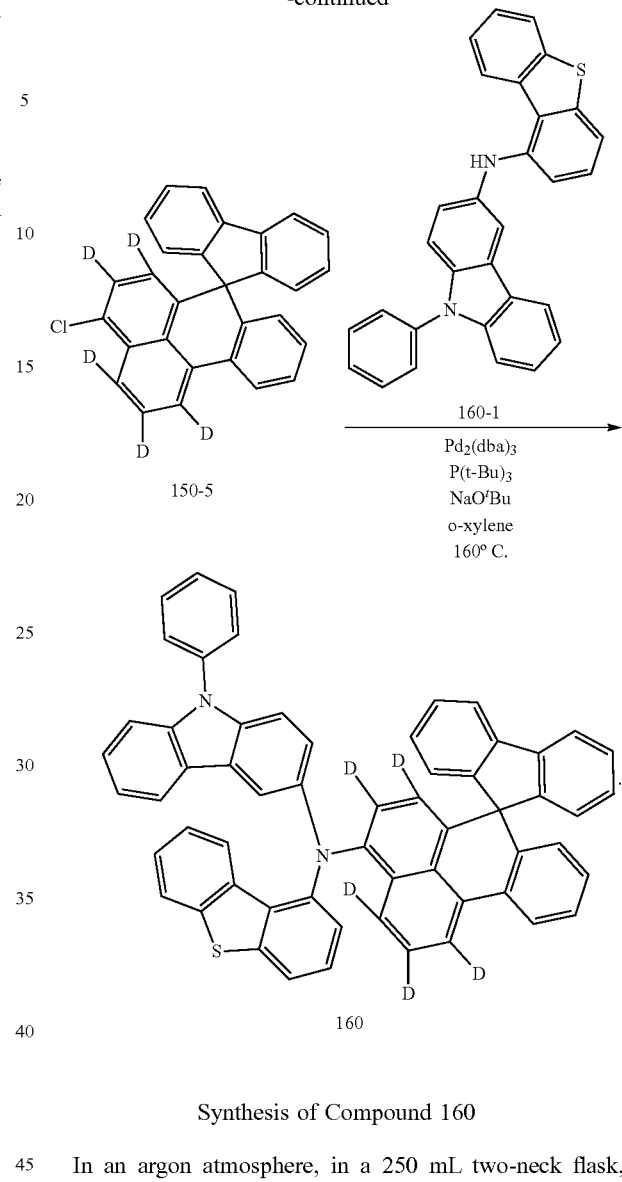

148

Synthesis of Compound 160

In an argon atmosphere, in a 250 mL two-neck flask, Compound 150-5 (4.05 g), Compound 160-1 (4.40 g), $Pd_2(dba)_3$ (0.46 g), $P(t-Bu)_3$ (0.21 g), and NaOtBu (2.44 g) were dissolved in o-xylene (50 mL) and then stirred at about 160° C. for about 1 hour. This reaction solution was cooled to room temperature and then quenched with water, followed by extracting an organic layer three times with ethyl ether. The separated organic layer was dried over anhydrous magnesium sulfate and distilled at reduced pressure to obtain residues. The obtained residues were separated and purified by column chromatography to obtain Compound 160 (6.22 g, yield: 77%).

By measuring utilizing FAB-MS, a mass number of m/z=808.29 was observed by molecular ion peak, thereby identifying Compound 160.

2. Manufacture and Evaluation of Light Emitting Element

Manufacture of Light Emitting Element

The light emitting element of an embodiment including the amine compound of an embodiment in a hole transport layer was manufactured as follows. The amine compounds of Compound 1, Compound 6, Compound 17, Compound 44, Compound 50, Compound 62, Compound 84, Compound 95, Compound 115, Compound 119, Compound 150, and Compound 160 as described above were used as hole transport layer materials to manufacture the light emitting elements of Examples 1 to 13, respectively.

Comparative Example Compounds C1 and C2 were used as hole transport layer material to manufacture the light emitting elements of Comparative Example 1 and Comparative Example 2, respectively.

Example Compounds and Comparative Example Compounds used to manufacture the devices are shown below:

Example Compound

1

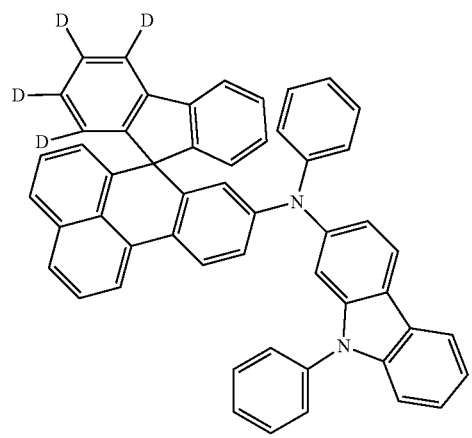

6

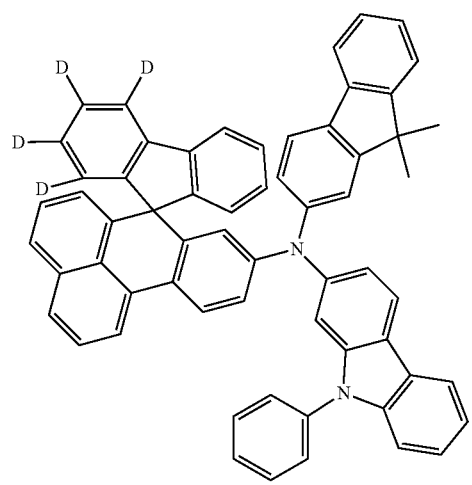

-continued

17

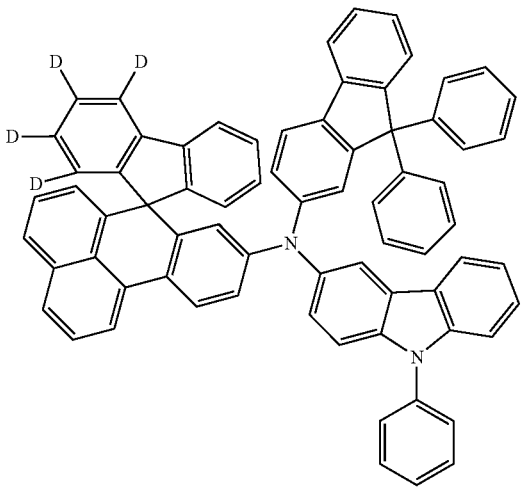

37

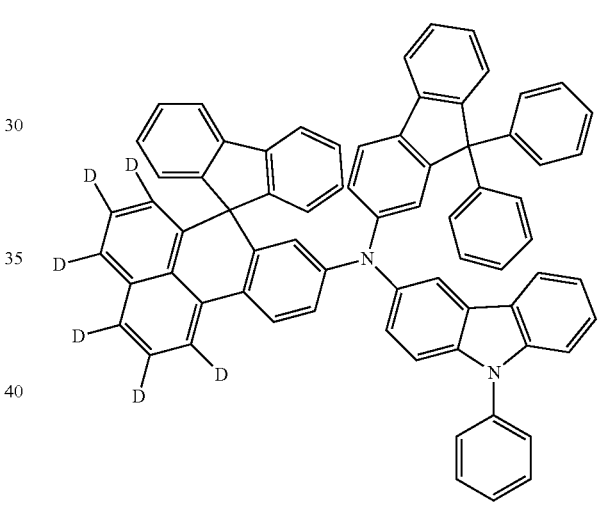

44

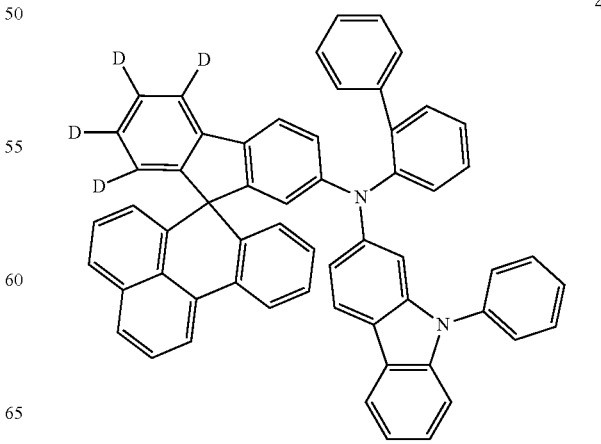

50
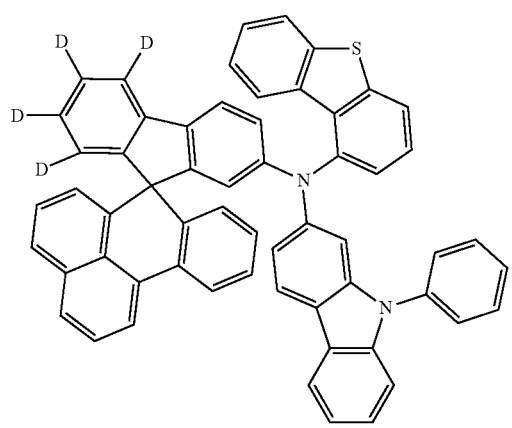
62
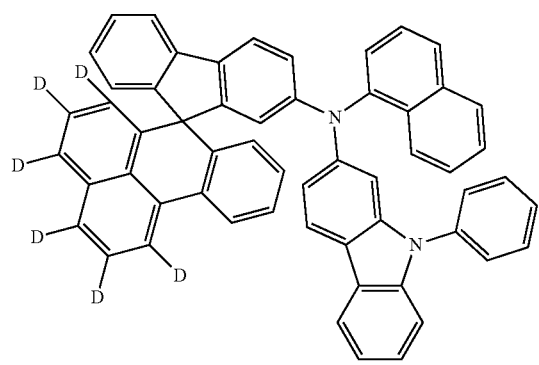
84
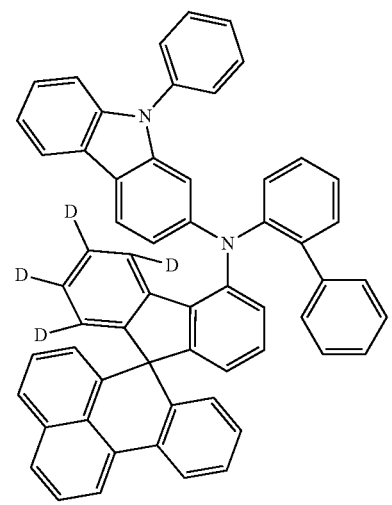
95
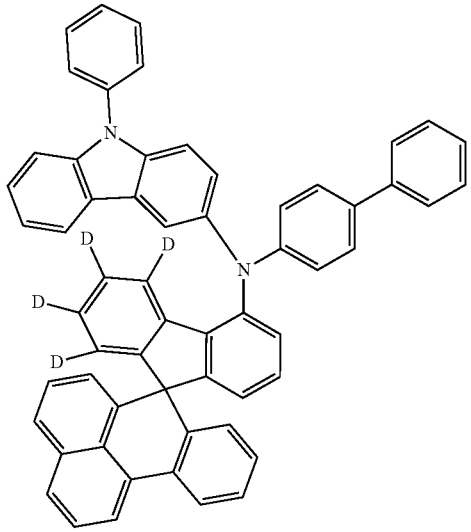
115
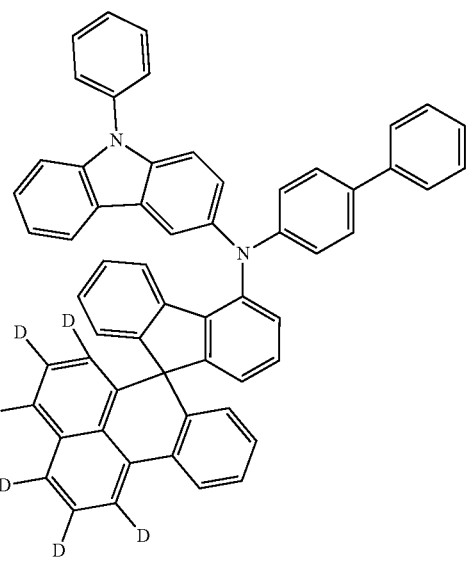
119
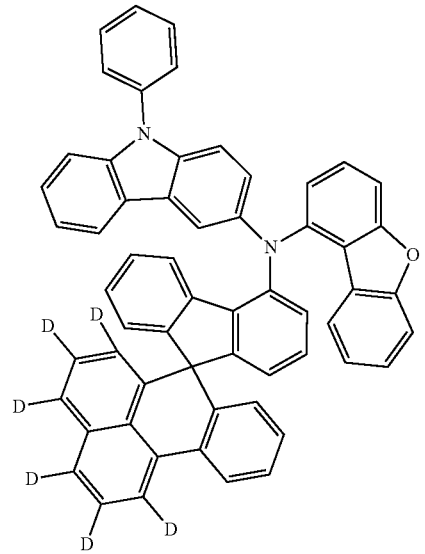

153
-continued
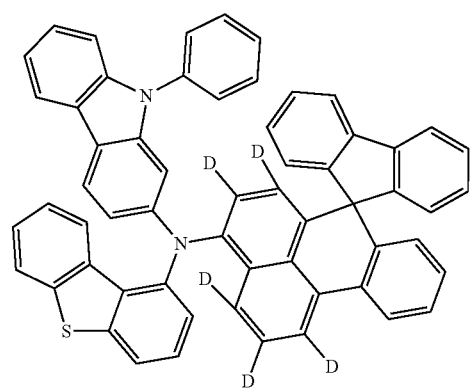
150
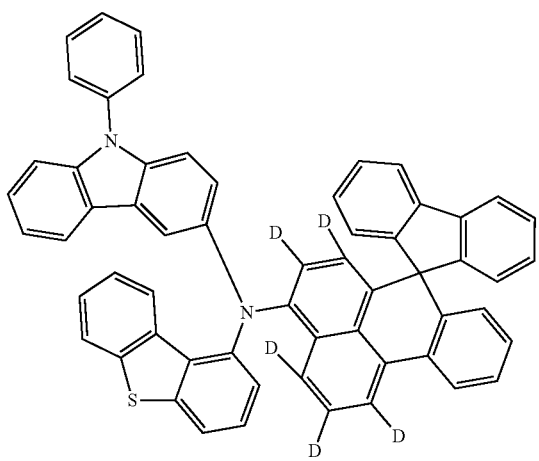
160
154
Comparative Example Compound
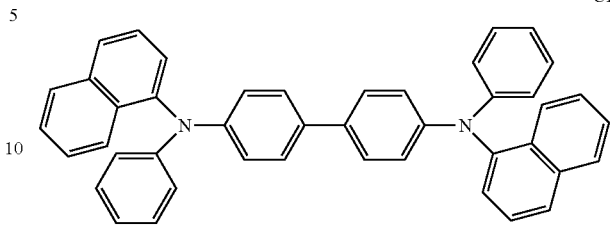
C1
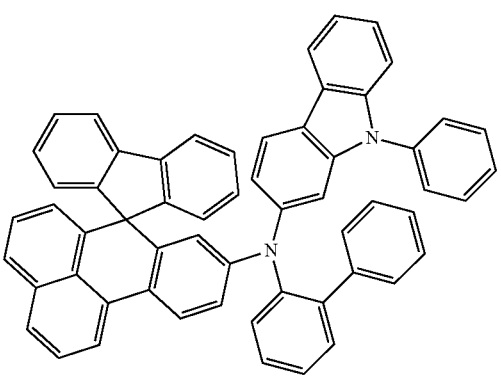
C2
Other Compounds Used to Manufacture Devices
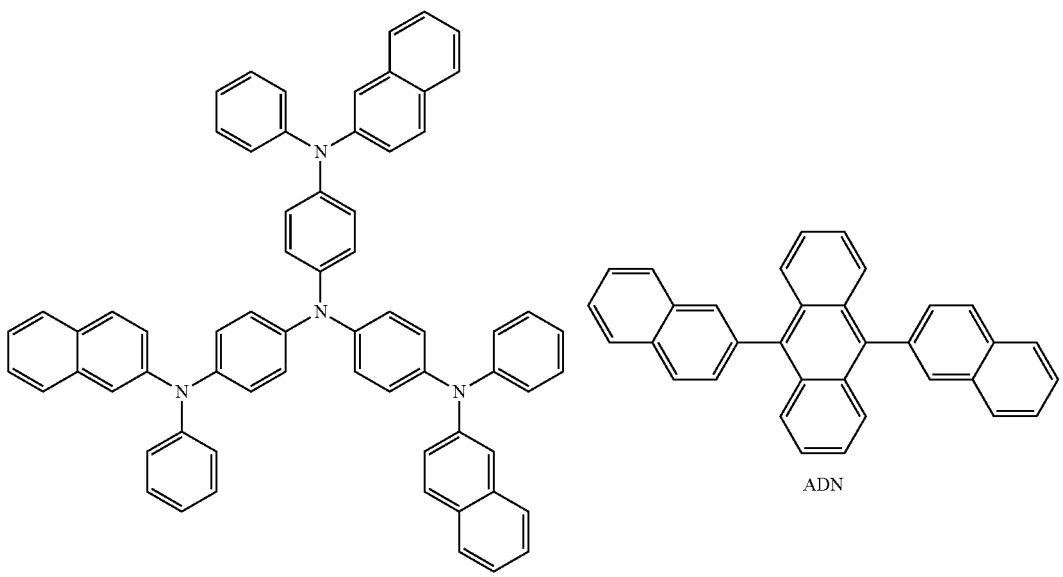
2-TNATA
ADN

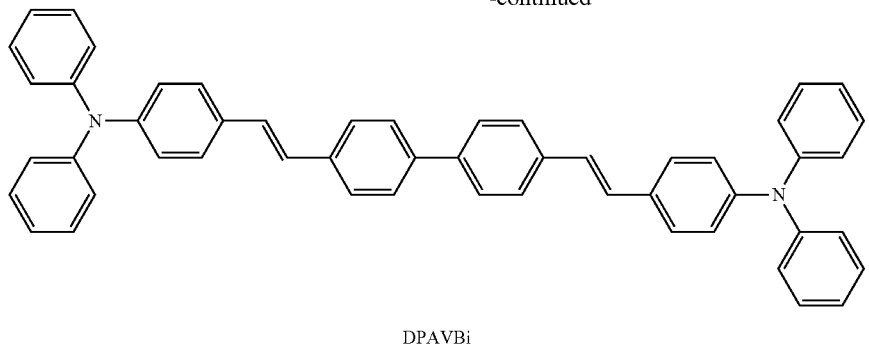

DPAVBi

A glass substrate on which a 1200 Å-thick ITO had been patterned was ultrasonically washed by using isopropyl alcohol and pure water for about 5 minutes each. After ultrasonically washed, the glass substrate was irradiated with UN rays for about 30 minutes and treated with ozone. Thereafter, 2-TNATA was deposited to form a 600 Å-thick hole injection layer. Then, Example Compound or Comparative Example Compound was deposited to form a 300 Å-thick hole transport layer.

Thereafter, ADN and DPAVBi as a blue fluorescent dopant were co-deposited at a weight ratio of 98:2 to form a 300 Å-thick emission layer. Then, $Alq_3$ was deposited to form a 300 Å-thick electron transport layer, and LiF was deposited to form a 10 Å-thick electron injection layer.

Then, Al was provided to form a 3000 Å-thick second electrode.

In the Examples, the hole injection layer, the hole transport layer, the emission layer, the electron transport layer, the electron injection layer, and the second electrode were formed by using a vacuum deposition apparatus.

Evaluation of Light Emitting Element Characteristics

Evaluation results of the light emitting elements of Examples 1 to 13 and Comparative Examples 1 to 2 are listed in Table 1. Driving voltage, brightness, luminous efficiency and a half service life of the light emitting elements are listed for comparison in Table 1. In the evaluation results of the characteristics for Examples and Comparative Examples listed in Table 1, the luminous efficiency shows an efficiency value at a current density of 50 $mA/cm^2$, and the half service life shows a brightness half-life at 100 $mA/cm^2$. Meanwhile, it was confirmed that the manufactured diodes all show blue emission colors.

Current densities, voltages and luminous efficiencies of the light emitting elements of Examples and Comparative Examples were measured in a dark room by using a 2400 Series Source Meter from Keithley Instruments, Inc., CS-200, Color and Luminance Meter from Konica Minolta, Inc., PC Program LabVIEW 8.2 for the measurement from Japan National Instrument, Inc.

TABLE 1

| Device Manufacturing examples | Hole transport layer material | Drive voltage (V) | Brightness (cd/m$^2$) | Emitting efficiency (cd/A) | Half service life (hr @ 100 mA/cm$^2$) |
|---|---|---|---|---|---|
| Example 1 | Example Compound 1 | 4.50 | 4270 | 8.54 | 370 |
| Example 2 | Example Compound 6 | 4.44 | 4420 | 8.84 | 390 |
| Example 3 | Example Compound 17 | 4.77 | 4370 | 8.74 | 372 |
| Example 4 | Example Compound 37 | 4.30 | 4070 | 8.14 | 365 |
| Example 5 | Example Compound 44 | 4.32 | 4170 | 8.34 | 362 |
| Example 6 | Example Compound 50 | 4.21 | 4215 | 8.43 | 353 |
| Example 7 | Example Compound 62 | 4.22 | 4165 | 8.33 | 372 |
| Example 8 | Example Compound 84 | 4.26 | 4230 | 8.46 | 378 |
| Example 9 | Example Compound 95 | 4.26 | 4230 | 8.46 | 398 |
| Example 10 | Example Compound 115 | 4.25 | 4130 | 8.26 | 384 |
| Example 11 | Example Compound 119 | 4.41 | 4225 | 8.45 | 343 |
| Example 12 | Example Compound 150 | 4.22 | 4175 | 8.35 | 366 |
| Example 13 | Example Compound 160 | 4.21 | 4215 | 8.43 | 363 |
| Comparative Example 1 | Comparative Example Compound C1 | 7.01 | 2645 | 5.29 | 258 |

TABLE 1-continued

| Device Manufacturing examples | Hole transport layer material | Drive voltage (V) | Brightness (cd/m$^2$) | Emitting efficiency (cd/A) | Half service life (hr @ 100 mA/cm$^2$) |
|---|---|---|---|---|---|
| Comparative Example 2 | Comparative Example Compound C2 | 5.13 | 3821 | 7.71 | 301 |

Referring to the results of Table 1, it can be seen that Examples of the light emitting elements using the amine compounds according to embodiments of the present disclosure as hole transport layer materials exhibit low driving voltage, high brightness, excellent emitting efficiency, and improved service life characteristics. That is, referring to Table 1, it can be seen that the light emitting elements of Examples 1 to 13 exhibit low voltage, high brightness, long service life, and high efficiency characteristics compared to those of Comparative Examples 1 and 2.

From the above, it can be seen that the Example Compounds have a molecular structure in which the condensed cycle having a spiro structure and the amine derivative are bonded, and thus, exhibit high durability to improve, for example, a service life characteristic, and exhibit improved brightness and high luminous efficiency characteristics due to a stable molecular structure compared to Comparative Example Compound C1.

In addition, it can be seen that Comparative Example Compound C2 has a molecular structure in which the condensed cycle having a spiro structure and the amine derivative are bonded like the Example Compounds, but the Example Compounds include at least one deuterium atom as a substituent, thereby exhibiting improved service life and high luminous efficiency characteristics compared to the case of using Comparative Example Compound C2.

Thus, Examples 1 to 13 show results of improving both the luminous efficiency and the light emitting service life compared to Comparative Examples 1 and 2. As a result, the diode efficiency and the diode service life of the light emitting elements of examples may be improved concurrently (e.g., simultaneously) by using the amine compounds of the examples having the structure in which the condensed cycle having a spiro structure substituted with at least one deuterium atom and the amine derivative are bonded.

The amine compound according to an example has a molecular structure in which the condensed cycle having a spiro structure substituted with at least one deuterium atom and the amine derivative are bonded, thereby contributing to low voltage, long service life, and high efficiency characteristics of the light emitting element. In addition, the light emitting element according to an example may include the amine compound of an example, thereby exhibiting long service life and high efficiency characteristics concurrently (e.g., simultaneously).

The light emitting element of an embodiment of the present disclosure may include the amine compound of an embodiment in the hole transport region, thereby exhibiting high efficiency and long service life characteristics.

The amine compound of an embodiment may improve luminous efficiency and a device service life of the light emitting element.

Although the subject matter of the present disclosure has been described with reference to example embodiments of the present disclosure, it will be understood that the present disclosure should not be limited to these example embodiments but various changes and modifications can be made by those skilled in the art without departing from the spirit and scope of the present disclosure.

Accordingly, the technical scope of the present disclosure is not intended to be limited to the contents set forth in the detailed description of the present specification, but is intended to be defined by the appended claims, and equivalents thereof.

What is claimed is:

1. A light emitting element comprising:
a first electrode;
a second electrode on the first electrode; and
at least one functional layer which is between the first electrode and the second electrode and comprises an amine compound represented by any one of Formula 1-1, Formula 1-2, and Formula 1-3:

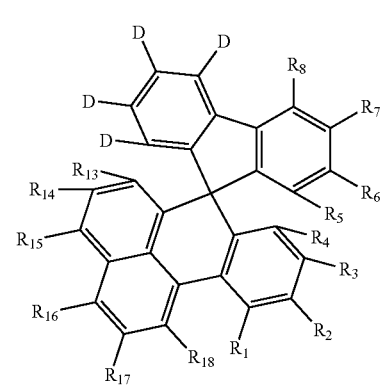

[Formula 1-1]

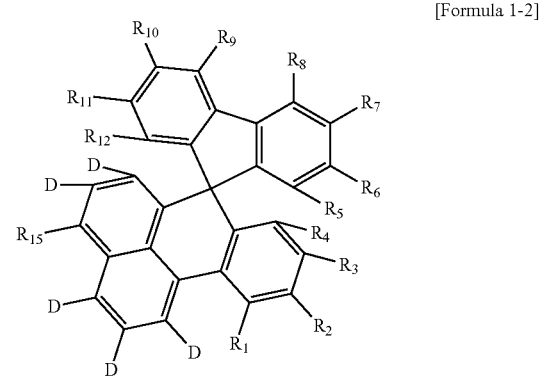

[Formula 1-2]

[Formula 1-3]

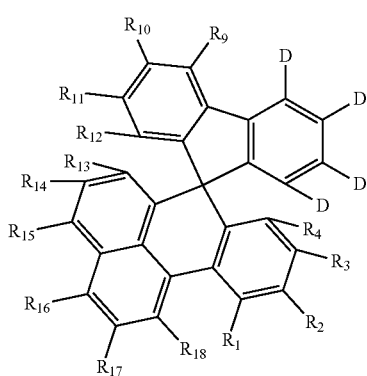

wherein, in Formula 1-1, $R_1$ to $R_8$ and $R_{13}$ to $R_{18}$ are each independently a hydrogen atom, a halogen atom, a substituted or unsubstituted silyl group, or a substituted or unsubstituted alkyl group having 1 to 20 carbon atoms, and any one selected from $R_3$, $R_6$, $R_8$, and $R_{15}$ is represented by Formula 2, in Formula 1-2, $R_1$ to $R_{12}$ are each independently a hydrogen atom, a halogen atom, a substituted or unsubstituted silyl group, or a substituted or unsubstituted alkyl group having 1 to 20 carbon atoms, and when $R_{15}$ is a deuterium atom, any one selected from $R_3$, $R_6$, and $R_8$ is represented by Formula 2, and in Formula 1-3, $R_1$ to $R_4$ and $R_9$ to $R_{18}$ are each independently a hydrogen atom, a halogen atom, a substituted or unsubstituted silyl group, or a substituted or unsubstituted alkyl group having 1 to 20 carbon atoms, and $R_3$ or $R_{15}$ is represented by Formula 2:

[Formula 2]

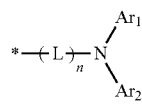

wherein, in Formula 2, n is an integer of 0 to 3,

L is a substituted or unsubstituted arylene group having 6 to 30 ring-forming carbon atoms, or a substituted or unsubstituted heteroarylene group having 2 to 30 ring-forming carbon atoms, and $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms.

2. The light emitting element of claim 1, wherein the at least one functional layer comprises an emission layer, a hole transport region between the first electrode and the emission layer, and an electron transport region between the emission layer and the second electrode, and the hole transport region comprises the amine compound represented by any one of Formula 1-1, Formula 1-2, and Formula 1-3.

3. The light emitting element of claim 2, wherein the hole transport region comprises a hole injection layer on the first electrode and a hole transport layer on the hole injection layer, and the hole transport layer comprises the amine compound represented by any one of Formula 1-1, Formula 1-2, and Formula 1-3.

4. The light emitting element of claim 1, wherein $Ar_1$ and $Ar_2$ are each independently a substituted or unsubstituted phenyl group, a substituted or unsubstituted naphthyl group, a substituted or unsubstituted fluorenyl group, a substituted or unsubstituted biphenyl group, a substituted or unsubstituted phenanthrenyl group, a substituted or unsubstituted carbazole group, a substituted or unsubstituted indolyl group, a substituted or unsubstituted pyridyl group, a substituted or unsubstituted dibenzofuranyl group, or a substituted or unsubstituted dibenzothiophenyl group.

5. The light emitting element of claim 1, wherein any one selected from $Ar_1$ and $Ar_2$ is a substituted or unsubstituted carbazole group.

6. The light emitting element of claim 1, wherein $Ar_1$ and $Ar_2$ are different from each other.

7. The light emitting element of claim 1, wherein Formula 2 is represented by Formula 2-1:

[Formula 2-1]

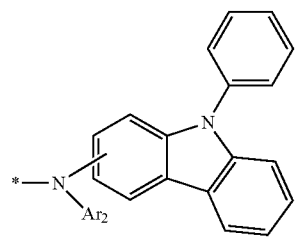

wherein, in Formula 2-1, $Ar_2$ is the same as defined with respect to Formula 2.

8. The light emitting element of claim 2, wherein the emission layer comprises a compound represented by Formula E-1:

[Formula E-1]

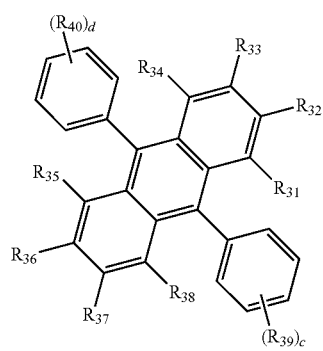

wherein, in Formula E-1, $R_{31}$ to $R_{40}$ are each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and, optionally, are bonded to an adjacent group to form a ring.

9. The light emitting element of claim 1, wherein the amine compound is represented by any one selected from among the compounds of Compound Group 1:

[Compound Group 1]
1
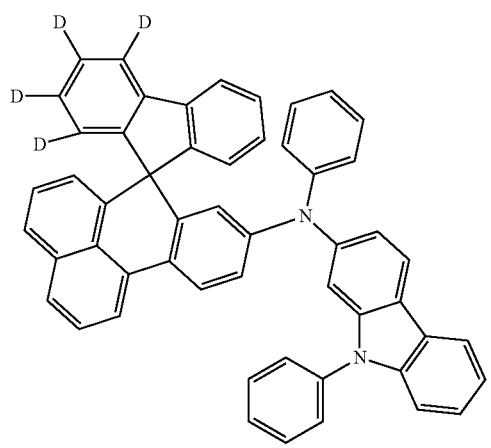
2
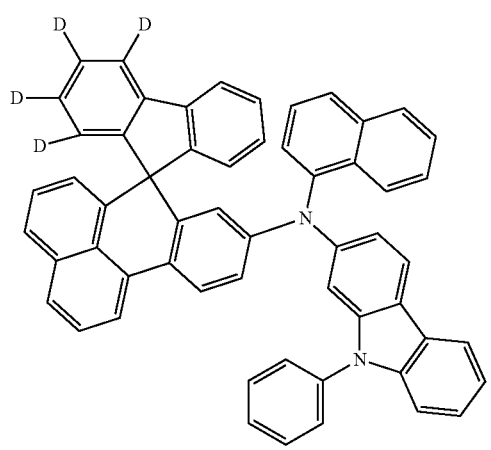
3
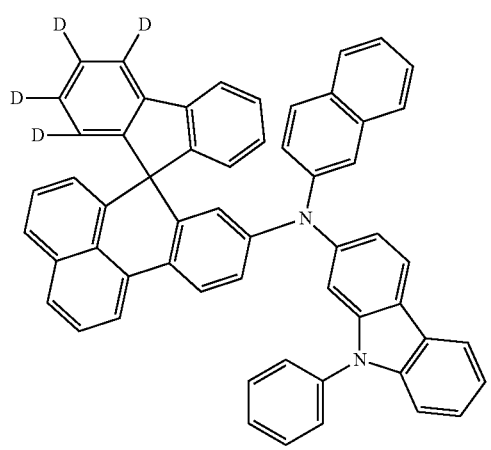
4
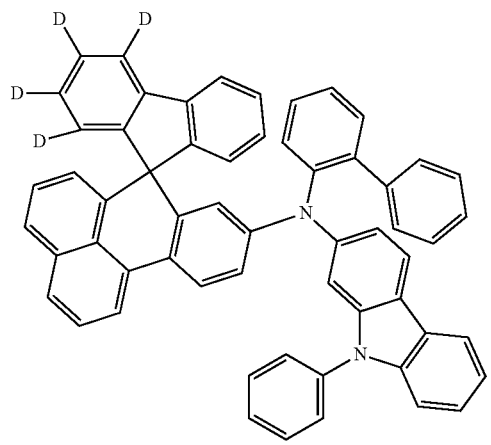
5
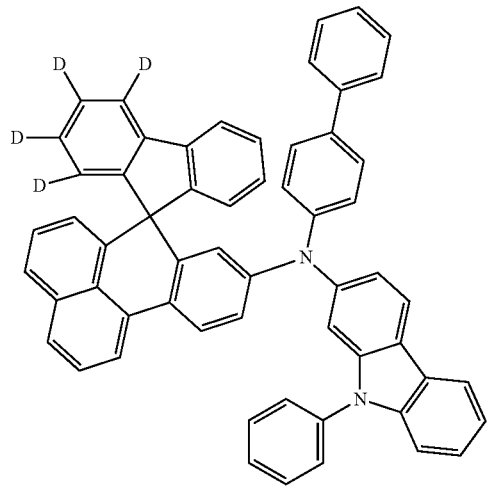
6
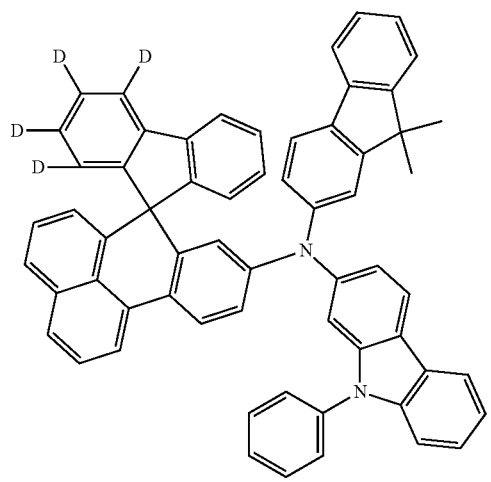

-continued
7
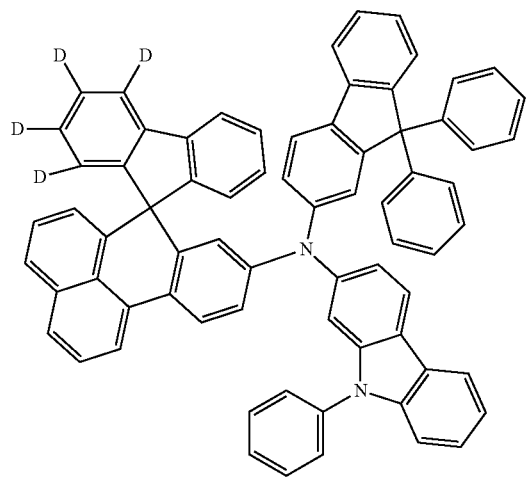
8
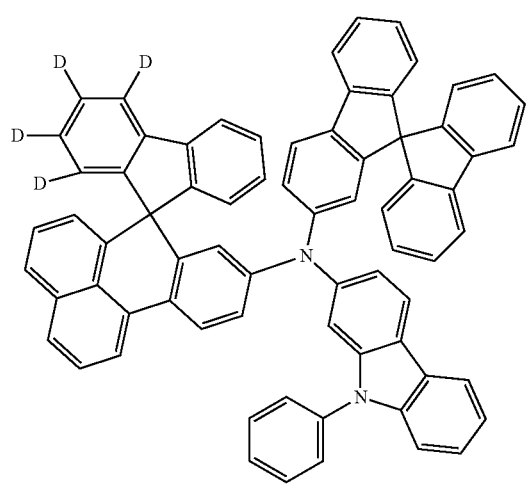
9
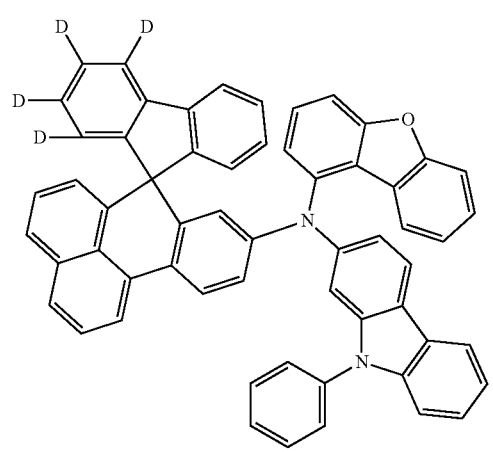
-continued
10
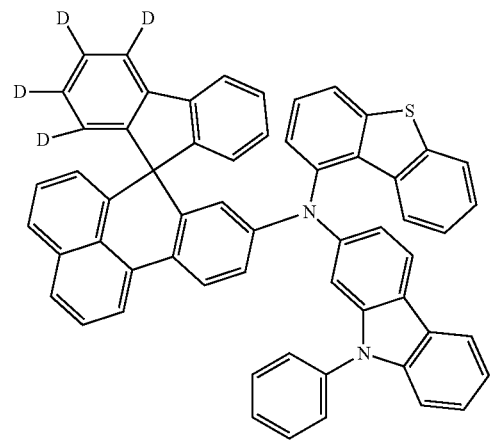
11
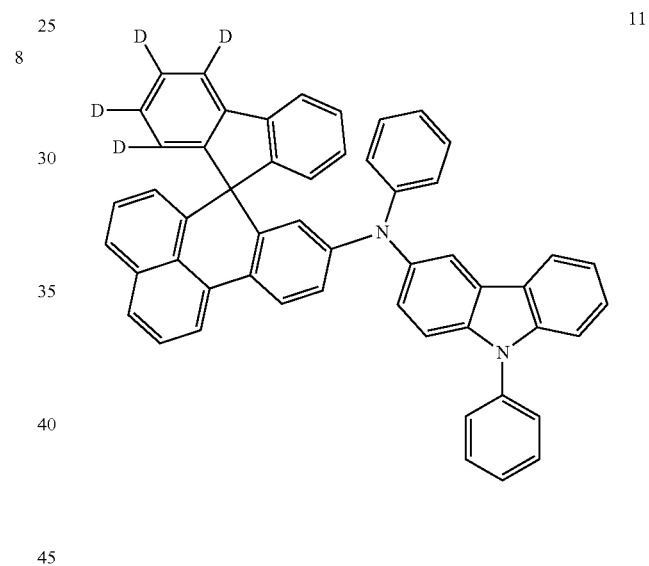
12
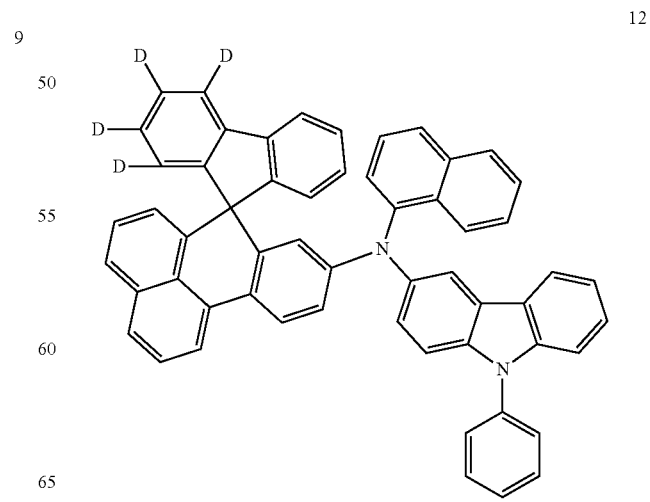

13
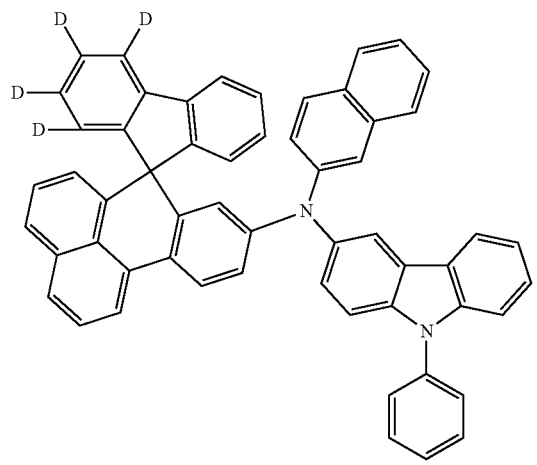
14
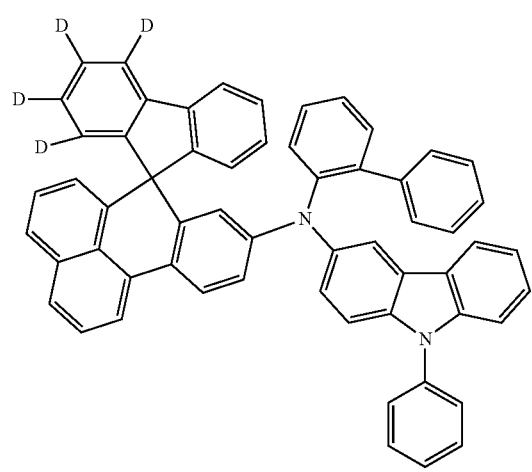
15
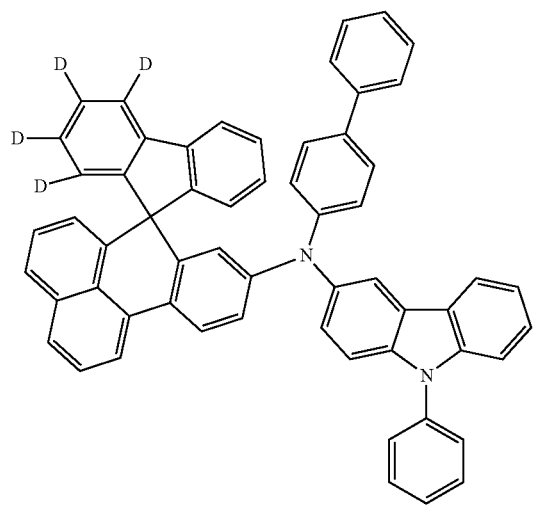
16
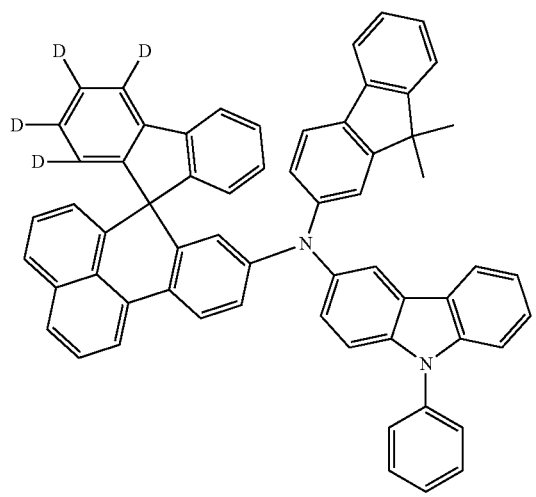
17
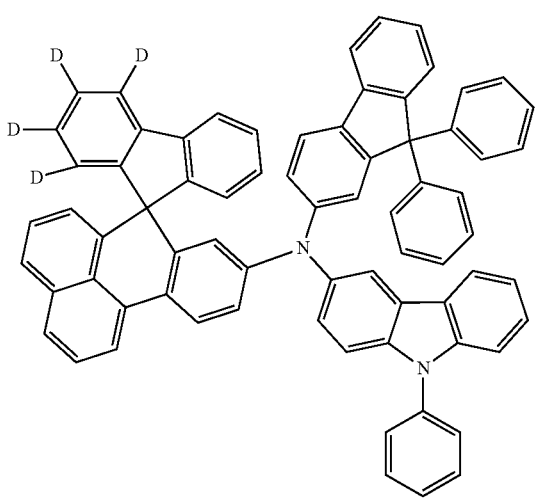
18
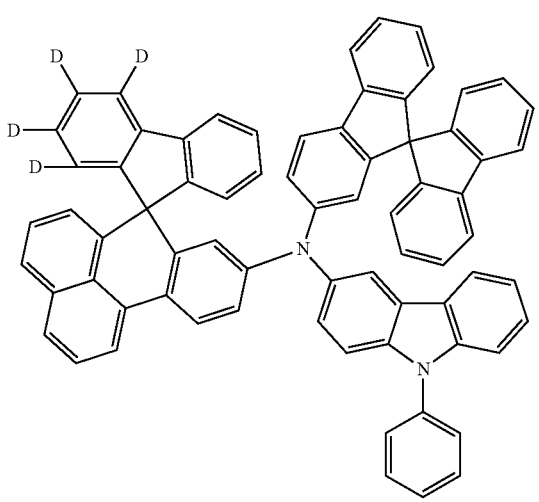

19
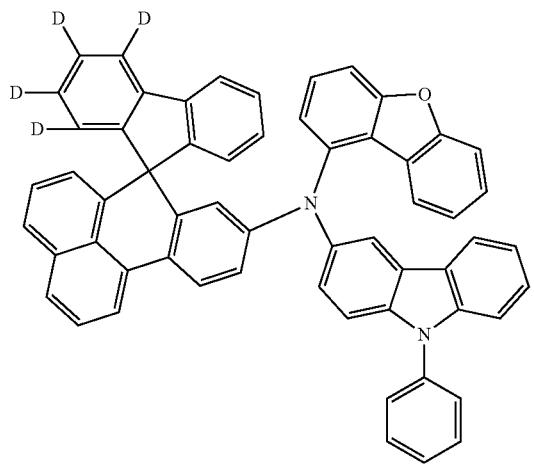
20
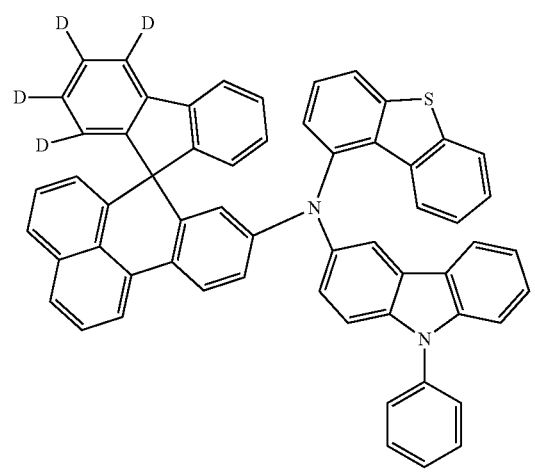
21
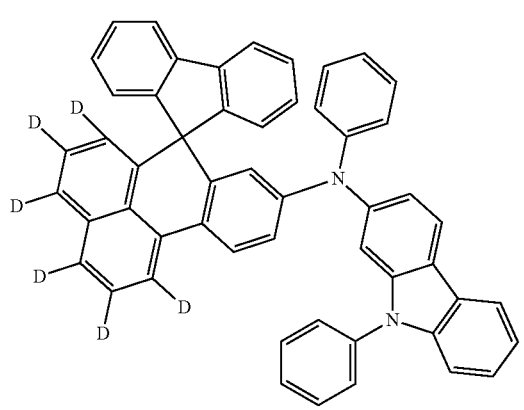
22
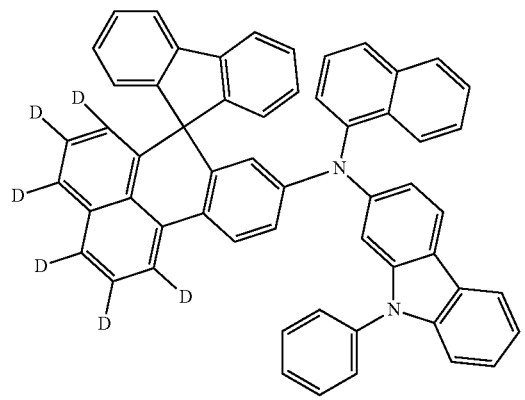
23
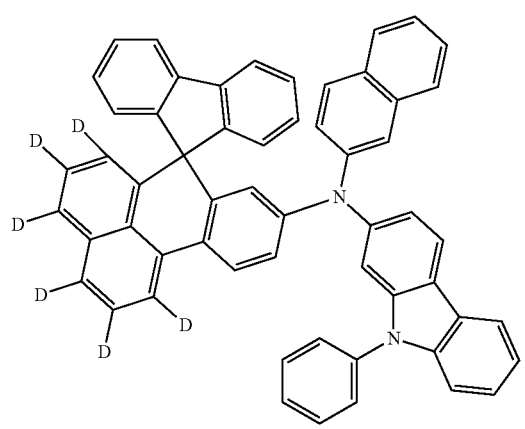
24

25
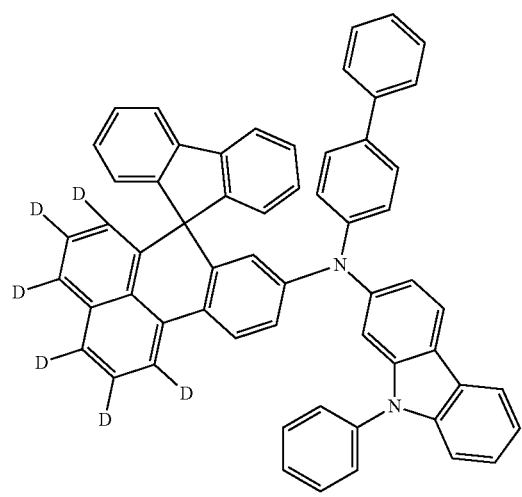
26
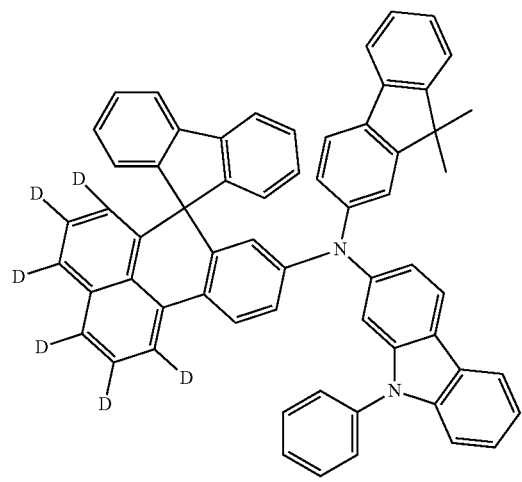
27
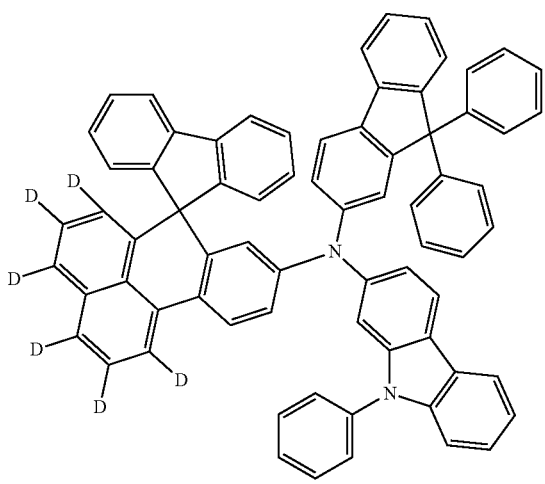
28
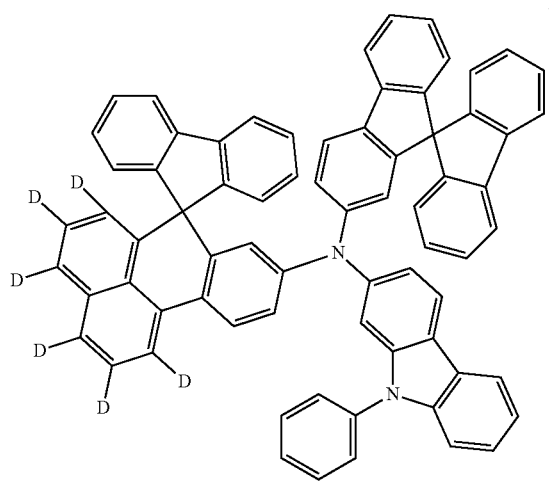
29
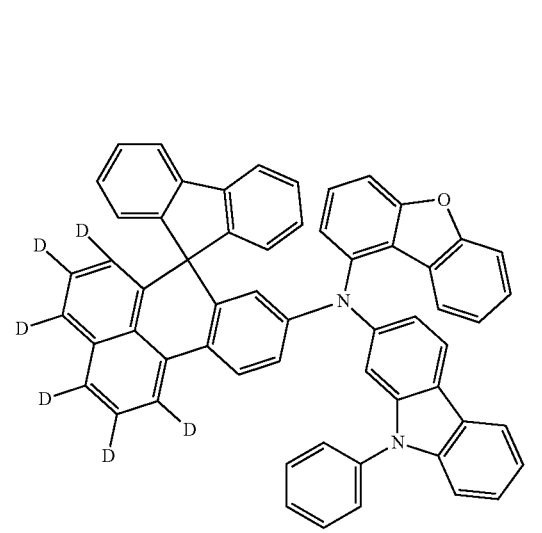
30
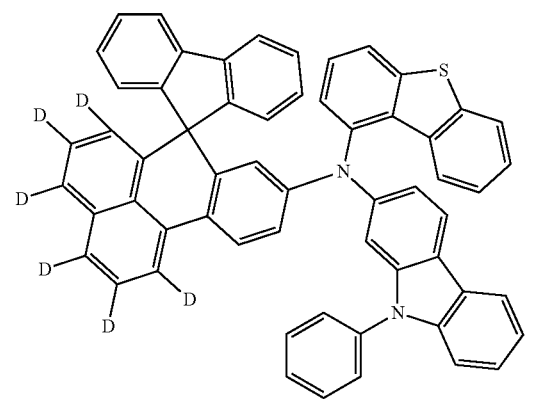

-continued
31
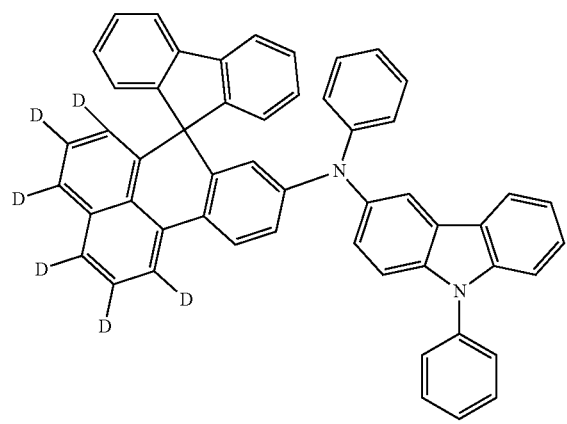
32
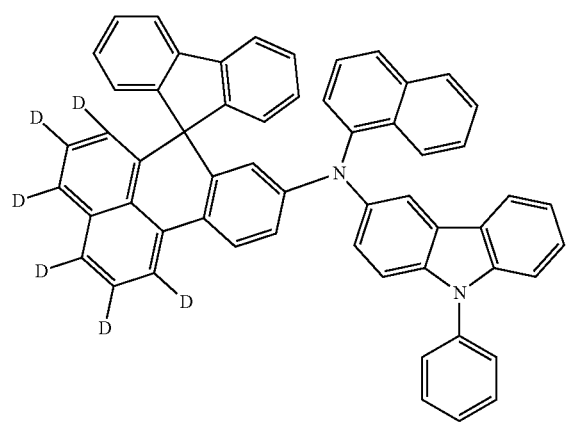
33
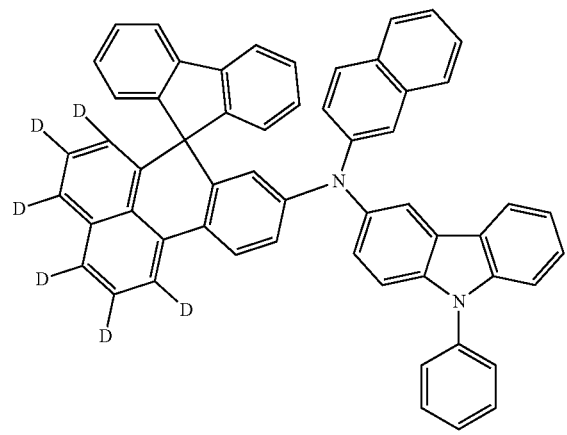
-continued
34
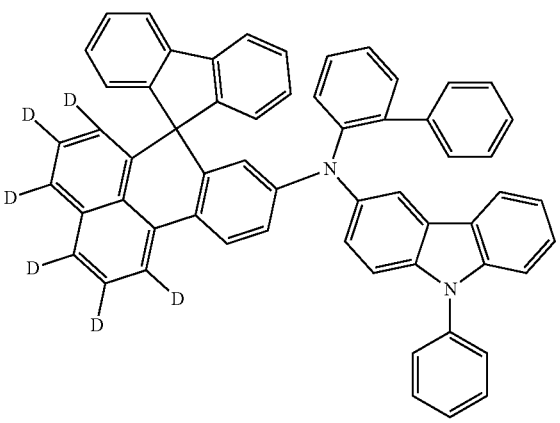
35
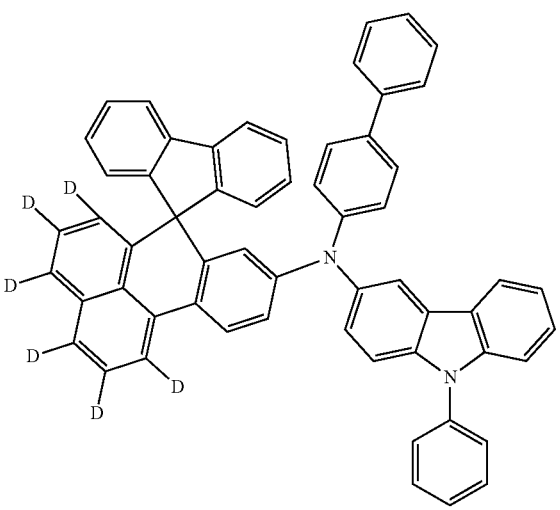
36
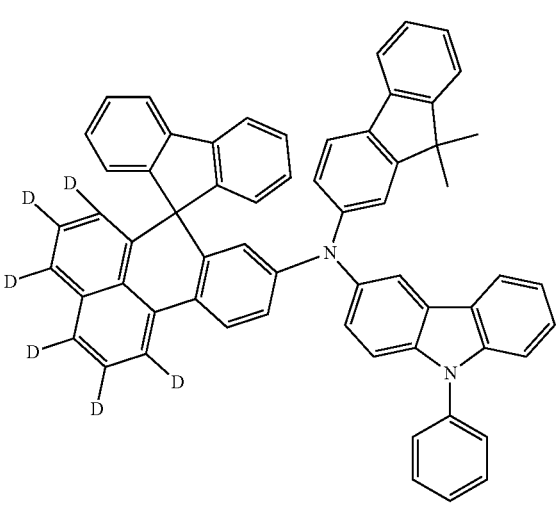

37
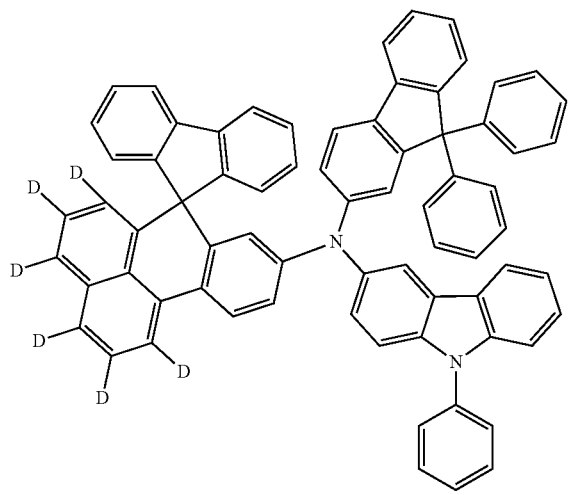
38
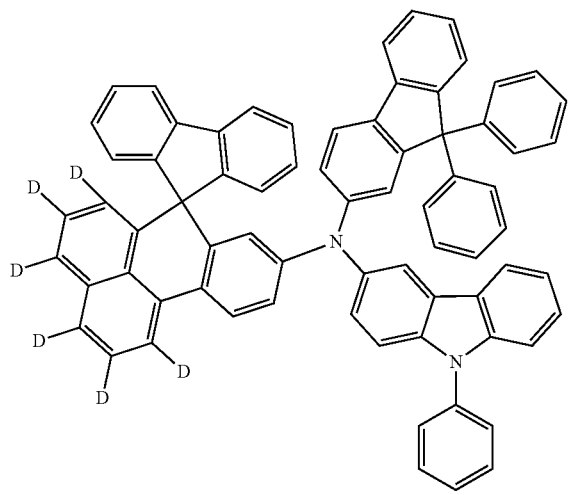
39
40
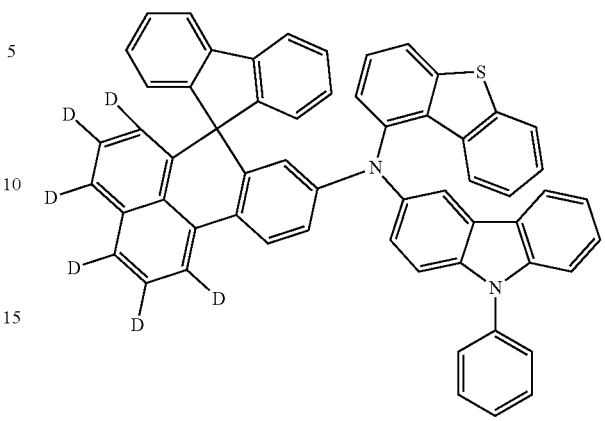
41
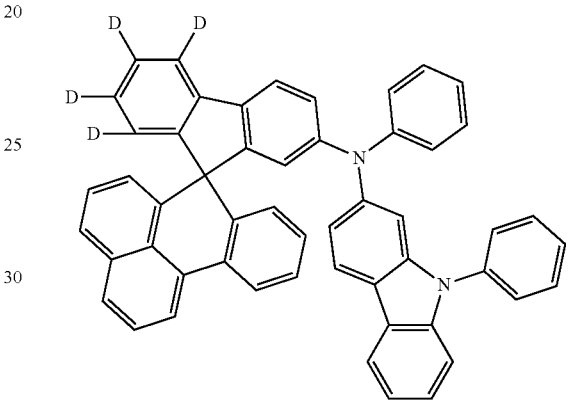
42
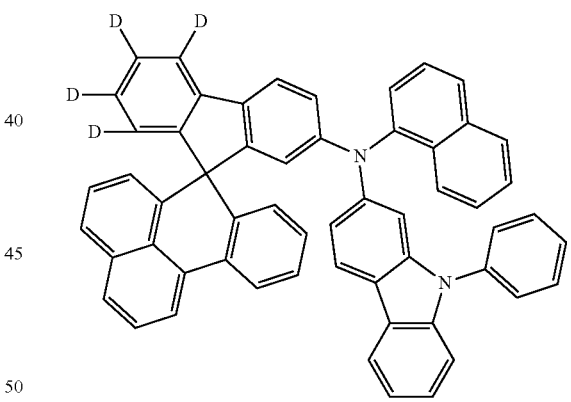
43
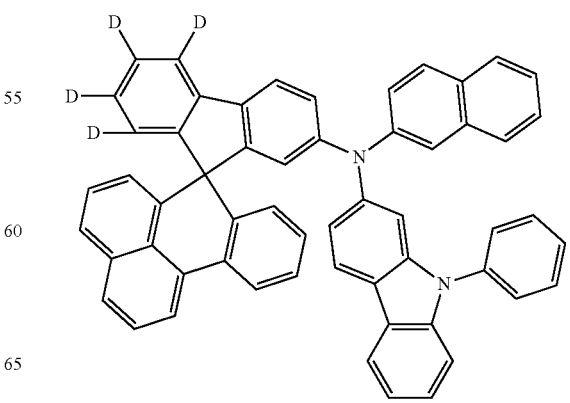

44
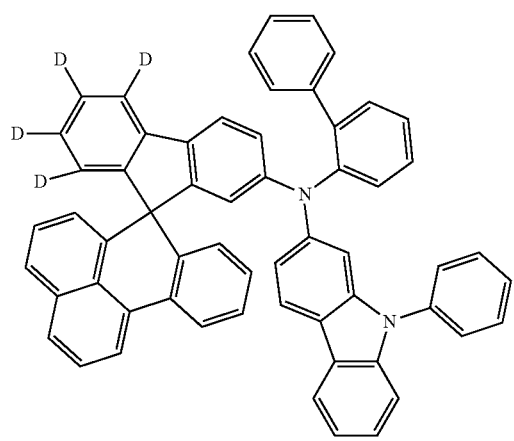
45
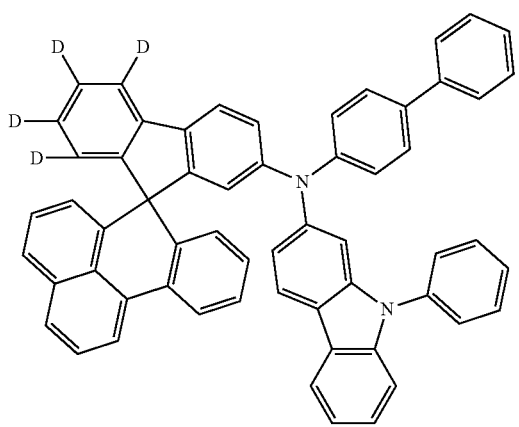
46
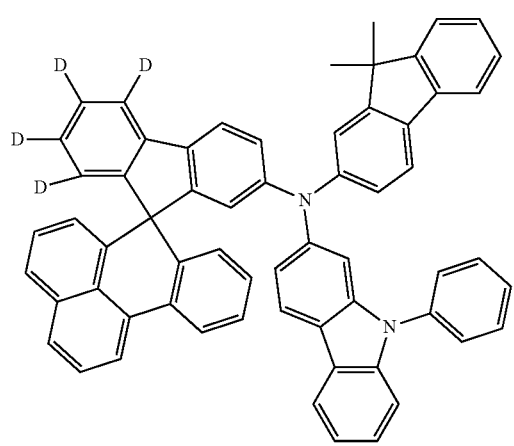
47
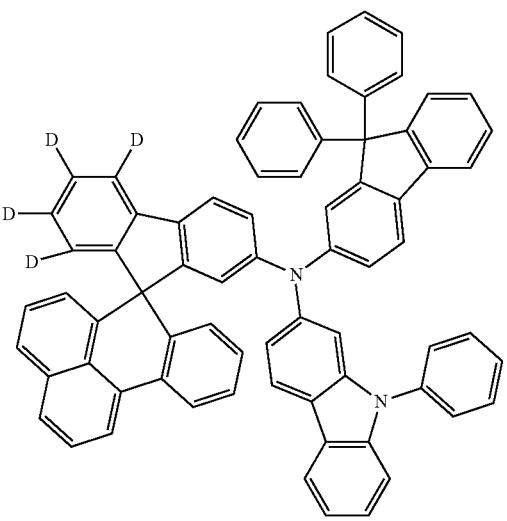
48
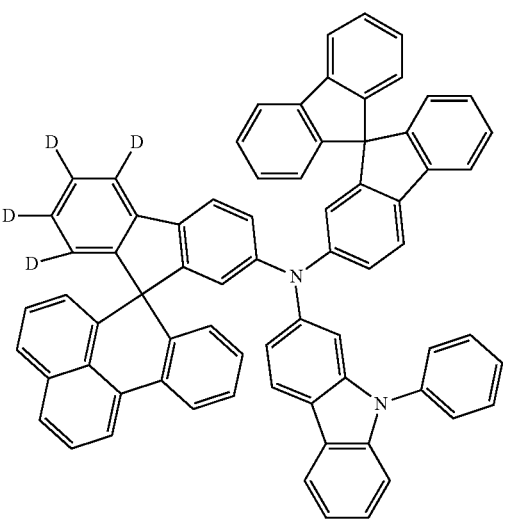
49
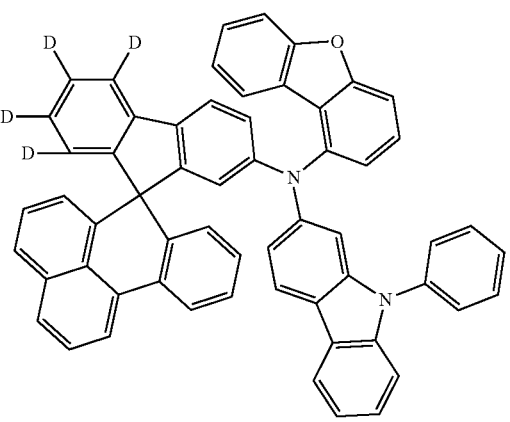

50
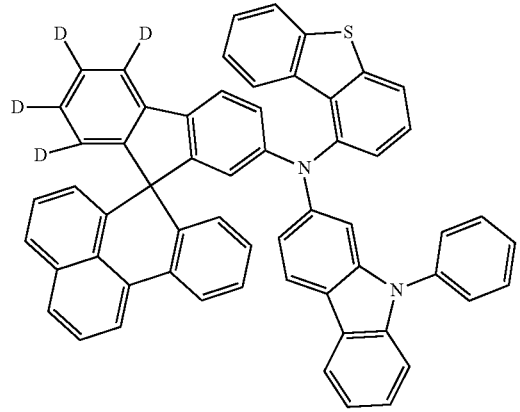
51
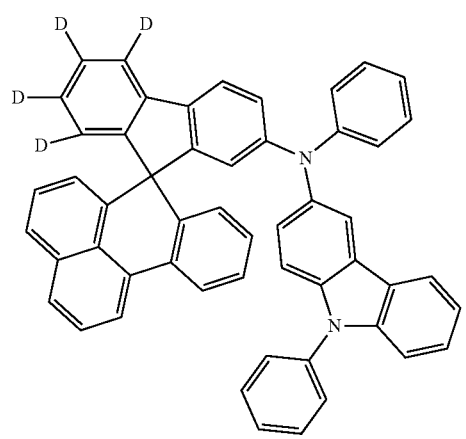
52
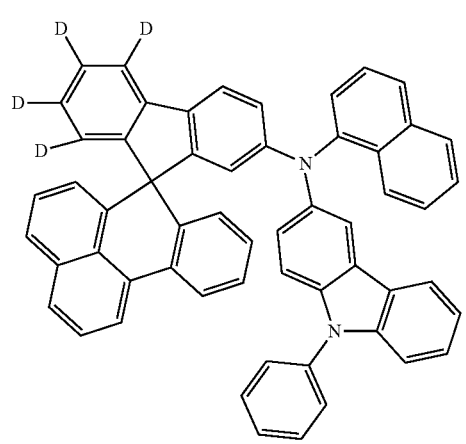
53
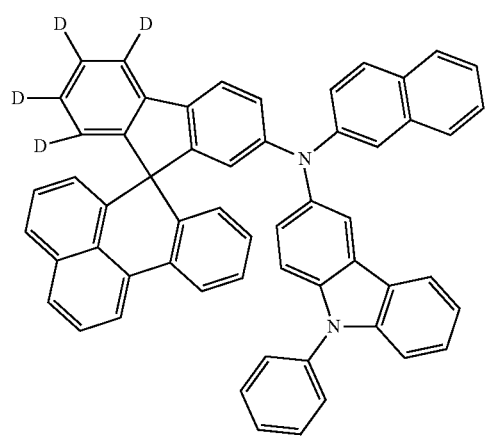
54
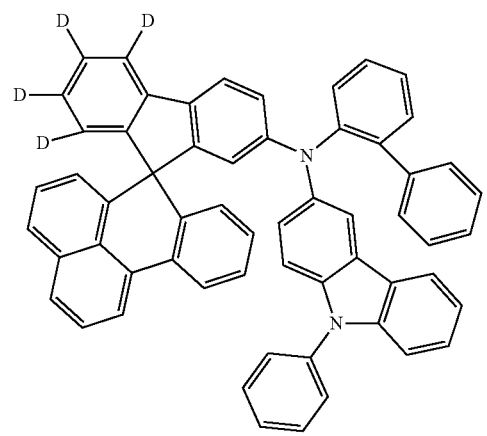
55
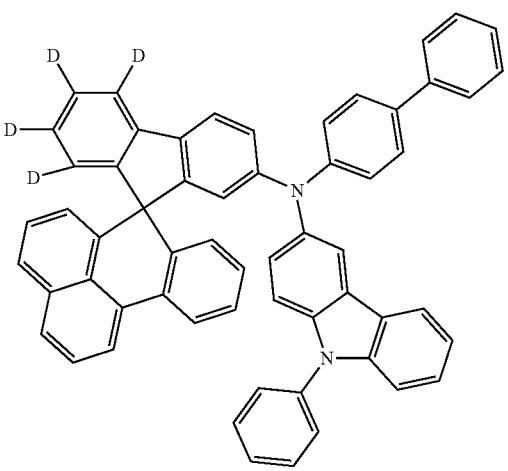

56
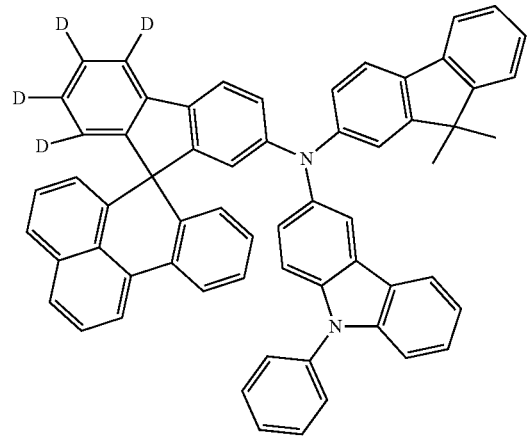
57
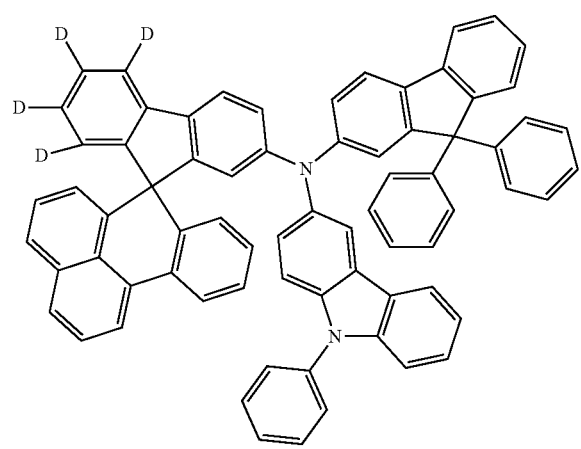
58
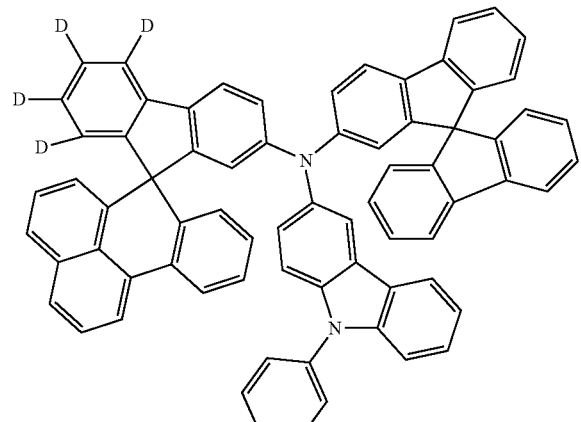
59
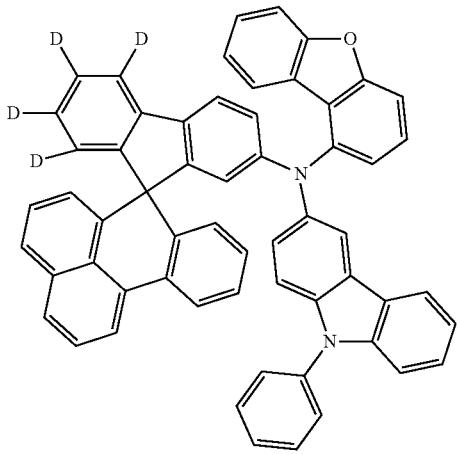
60
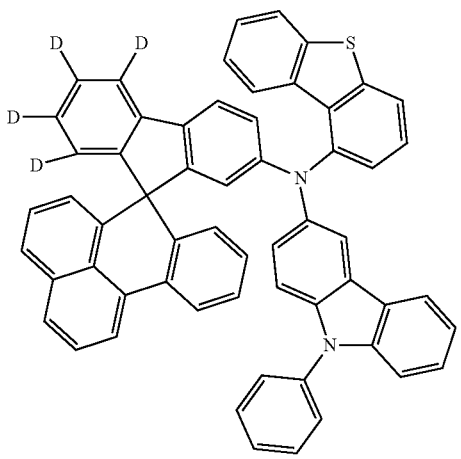
61
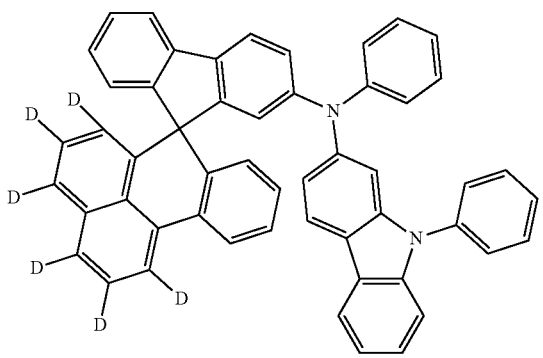
62
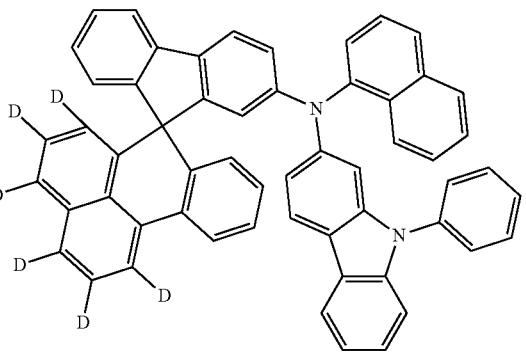

63
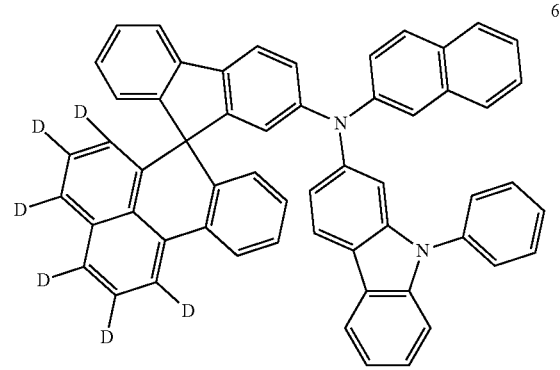
64
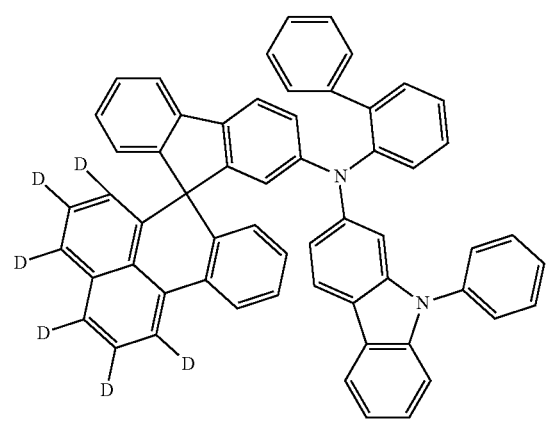
65
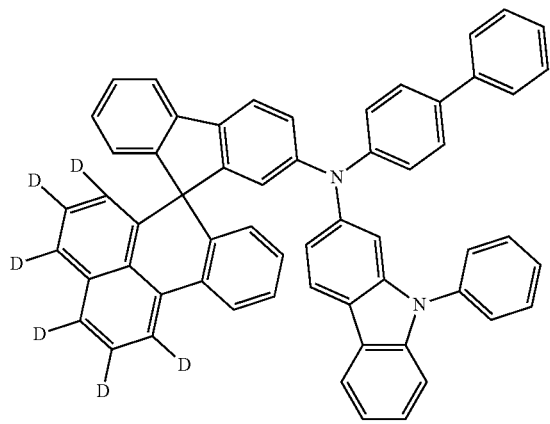
66
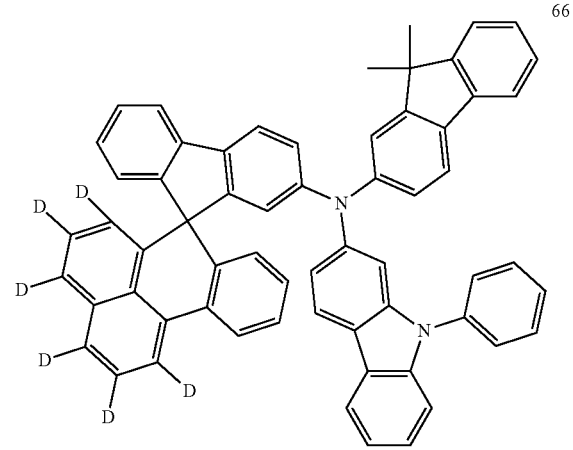
67
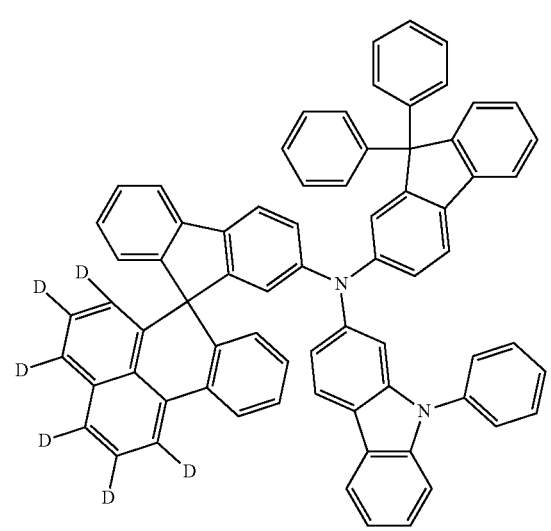
68
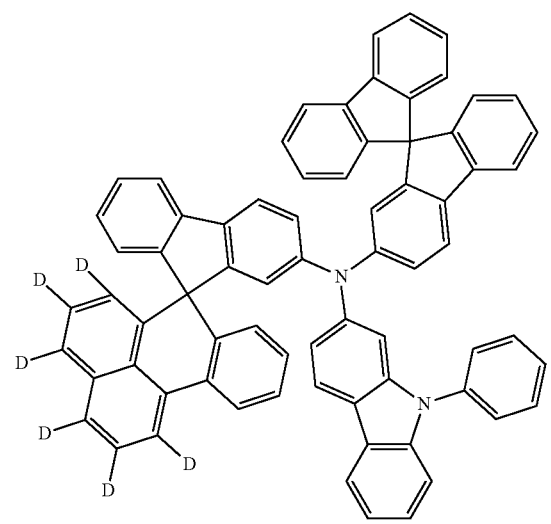

69
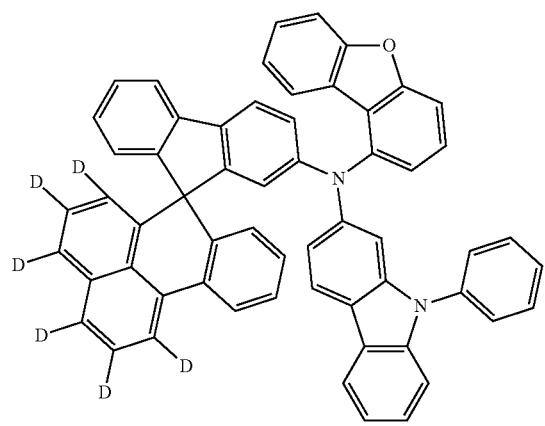
70
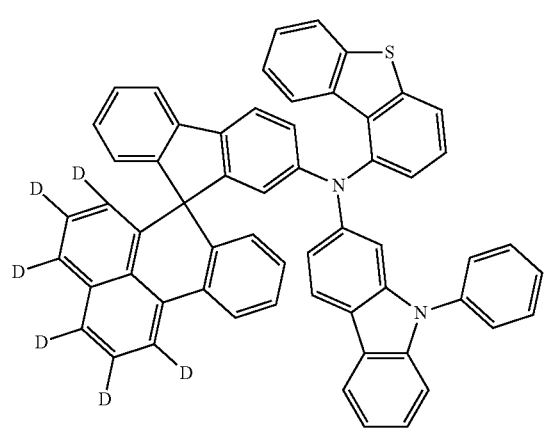
71
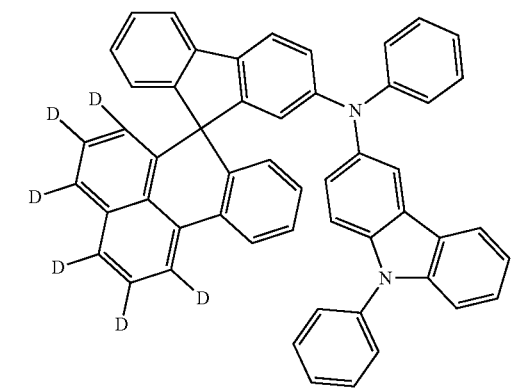
72
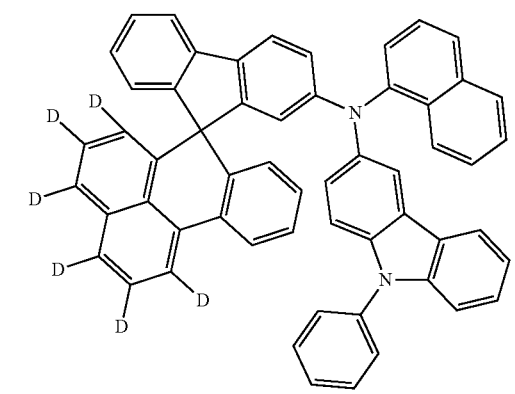
73
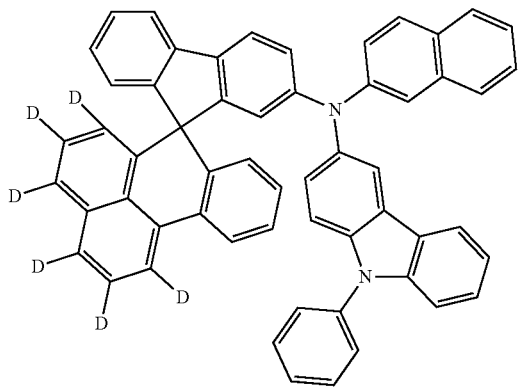
74
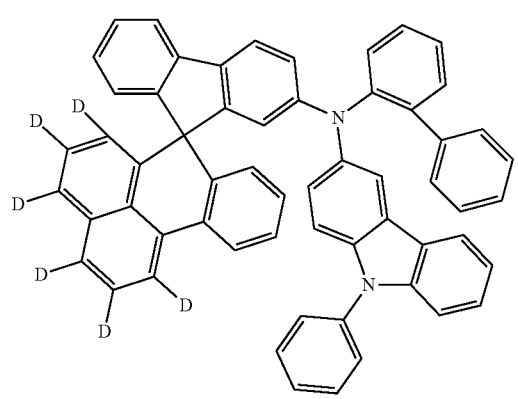
75
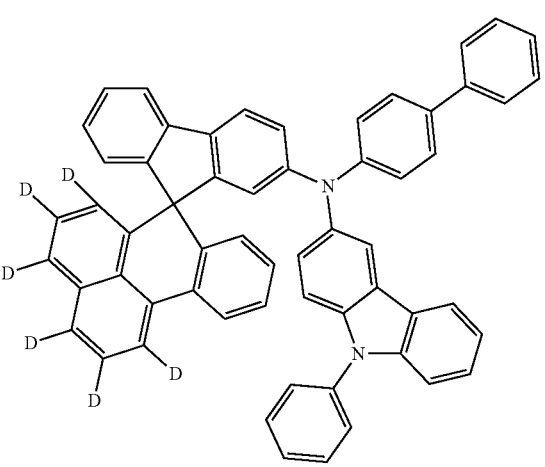

76
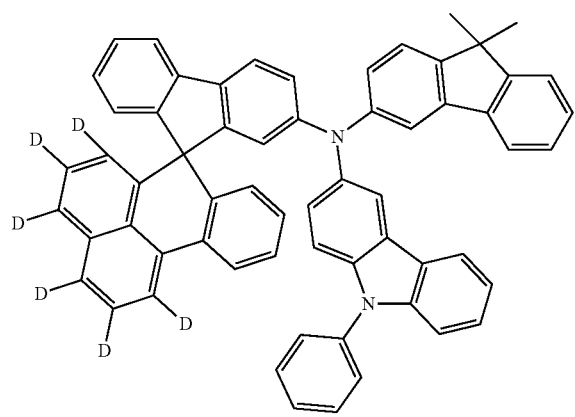
77
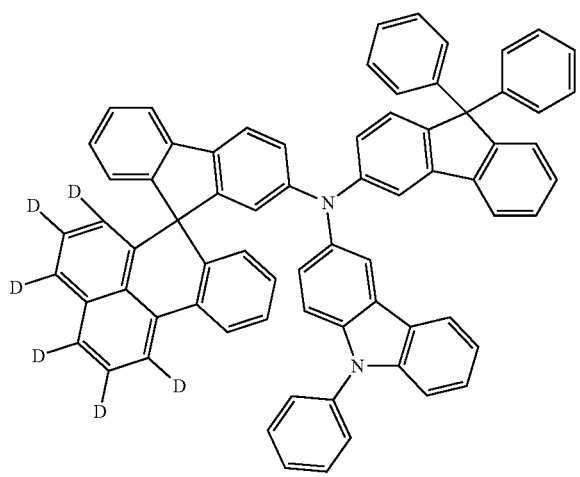
78
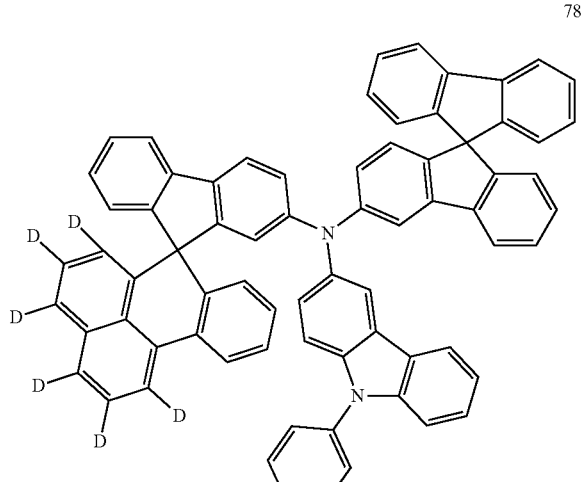
79
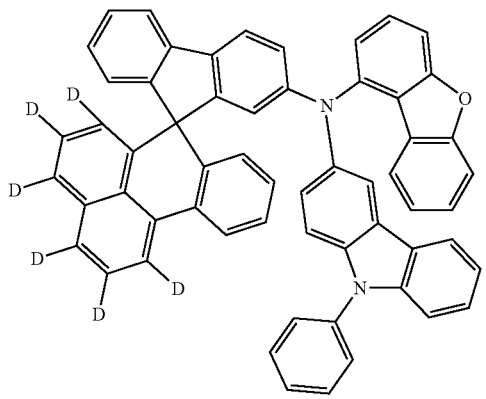
80
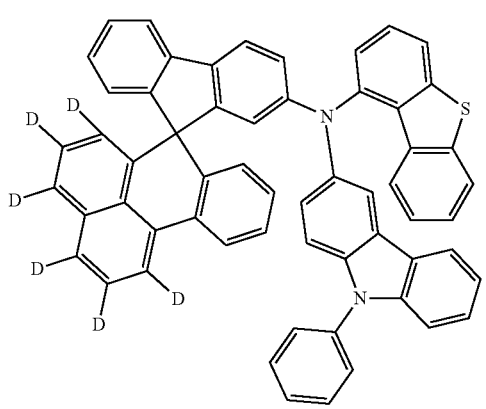
81
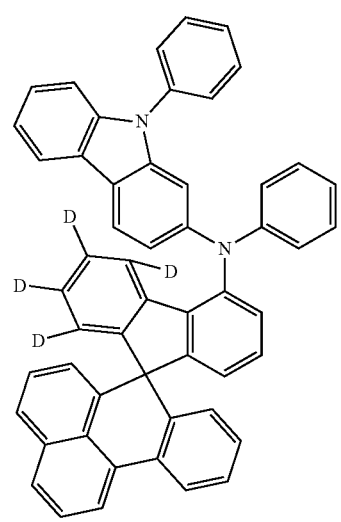

82
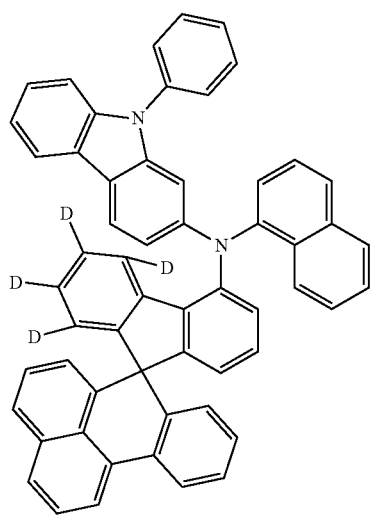
83
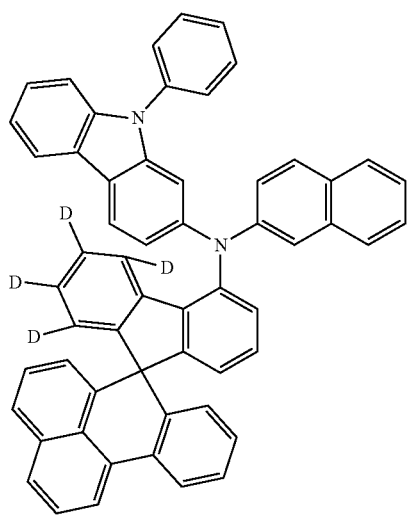
84
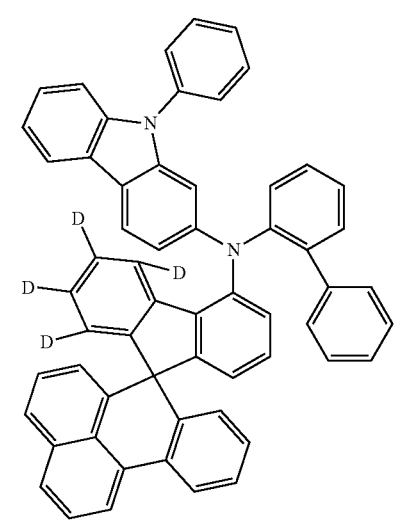
85
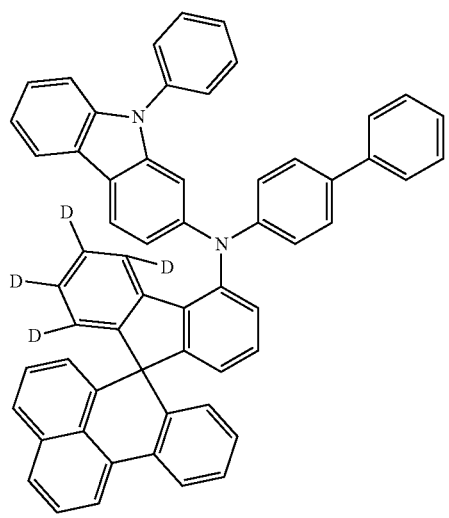
86
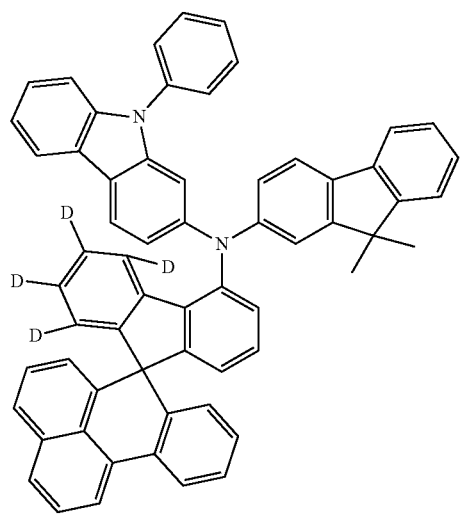
87
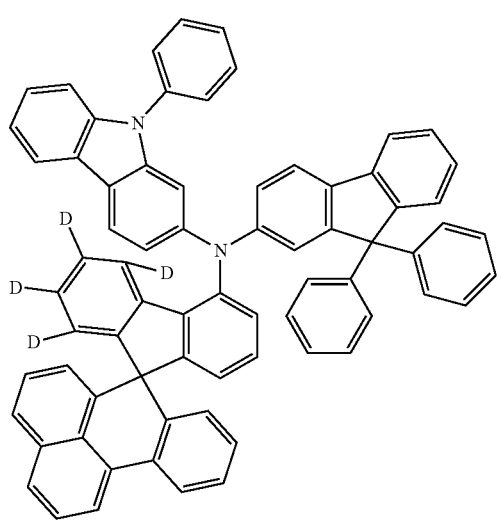

88
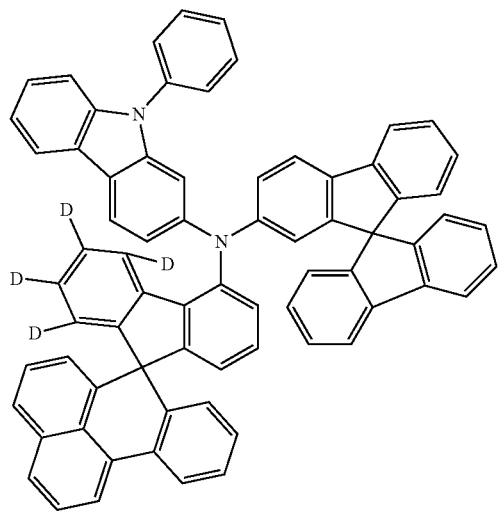
89
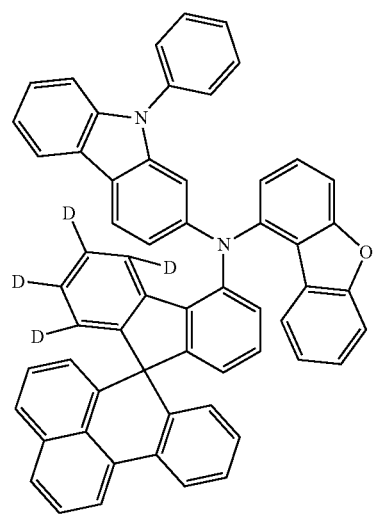
90
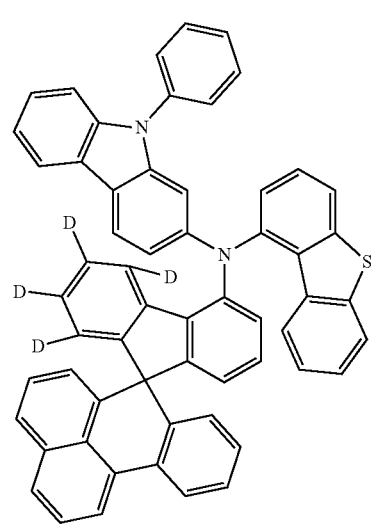
91
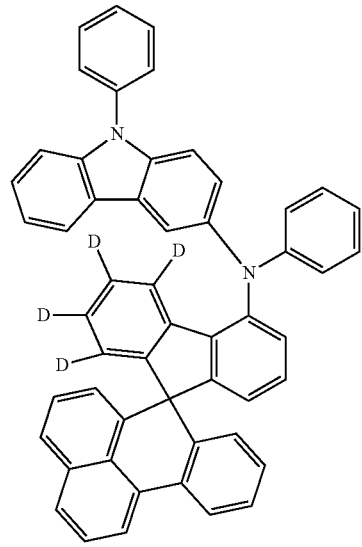
92
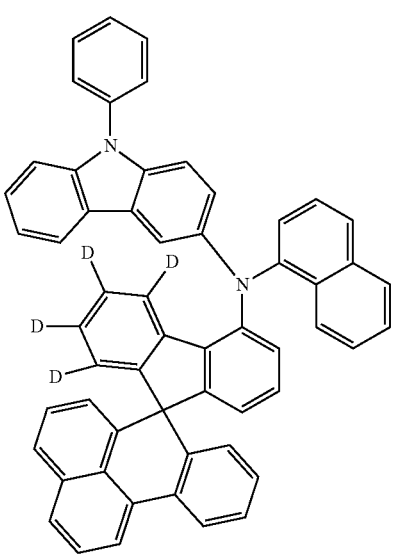
93
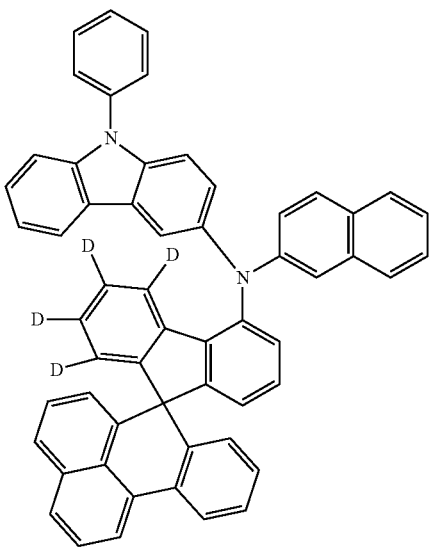

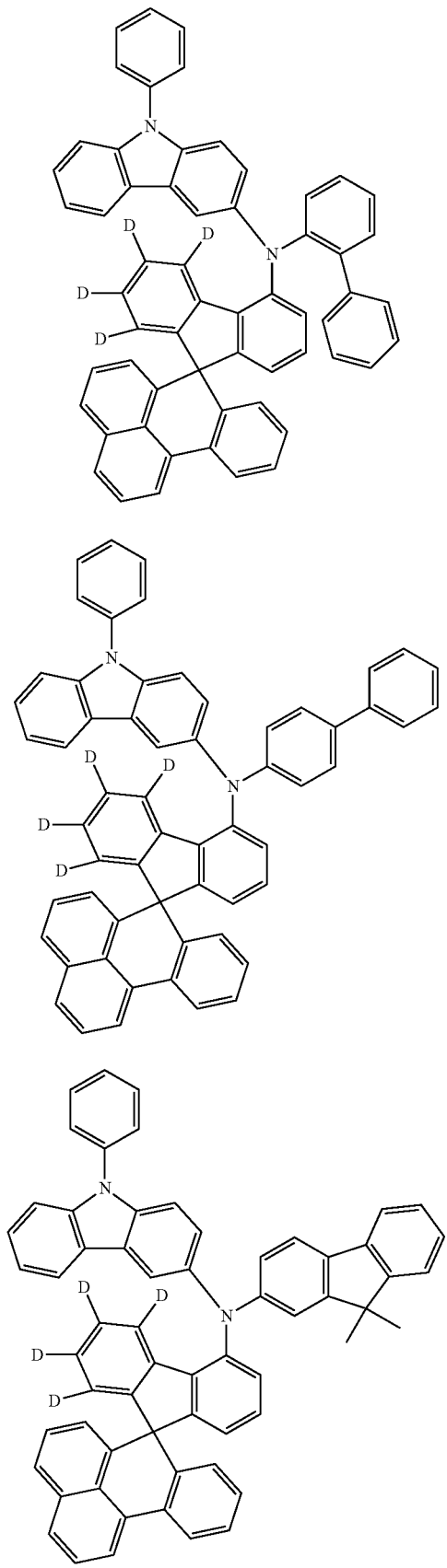
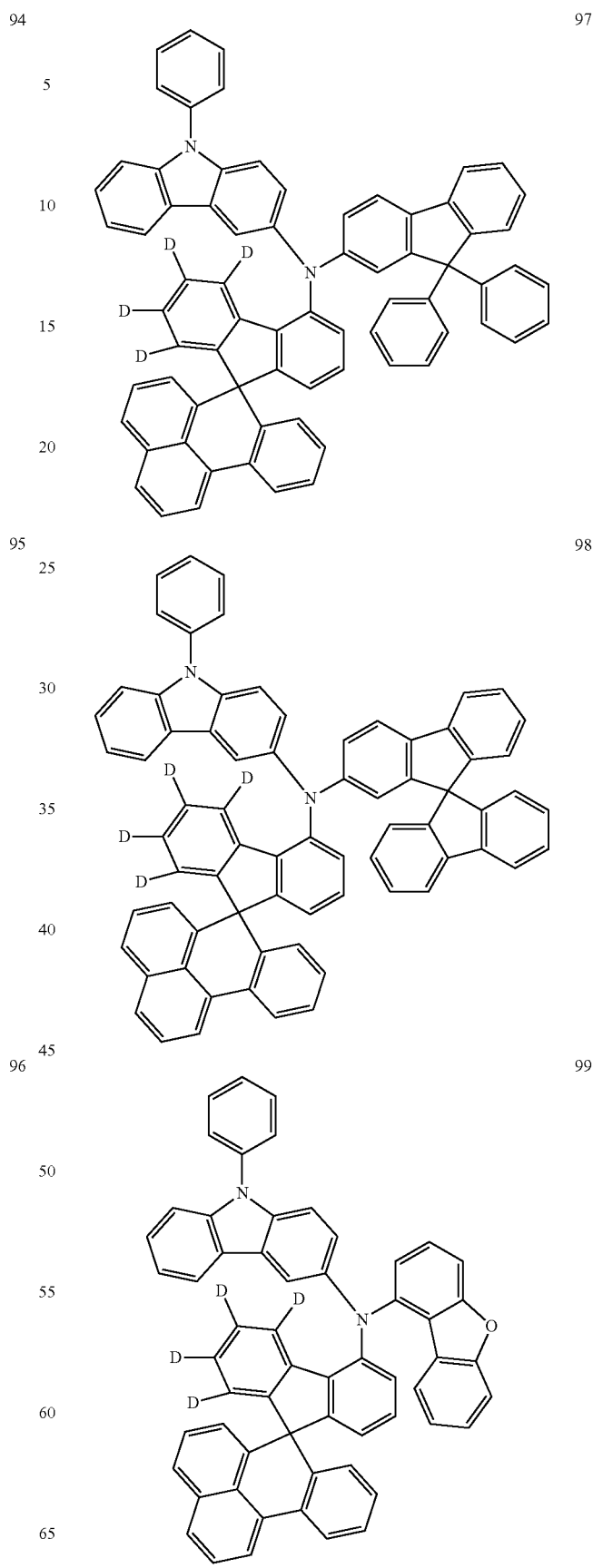

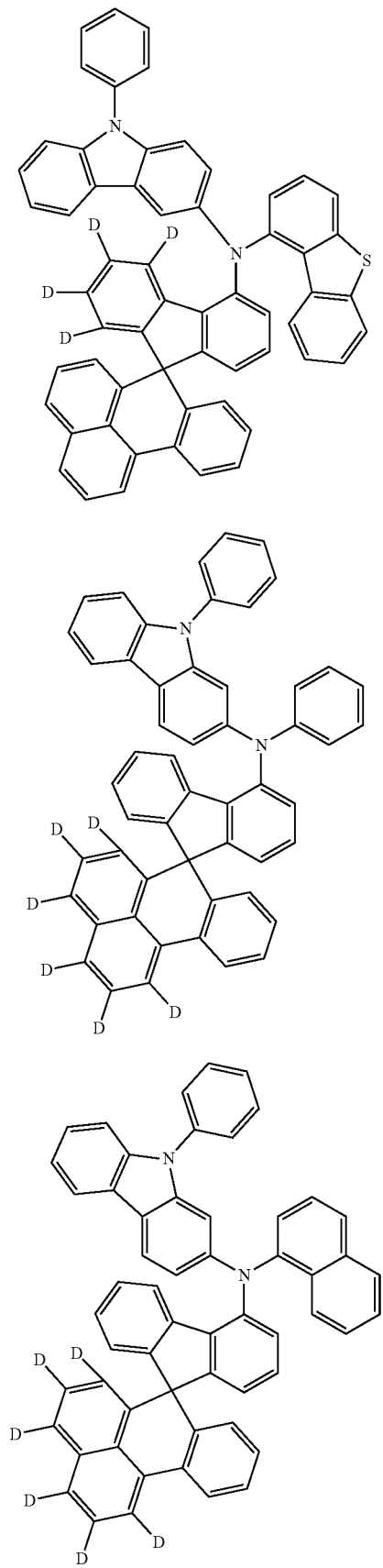
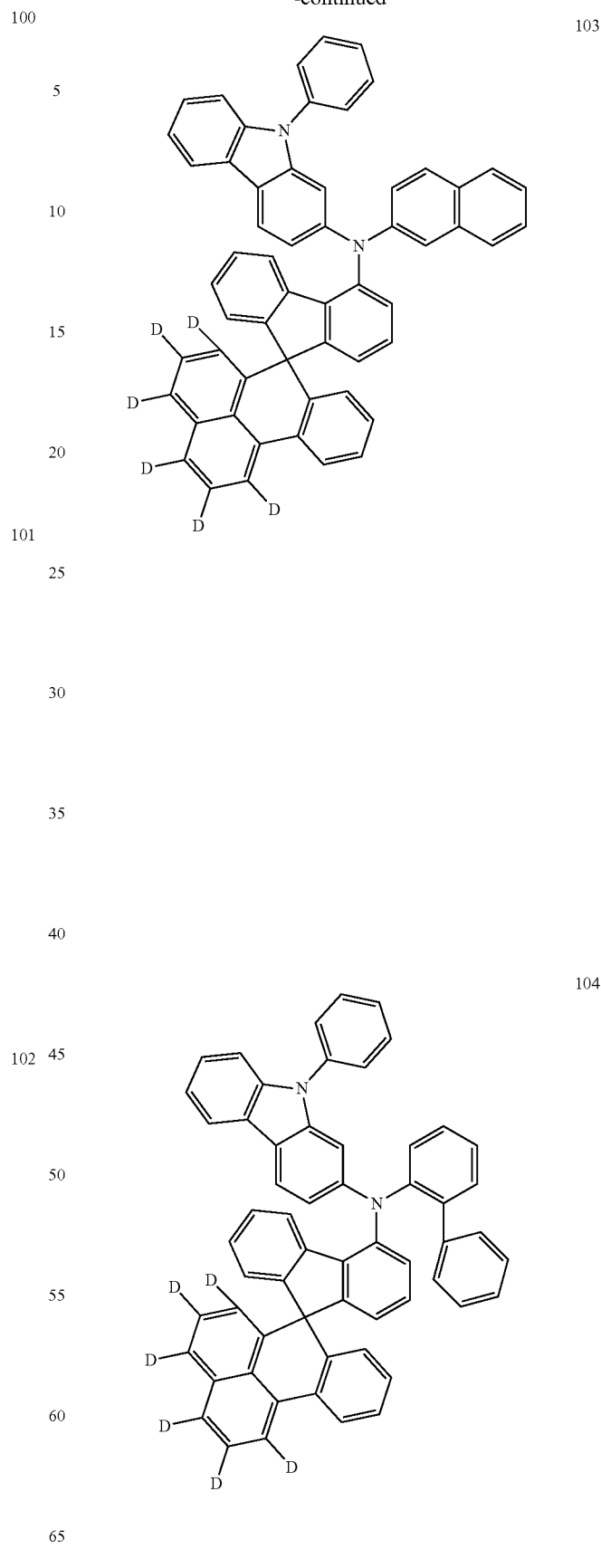

105
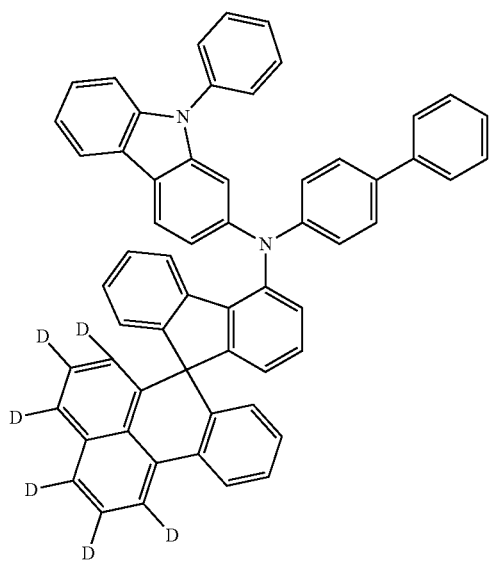
106
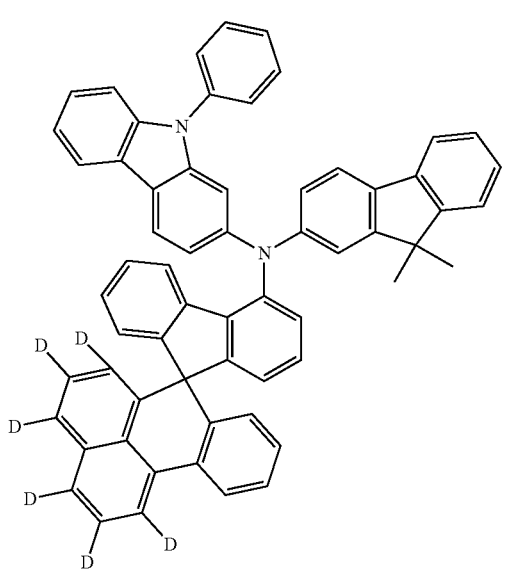
107
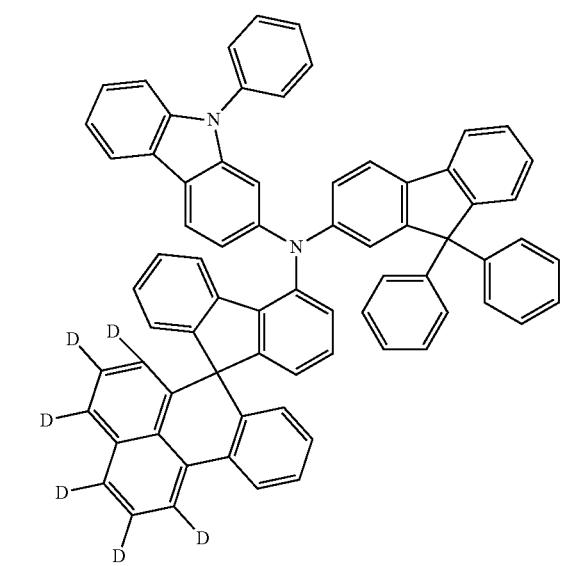
108
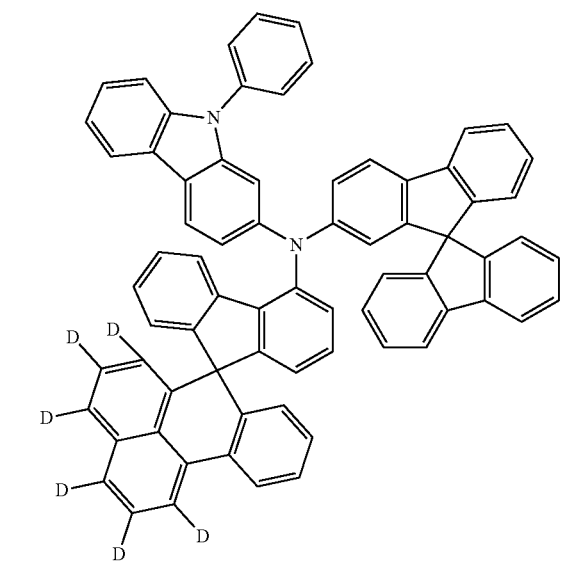

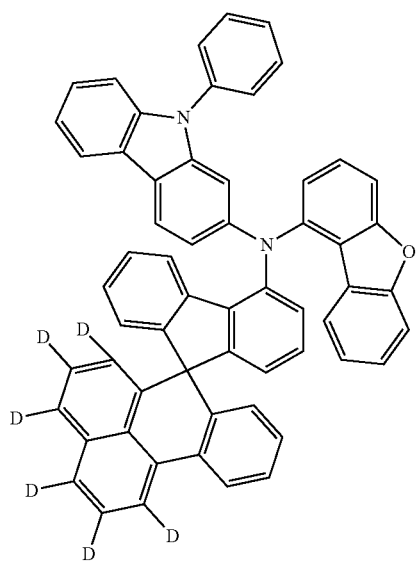
109
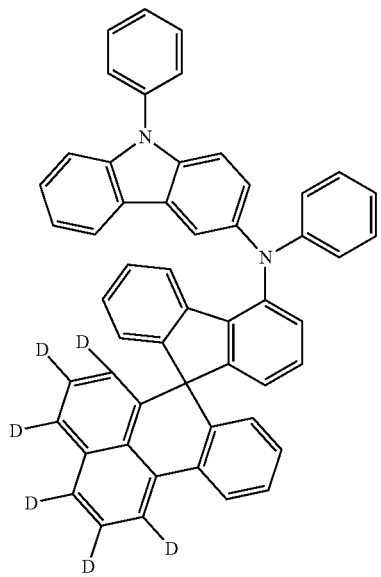
111
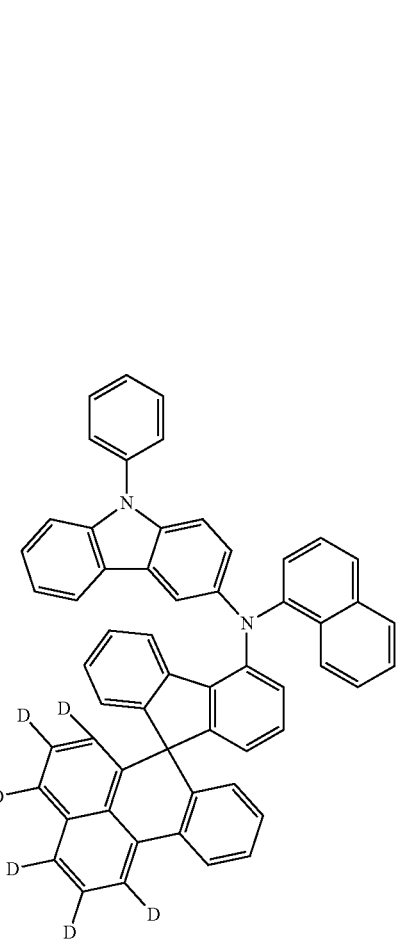
110
112

199
-continued
113
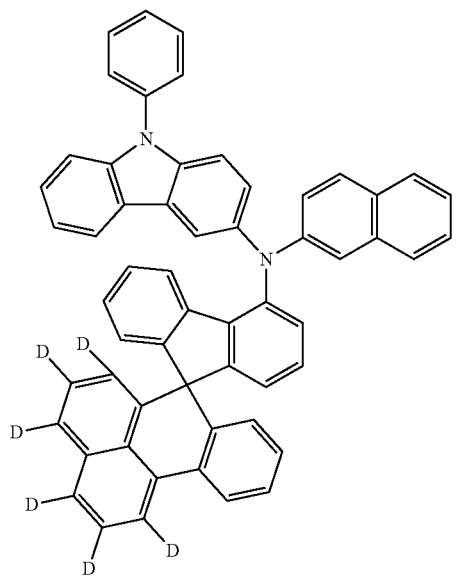
114
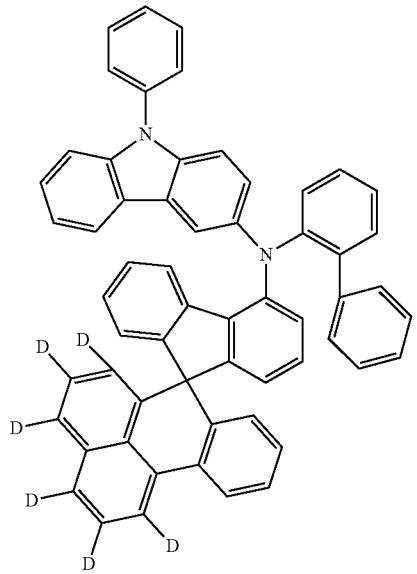
200
-continued
115
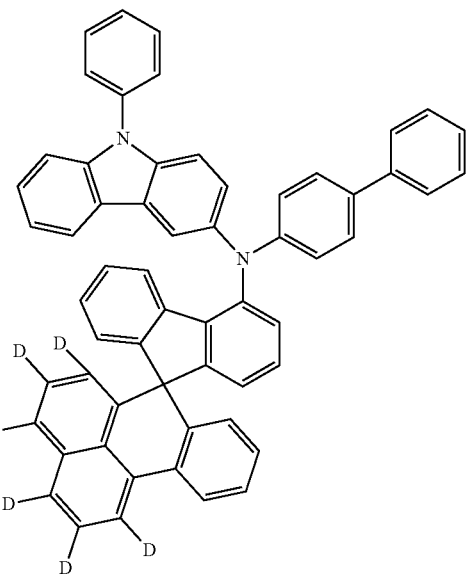
116
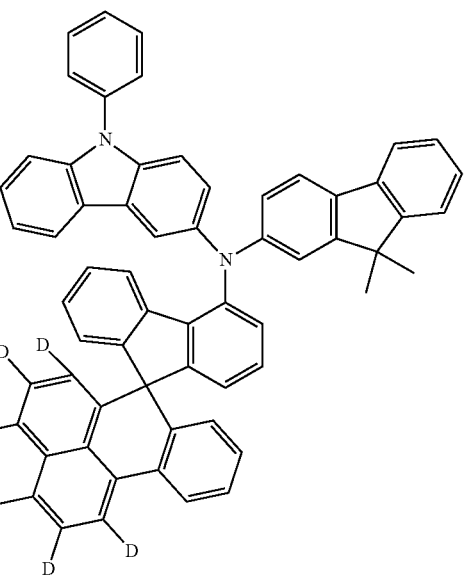

117
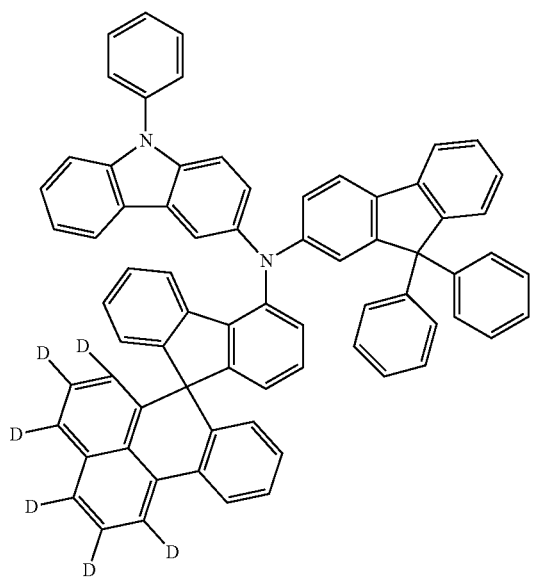
119
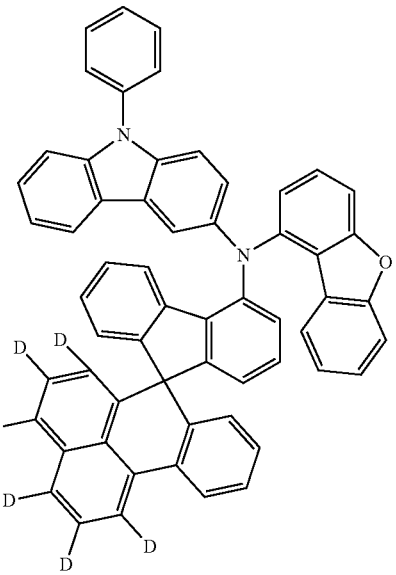
120
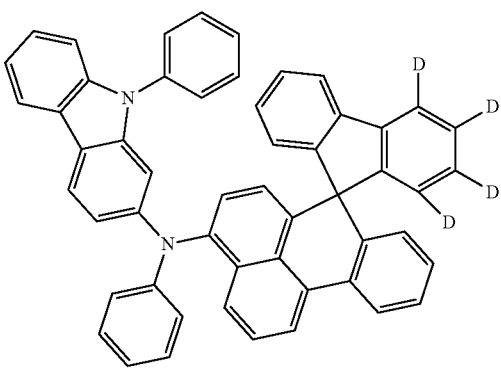
118
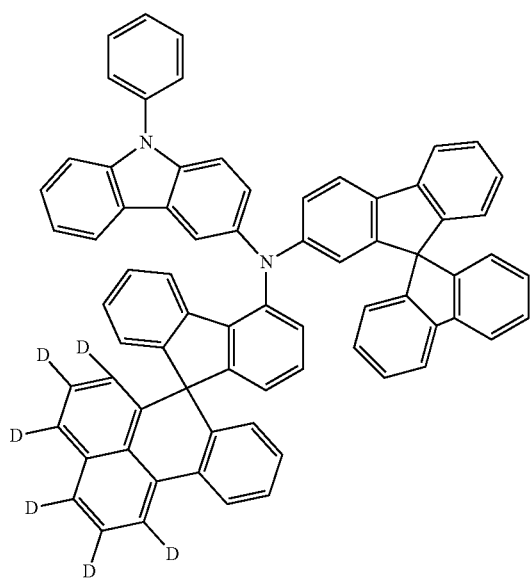
121

122
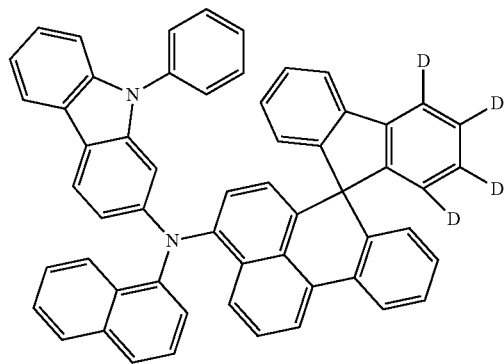
123
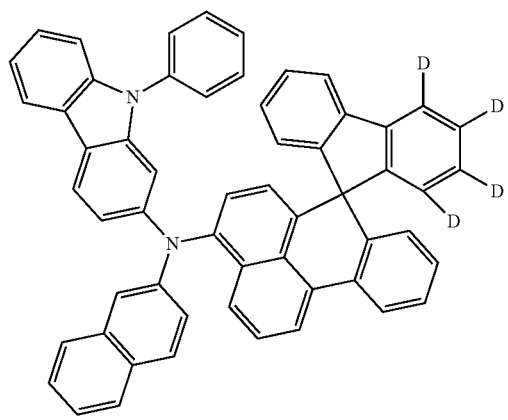
124
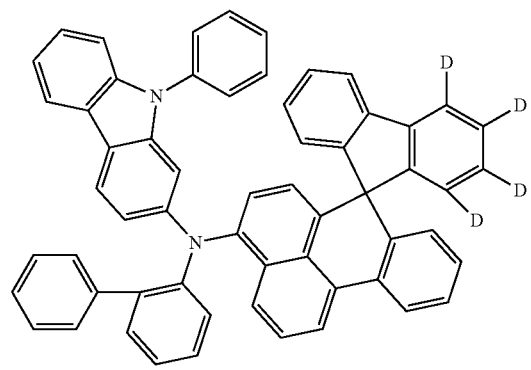
125
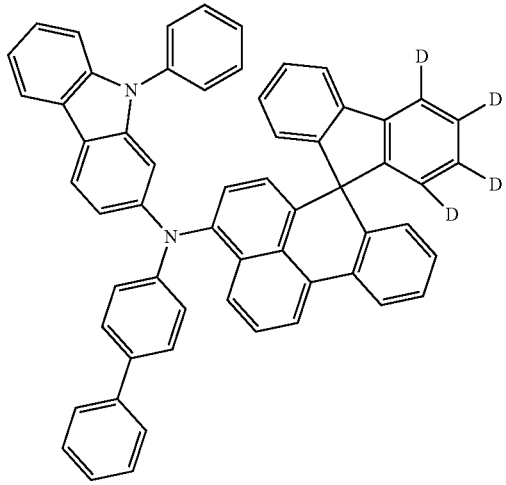
126
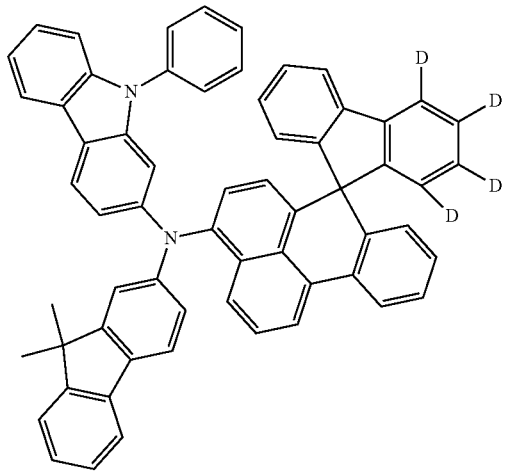
127
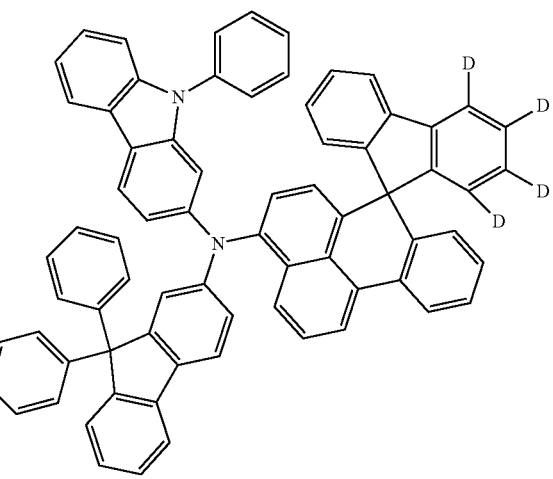

205
-continued
128
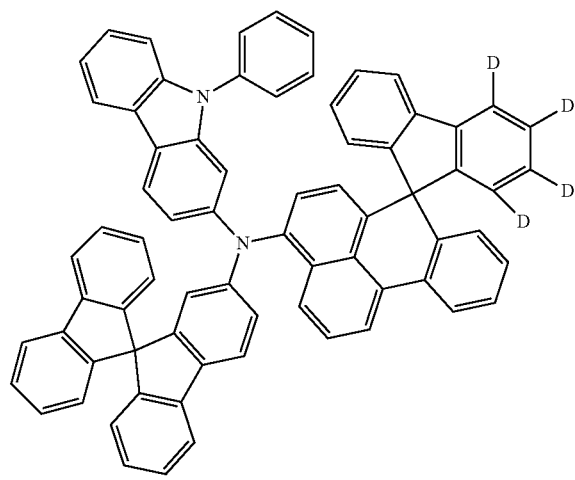
129
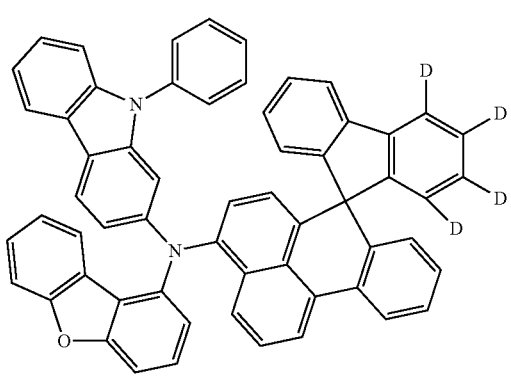
130
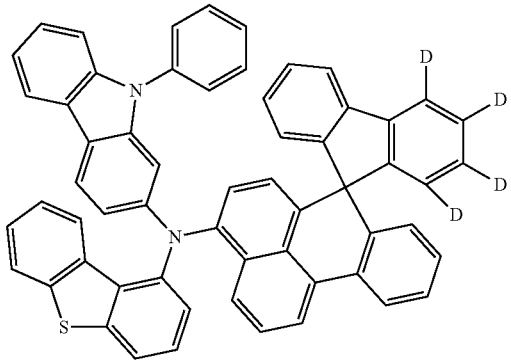
131
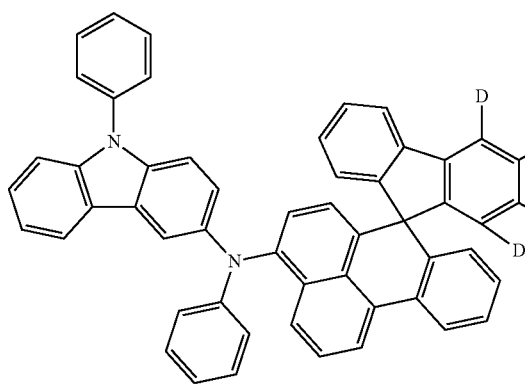
206
-continued
132
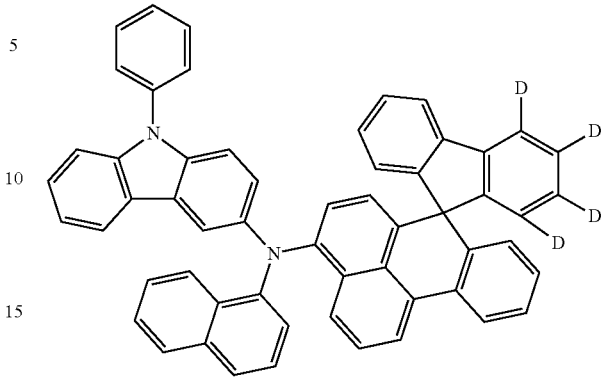
133
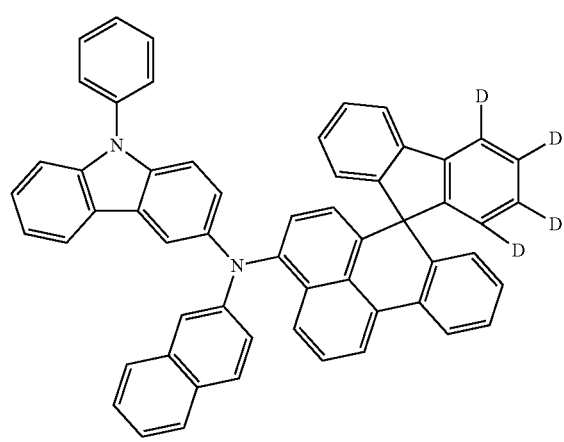
134
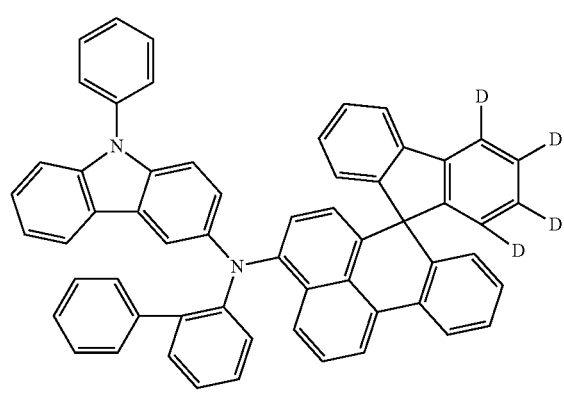

135
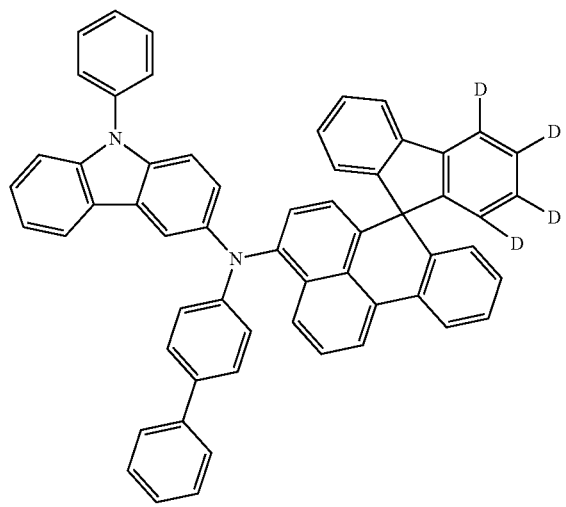
136
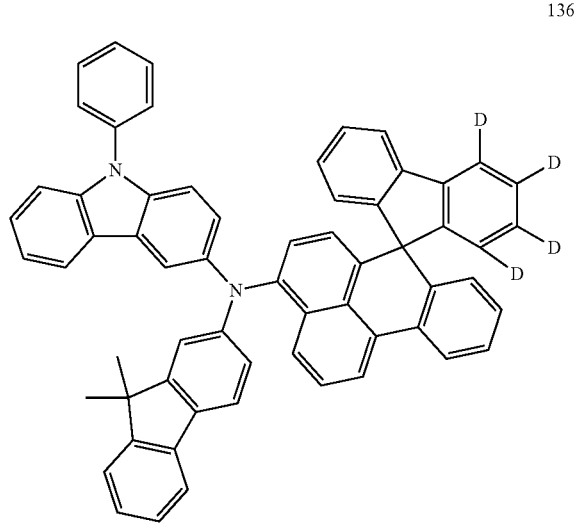
137
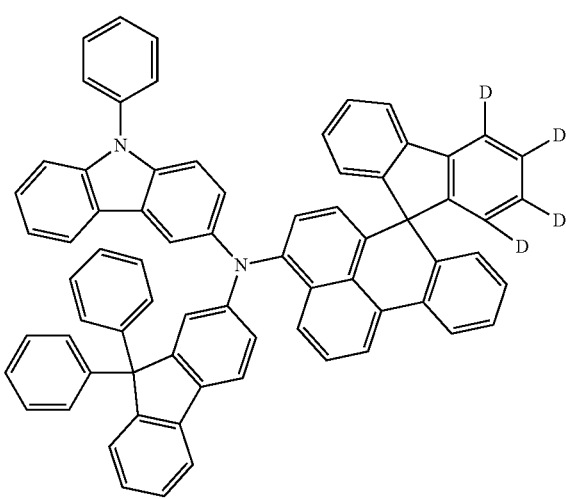
138
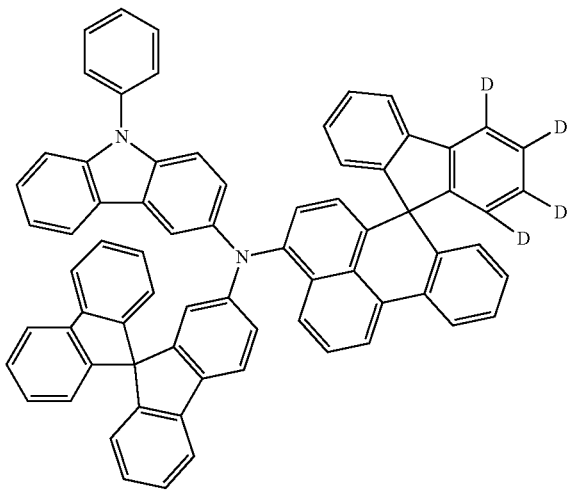
139
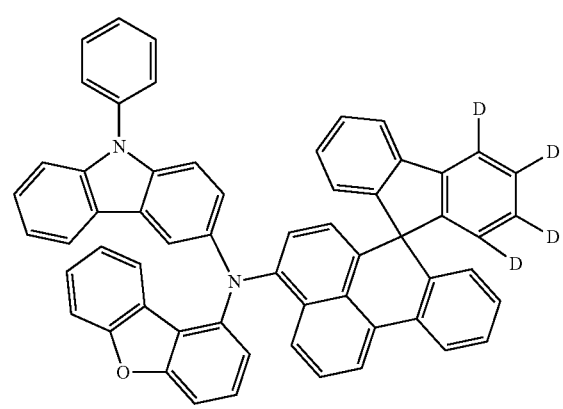
140
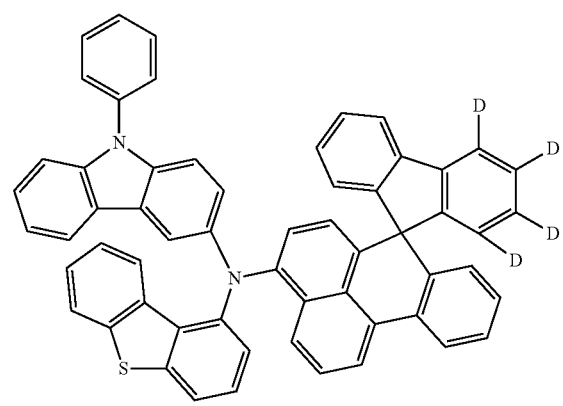

141
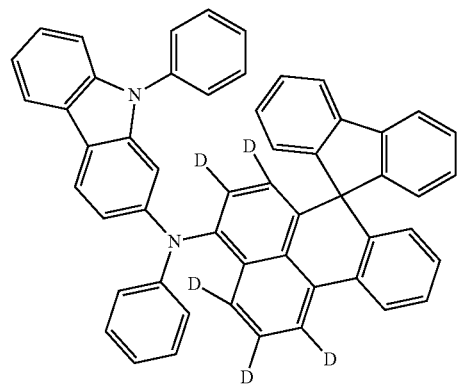
142
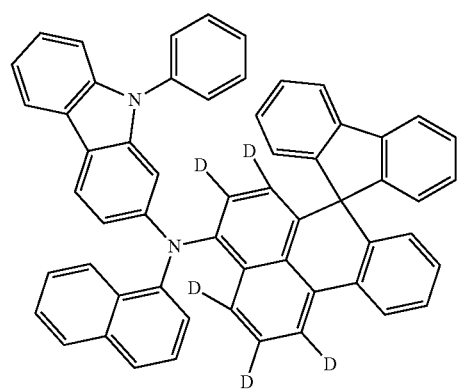
143
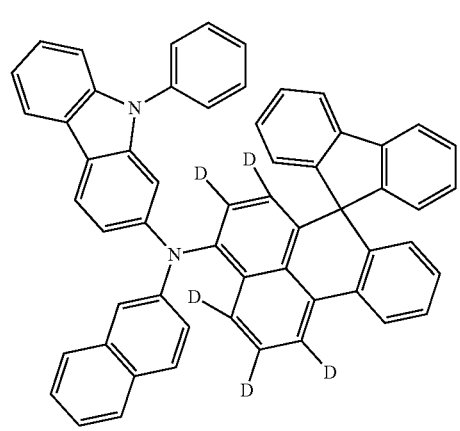
144
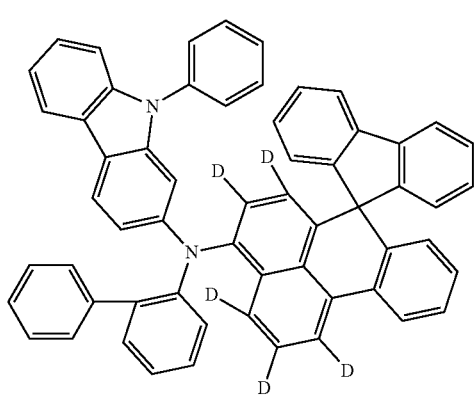
145
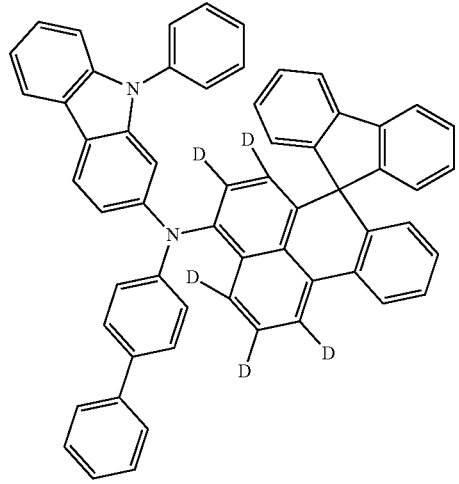
146
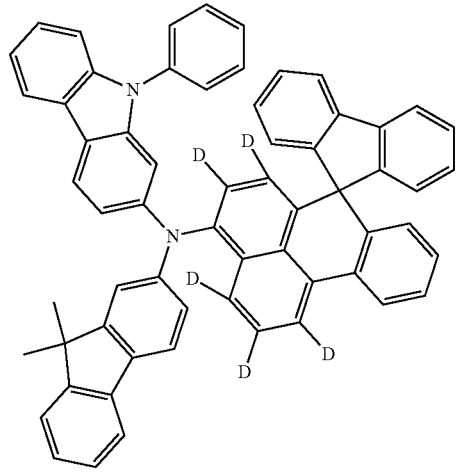
147
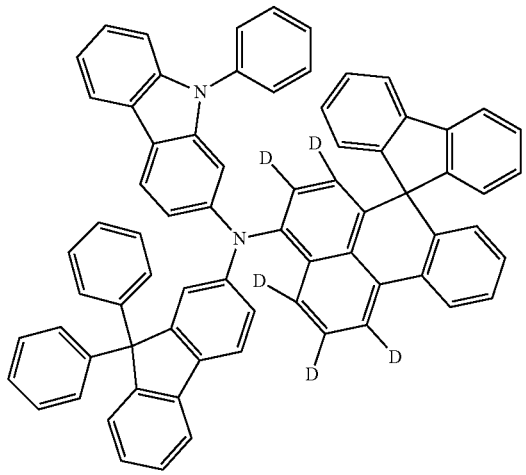

148
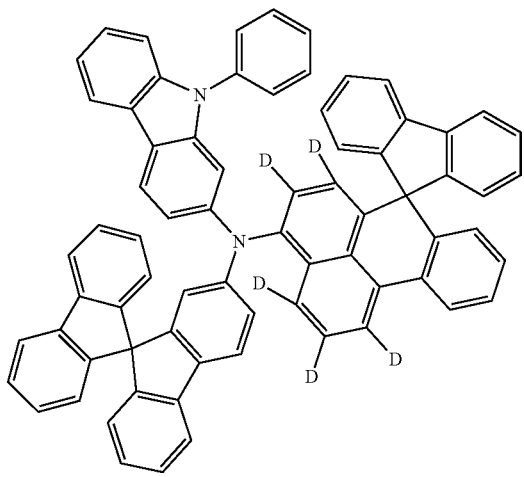
149
151
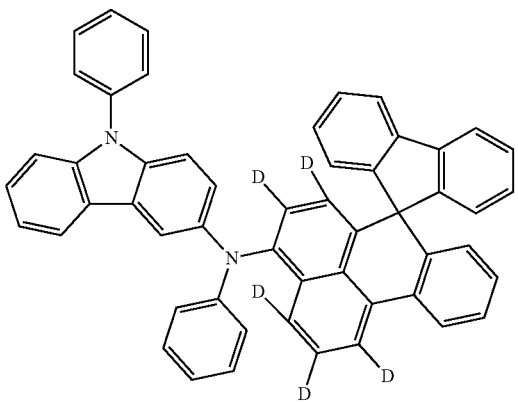
152
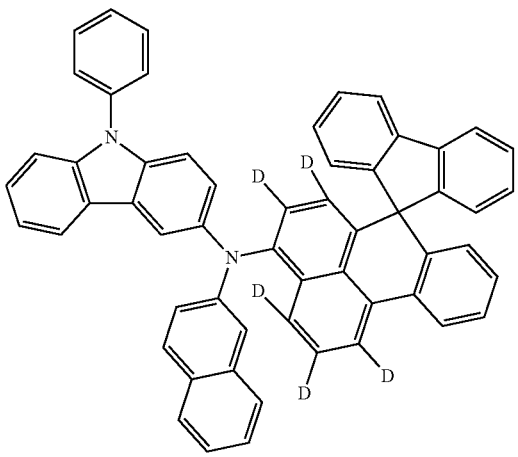
150
153
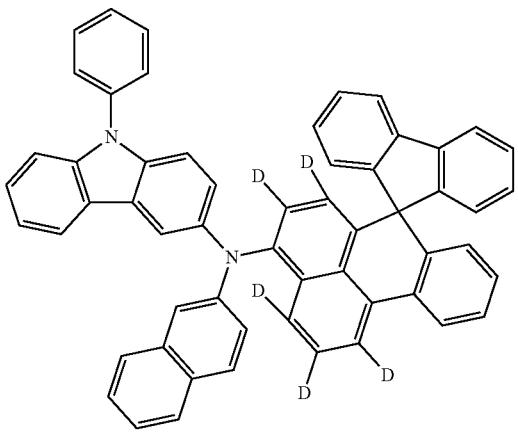

-continued
154
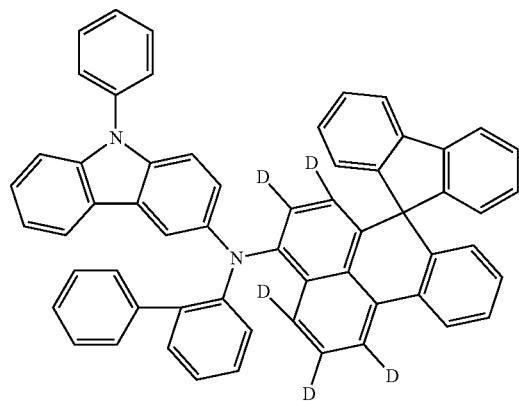
155
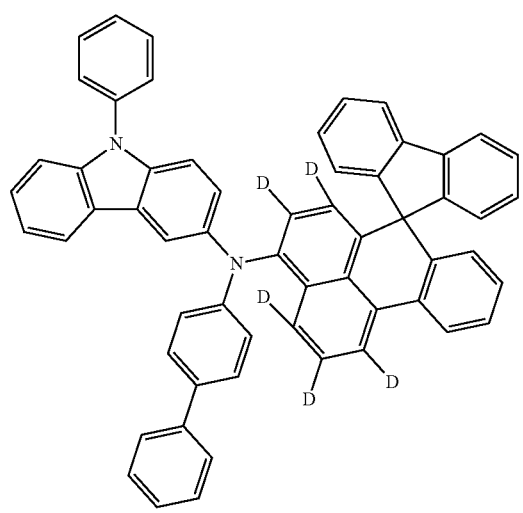
156
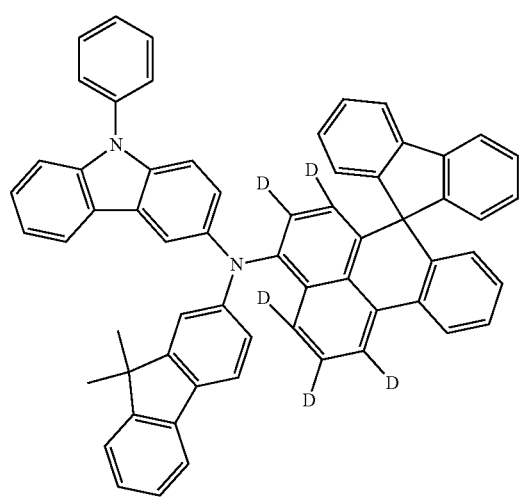
-continued
157
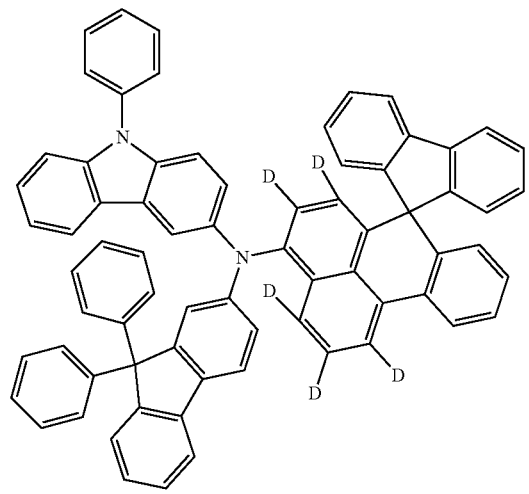
158
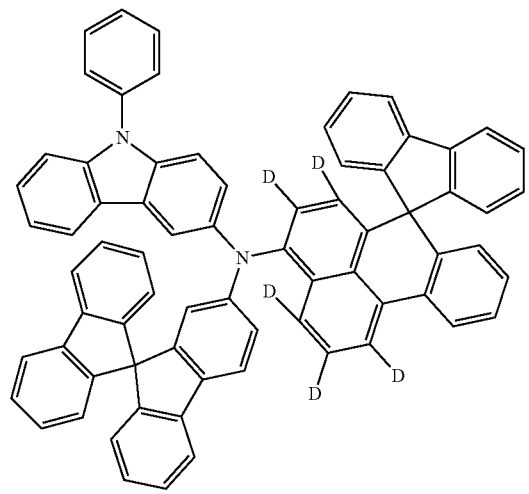
159
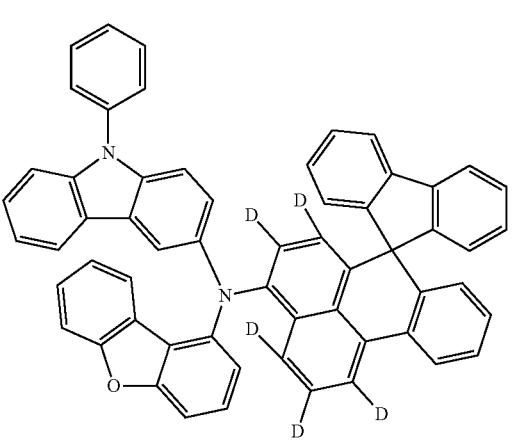

160

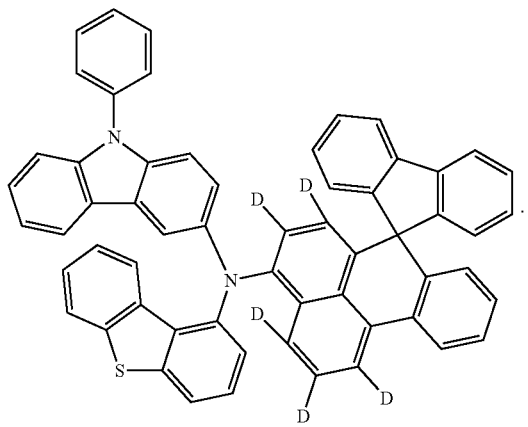

10. An amine compound represented by any one of Formula 1-1, Formula 1-2, and Formula 1-3:

[Formula 1-1]

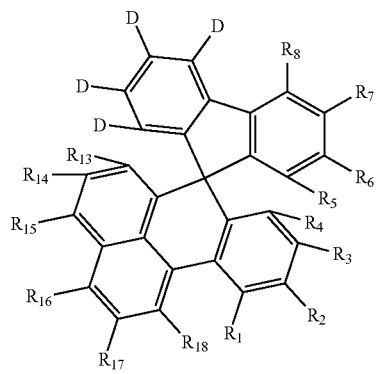

[Formula 1-2]

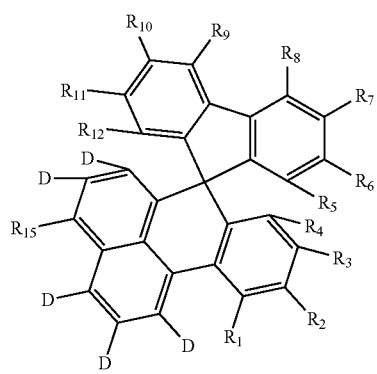

[Formula 1-3]

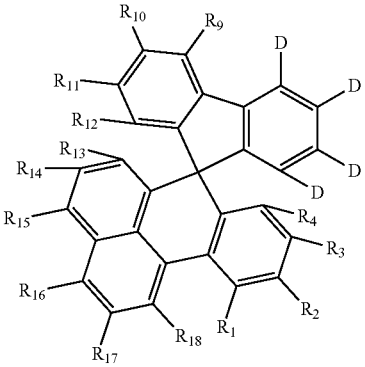

wherein, in Formula 1-1, $R_1$ to $R_8$ and $R_{13}$ to $R_{18}$ are each independently a hydrogen atom, a halogen atom, a substituted or unsubstituted silyl group, or a substituted or unsubstituted alkyl group having 1 to 20 carbon atoms, and any one selected from $R_3$, $R_6$, $R_8$, and $R_{15}$ is represented by Formula 2, in Formula 1-2, $R_1$ to $R_{12}$ are each independently a hydrogen atom, a halogen atom, a substituted or unsubstituted silyl group, or a substituted or unsubstituted alkyl group having 1 to 20 carbon atoms, and when $R_{15}$ is a deuterium atom, any one selected from $R_3$, $R_6$, and $R_8$ is represented by Formula 2, and in Formula 1-3, $R_1$ to $R_4$ and $R_9$ to $R_{18}$ are each independently a hydrogen atom, a halogen atom, a substituted or unsubstituted silyl group, or a substituted or unsubstituted alkyl group having 1 to 20 carbon atoms, and $R_3$ or $R_{15}$ is represented by Formula 2:

[Formula 2]

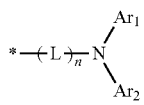

wherein, in Formula 2, n is an integer of 0 to 3,

L is a substituted or unsubstituted arylene group having 6 to 30 ring-forming carbon atoms, or a substituted or unsubstituted heteroarylene group having 2 to 30 ring-forming carbon atoms, and $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms.

11. The amine compound of claim 10, wherein $Ar_1$ and $Ar_2$ are each independently a substituted or unsubstituted phenyl group, a substituted or unsubstituted naphthyl group, a substituted or unsubstituted fluorenyl group, a substituted or unsubstituted biphenyl group, a substituted or unsubstituted phenanthrenyl group, a substituted or unsubstituted carbazole group, a substituted or unsubstituted indolyl group, a substituted or unsubstituted pyridyl group, a substituted or unsubstituted dibenzofuranyl group, or a substituted or unsubstituted dibenzothiophenyl group.

12. The amine compound of claim 10, wherein any one selected from $Ar_1$ and $Ar_2$ is a substituted or unsubstituted carbazole group.

13. The amine compound of claim 10, wherein Ar$_1$ and Ar$_2$ are different from each other.

14. The amine compound of claim 10, wherein Formula 2 is represented by Formula 2-1:

[Formula 2-1]

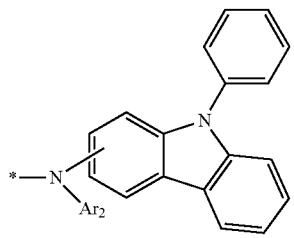

wherein, in Formula 2-1, Ar$_2$ is the same as defined with respect to Formula 2.

15. The amine compound of claim 10, wherein, in Formula 2, when n is an integer of 1 or greater,
   L are each independently a substituted or unsubstituted divalent phenyl group, a substituted or unsubstituted divalent biphenyl group, a substituted or unsubstituted divalent naphthyl group, a substituted or unsubstituted divalent fluorene group, a substituted or unsubstituted divalent phenanthrene group, a substituted or unsubstituted divalent carbazole group, a substituted or unsubstituted divalent indole group, or a substituted or unsubstituted divalent pyridine group.

16. The amine compound of claim 10, is represented by any one selected from among the compounds of Compound Group 1:

[Compound Group 1]

1

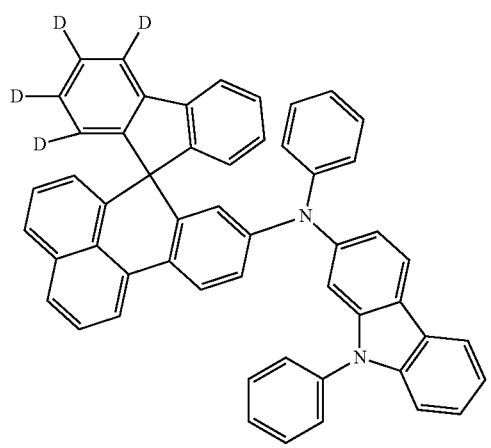

-continued

2

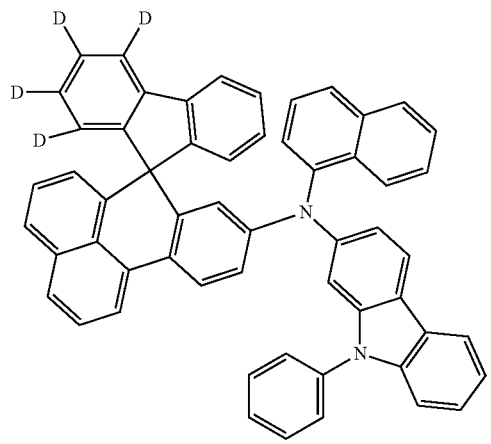

3

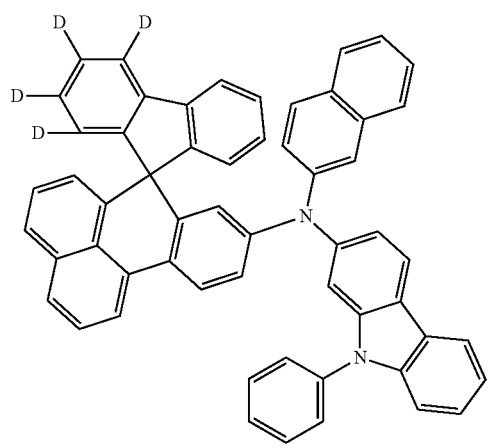

4

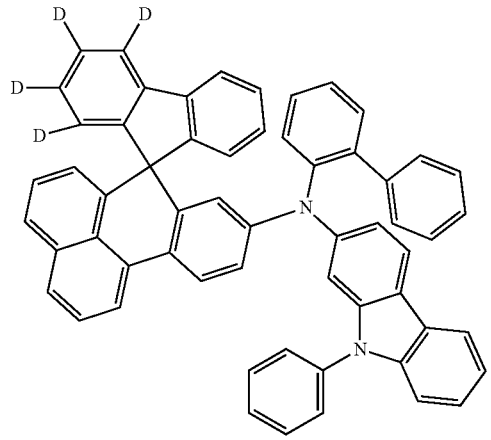

5
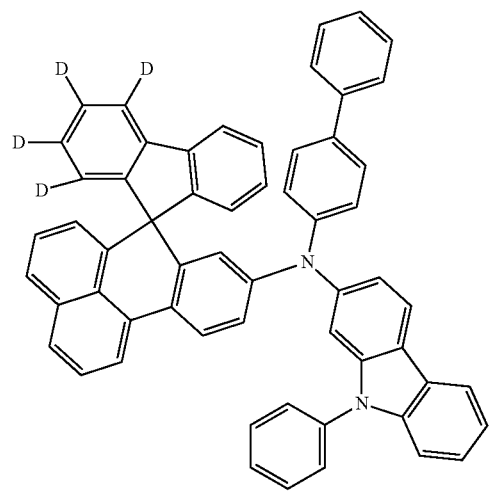
6
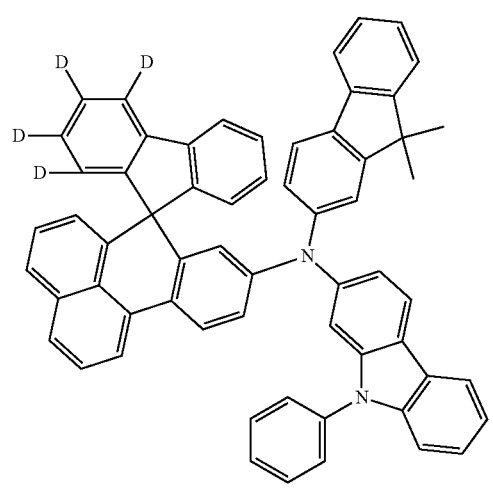
7
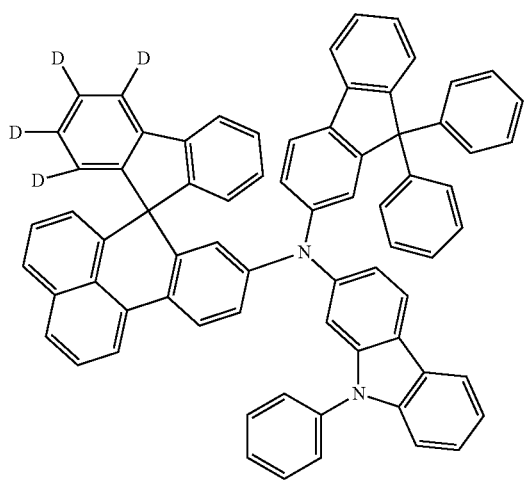
8
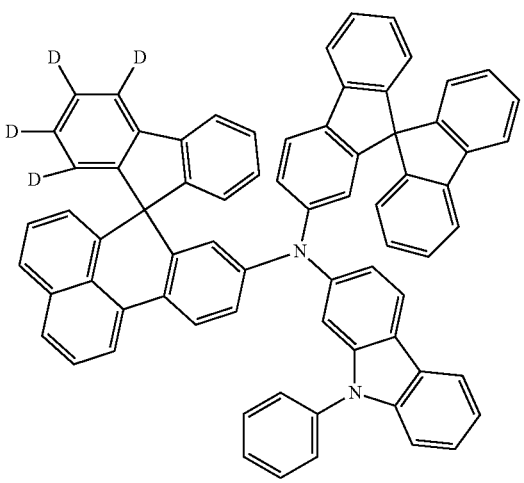
9
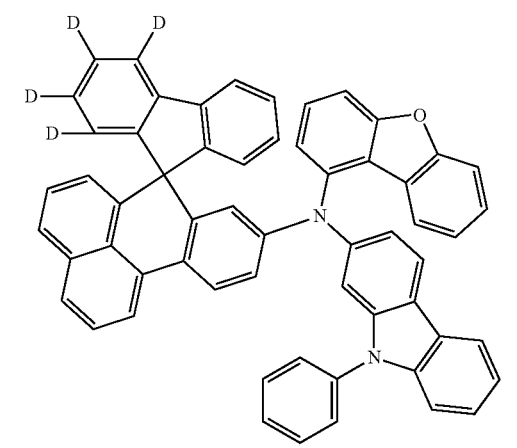
10
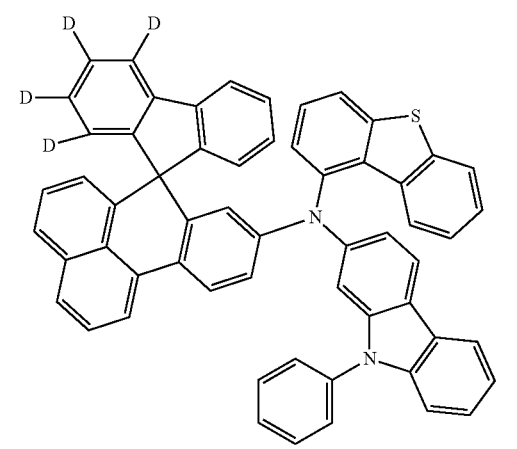

11
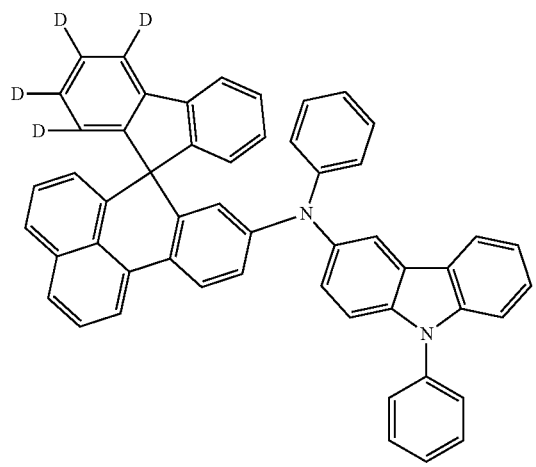
12
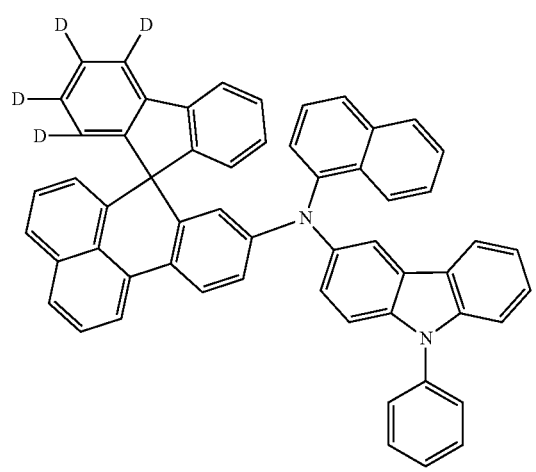
13
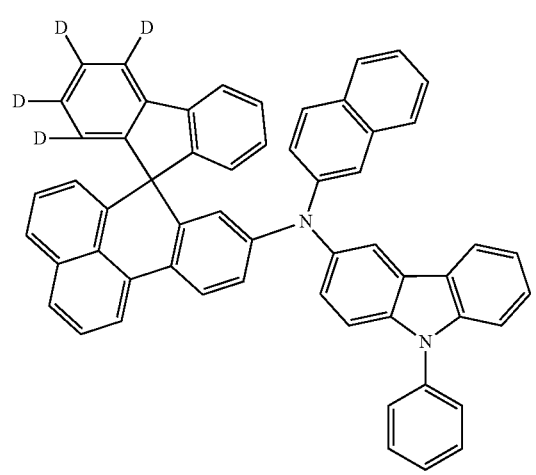
14
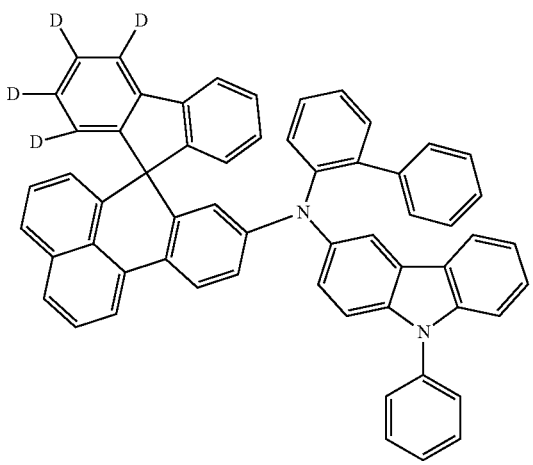
15
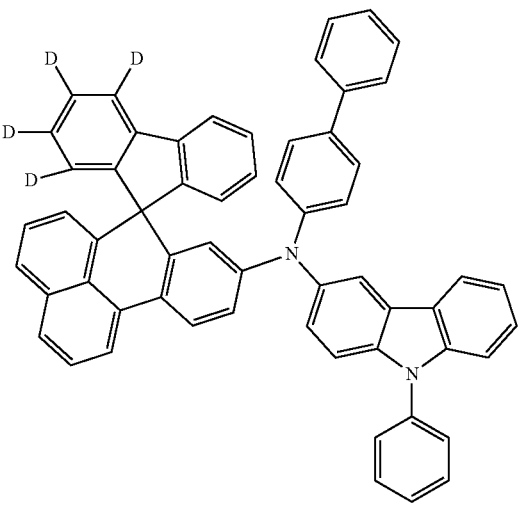
16
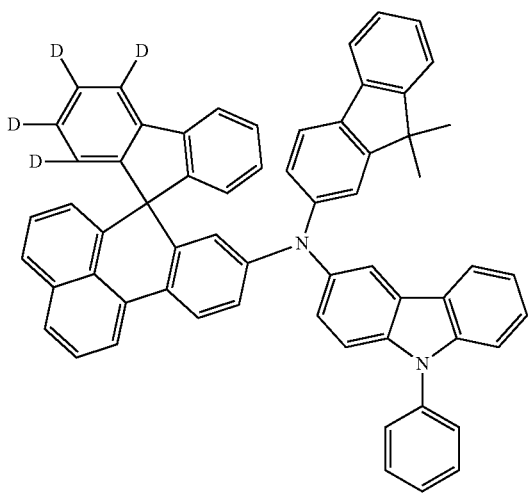

17
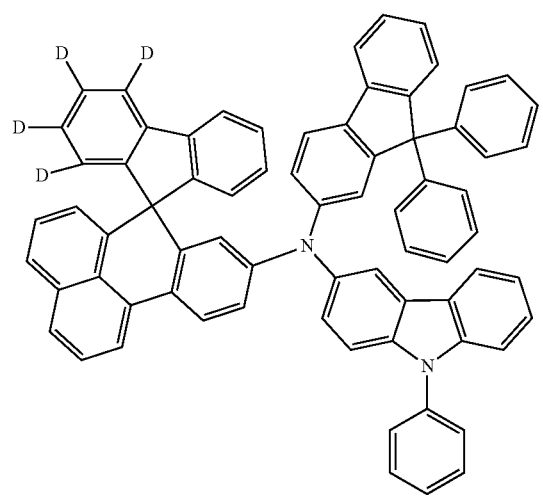
18
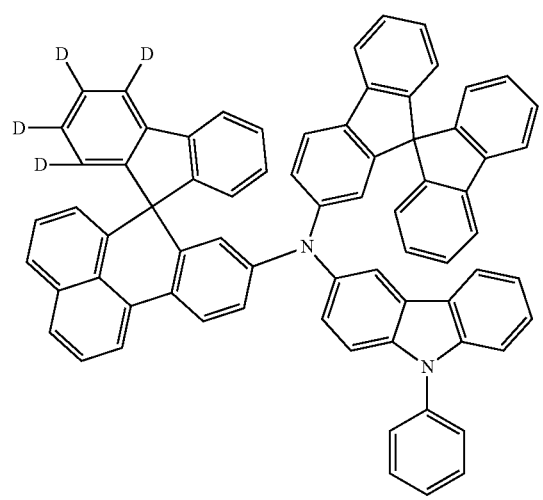
19
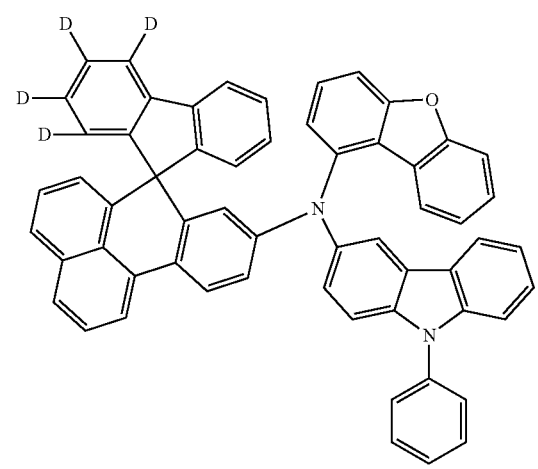
20
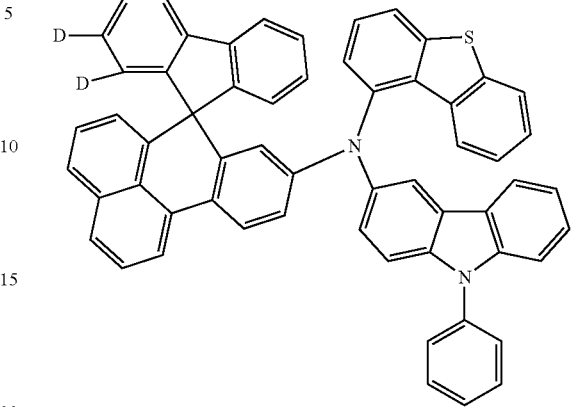
21
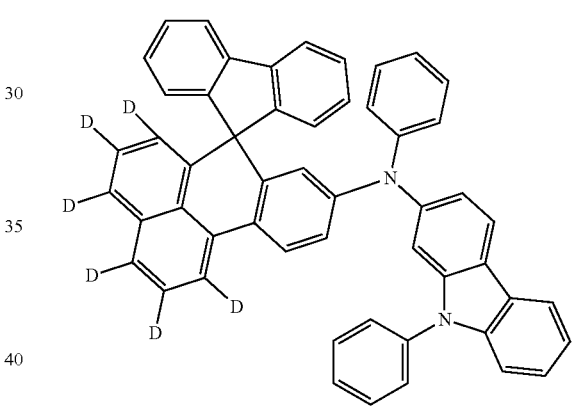
22
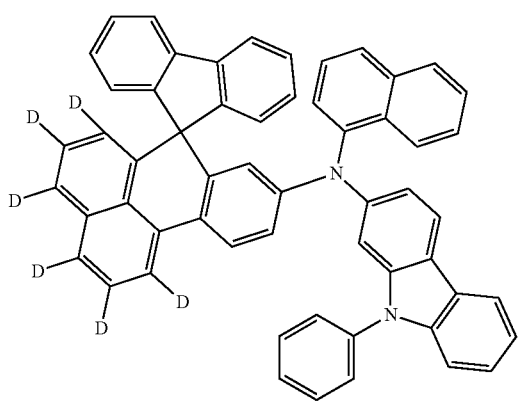

23
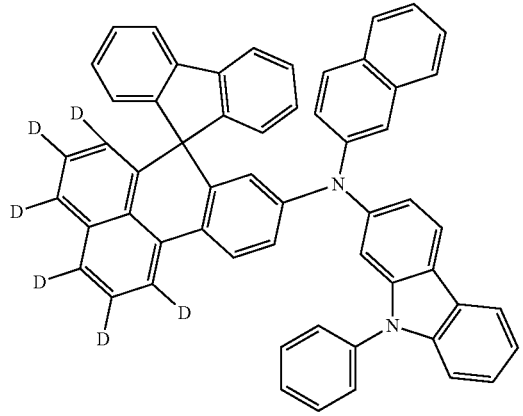
24
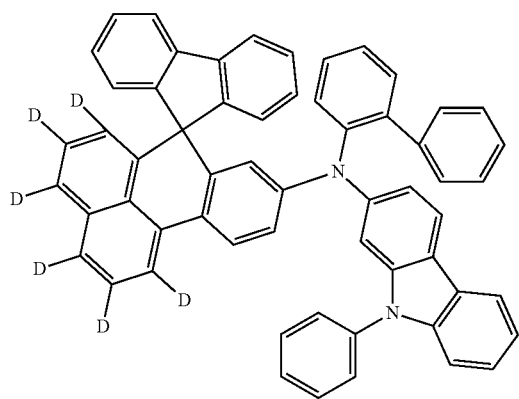
25
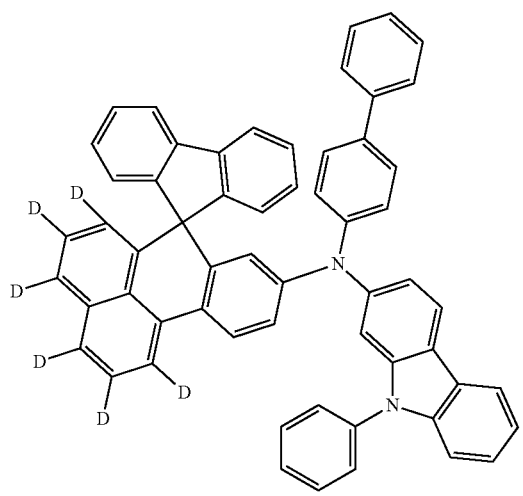
26
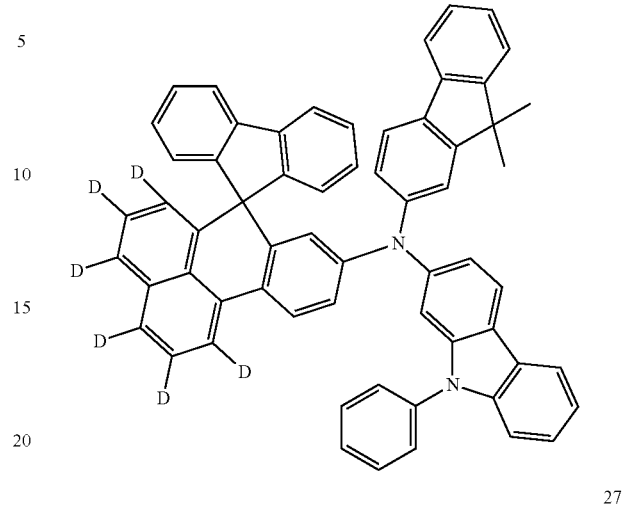
27
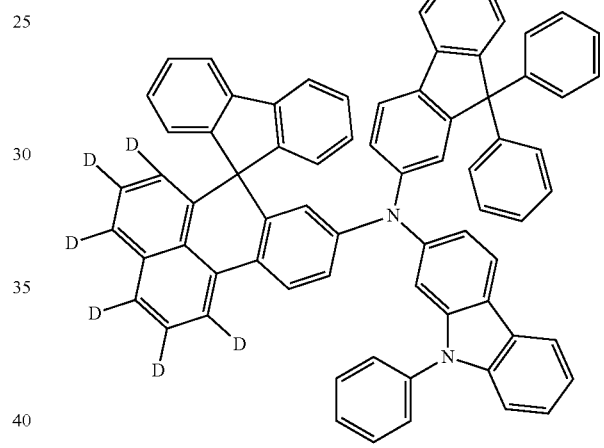
28
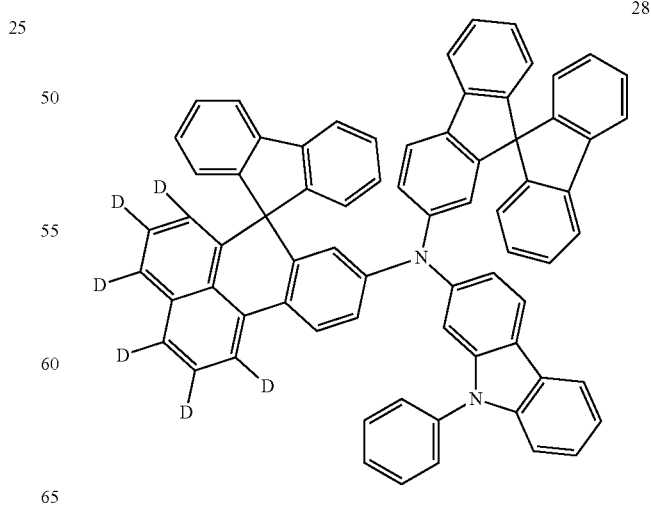

29
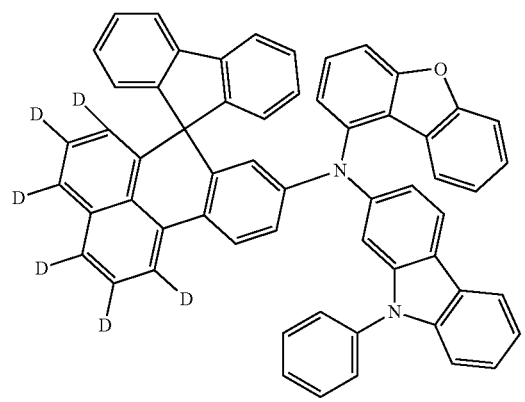
30
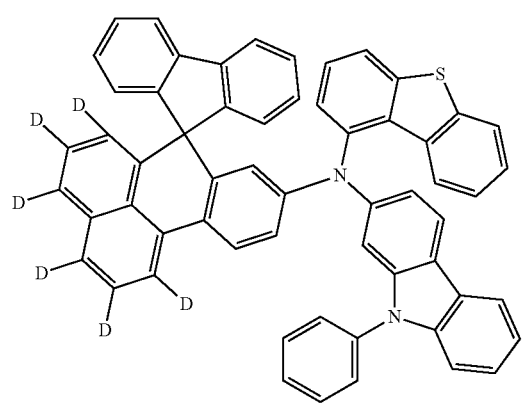
31
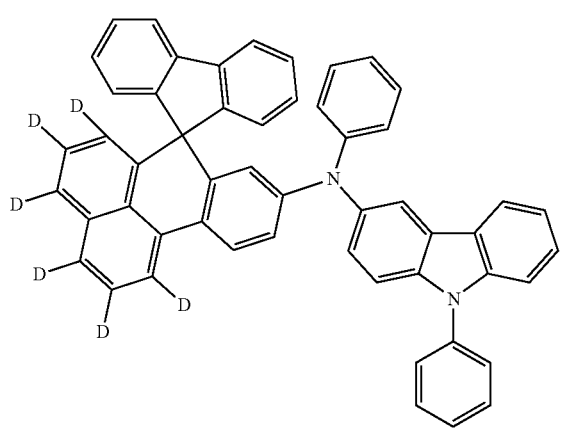
32
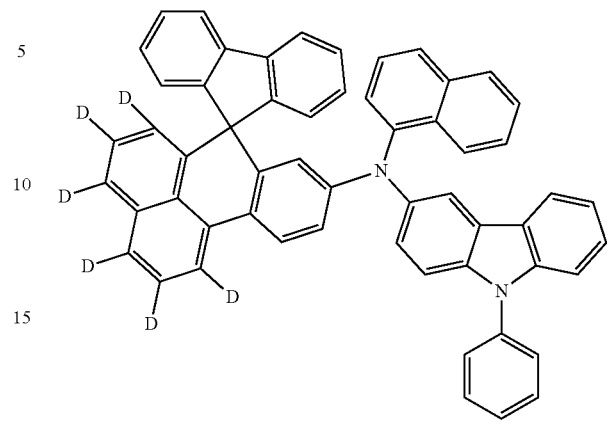
33
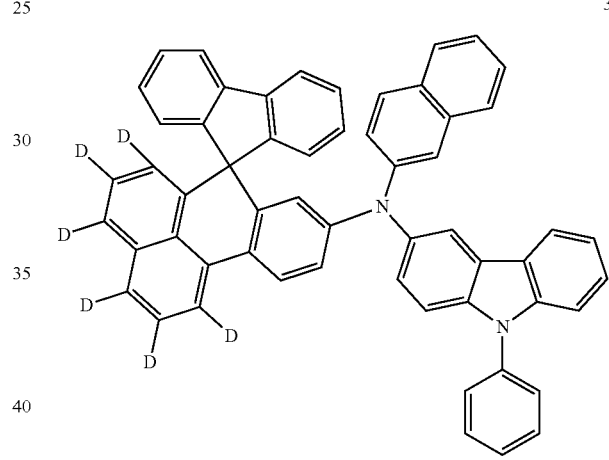
34
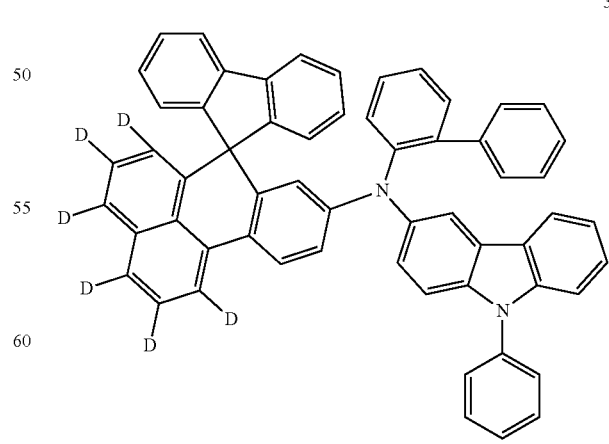

35
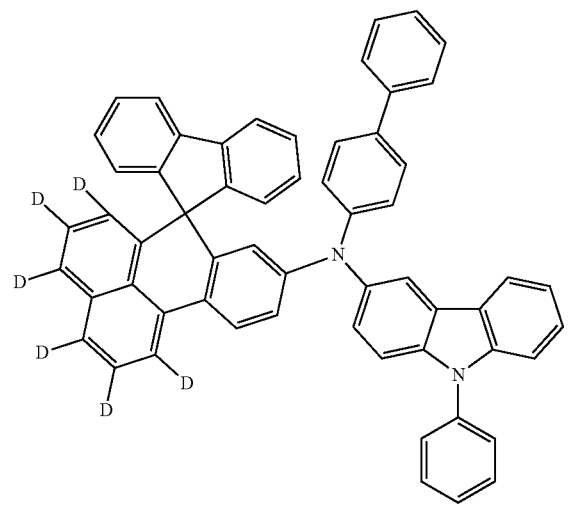
36
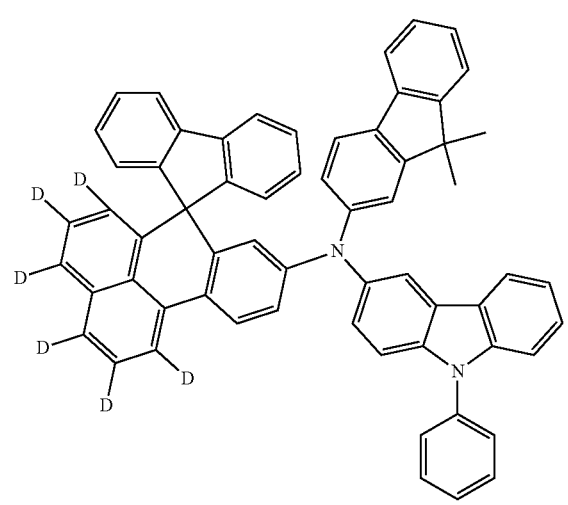
37
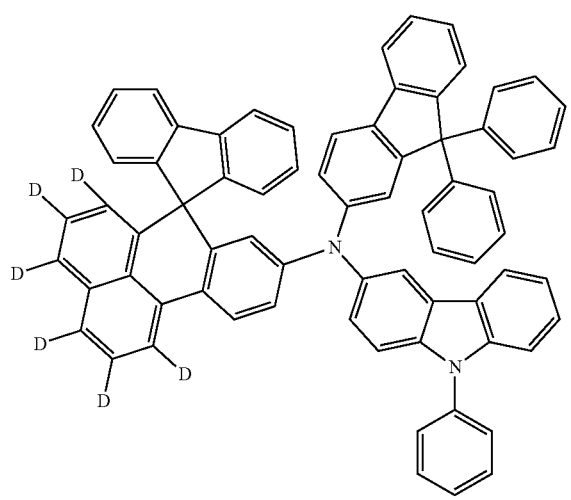
38
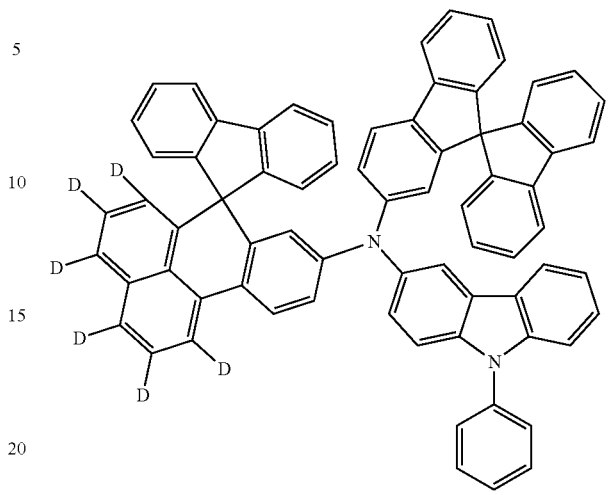
39
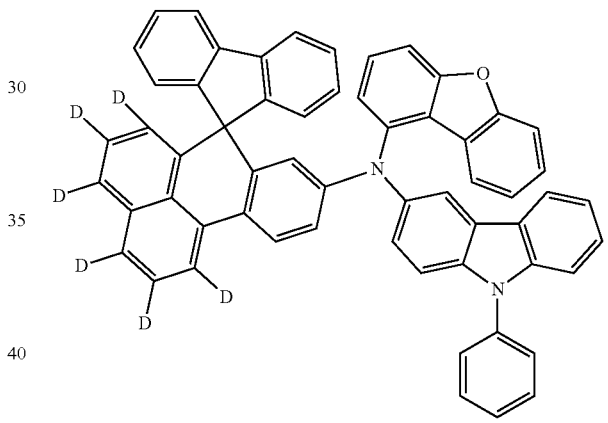
40
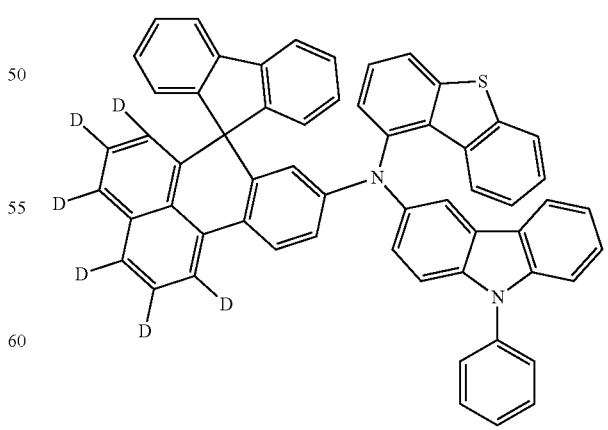

41
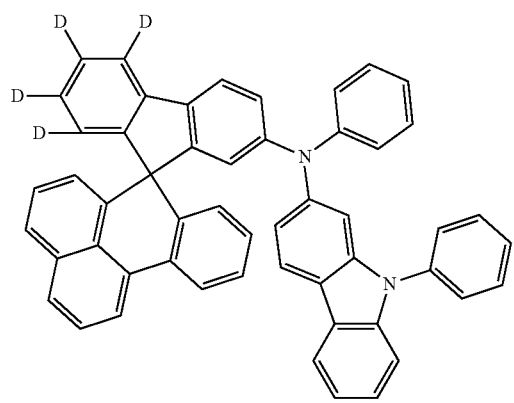
42
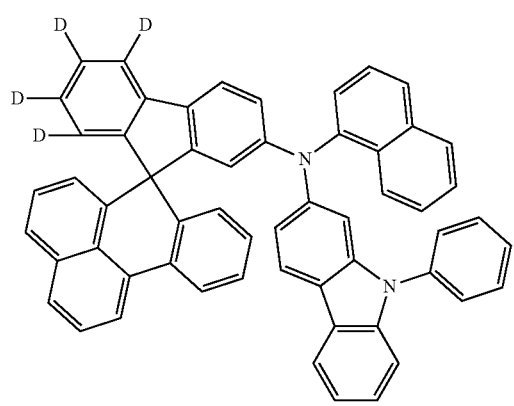
43
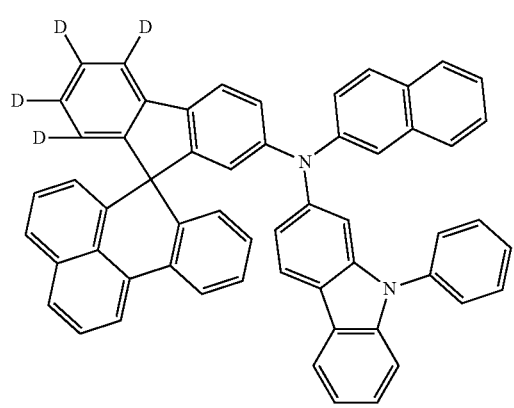
44
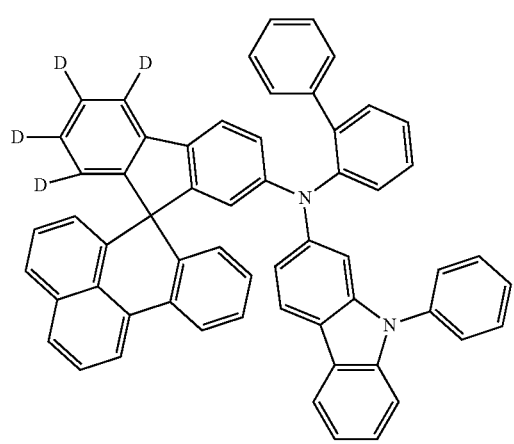
45
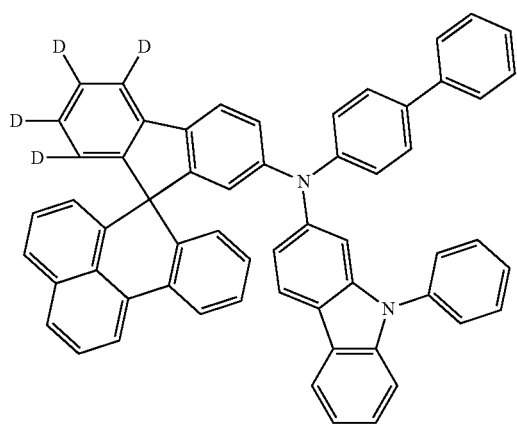
46
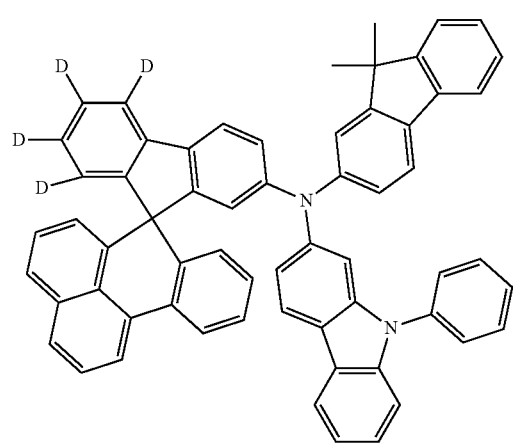
47
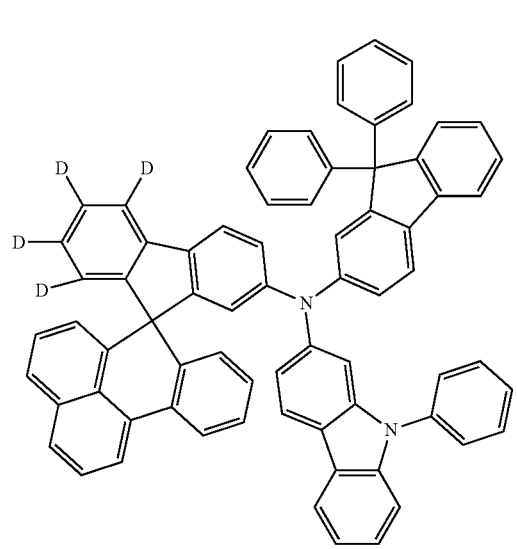

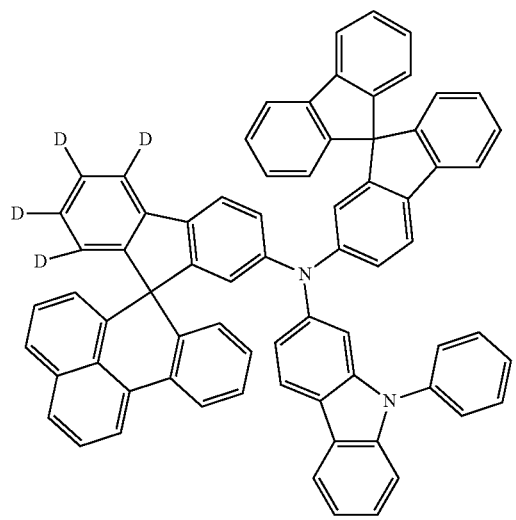
48
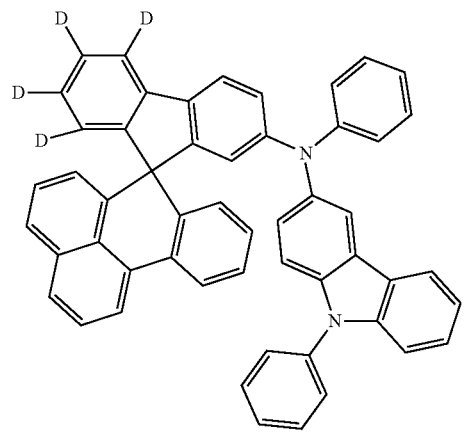
51
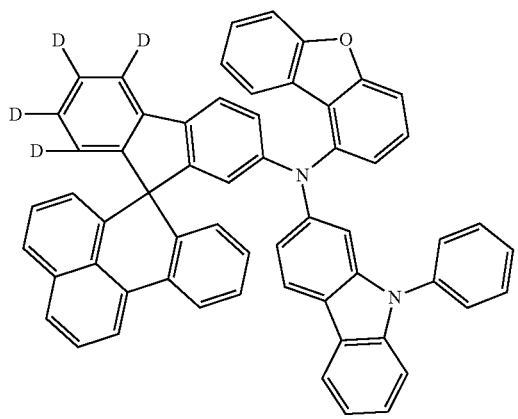
49
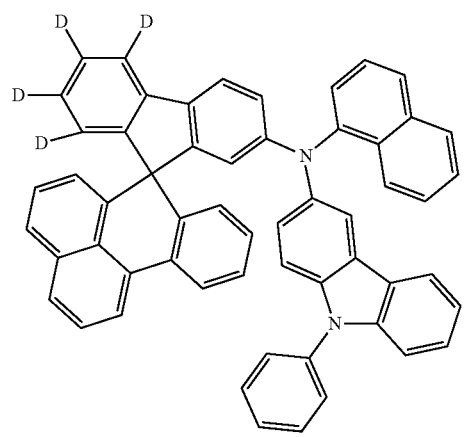
52
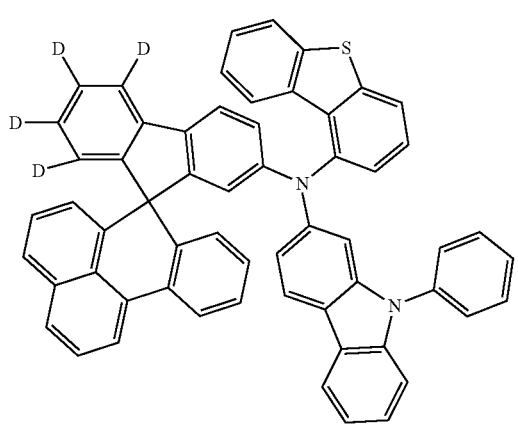
50
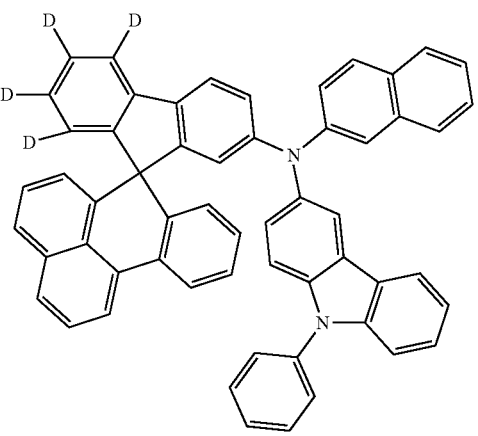
53

54
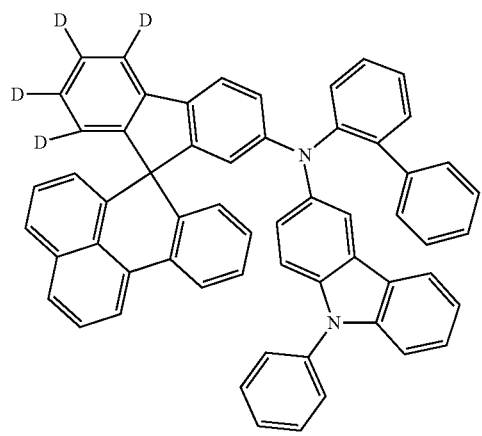
55
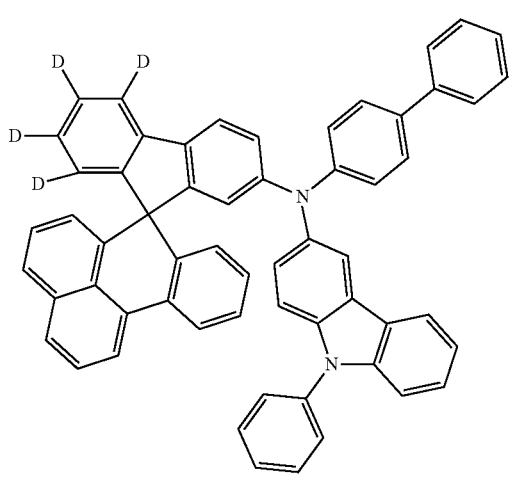
56
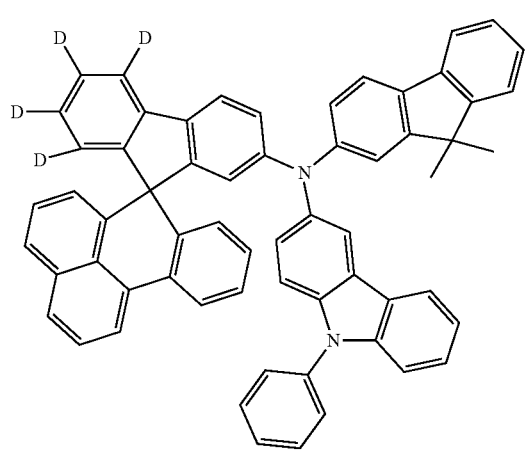
57
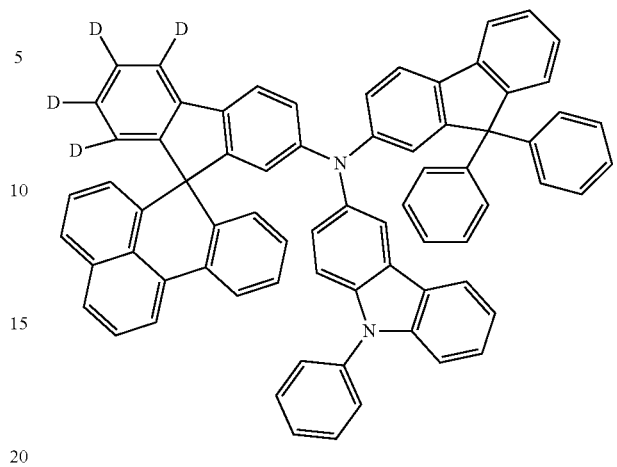
58
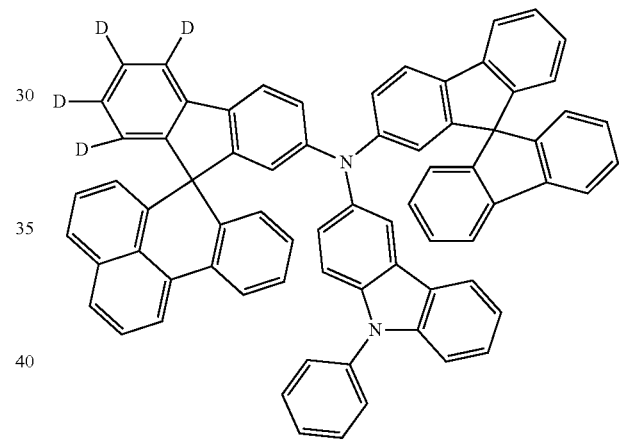
59
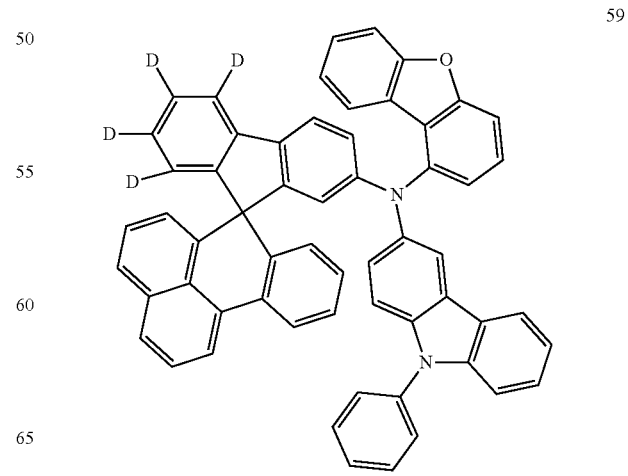

| 237 -continued | 238 -continued |
|---|---|
| 60 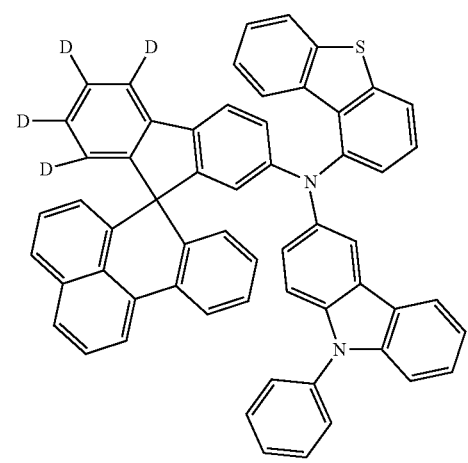 | 64 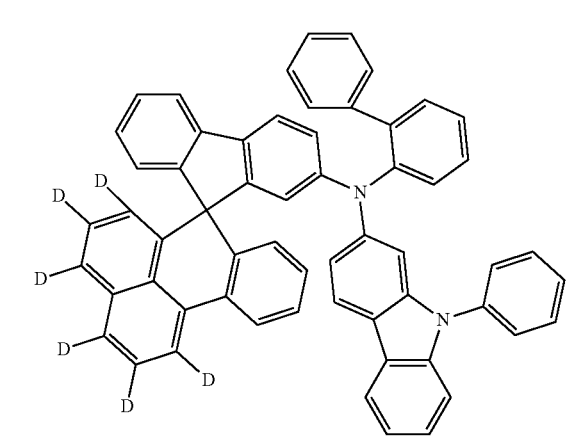 |
| 61 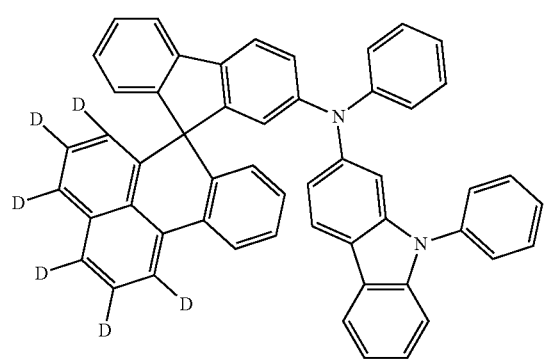 | 65 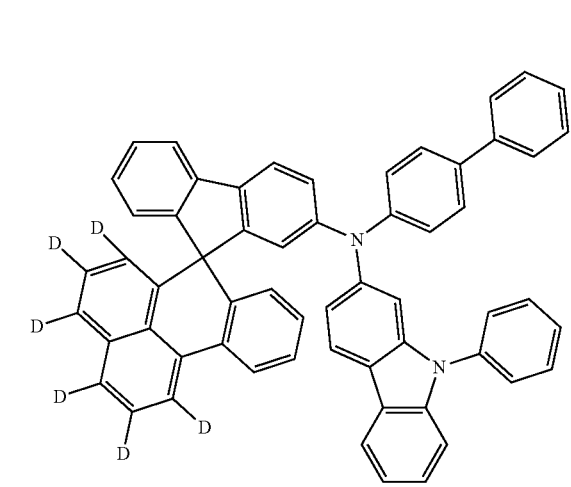 |
| 62 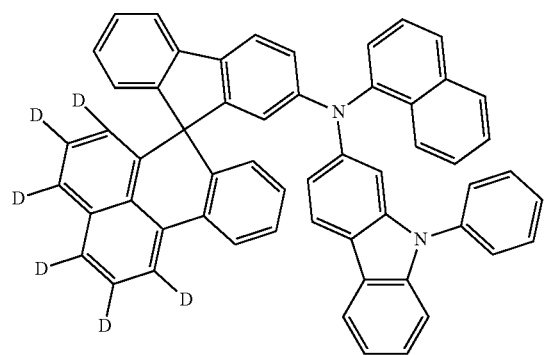 | 66 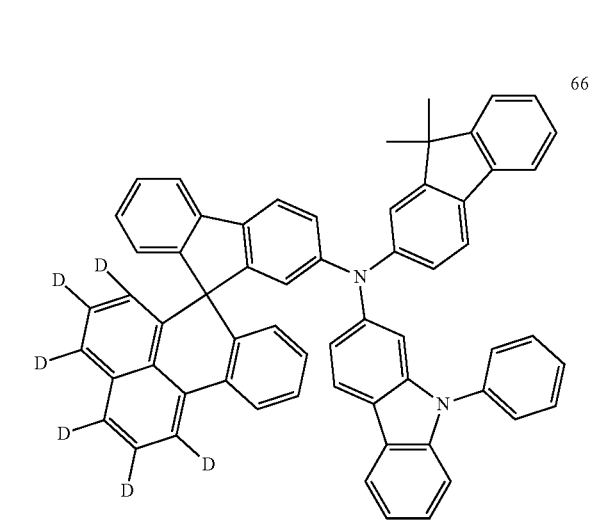 |
| 63 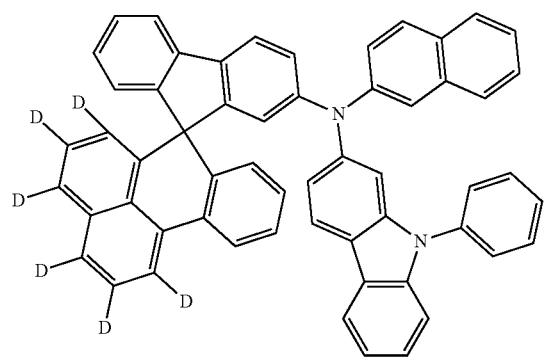 | |

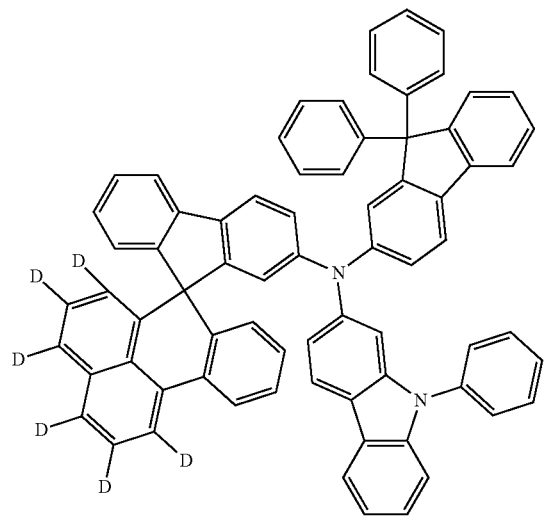
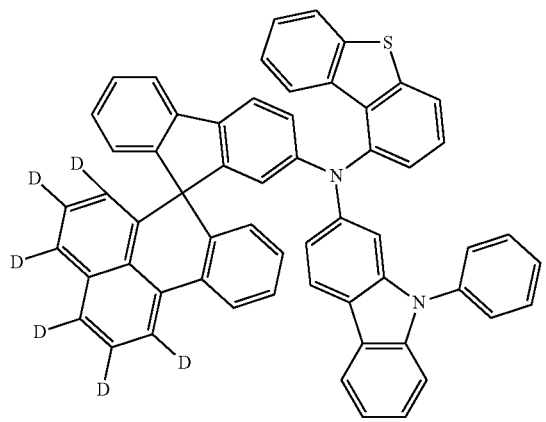
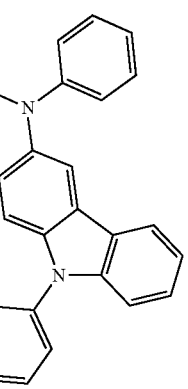
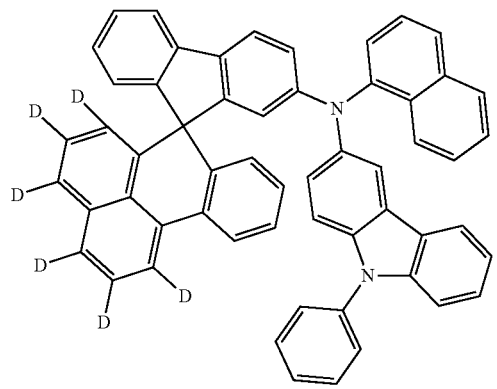
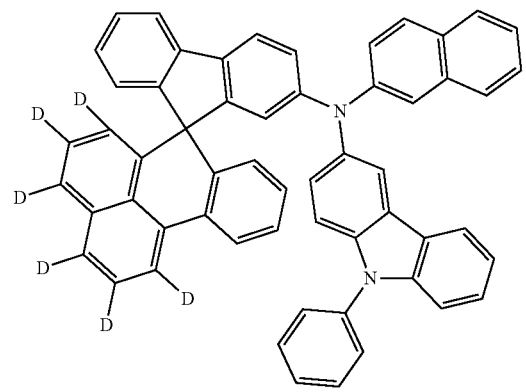

74
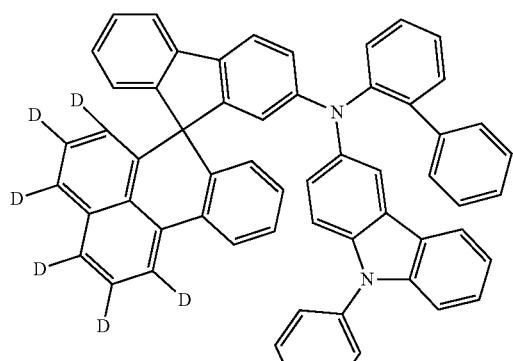
75
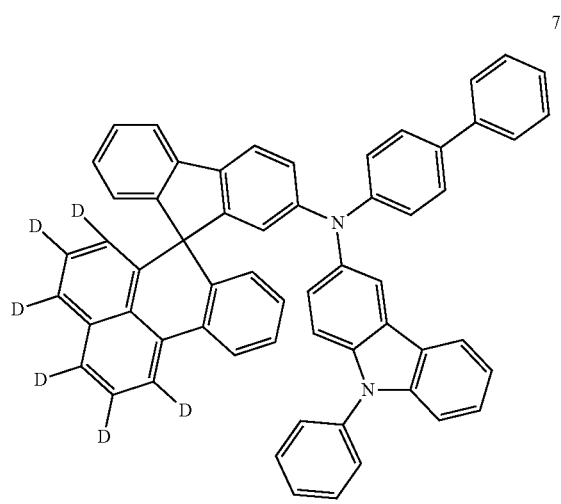
76
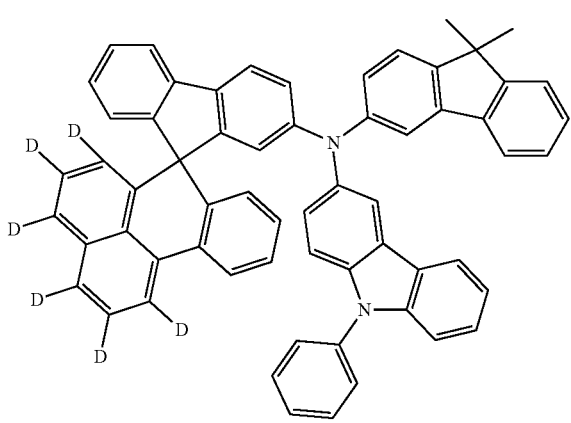
77
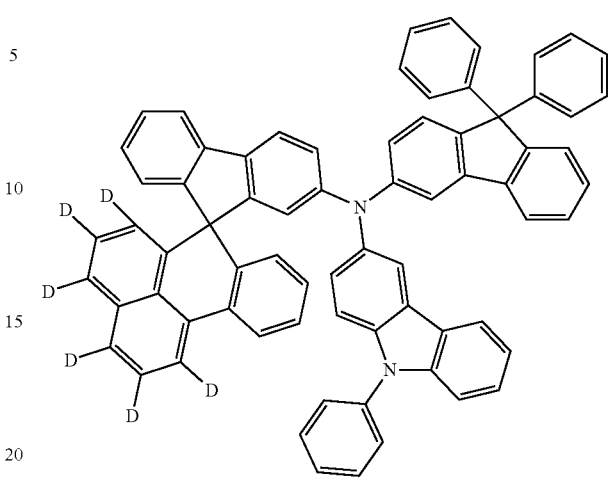
78
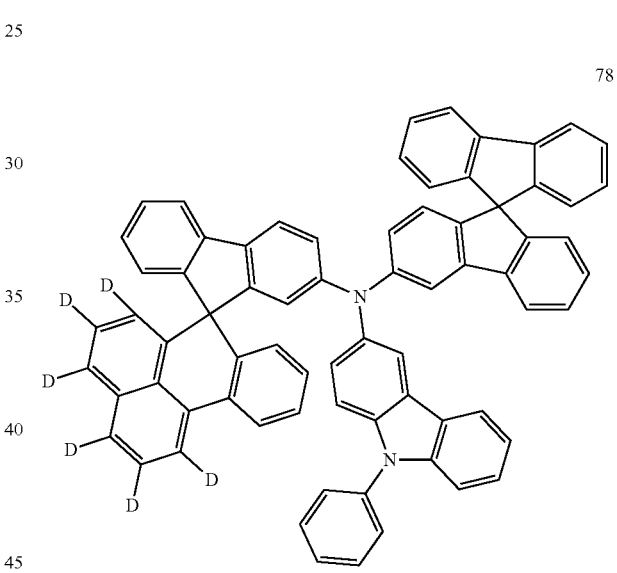
79
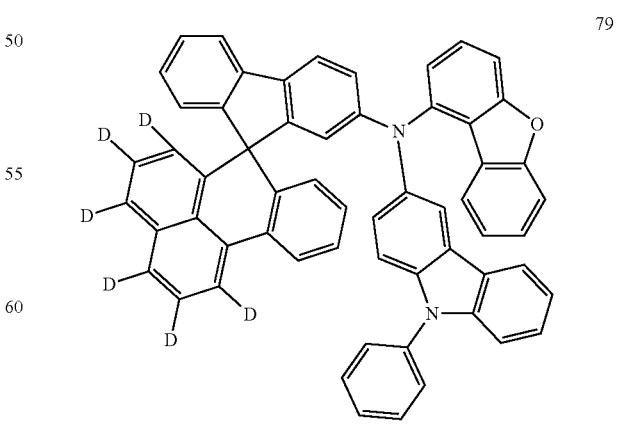

80
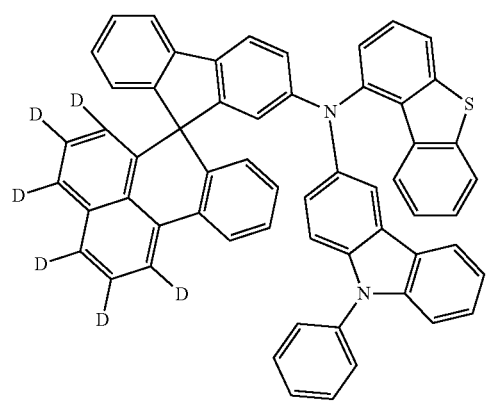
81
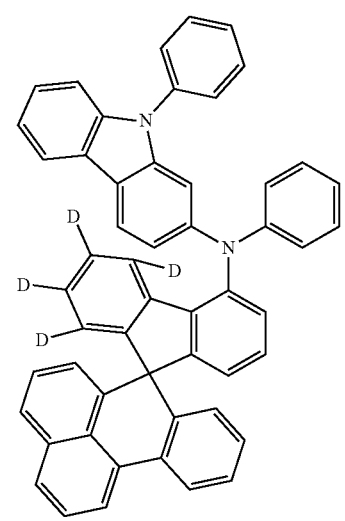
82
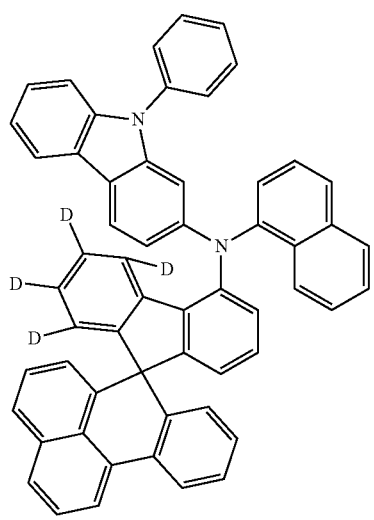
83
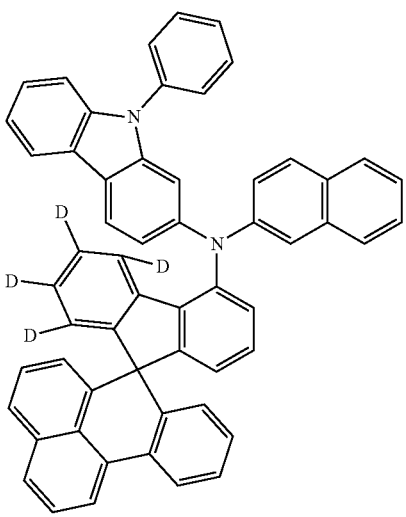
84
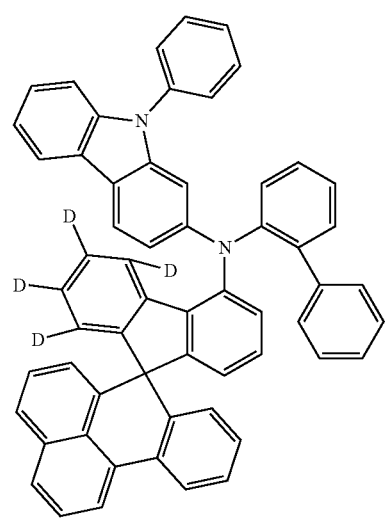
85
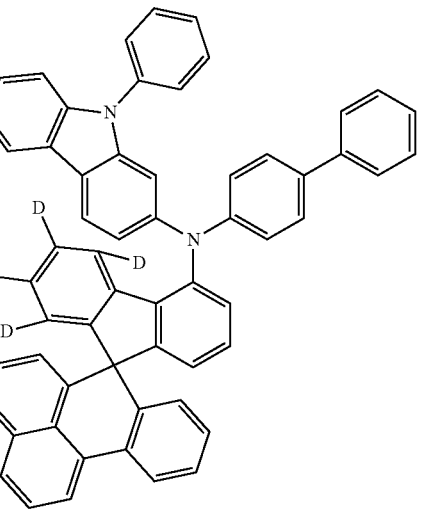

86
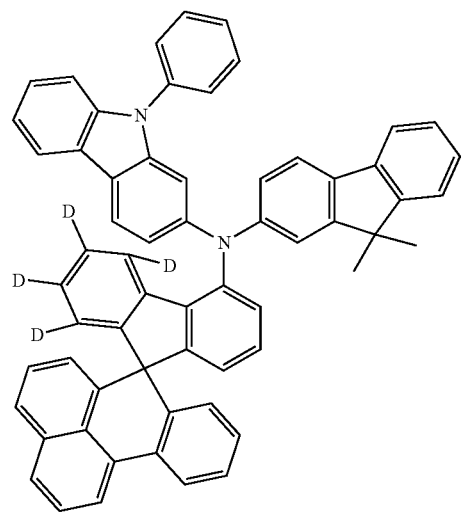
87
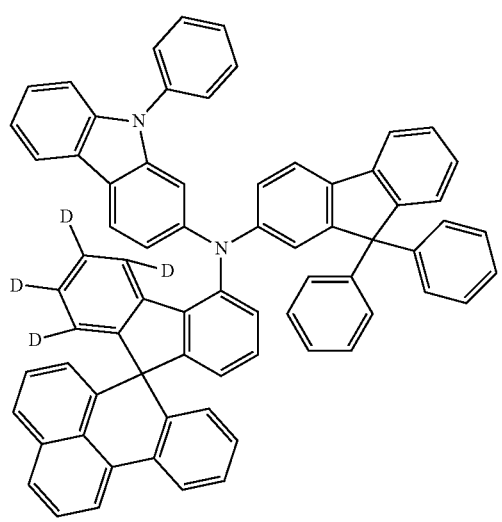
88
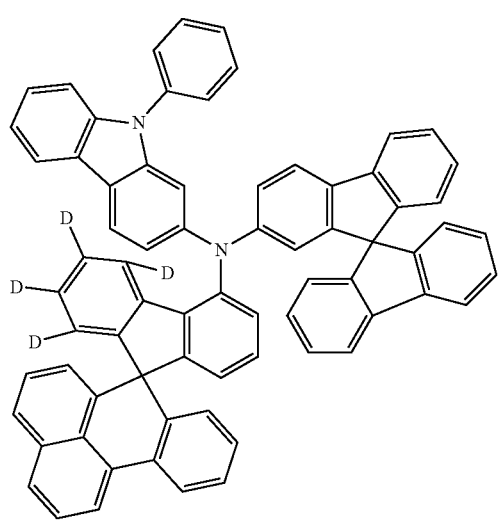
89
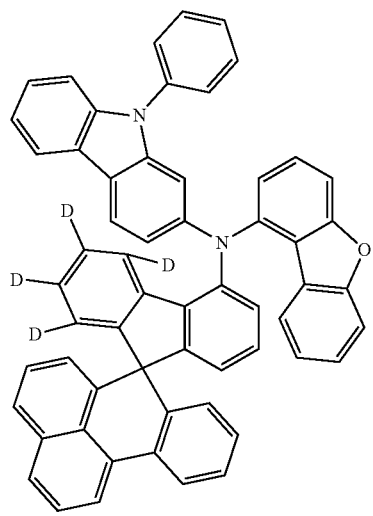
90
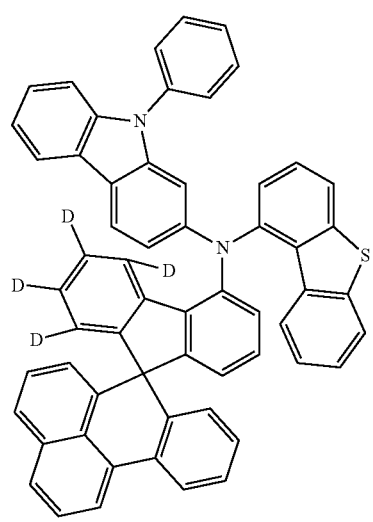
91
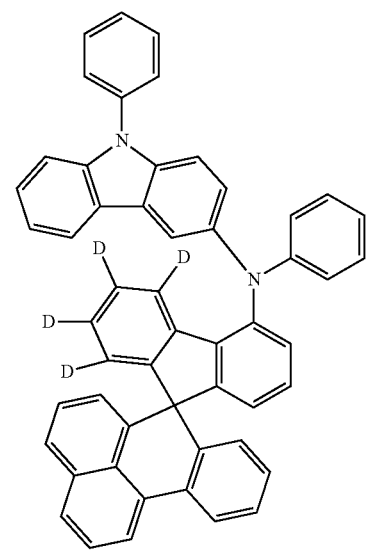

92
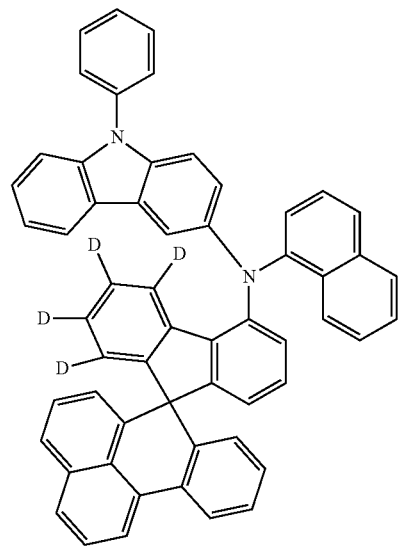
93
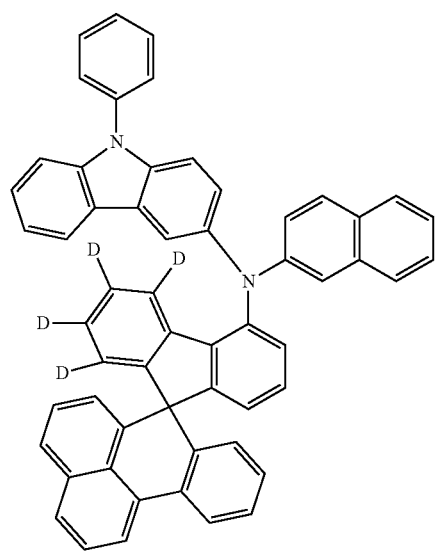
94
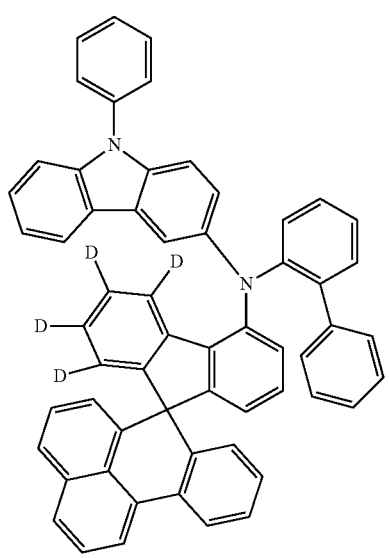
95
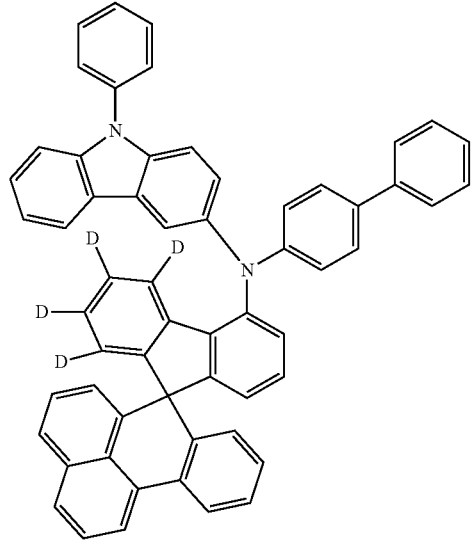
96
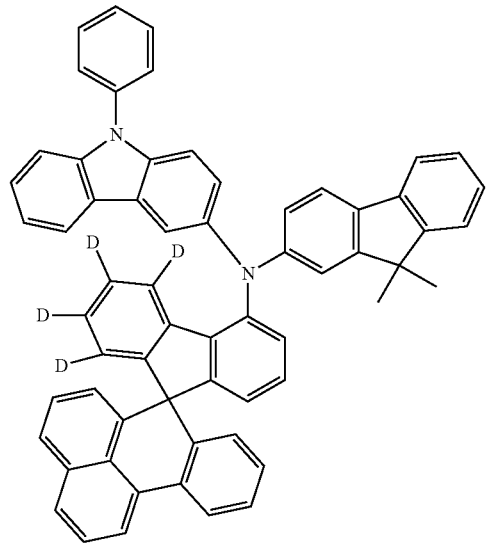
97
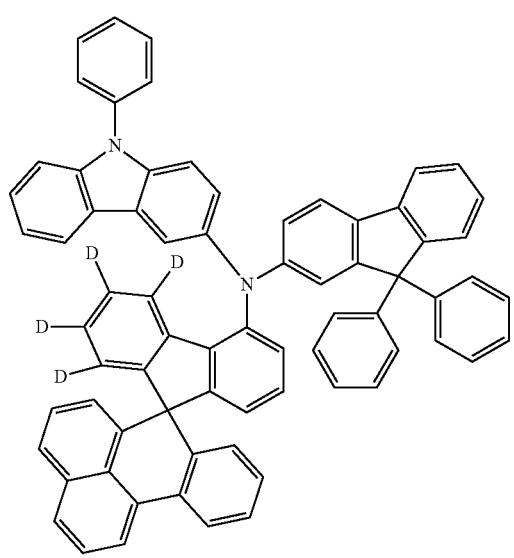

98
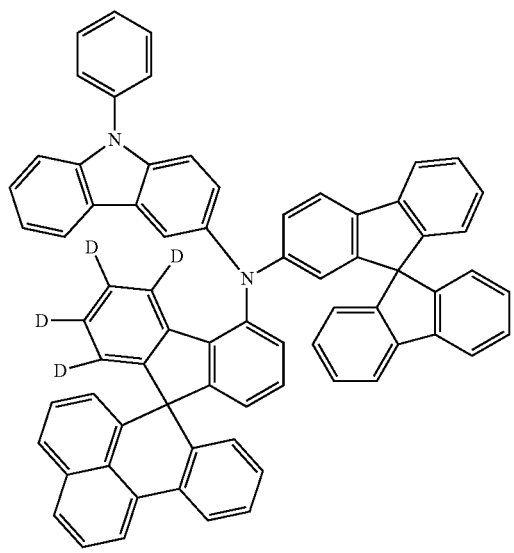
99
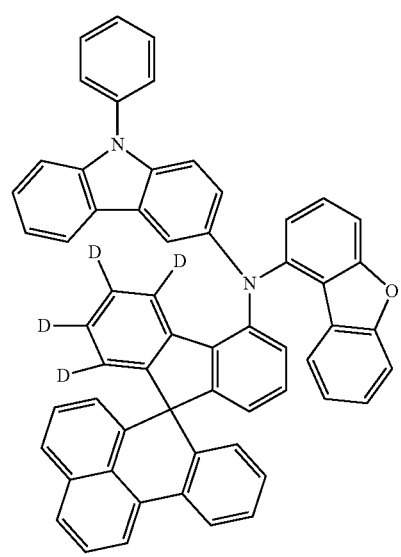
100
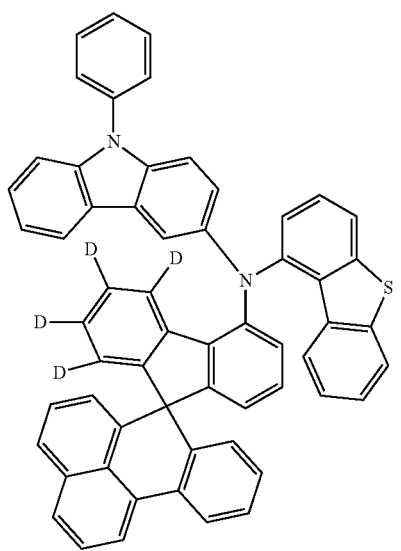
101
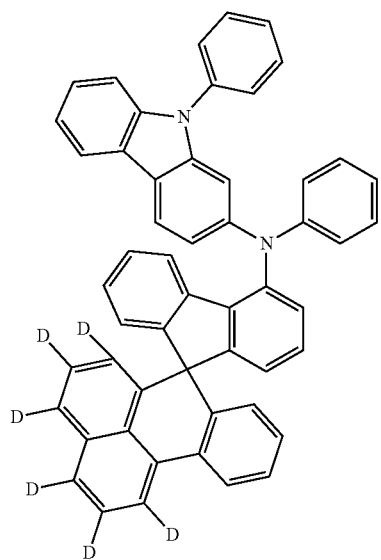
102
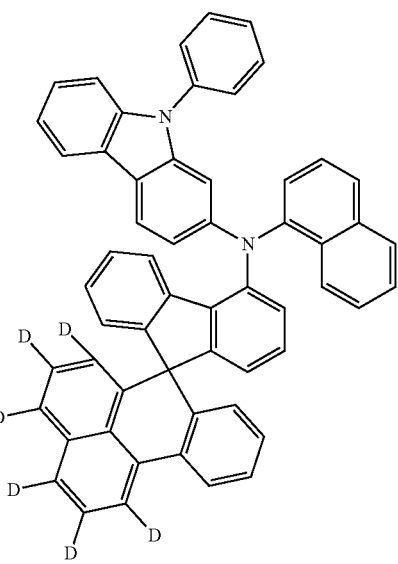

251
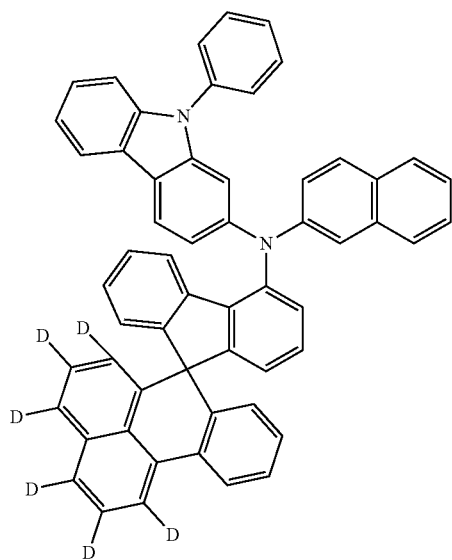
252
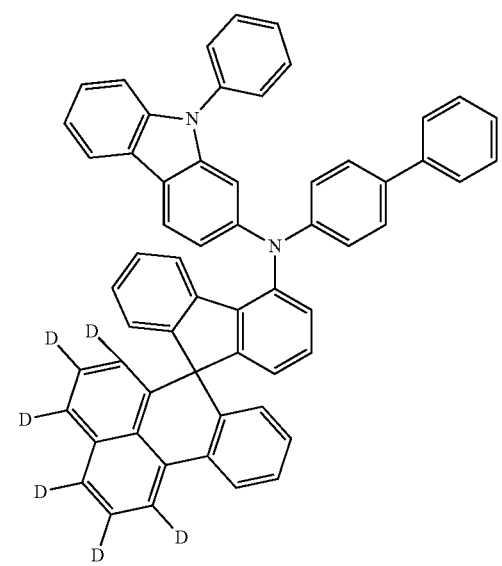
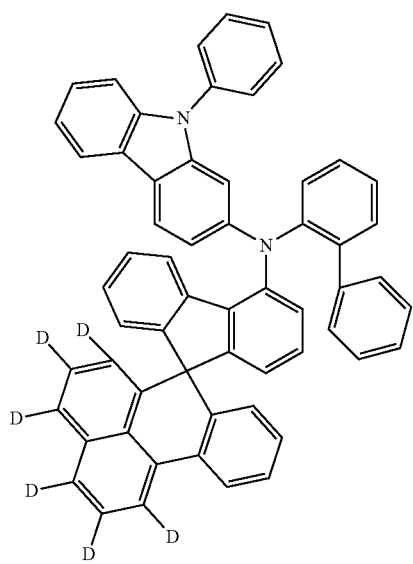
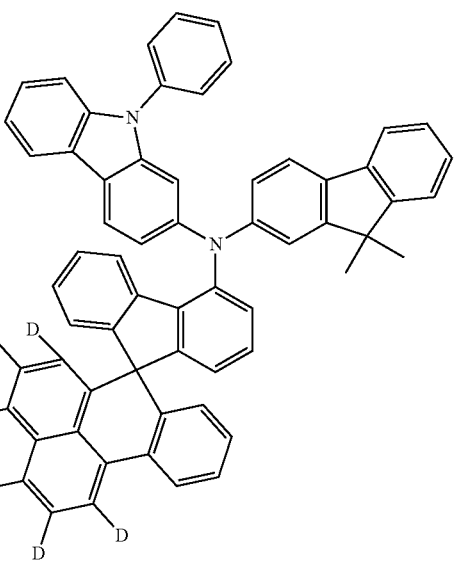

107
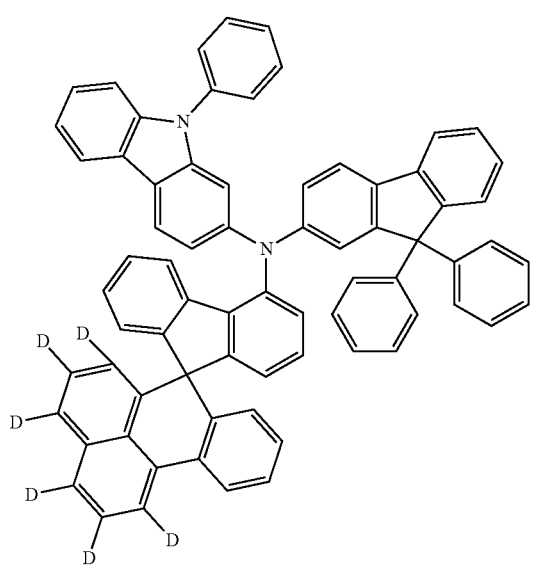
108
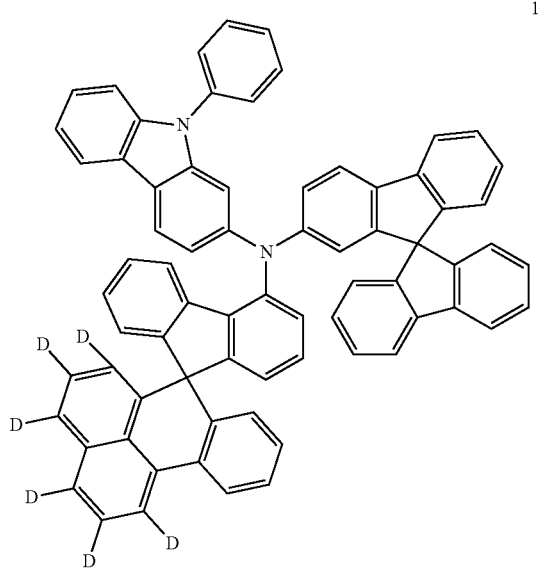
109
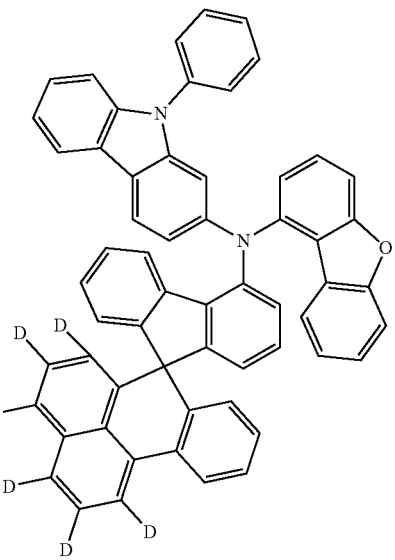
110
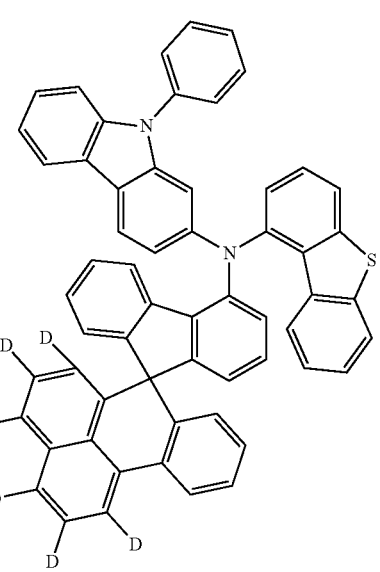

255
-continued
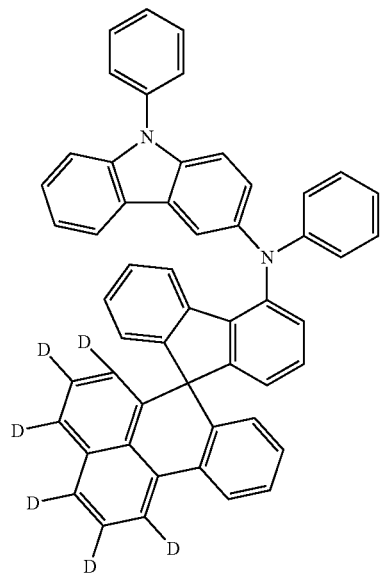
111
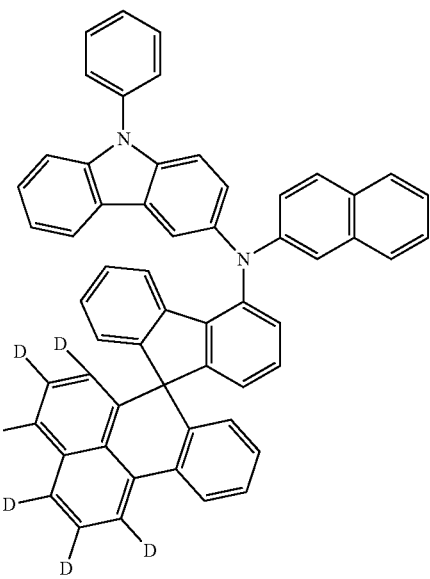
113
112
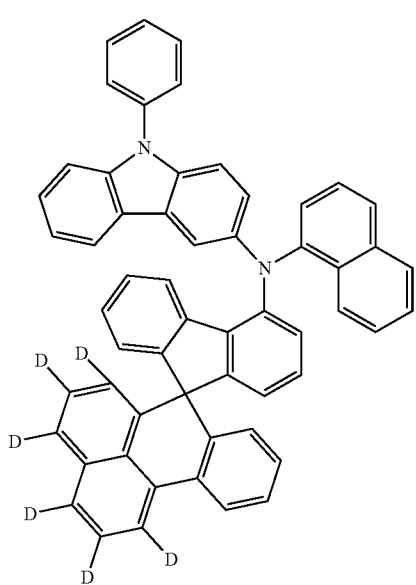
256
-continued
114
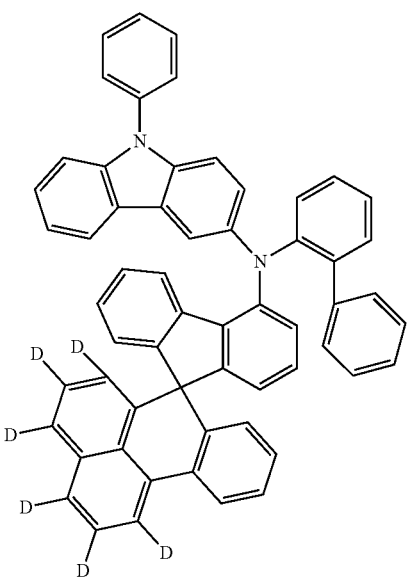

115
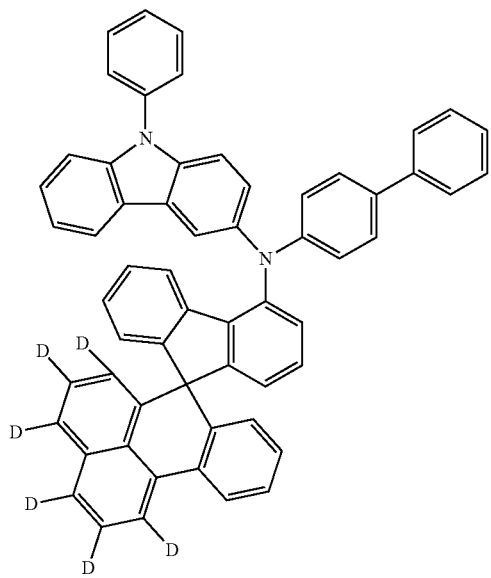
116
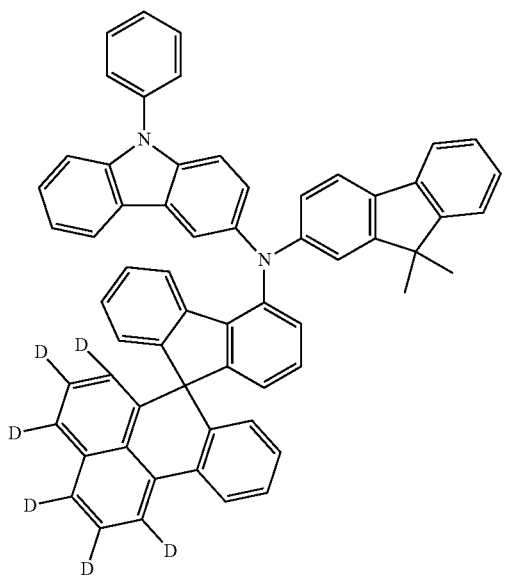
117
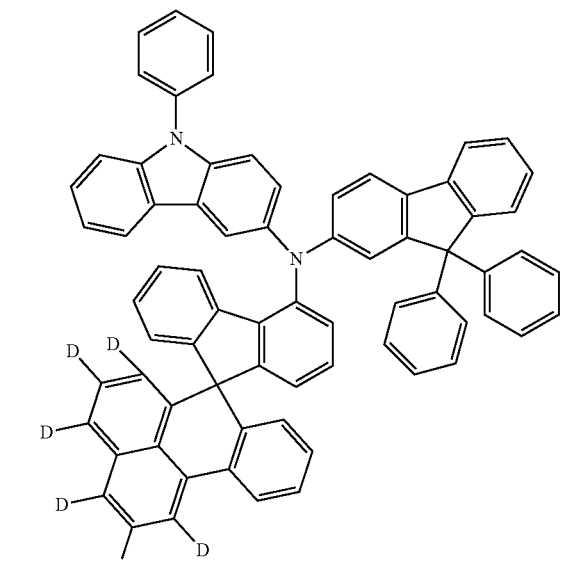
118
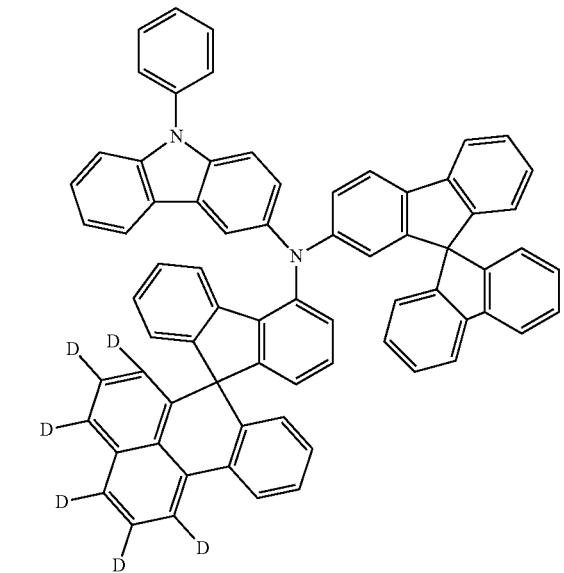

119
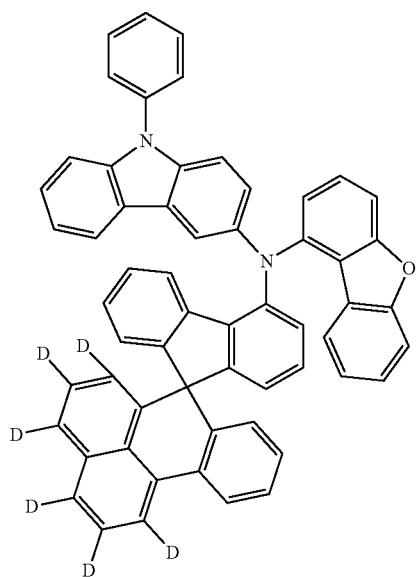
120
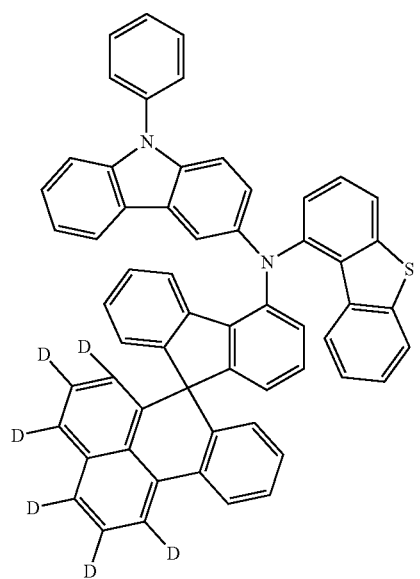
121
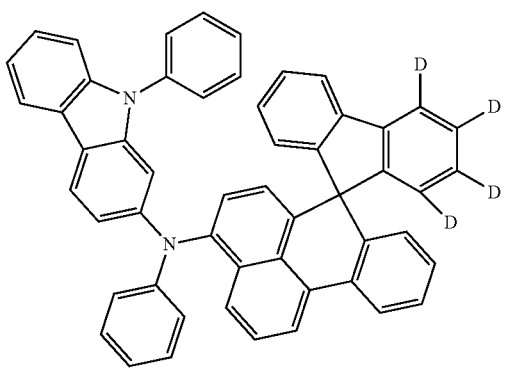
122
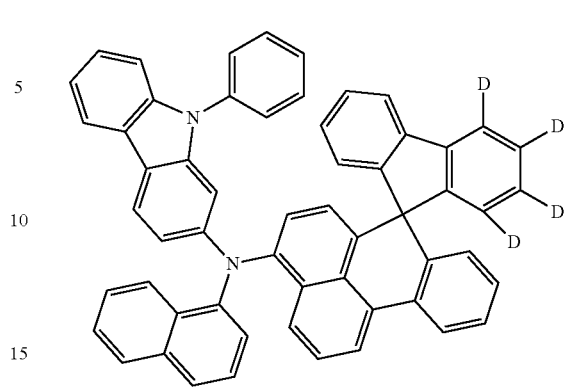
123
124

125
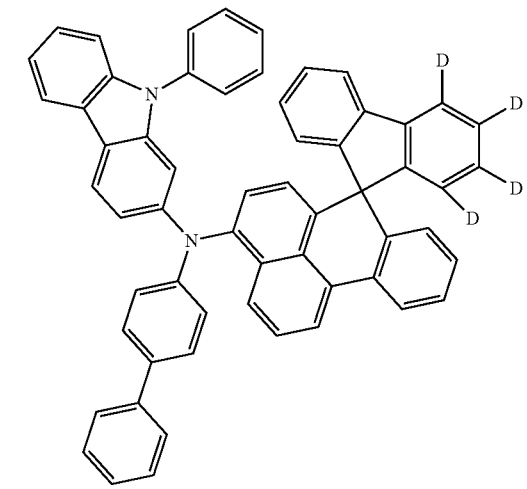
126
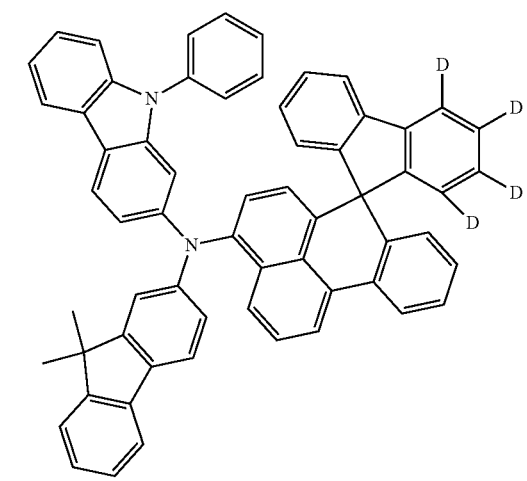
127
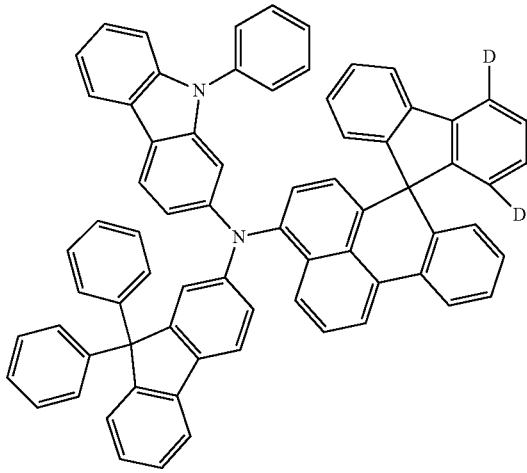
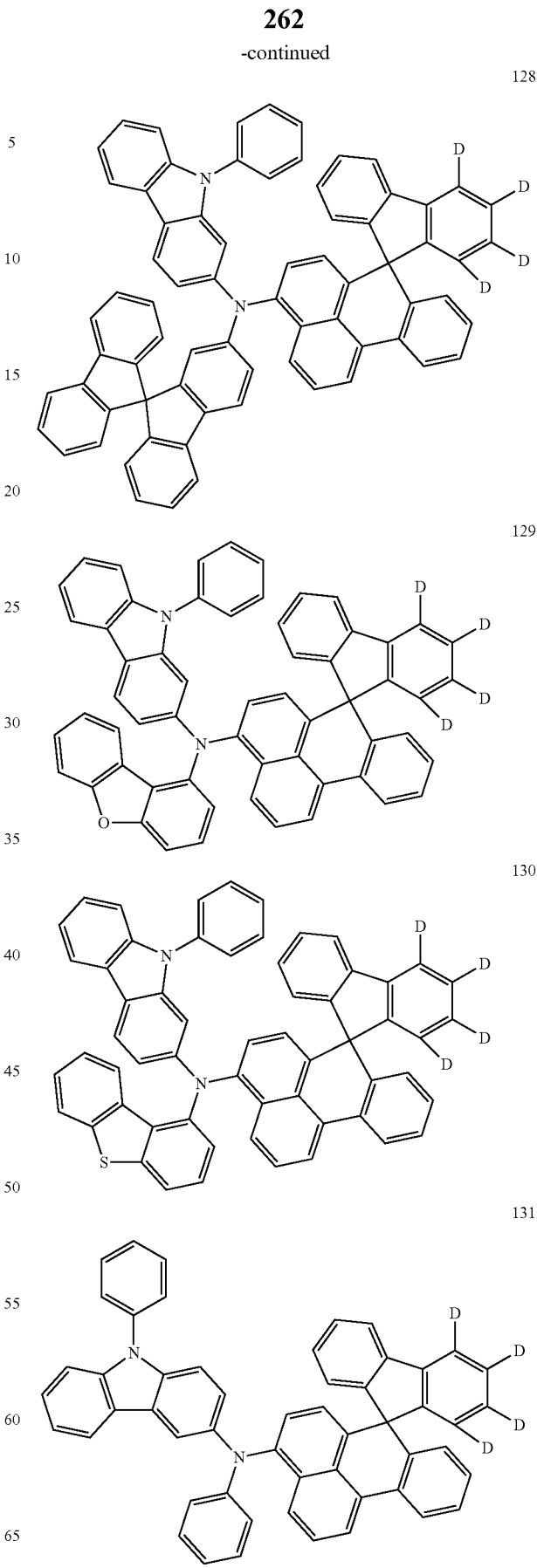

132
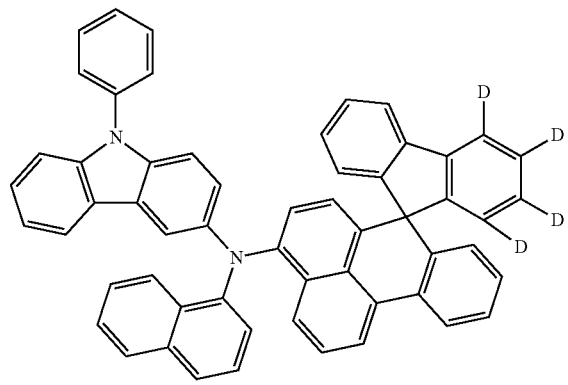
133
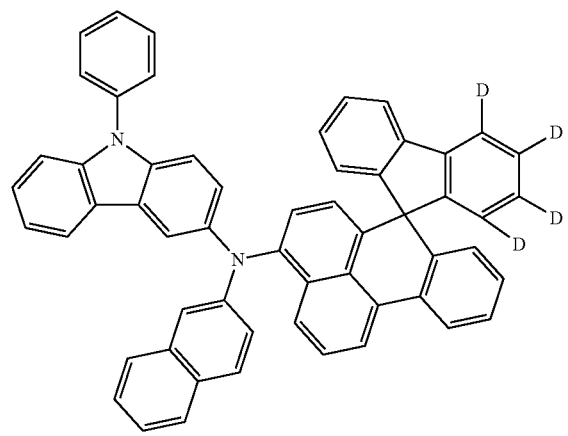
134
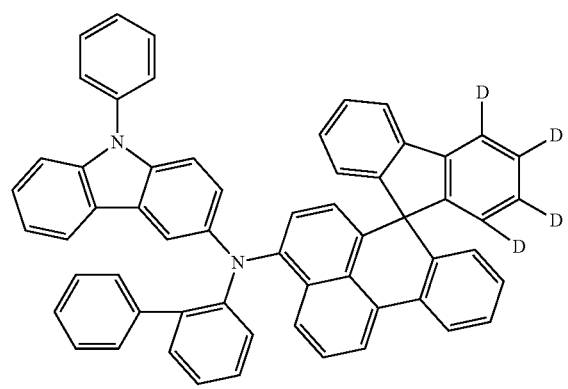
135
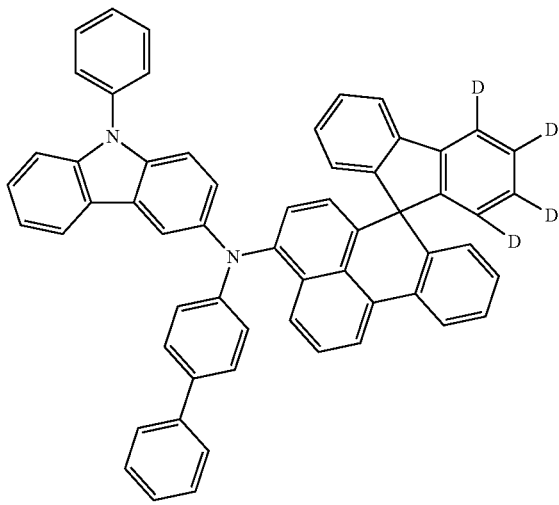
136
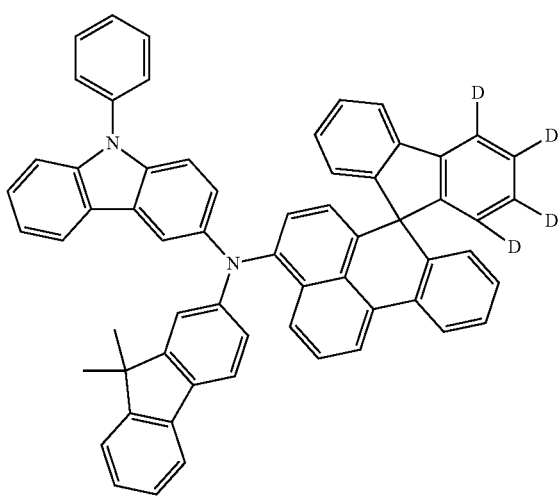
137
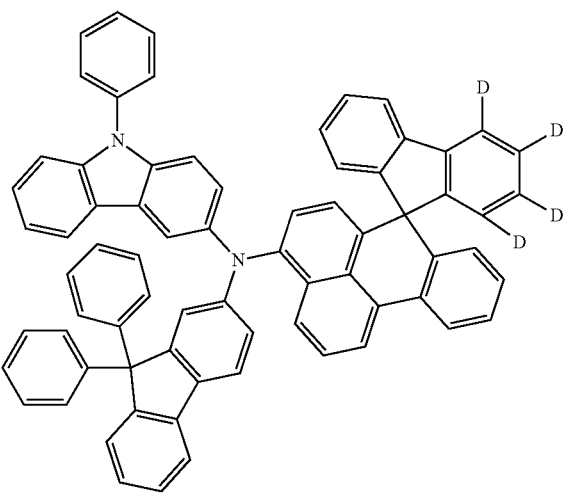

-continued
138
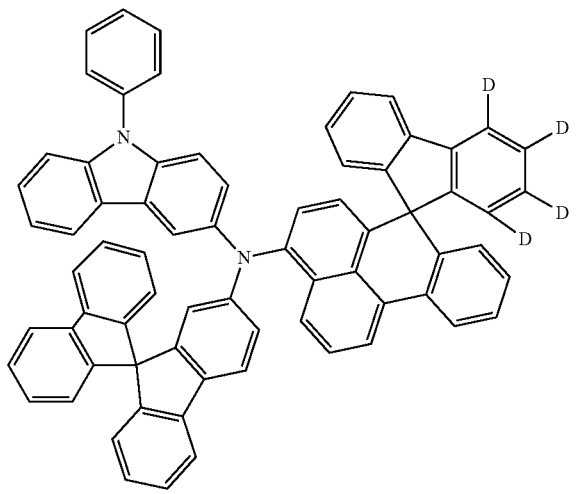
139
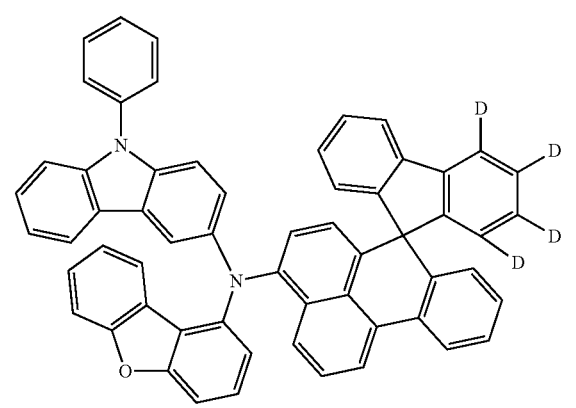
140
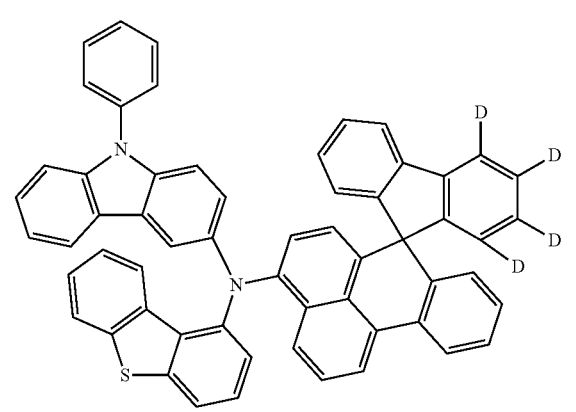
-continued
141
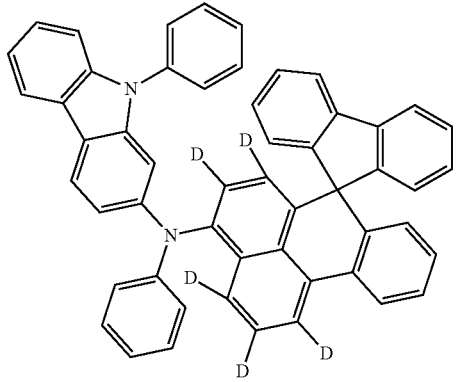
142
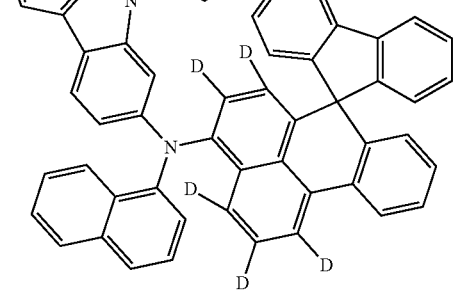
143
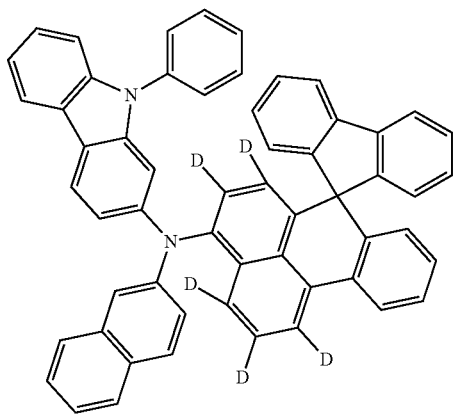
144
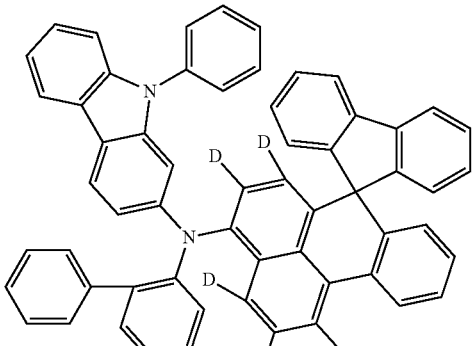

267
-continued
145
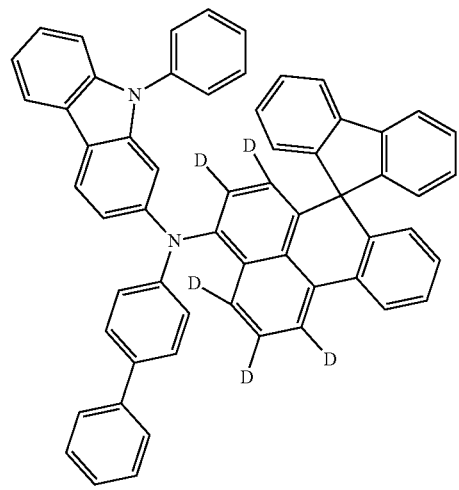
146
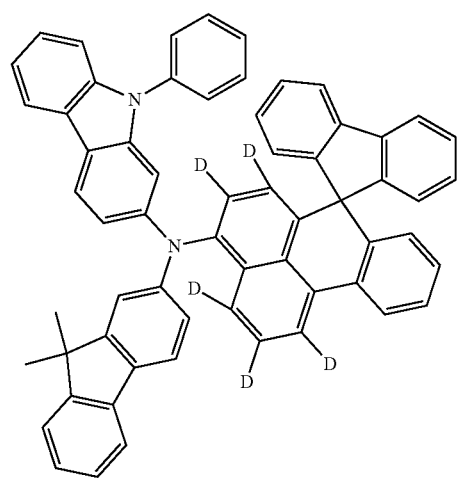
147
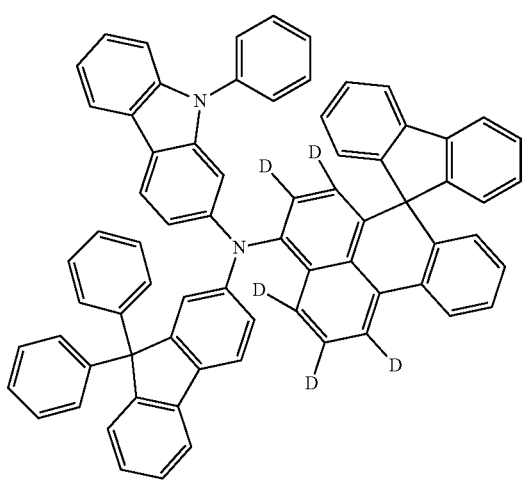
268
-continued
148
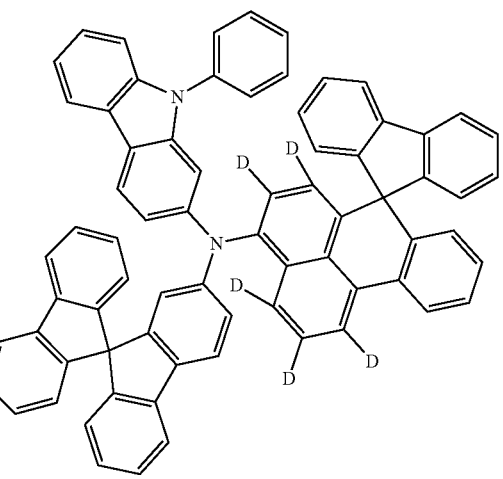
149
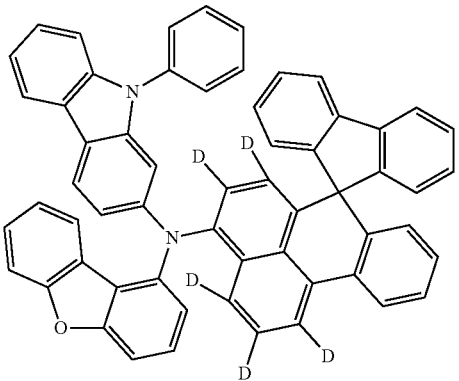
150
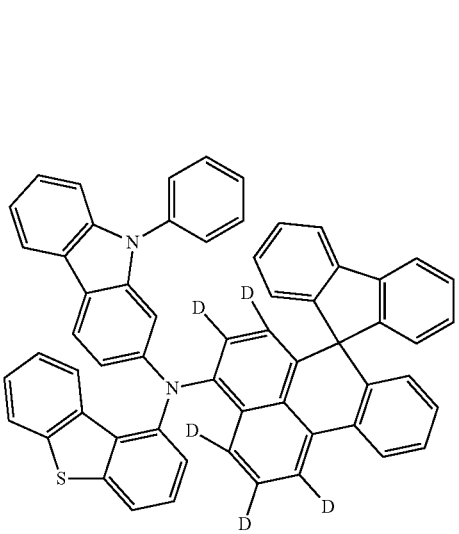

-continued
151
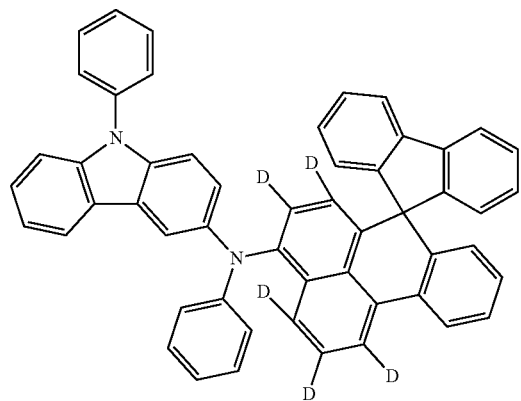
152
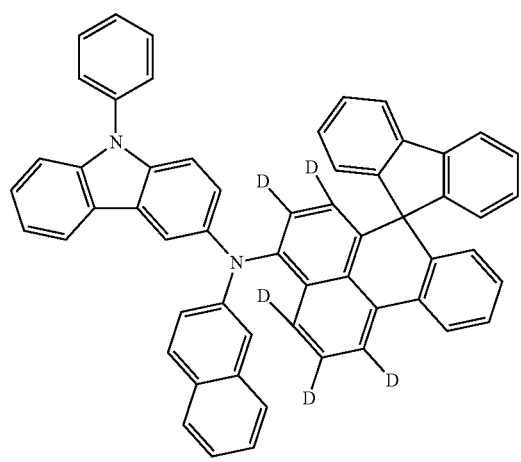
153
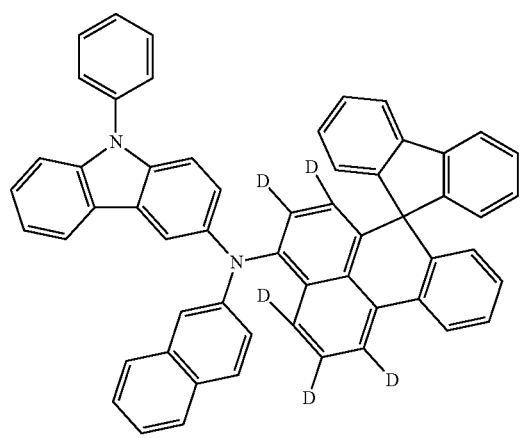
-continued
154
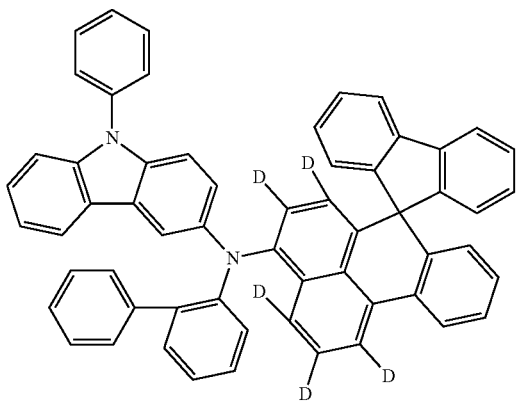
155
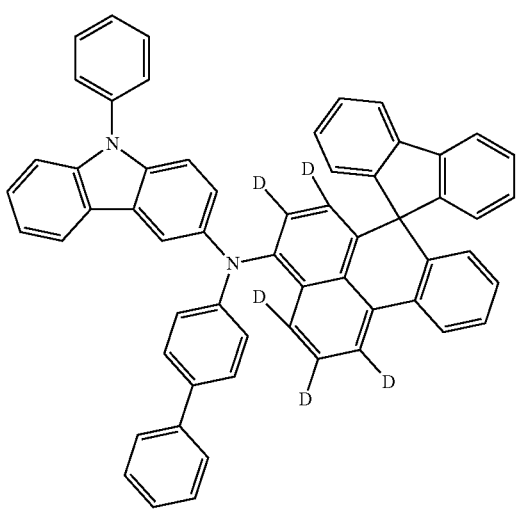
156
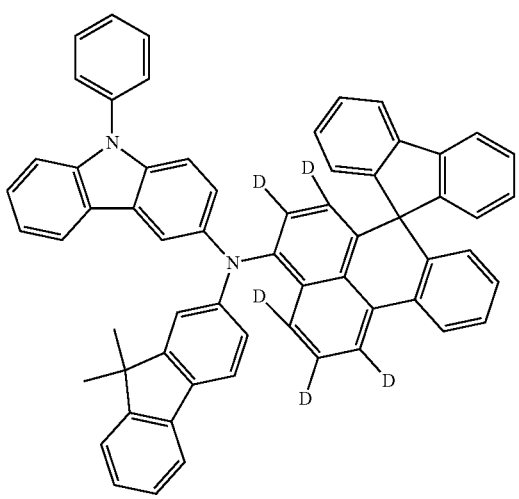

157

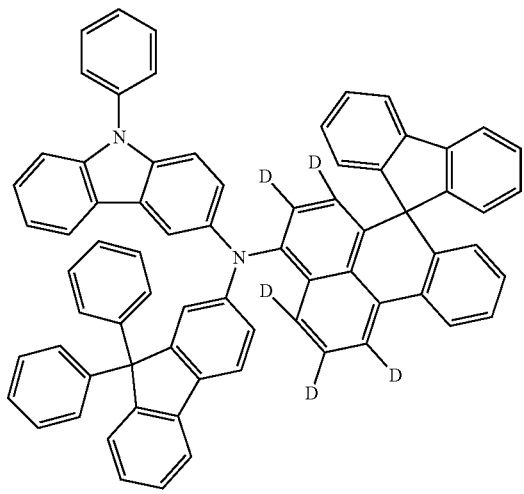

158

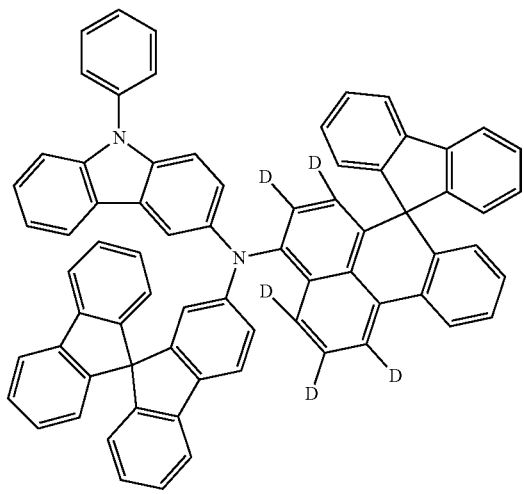

159

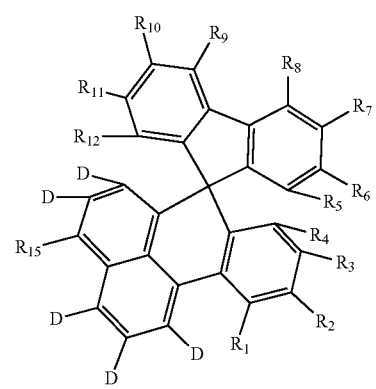

160

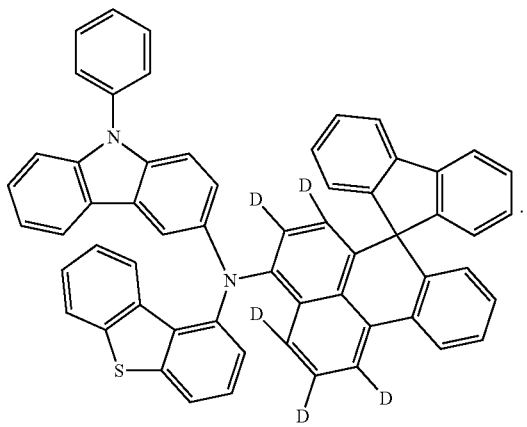

17. A display device comprising a display panel including a plurality of light emitting elements,
wherein each of the light emitting elements comprises:
a first electrode;
a second electrode on the first electrode; and
at least one functional layer which is between the first electrode and the second electrode and comprises an amine compound represented by any one of Formula 1-1, Formula 1-2, and Formula 1-3:

[Formula 1-1]

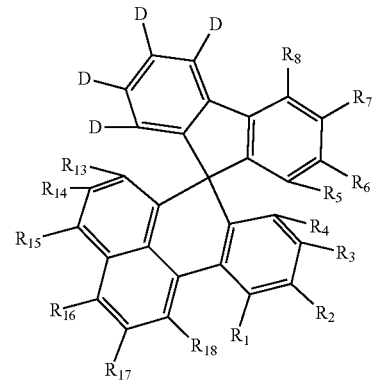

[Formula 1-2]

-continued

[Formula 1-3]

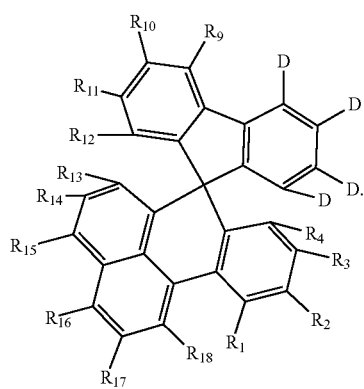

wherein, in Formula 1-1, $R_1$ to $R_8$ and $R_{13}$ to $R_{18}$ are each independently a hydrogen atom, a halogen atom, a substituted or unsubstituted silyl group, or a substituted or unsubstituted alkyl group having 1 to 20 carbon atoms, and any one selected from $R_3$, $R_6$, $R_8$, and $R_{15}$ is represented by Formula 2, in Formula 1-2, $R_1$ to $R_{12}$ are each independently a hydrogen atom, a halogen atom, a substituted or unsubstituted silyl group, or a substituted or unsubstituted alkyl group having 1 to 20 carbon atoms, and when $R_{15}$ is a deuterium atom, any one selected from $R_3$, $R_6$, and $R_8$ is represented by Formula 2, and in Formula 1-3, $R_1$ to $R_4$ and $R_9$ to $R_{18}$ are each independently a hydrogen atom, a halogen atom, a substituted or unsubstituted silyl group, or a substituted or unsubstituted alkyl group having 1 to 20 carbon atoms, and $R_3$ or $R_{15}$ is represented by Formula 2:

[Formula 2]

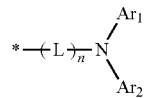

wherein, in Formula 2,
n is an integer of 0 to 3,
L is a substituted or unsubstituted arylene group having 6 to 30 ring-forming carbon atoms, or a substituted or unsubstituted heteroarylene group having 2 to 30 ring-forming carbon atoms, and
$Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms.

18. The display device of claim 17, further comprising an optical layer on the display panel,
wherein the optical layer is polarization layer or color filter layer.

* * * * *